(12) United States Patent
Imai et al.

(10) Patent No.: US 7,230,968 B2
(45) Date of Patent: Jun. 12, 2007

(54) SEMICONDUCTOR LASER DEVICE AND SOLID-STATE LASER DEVICE USING SAME

(75) Inventors: Hirofumi Imai, Futtsu (JP); Naoya Hamada, Futtsu (JP); Motoi Kido, Futtsu (JP); Tatsuhiko Sakai, Futtsu (JP); Atsushi Sugihashi, Futtsu (JP); Hideyuki Hamamura, Futtsu (JP); Satoshi Yamaguchi, Oita (JP)

(73) Assignee: Nippon Steel Corporation, Tokyo (JP)

( * ) Notice: Subject to any disclaimer, the term of this patent is extended or adjusted under 35 U.S.C. 154(b) by 363 days.

(21) Appl. No.: 10/801,109

(22) Filed: Mar. 15, 2004

(65) Prior Publication Data
US 2005/0063435 A1 Mar. 24, 2005

(30) Foreign Application Priority Data
Jul. 10, 2003 (JP) .............................. 2003-194913

(51) Int. Cl.
*H01S 3/08* (2006.01)
(52) U.S. Cl. ........................ 372/101; 372/107
(58) Field of Classification Search ................ 372/101, 372/107
See application file for complete search history.

(56) References Cited

U.S. PATENT DOCUMENTS
5,513,201 A 4/1996 Yamaguchi et al. .......... 372/75

FOREIGN PATENT DOCUMENTS
JP A 2002-239773 8/2002
JP A 2003-057588 2/2003

*Primary Examiner*—Armando Rodriguez
(74) *Attorney, Agent, or Firm*—Baker Botts LLP; Chang Sik Kim

(57) ABSTRACT

A semiconductor laser device including a laser element stack array emitting a two-dimensional array shaped group of laser beams consisting of rows of laser beams arranged linearly in parallel in a broken line configuration and optical elements arranged in front of the array, receiving rows of laser beams bent and collimated in a direction substantially perpendicular to the orientation of the broken line configuration. Laser beams are emitted from emitters or groups of emitters and are rotated by right angles so as to convert the laser beams to a plurality of rows aligned in parallel in an approximate ladder rung configuration and the distance between center axes of the rows of laser beams is shortened to condense the laser beams by converting them to a group of laser beams emitted from a common object and thereby making all laser beams converge to a single image.

235 Claims, 82 Drawing Sheets

Fig.19
(a) OUTPUT BEAMS OF LASER DIODE STACK ARRAY
(b) BEAMS AFTER FIRST BEAM CONVERTER
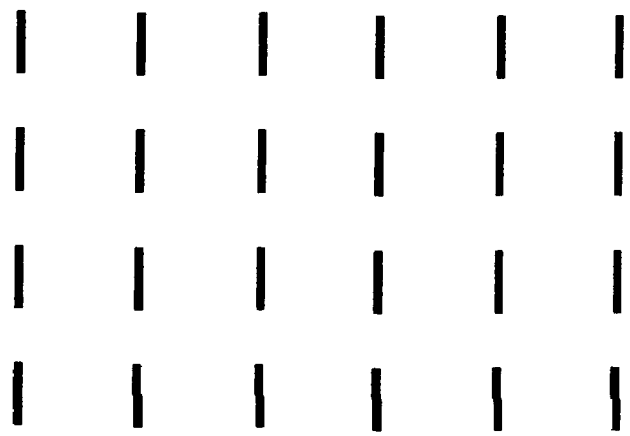
(c) IMAGE FORMED BY CONDENSING LENS

(a) AFTER SECOND TELESCOPE (b) IMAGE AFTER CONDENSING LENS

Fig. 29
(a) BEFORE TELESCOPE
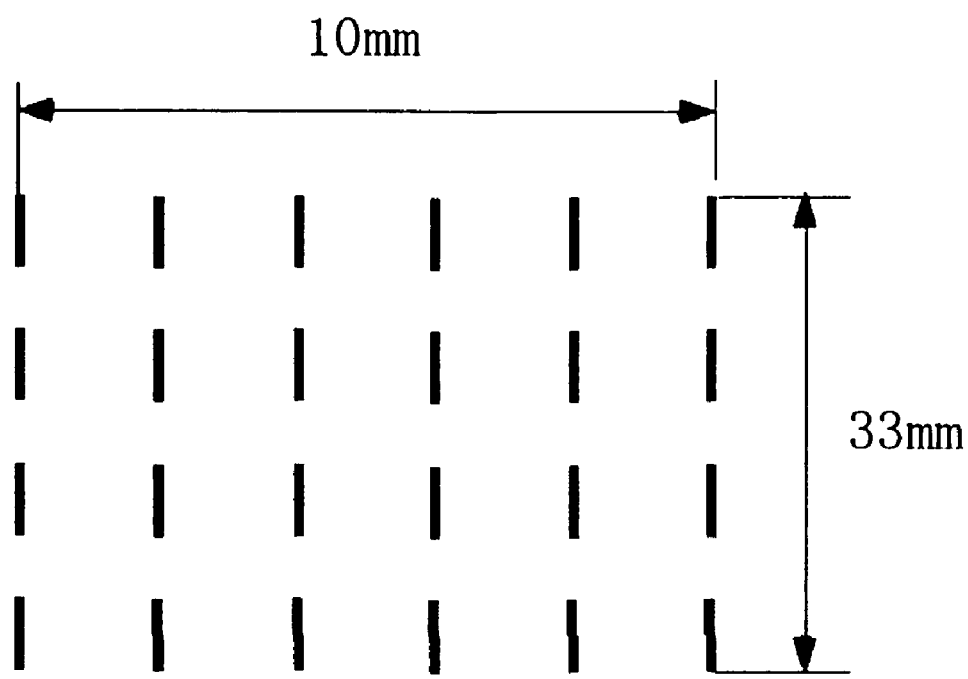
(b) AFTER TELESCOPE
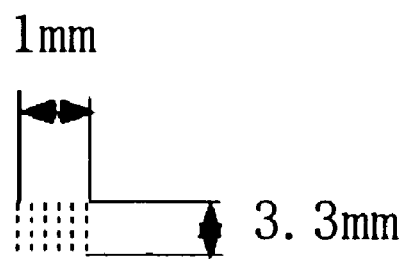

$r = t\sin(\theta - \phi)/\cos(\phi)$ $\phi = \sin^{-1}(\sin(\theta)/n)$

Fig.37
(a) BEFORE SECOND BEAM CONVERTER
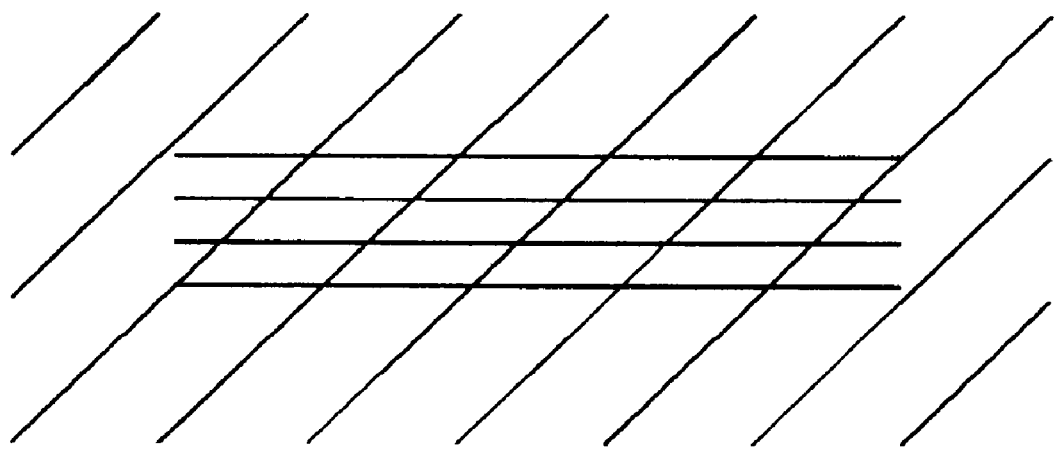
(b) AFTER SECOND BEAM CONVERTER
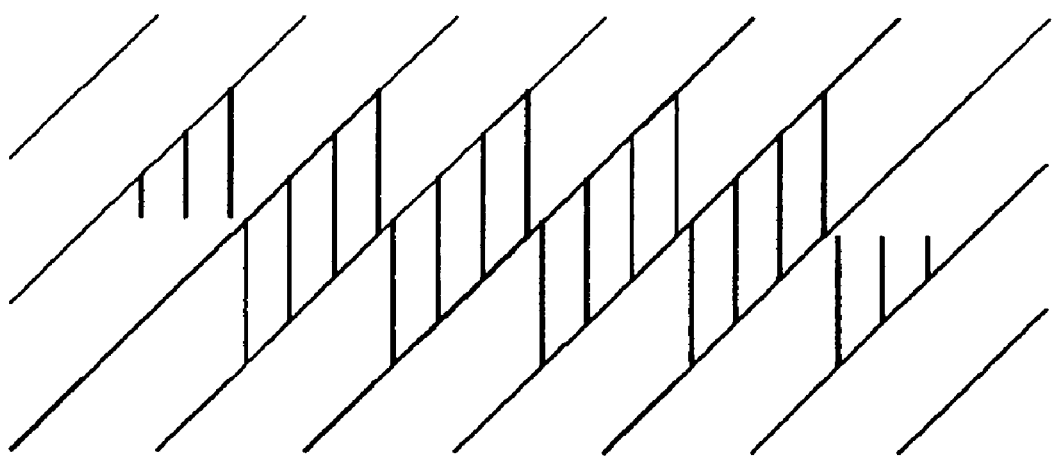

Fig. 83
(a)
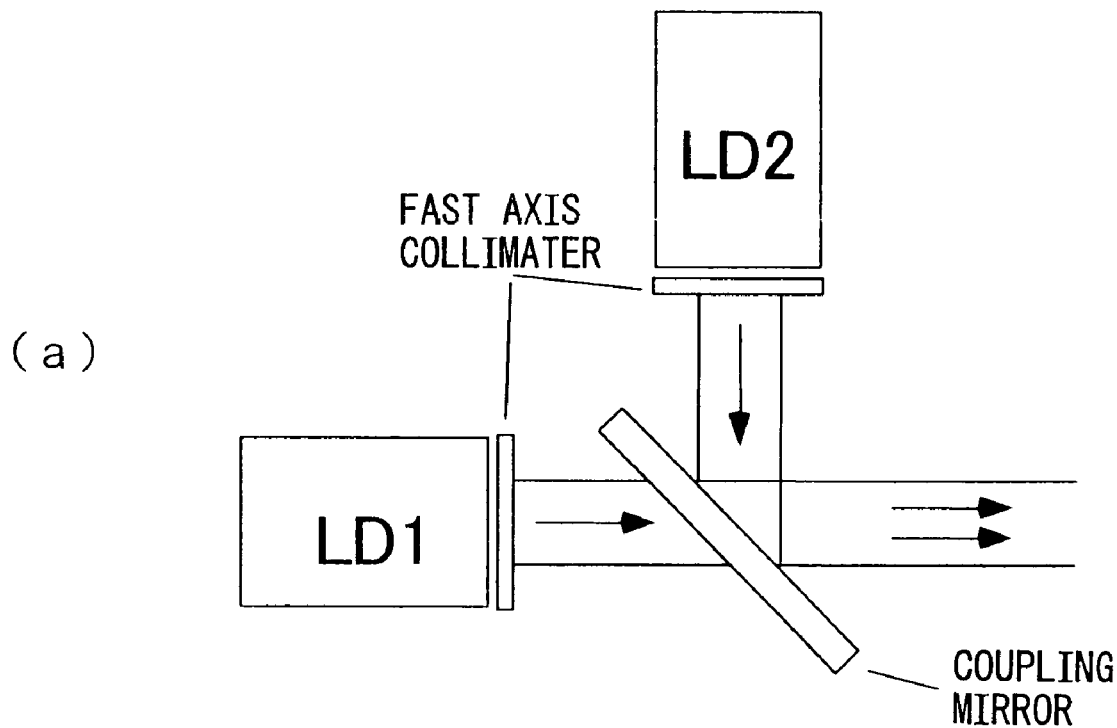
(b)
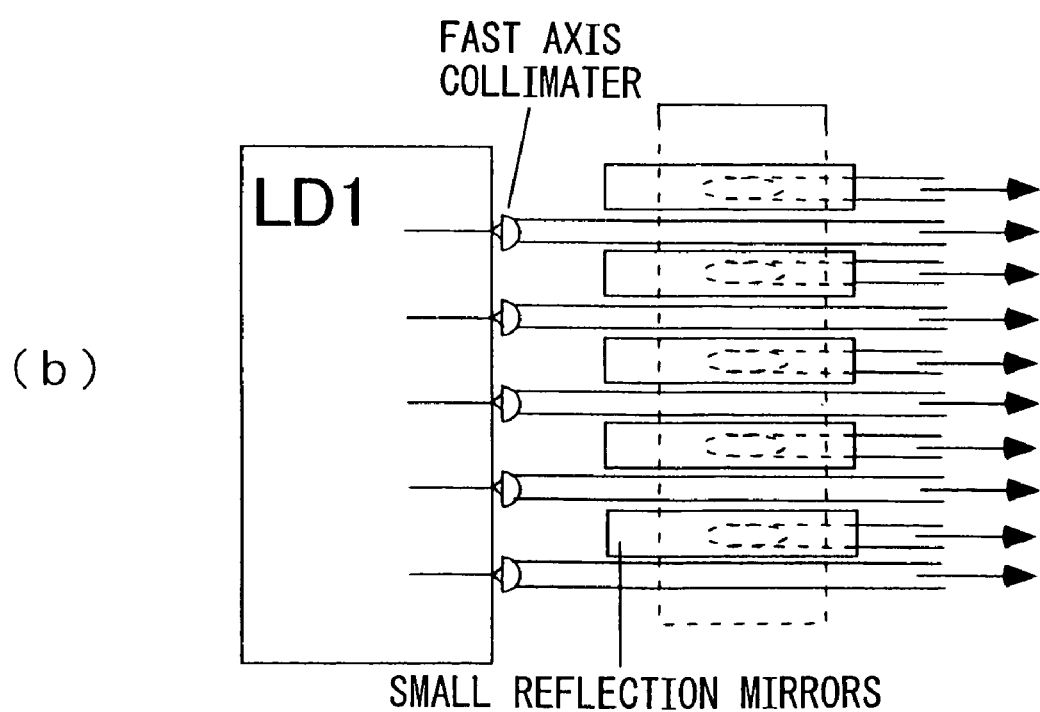

SEMICONDUCTOR LASER DEVICE AND SOLID-STATE LASER DEVICE USING SAME

CROSS-REFERENCE TO RELATED APPLICATION(S)

This application claims priority under 35 U.S.C. § 119 from Japanese Patent Application No. 2003-194913 filed on Jul. 10, 2003, the entire disclosure of which is incorporated herein by reference.

FIELD OF THE INVENTION

The present invention relates to a beam converter capable of being used for a laser diode stack array and a laser device that is capable of using such beam converter. The present invention further relates to a semiconductor laser condenser capable of condensing semiconductor laser beams to a fine spot and a semiconductor laser pumped solid-state laser device configured to pump a beam of a solid-state laser element by semiconductor laser beams. A laser diode and a semiconductor laser is the same meanings here.

BACKGROUND INFORMATION

Linear arrays of semiconductor lasers comprised of active layer stripes of semiconductor lasers arranged one dimensionally and having a continuous wave (CW) output of about 50 W have been available. Linear arrays of semiconductor laser, for example as shown in FIG. 1, comprise from 10 to several tens of stripes with ends of widths of 100 μm to 200 μm serving as emitters arranged at fixed intervals in a plane over a total width of 1 cm.

By stacking several of these semiconductor laser linear arrays to form a two-dimensional array as shown in FIG. 2, it is possible to easily obtain an increased output. Such a two-dimensional semiconductor laser array is called a "semiconductor laser stack array" or a "semiconductor laser stack bar". Ones with kW class outputs are available on the market. If it were possible to directly condense the laser beams of the stack array using an optical system so as to obtain a sufficiently fine spot, it is likely possible to use such laser beams for a various applications such as laser materials processing.

It may be possible to obtain from a single semiconductor laser stack array a light source comprised of line segments arranged in a two-dimensional array emitting (10 to several tens)×n number of laser beams where n is the number of stack layers. Further, a high output semiconductor laser such as a quasi-CW semiconductor laser provides a light source with a large number of emitters arranged densely, with emission beams mixing with emission beams from adjoining lasers right after emission, and with substantially consecutive linear light sources arranged corresponding to the number of stack layers.

Each stripe beam is emitted from a linear light source. The beam divergence angle has a large vertical component φ with respect to the active layer of about 40° to 50° and a small parallel component θ of about 10°. Below, the large divergence angle direction perpendicular to an active layer will be called the "fast axis", while the small divergence angle direction parallel to an active layer will be called the "slow axis". The width of the emission light source is a narrow one of not more than 1 μm at the fast axis side and a broad one of 100 μm to 200 μm as explained above at the slow axis side.

For example, consider a laser diode ("LD") stack array comprised of several stacked linear arrays each comprised of 12 stripes of thicknesses of 1 μm and widths of 200 μm arranged at a pitch of 800 μm. The slow axis component of a stripe beam has a beam divergence angle of 10°, so adjoining stripe beams become superposed with each other at 3.4 mm from the emitter ends of the stripes. When placing a lens after this superposition, part of the beams become beams having angles with respect to the axis of the lens and are focused at points different from the focal point of the focusing lens, so the efficiency of the system is lowered.

Therefore, in order to collimate the beams emitted from the stripe arrays using a microcylindrical lens array, it is necessary to place a lens (focal length f1≦3.4 mm) at a close position of within 3.4 mm. If multiplying the magnification (f2/f1) determined by the combination with the focal length f2 of the condensing lens for condensing the collimate beams with the width of the stripes to find the focused spot diameter, it inevitably becomes large.

In this way, in the past, it was difficult to concentrate the emission laser beams of an LD stack bar giving a light source comprised of line segments arranged in a two-dimensional array to a small area with a high density. To utilize the LD stack array for laser processing or medical applications, which account for the major part of industrial applications for high power lasers, some special means is required for concentrating the beam energy in a narrow region.

Further, if an attempt is made to use a semiconductor laser stack array as a pumped light source of a solid-state laser (as described above), since the width of the array is about 1 cm, it may not be possible to focus beams to a single spot using an ordinary lens system and the high pumping efficiency end pumping system may not be used, so application was previously only possible for side pumping systems. On the other hand, for the end pumping system in which pumping light comes from the direction of optical axis of the solid-state laser, it is possible to obtain high efficiency single fundamental lateral mode oscillation by matching the pumping space by the semiconductor laser output beams with the mode space of the solid-state laser oscillation.

Further, matching of the pumping space can be important in a double clad fiber laser, considered an advanced form of an end pumped solid-state laser. A double clad fiber laser can also be considered a high efficient brightness raising device, but the input aperture of the pumping light is a narrow some 600 μm×240 μm, so for obtaining a higher output, a special may was previously used for concentrating the rather high level semiconductor laser beams.

SUMMARY OF THE INVENTION

In view of the above problems, one of the objects of the present invention is to provide a novel beam converter used for a semiconductor laser device using a semiconductor laser stack array, and able to raise the energy density by making the focal point of the semiconductor laser device extremely small and to provide a semiconductor laser device using this beam converter to raise the energy density at the focal point of the semiconductor laser device using a semiconductor laser stack array.

Another object of the present invention is to provide a powerful semiconductor laser pumped solid-state laser device using the above semiconductor laser device.

An exemplary embodiment of the present invention can solve the above-described problems. For the purposes of describing the exemplary embodiments of the present invention, "in front" can mean a focal point side, and the reference numerals of the examples are indicated in parentheses.

Therefore, an exemplary embodiment of a semiconductor laser device according to the present invention includes a laser diode stack array provided with a plurality of emitters, extending long in a first direction of emission of laser beams, adapted to be arranged linearly in the first direction and arranged in a plurality of rows and emitting a group of laser beams having laser beam elements arranged in a two-dimensional array. The laser device also includes a first condenser provided in front of the laser diode stack array and bending and collimating the group of laser beams for every row in a second direction substantially at right angles to the first direction. Further, the laser device includes a first beam converter provided in front of the first condenser, and adapted to receive a group of laser beams collimated in the second direction, and configured to emit the laser beams converted to a substantially ladder rung configuration group of laser beams extending in the first direction for every row.

According to this exemplary embodiment, a second condenser can be provided in front of the first beam converter, which is adapted to bend and collimate the group of laser beams output from the first beam converter in a second direction substantially at right angles to the first direction for every row, and configured to use each with center axes offset by exactly predetermined amounts to convert them to beams emitted from approximately the same object by generating an angular change of the optical axes. In addition, the laser device includes a first beam compressor that is capable of receiving the group of laser beams output from the second condenser, and emitting them converted to a compressed substantially ladder rung configuration group of laser beams with shortened ladder rung intervals and extending in the first direction of the plurality of rows. A third condenser can also be provided for condensing the group of laser beams output from the first beam compressor.

Another exemplary embodiment of a semiconductor laser device according to the present invention can include a laser beam array or a laser diode stack array provided with a plurality of emitters. The emitters can extend in a first direction of emission of laser beams, and may be arranged linearly in the first direction and in a plurality of rows and emitting a group of laser beams having laser beam elements. The laser beam elements can be arranged in the two-dimensional array. The emitters may can emit a group of laser beams comprised of laser beams substantially continuing linearly arranged in a plurality of rows.

A first condenser may also be provided in front of the laser diode stack array, and adapted to bend and collimate a group of laser beams for every row in a second direction substantially at right angles to the first direction. The laser device may also include a first beam converter provided in front of the first condenser, dividing the group of laser beams in each row, providing in each row in parallel optical elements for bending the axes of the cross-sections of the laser beam units to substantially right angles using as units the divided pluralities of laser beams, receiving the group of laser beams collimated in the second direction, rotating the axes of the cross-sections of the laser beam units for each optical element, and emitting the beams as a substantially ladder rung configuration group of laser beams extending in the first direction using the divided pluralities of laser beams as units.

A second condenser may be provided in front of the first beam converter, bending and collimating the group of laser beams output from the first beam converter in a second direction substantially at right angles to the first direction for every row, and using each with center axes offset by exactly predetermined amounts to convert them to beams emitted from approximately the same object by generating an angular change of the optical axes. In addition, a first beam compressor is provided which is adapted to receive the group of laser beams output from the second condenser, and emit the beams converted to a substantially ladder rung configuration group of laser beams with shortened ladder rung intervals and extending in the first direction of the plurality of rows. The laser device also includes a third condenser configured to condense the group of laser beams output from the first beam compressor.

Still another exemplary embodiment of a semiconductor laser device according to the present invention can include a laser diode stack array provided with a plurality of emitters, extending long in a first direction of emission of laser beams, and capable of being arranged linearly in the first direction and arranged in a plurality of rows, and configured to emit a group of laser beams having laser beam elements arranged in a two-dimensional array. A first condenser is also provided in front of the laser diode stack array and bending and collimating the group of laser beams for every row in a second direction substantially at right angles to the first direction. In addition, the laser device may include a first beam converter provided in front of the first condenser, which is adapted to receive the group of laser beams collimated in the second direction, and emitting it converted to a substantially ladder rung configuration group of laser beams extending in the first direction for every row;

A second condenser can also be provided in front of the first beam converter, and adapted to bend and collimate the group of laser beams output from the first beam converter (30) in a second direction substantially at right angles to the first direction for every row. The laser device further includes a first beam compressor that is capable of receiving the group of laser beams output from the second condenser and emitting the beams converted to a compressed substantially ladder rung configuration group of laser beams with shortened ladder rung intervals and extending in the first direction of the plurality of rows. An angle changer is also provided in front of one of the second condenser and the first beam compressor (40), capable of receiving the substantially ladder rung configuration group of laser beams extending in the first direction of the plurality of rows, and adapted to change the center optical axes of the group of beams to the second direction for each row to obtain a group of beams emitted from substantially the same object. Further, the laser device can include a third condenser for condensing the group of laser beams changed in center optical axes.

Yet another exemplary embodiment of a semiconductor laser device according to the present invention can include (i) a laser diode stack array provided with a plurality of emitters, extending long in a first direction of emission of laser beams, to be arranged linearly in the first direction and arranged in a plurality of rows and emitting a group of laser beams having laser beam elements arranged in a two-dimensional array, or (ii) a laser diode stack array provided with a plurality of emitters, extending long in a first direction of emission of laser beams, to be arranged linearly densely in the first direction and arranged in a plurality of rows and emitting a group of laser beams comprised of laser beams substantially continuing linearly arranged in a plurality of rows. A first condenser may be provided in front of the laser diode stack array and bending and collimating the group of laser beams for every row in a second direction substantially at right angles to the first direction. A first beam converter may be provided in front of the first condenser, so as to divide the group of laser beams in each row, providing in each row in parallel optical elements for bending the axes of the cross-sections of the laser beam units to substantially right angles using as units the divided pluralities of laser beams, receive the group of laser beams collimated in the second direction, rotating the axes of the cross-sections of the laser beam units for each optical element, and emit the beams as a substantially ladder rung configuration group of laser beams extending in the first direction using the divided pluralities of laser beams as units. The laser device may also include a second condenser provided in front of the first beam converter, and configured to bend and collimate the group of laser beams output from the first beam converter in a second direction substantially at right angles to the first direction for every row. A first beam compressor may also be provided to receive the group of laser beams output from the second condenser, and emit the beams converted to a substantially ladder rung configuration group of laser beams with shortened ladder rung intervals and extending in the first direction of the plurality of rows. An angle changer may be provided in front of the second condenser or the first beam compressor, which is adapted to receive the substantially ladder rung configuration group of laser beams extending in the first direction of the plurality of rows, and change the center optical axes of the group of beams to the second direction for each row to obtain a group of beams emitted from substantially the same object. Further the laser device may include a third condenser configured to condense the group of laser beams.

According to a further exemplary embodiment of the present invention, the second condenser or the first beam converter can be integrally formed with the angle changer.

Yet another exemplary embodiment of a semiconductor laser device according to the present invention can include a laser diode stack array provided with a plurality of emitters, extending long in a first direction of emission of laser beams, capable of being arranged linearly in the first direction and arranged in a plurality of rows and emitting a group of laser beams having laser beam elements arranged in a two-dimensional array. A first condenser may be provided front of the laser diode stack array and bending and collimating the group of laser beams for every row in a second direction substantially at right angles to the first direction. A first beam converter may be provided in front of the first condenser, so as to receive the group of laser beams collimated in the second direction, and emit the beams converted to a substantially ladder rung configuration group of laser beams extending in the first direction for every row. A second condenser may be provided in front of the first beam converter so as to bend and collimate the group of laser beams output from the first beam converter in a second direction substantially at right angles to the first direction for every row. The laser device also may include a third condenser adapted for receiving the group of laser beams output from the second condenser (80), forming images, and reducing the distance between rows.

A further exemplary embodiment of a semiconductor laser device according to the present invention can include (i) a laser diode stack array provided with a plurality of emitters, extending long in a first direction of emission of laser beams, capable of being arranged linearly in the first direction and arranged in a plurality of rows and emitting a group of laser beams having laser beam elements arranged in a two-dimensional array, or (ii) a laser diode stack array provided with a plurality of emitters, extending long in a first direction of emission of laser beams, and capable of being arranged linearly densely in the first direction, provided in a plurality of rows, and emitting a group of laser beams comprised of laser beams substantially continuing linearly arranged in a plurality of rows;

The laser device according to this exemplary embodiment may include a first condenser provided in front of the laser diode stack array, and adapted to bend and collimate the group of laser beams for every row in a second direction substantially at right angles to the first direction. A first beam converter may be provided in front of the first condenser, thus dividing the group of laser beams in each row, providing in each row in parallel optical elements for bending the axes of the cross-sections of the laser beam units to substantially right angles using as units the divided pluralities of laser beams, receiving the group of laser beams collimated in the second direction, rotating the axes of the cross-sections of the laser beam units for each optical element, and emitting the beams as a substantially ladder rung configuration group of laser beams extending in the first direction using the divided pluralities of laser beams as units. A second condenser may be provided in front of the first beam converter, and adapted to bend and collimate the group of laser beams output from the first beam converter in a second direction substantially at right angles to the first direction for every row. Further, a third condenser may be provided for receiving the group of laser beams, forming images, and reducing the distance between rows.

Still further exemplary embodiment of a semiconductor laser device according to the present invention can include a laser diode stack array provided with a plurality of emitters, extending long in a first direction of emission of laser beams, to be arranged linearly in the first direction and arranged in a plurality of rows and emitting a group of laser beams having laser beam elements arranged in a two-dimensional array. A first condenser may be arranged in front of the laser diode stack array and bending, and adapted to collimate the group of laser beams for every row in a second direction substantially at right angles to the first direction. A first beam converter may be provided in front of the first condenser, thus receiving the group of laser beams collimated in the second direction, and emitting the beams converted to a substantially ladder rung configuration group of laser beams extending in the first direction for every row. A second condenser may be provided in front of the first beam converter, and configured to bend and collimate the group of laser beams output from the first beam converter in a second direction substantially at right angles to the first direction for every row. A fourth condenser may be provided in front of the second condenser, and provided for receiving the substantially ladder rung configuration group of laser beams extending in the first direction of the plurality of rows, forming images, and reducing the distance between rows. The laser device can include a third condenser for further reducing and reforming the image from the fourth condenser.

Yet another exemplary embodiment of a semiconductor laser device according to the present invention can include (i) a laser diode stack array provided with a plurality of emitters, provided for extending long in a first direction of emission of laser beams, to be arranged linearly in the first direction and arranged in a plurality of rows and emitting a group of laser beams having laser beam elements arranged in a two-dimensional array, or (ii) a laser diode stack array provided with a plurality of emitters, extending long in a first direction of emission of laser beams, to be arranged linearly densely in the first direction and arranged in a plurality of rows and emitting a group of laser beams comprised of laser beams substantially continuing linearly arranged in a plurality of rows. A first condenser may be provided in front of the laser diode stack array and bending and collimating the group of laser beams for every row in a second direction substantially at right angles to the first direction. A first beam converter may be provided in front of the first condenser, dividing the group of laser beams in each row, providing in each row in parallel optical elements for bending the axes of the cross-sections of the laser beam units to substantially right angles using as units the divided pluralities of laser beams, receiving the group of laser beams collimated in the second direction, rotating the axes of the cross-sections of the laser beam units for each optical element, and emitting the beams as a substantially ladder rung configuration group of laser beams extending in the first direction using the divided pluralities of laser beams as units.

The laser device of this exemplary embodiment may also include a second condenser provided in front of the first beam converter, and adapted to bend and collimate the group of laser beams output from the first beam converter in a second direction substantially at right angles to the first direction for every row. A fourth condenser may be provided in front of the second condenser, and adapted for receiving the substantially ladder rung configuration group of laser beams extending in the first direction of the plurality of rows, forming images, and reducing the distance between rows. Further, a third condenser can be provided for further reducing and reforming the image from the fourth condenser.

According one exemplary variant of the present invention, an angle changer may also be provided at the image-forming plane of the fourth condenser or in its vicinity and changing the center optical axes of the group of beams to the second direction for each row to obtain a group of beams emitted from substantially the same object.

A further exemplary embodiment of a semiconductor laser device according to the present invention can include a laser diode stack array provided with a plurality of emitters, extending long in a first direction of emission of laser beams, capable of being arranged linearly in the first direction and arranged in a plurality of rows and emitting a group of laser beams having laser beam elements arranged in a two-dimensional array. A first condenser may be provided in front of the laser diode stack array, and bending and collimating the group of laser beams for every row in a second direction substantially at right angles to the first direction. A first beam converter may be provided in front of the first condenser, so as to receive the group of laser beams collimated in the second direction, and emitting the lasers converted to a substantially ladder rung configuration group of laser beams extending in the first direction for every row.

A second condenser can be provided in front of the first beam converter, and adapted for bending and collimating the group of laser beams output from the first beam converter in a second direction substantially at right angles to the first direction for every row. A first beam compressor can receive the group of laser beams output from the second condenser, and emit the received laser beams converted into a compressed substantially ladder rung configuration group of laser beams extending in the first direction of the plurality of rows. A second beam compressor may be provided in front of the first beam compressor, and emit the laser beams output from the first beam compressor converted into a group of laser beams with shortened intervals of the rows and compressed in the second direction of the plurality of rows.

The laser device of this exemplary embodiment may include a fourth condenser for receiving the beams output from the second beam compressor, and making the beam divergence angle in the first direction close to the beam divergence angle of the second direction. A third condenser may be provided for condensing the group of laser beams output from the fourth condenser.

Another exemplary embodiment of a semiconductor laser device according to the present invention can include (i) a laser diode stack array provided with a plurality of emitters, extending long in a first direction of emission of laser beams, arranged linearly in the first direction and arranged in a plurality of rows, and capable of emitting a group of laser beams having laser beam elements arranged in a two-dimensional array or (ii) a laser diode stack array provided with a plurality of emitters, extending long in a first direction of emission of laser beams, arranged linearly densely in the first direction and arranged in a plurality of rows, and capable of emitting a group of laser beams comprised of laser beams substantially continuing linearly arranged in a plurality of rows. A first condenser may be provided in front of the laser diode stack array and bending, and configured to collimate the group of laser beams for every row in a second direction substantially at right angles to the first direction. A first beam converter may be provided in front of the first condenser, thus dividing the group of laser beams in each row, providing in each row in parallel optical elements for bending the axes of the cross-sections of the laser beam units to substantially right angles using as units the divided pluralities of laser beams, receiving the group of laser beams collimated in the second direction, rotating the axes of the cross-sections of the laser beam units for each optical element, and emitting the beams as a substantially ladder rung configuration group of laser beams extending in the first direction using the divided pluralities of laser beams as units. A second condenser may be provided in front of the first beam converter (30) and bending and collimating the group of laser beams output from the first beam converter (30) in a second direction substantially at right angles to the first direction for every row.

The laser device according to this exemplary embodiment also may include a first beam compressor that receives the group of laser beams output from the second condenser and emit the beams converted into a compressed substantially ladder rung configuration group of laser beams extending in the first direction of the plurality of rows. A second beam compressor may be provided in front of the first beam compressor, and adapted to emit the laser beams output from the first beam compressor converted into a group of laser beams with shortened intervals of the rows and compressed in the second direction of the plurality of rows. A fourth condenser may be provided for receiving the beams output from the second beam compressor, and making the beam divergence angle in the first direction close to the beam divergence angle of the second direction. Further, a third condenser may be provided for condensing the group of laser beams output from the fourth condenser.

A still further exemplary embodiment of a semiconductor laser device according to the present invention can include a laser diode stack array provided with a plurality of emitters, extending long in a first direction of emission of laser beams, to be arranged linearly in the first direction and arranged in a plurality of rows and emitting a group of laser beams having laser beam elements arranged in a two-dimensional array. A first condenser may be provided in front of the laser diode stack array, and adapted for bending and collimating the group of laser beams for every row in a second direction substantially at right angles to the first direction. A first beam converter may be provided in front of the first condenser, and adapted for receiving the group of laser beams collimated in the second direction, and emitting the beams converted to a substantially ladder rung configuration group of laser beams extending in the first direction for every row. A second condenser may also be provided in front of the first beam converter, and configured to bend and collimate the group of laser beams output from the first beam converter (30) in a second direction substantially at right angles to the first direction for every row.

The laser device according to this exemplary embodiment may also include a first beam compressor adapted for receiving the group of laser beams output from the second condenser, and emitting the beams converted into a compressed substantially ladder rung configuration group of laser beams with shortened ladder rung intervals and extending in the first direction of the plurality of rows. A second beam compressor may be provided in front of the first beam compressor, and adapted for emitting the laser beams converted into a compressed group of laser beams with shortened intervals of the rows and extending in the second direction of the plurality of rows. An angle changer may be provided inside the first beam compressor or the second beam compressor, and may be configured to change the optical axis angles. A third condenser may be provided for condensing the group of laser beams.

Another exemplary embodiment of a semiconductor laser device according to the present invention can include (i) a laser diode stack array provided with a plurality of emitters, extending long in a first direction of emission of laser beams, which may be arranged linearly in the first direction and arranged in a plurality of rows, and adapted to emit a group of laser beams having laser beam elements arranged in a two-dimensional array or (ii) a laser diode stack array provided with a plurality of emitters, extending long in a first direction of emission of laser beams, to be arranged linearly densely in the first direction and arranged in a plurality of rows and emitting a group of laser beams comprised of laser beams substantially continuing linearly arranged in a plurality of rows. A first condenser may be provided in front of the laser diode stack array, and adapted for bending and collimating the group of laser beams for every row in a second direction substantially at right angles to the first direction. A first beam converter can be provided in front of the first condenser, dividing the group of laser beams in each row, providing in each row in parallel optical elements for bending the axes of the cross-sections of the laser beam units to substantially right angles using as units the divided pluralities of laser beams, receiving the group of laser beams collimated in the second direction, rotating the axes of the cross-sections of the laser beam units for each optical element, and emitting the beams as a substantially ladder rung configuration group of laser beams extending in the first direction using the divided pluralities of laser beams as units;

The laser device according to the present invention may include a second condenser that may be provided in front of the first beam converter, so as to bend and collimate the group of laser beams output from the first beam converter in a second direction substantially at right angles to the first direction for every row. A first beam compressor may receive the group of laser beams output from the second condenser, and emitting the beams converted into a compressed substantially ladder rung configuration group of laser beams extending in the first direction of the plurality of rows.

The exemplary laser device may also include a second beam compressor provided in front of the first beam compressor, and capable of emitting the laser beams output from the first beam compressor converted into a compressed group of laser beams with shortened intervals of the rows and extending in the second direction of the plurality of rows. An angle changer may be provided inside one of the first beam compressor and the second beam compressor, and changing the optical axis angles. Further, a third condenser may be provided for condensing the group of laser beams.

According to one exemplary variant of the present invention, the beam compressors can include a two-dimensional beam compressor combining the functions of the first beam compressor and second beam compressor. In addition, a second beam converter may be provided between the first beam compressor and the second beam compressor, which is capable of receiving the substantially ladder rung configuration group of laser beams with shortened ladder rung intervals and extending in the first direction of the plurality of rows, converting it to substantially ladder rung configuration laser beams extending in the second direction for each row, and as a result emitting the beams converted to a single row of substantially ladder rung configuration laser beams with all laser beams extending in the second direction. Alternatively, a second beam converter may be provided between the first beam compressor and the second beam compressor, which is adapted for receiving the substantially ladder rung configuration group of laser beams with shortened ladder rung intervals and extending in the first direction of the plurality of rows, converting it to substantially ladder rung configuration laser beams extending in the second direction for each row, and as a result emitting the beams converted to a single row of substantially ladder rung configuration laser beams with all laser beams extending in the second direction. Such exemplary laser device may also include an angle changer provided in front of the second beam converter and changing the center optical axes of the group of beams to the second direction to obtain a group of beams emitted from substantially the same object.

According to another exemplary variant of the present invention, a fifth condenser may be provided between the first beam compressor and the second beam converter, which is capable of receiving the substantially ladder rung configuration group of laser beams with shortened ladder rung intervals and extending in the first direction of the plurality of rows, and emitting the beams, and bending and collimating the laser beams of each row. The fifth condenser may be a cylindrical lens.

In addition, a shifter can be provided between the first beam converter and the second condenser and shifting in parallel optical axes in the second direction for each row. The shifter provided may also be provided between the first condenser and the first beam converter and shifting in parallel optical axes in the second direction for each row. The second condenser may be a one-dimensional array of cylindrical lenses.

A further exemplary embodiment of a semiconductor laser device according to the present invention can include a laser diode stack array provided with a plurality of emitters, extending long in a first direction of emission of laser beams, capable of being arranged linearly in the first direction and arranged in a plurality of rows and emitting a group of laser beams having laser beam elements arranged in a two-dimensional array. A first condenser may be provided in front of the laser diode stack array, and configured to bend and collimate the group of laser beams for every row in a second direction substantially at right angles to the first direction. A second beam compressor can be provided in front of the first condenser, and adapted for receiving the group of laser beams collimated in the second direction, and emitting the laser beams converted into a group of laser beams with compressed distances between optical axes in the second direction.

This exemplary laser device may also include a first beam converter provided in front of the second beam compressor, configured for dividing the group of laser beams in each row, providing in each row in parallel optical elements for bending the axes of the cross-sections of the laser beam units to substantially right angles using as units the divided pluralities of laser beams, receiving the group of laser beams collimated in the second direction and compressed in distance between optical axes in the second direction, rotating the axes of the cross-sections of the laser beam units for each optical element, and emitting the beams as a substantially ladder rung configuration group of laser beams extending in the first direction using the divided pluralities of laser beams as units. A first beam compressor may be provided in front of the first beam converter, and adapted for emitting the laser beams converted into a group of laser beams compressed in the first direction. A second condenser may be provided in front of the first beam compressor, and adapted for making the beam divergence angle of the first direction close to the divergence angle of the second direction. Further, a third condenser may be provided for condensing the group of laser beams.

Still a further exemplary embodiment of a semiconductor laser device according to the present invention can include (i) a laser diode stack array provided with a plurality of emitters, extending long in a first direction of emission of laser beams, adapted to be arranged linearly in the first direction and arranged in a plurality of rows and emitting a group of laser beams having laser beam elements arranged in a two-dimensional array, or (ii) a laser diode stack array provided with a plurality of emitters, extending long in a first direction of emission of laser beams, adapted be arranged linearly densely in the first direction and arranged in a plurality of rows and emitting a group of laser beams comprised of laser beams substantially continuing linearly arranged in a plurality of rows. A first condenser may be provided in front of the laser diode stack array and configured for bending and collimating the group of laser beams for every row in a second direction substantially at right angles to the first direction;

The exemplary laser device may also include a second beam compressor provided in front of the first condenser, adapted for receiving the group of laser beams collimated in the second direction, and emitting the laser beams converted into a group of laser beams with compressed distances between optical axes in the second direction. A first beam converter may be provided in front of the second beam compressor, capable of dividing the group of laser beams in each row, providing in each row in parallel optical elements for bending the axes of the cross-sections of the laser beam units to substantially right angles using as units the divided pluralities of laser beams, receiving the group of laser beams collimated in the second direction and compressed in distance between optical axes in the second direction, rotating the axes of the cross-sections of the laser beam units for each optical element, and emitting the beams as a substantially ladder rung configuration group of laser beams extending in the first direction using the divided pluralities of laser beams as units. A first beam compressor may be provided in front of the first beam converter, and configured for emitting the laser beams converted into a group of laser beams compressed in the first direction.

The exemplary laser device may also include a second condenser provided in front of the first beam compressor, and adapted for making the beam divergence angle of the first direction close to the divergence angle of the second direction. A third condenser may be provided for condensing the group of laser beams.

In another exemplary variant of the present invention, a fifth condenser may be provided between the second beam compressor and the first beam converter, which is adapted for receiving a group of laser beams with distances between optical axes in the second direction compressed, and emitting the laser beams of each row bent and collimated in the second direction. The fifth condenser may be a cylindrical lens. An angle changer may also be provided in front of the second beam compressor, and the angle changer may be adapted for changing the center optical axes of the group of beams to obtain a group of beams emitted from substantially the same object. The angle changer may be an inclined transparent plate, an array of wedge prisms, an array of cylindrical lenses and/or a segment type reflection mirror.

The beam compressor may be comprised of one of an anamorphic prism and anamorphic prism pair, and can be a telescope that uses a one-dimensional lense or a two-dimensional lenses, and/or a one-dimensional and two-dimensional parabolic mirror. The first condenser may be a one-dimensional array of cylindrical lenses. In addition, an angle adjuster may be provided in front of the first condenser, the angle adjuster being adapted for finely adjusting the angle of optical axes for each row to the second direction. The angle adjuster can combine at least two wedge plates in reverse directions, and can rotate at least one wedge plate.

Each of the optical elements may be provided with a receiving part for receiving incident light beams having cross-sections perpendicular to the optical axes as first axes, an optical system for rotating the first axis of the beam cross-sections to substantially right angles, and an emission part for emitting emitted beams passing through the optical system. The optical elements arranged on the optical axes of the laser beams and the receiving parts and emission parts of the optical elements arranged adjoining each other two-dimensionally on the same planes.

The optical element can be a space defined by reflecting faces, with the space providing a first reflecting face vertical and inclined about 45° with respect to incident beams, a second reflecting face parallel to the incident beams and inclined about 45° with respect to the horizontal plane, and a third reflecting face perpendicular to the vertical surface parallel to the incident beams, parallel to the line of intersection between the first reflecting face and second reflecting face, and inclined about 45° with respect to the horizontal plane. The optical element may be a prism comprised of a first total reflecting face, a second total reflecting face, a third total reflecting face, an incidence face, an emission face, and a joining face, in which prism the first, second, and third total reflecting faces intersect each other with intersecting angles of 60°, the incidence face and emission face are parallel and perpendicularly intersect the second total reflecting face and are inclined about 45° with respect to the first and third total reflecting faces, and the joining face is parallel to the second total reflecting face, and wherein one of a one-dimensional array of prisms comprised of the prisms arranged adjoining each other with the third total reflecting faces, incidence faces, and emission faces on the same planes and with joining faces and second total reflecting faces of adjoining prisms joined together and a two-dimensional array comprised of one-dimensional arrays of prisms further aligned in parallel is used as the beam converter.

An optical glass member may be provided which have parallel first and second flat surfaces, a third flat surface intersecting the first flat surface by an angle of 135°, and a fourth surface comprised of a cyclically bent surface comprised of peaks and valleys having a bending angle of the line along which the peaks and valleys extend of 60°. The surfaces can be formed continuously in a wave configuration in a direction intersecting the first flat surface by an angle of $\tan^{-1} (1/\sqrt{2})$, and having peak lines and valley lines parallel to the third flat surface, the first flat surface being used as an incidence face, the second flat surface being used as an emission face, the faces among the bent faces forming the fourth surface intersecting the first flat surface by an angle of 45° being used as a first reflecting face, the other faces being used as a second reflecting face, and the third flat surface being used as a third reflecting face. In addition or alternatively, a one-dimensional array may be provided which is comprised of the optical glass members further aligned linearly is used as a beam converter.

A mirror structure may also be provided having a first flat surface intersecting a flat surface perpendicular to an incidence optical axis by an angle of 135°, a second surface comprised of a cyclically bent surface comprised of peaks and valleys having a bending angle of the line along which the peaks and valleys extend of 60°. The surfaces can be formed continuously in a wave configuration in a direction intersecting a flat surface perpendicular to the incidence optical axis by an angle of $\tan^{-1} (1/\sqrt{2})$, and having peak lines and valley lines parallel to the first flat surface, the first flat surface and the second surface being treated to form mirror surfaces, the faces among the bent faces forming the second surface intersecting the flat surface perpendicular to the incidence optical axis by an angle of 45° being used as a first reflecting face, the other faces being used as a second reflecting face, and the first flat surface being used as a third reflecting face. Alternatively or in addition, a one-dimensional array may be provided which is comprised of the mirror structures further aligned linearly is used as a beam converter.

The optical element may be comprised of a pair of convex cylindrical lenses each with axes inclined about 45° arranged facing each other across a space of a predetermined distance. The optical element may also be comprised of an array of a plurality of pairs of convex cylindrical lenses each with axes inclined about 45° arranged facing each other across a space of a predetermined distance. In the pairs of cylindrical lenses, a radius of curvature of emission side lenses may be smaller than a radius of curvature of incidence side lenses.

The optical element may also be a cylindrical lens having convex lens parts at the two ends of the side faces and wherein a plurality of optical elements are joined inclined by about 45° with respect to an incidence optical axis. The beam converter may be a one-dimensional array of a plurality of cylindrical lenses having convex lens parts at the two ends of the side faces joined inclined by about 45° with respect to an incidence optical axis. In the convex lens parts, a radius of curvature of emission side lenses may be smaller than a radius of curvature of incidence side lenses.

The beam converter may be comprised of an optical glass prism having a rectangular cross-section formed with a plurality of cylindrical surfaces inclined about 45° in the same direction as its incidence face and emission face and emits incident beams entering its cylindrical surfaces rotated about 90° in cross-section. In the cylindrical surfaces, a radius of curvature of emission side surfaces can be smaller than a radius of curvature of incidence side surfaces, with the angle of inclination adjusted to emit incident beams entering its cylindrical surfaces rotated about 90° in cross-section.

The optical element may also be a dub prism having a trapezoidal cross-section and a plurality of the optical elements is arranged inclined by about 45°. Further, the optical element can be comprised of two optical elements changing in power in only a direction perpendicular to a center axis due to diffraction and arranged with center axes inclined about 45°. The beam converter may also be comprised of, at both the incidence side and emission side, a pair of binary optic elements arranged facing each other across a space of a predetermined distance, the surfaces of the incidence side binary optic element and emission side binary optic element being formed with pluralities of axially symmetric stepped surfaces changing in depth so that the powers change symmetric to center axes inclined about 45° in directions perpendicular to the center axes, and emits incident beams entering the axially symmetric stepped surfaces rotated about 90° in cross-section.

In a further exemplary variant of the present invention, the optical element may be comprised of an optical element comprised of a structure with continuously changing refractive indexes and changing in power in only a direction perpendicular to the orientation of arrangement and is arranged inclined 45° with respect to a horizontal plane. Alternatively, the beam converter is comprised of a plurality of one-dimensional profile refractive index lens elements comprised of optical glass members with refractive indexes highest at the center faces and becoming lower the closer to the side faces and joined with the center faces inclined about 45° with respect to a horizontal plane. The beam converter may also be comprised of an optical glass plate on both surfaces of which are formed pluralities of semicylindrical profile refractive index lens elements inclined about 45° with respect to those surfaces, arranged facing each other in the same direction, and having refractive indexes highest at the centers of the semicylinders and refractive indexes becoming lower the further to the outsides.

The laser device according to an exemplary embodiment of the present invention may include at least two laser diode stack arrays provided with the first condensers in front and provided with an optical device for coupling the at least two groups of laser beams emitted from the first condensers in front of the condensers. An optical device may also be provided for wavelength coupling at least two groups of laser beams entering the third condenser after the condenser. At least three laser diode stack arrays may be provided with the first condensers in front and provided with an optical device for coupling the at least two groups of laser beams emitted from the first condensers in front of the condensers and provided with an optical device for wavelength coupling at least two groups of laser beams entering the third condenser after the condenser. The optical device may be a polarization element, a mirror formed with through windows at the same pitch as the stack pitch of the laser diode stack array, mirrors arranged at the same pitch as the stack pitch of the laser diode stack array, right angle prisms arranged at the same pitch as the stack pitch of the laser diode stack array and/or a dichroic mirror.

An optical fiber may also be provided that has an end face at a focal plane of the third condenser. The optical fiber may include a core doped with a rare earth element. The semiconductor laser pumped solid-state laser device may be provided with a semiconductor laser device and a solid-state laser element with a pumped light receiving face matched with a focal position of the third condenser. The laser device may include an optical system for collimating the beams emitted from the optical fiber as set forth in so as to converge them to the focal point, and a solid-state laser element having a pumped light receiving face and having the pumped light receiving face matched with the position of the focal point. The optical fiber may be an optical fiber with a core doped with a rare earth element.

The semiconductor laser device of an exemplary embodiment of the present invention can condense the laser energy produced by a laser diode stack array to an extremely small area, so can be sufficiently used for laser processing or medical applications. Further, a semiconductor laser device may use a beam converter of an exemplary embodiment of the present invention to achieve the effect of aligning the emitters of a semiconductor laser stack array in a substantially single row ladder rung configuration can concentrate the energy of the semiconductor laser stack array at an extremely small focal point. Further, the semiconductor laser pumped solid-state laser device according to the exemplary embodiment of the present invention can achieve end pumping utilizing powerful semiconductor lasers, and obtain a solid-state laser output with a high efficiency and good beam quality.

BRIEF DESCRIPTION OF THE DRAWINGS

FIGS. 19A to 19C are views illustrating the state of change of an image in the semiconductor laser device shown in FIG. 17 and FIG. 18.

FIGS. 29A and 29B are views for explaining the state of change of an image in the semiconductor laser device shown in FIG. 27 and FIG. 28.

FIGS. 37A and 37B are views illustrating an action of the second beam converter in the device of FIG. 36.

FIGS. 83A and 83B are views of a mode of coupling two laser beams using mirrors arranged at the same pitch as the stack pitch of the laser diode stack array.

DETAILED DESCRIPTION

It has been described herein that a laser diode stack array is hard to focus since the divergence angles of the beams differ between the fast axis and the slow axis. According to an exemplary embodiment of the present invention, the technique may be used that rotates the beams by 90° to enable suitable collimation for each axis. Using such technique, it is possible to first collimate the large dispersion fast axis and later slowly and stably independently collimate the small dispersion slow axis.

Further, the laser diode stack array may form a planar light source comprised of a plurality of light sources having parallel optical axes arranged on the same plane.

Figure 1:
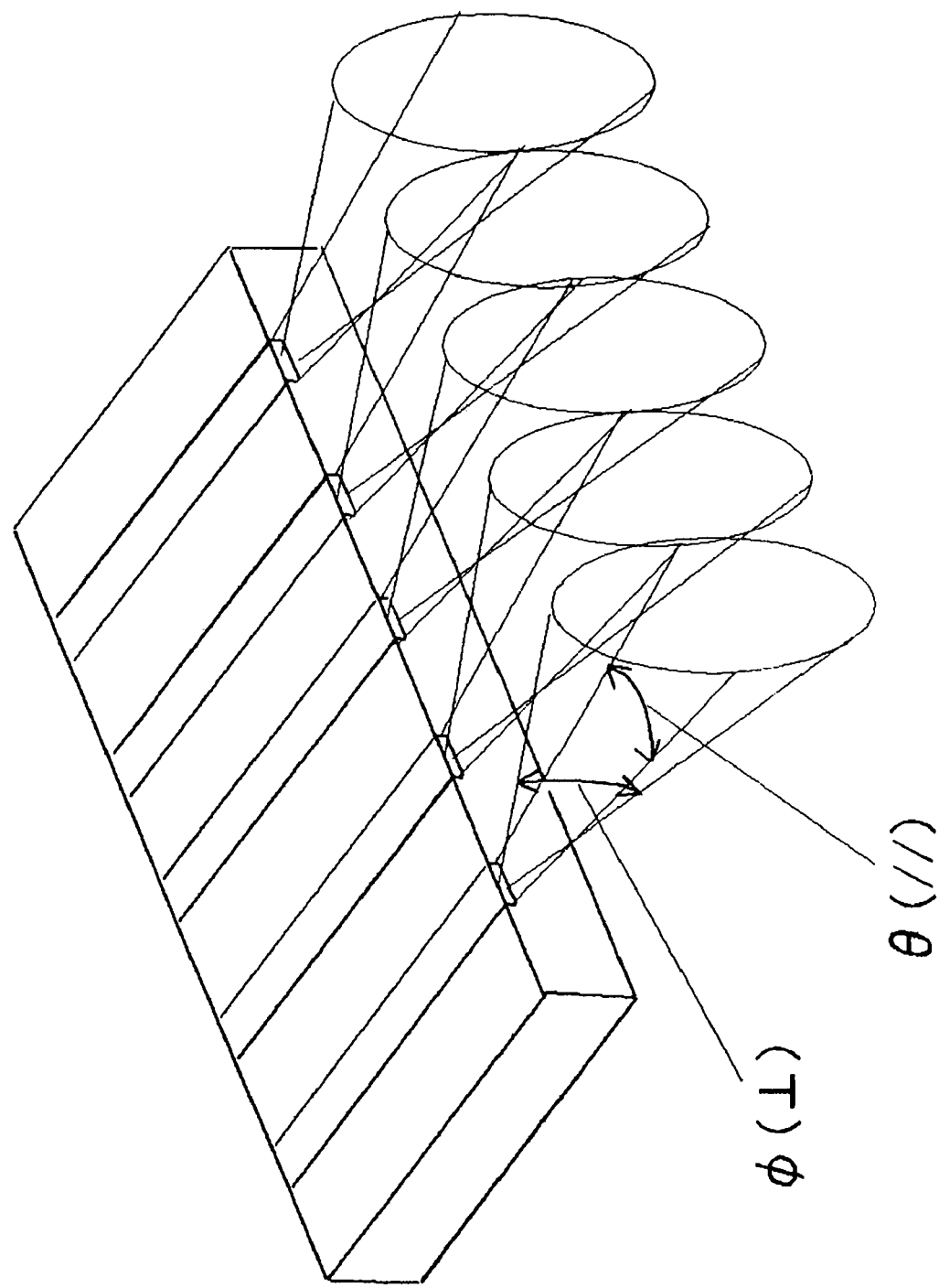
FIG. 1 is a view for explaining a laser diode array and directionality of laser beams.
Figure 2:
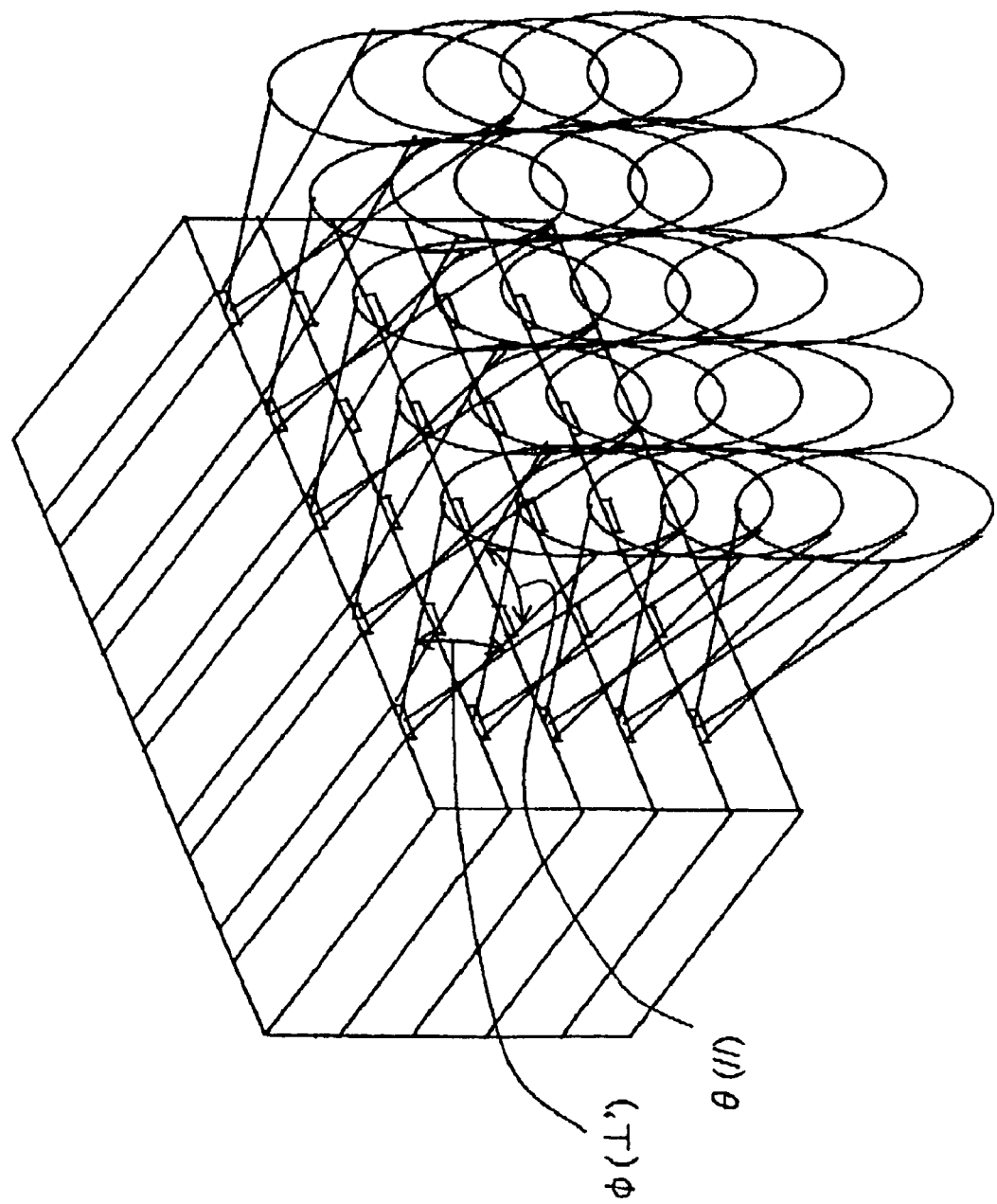
FIG. 2 is a view for explaining a laser diode stack array and directionality of laser beams.
Figure 3:
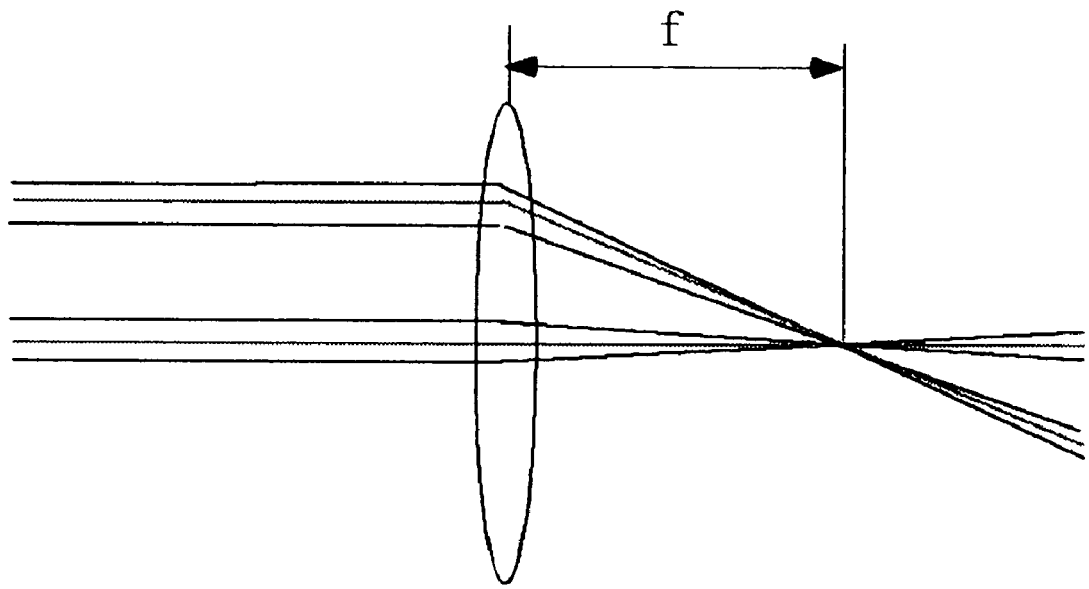
FIG. 3 is a view of the state of image formation when parallel beams enter a condensing lens with a particular focal length.

FIG. 3 shows the state of parallel beams entering a condensing lens having a focal length f. For simplification, the case of two parallel beams is shown. In such case, all beams are condensed at the focal point of the lens and a single image is obtained on the center axis.

Figure 4:
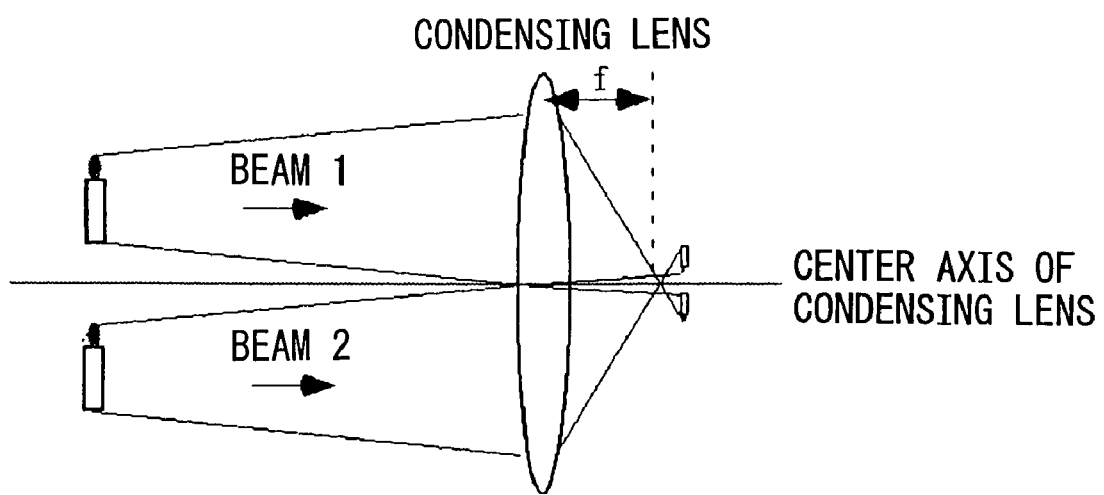
FIG. 4 is a view of the state of image formation when beams having optical axes which are parallel, but having divergence angles enter a condensing lens.

On the other hand, when beams having parallel optical axes, but divergence angles enter the condensing lens, the image moves to the far side from the focal point of the lens due to the divergence angles, so separate images are formed at positions off from the center axis of the lens. This state is shown in FIG. 4. For the purpose of simplicity, the case of two beams is schematically shown using candles. Beams emitted from different objects placed at a finite distance geometrically form different images. The laser diode stack array corresponds to the arrangement of FIG. 4. With images formed at separate image points in this way, no augmentation of the light intensity would likely be obtained, and it is likely not possible to concentrate high level energy at a narrow region.

Research has been conducted regarding beams being emitted from a plurality of optical fibers, and the findings described in Japanese Patent Publication No. 2001-255491, the entire disclosure of which is incorporated herein by reference. The following two methods have been described in the above-identified publication.

Figure 5:
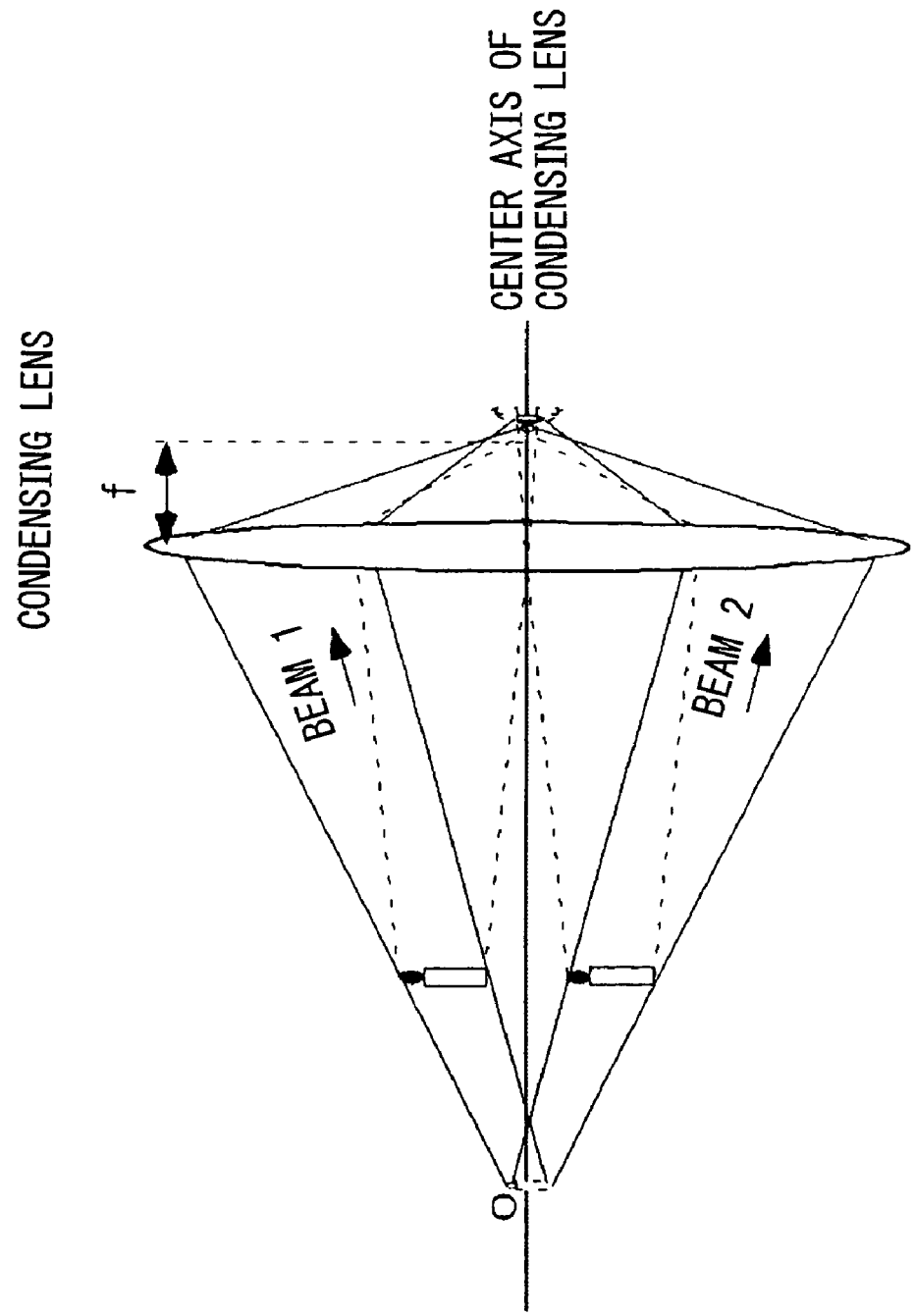
FIG. 5 is a view of the state of giving an angle so that a plurality of beams are emitted from a common imaginary object placed on the center axis of the lens.

(i) All beams are given predetermined angles to make it appear as if they were emitted from the same light source when seen from the condensing lens. In particular, as shown in FIG. 5, angles are given so that the beams are emitted from a common imaginary object O placed on the center axis of the lens. FIG. 5 shows the case of two beams for the purpose of simplicity. An effective caliber of the condensing lens should be made larger to match the opening of the angle between the beams. This technique can be used for light sources with limited divergence angles such as lasers.

Figure 6:
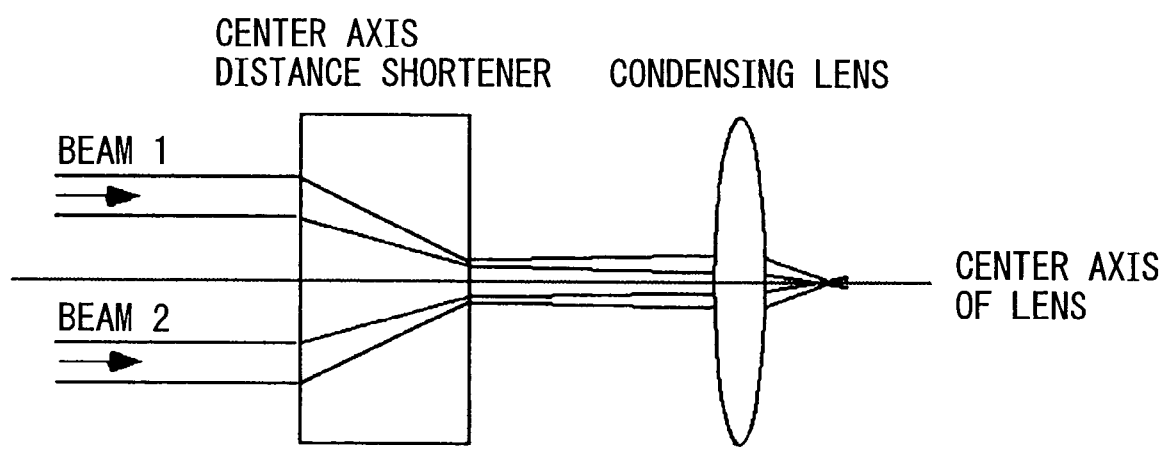
FIG. 6 is a view for explaining the operation for reducing the distance between center axes of a plurality of beams.

(ii) An operation is performed for reducing the distance between center axes of the beams and, in accordance with need, and an image is reduced and reformed so as to form the image small as a whole. That is, as shown in FIG. 6, the distance between center axes of beams having equal intensity profiles is narrowed to make the distance between objects smaller and, as needed, the image is reformed. FIG. 6 shows the case of two beams for the purpose of simplicity.

It should be noted that combining the above two methods can be more effective.

In the case of the above optical fiber, it is possible to tightly bundle a plurality of fibers to reduce the distance between objects in advance. The method of the above-identified Japanese may work effectively. However, with a laser diode stack array, changing the width of the array or the stack intervals may be difficult.

Therefore, methods for combining as much as possible a plurality of objects separated in distance have been reviewed. As a result, various methods such as the introduction of a compressor have been uncovered.

Figure 7:
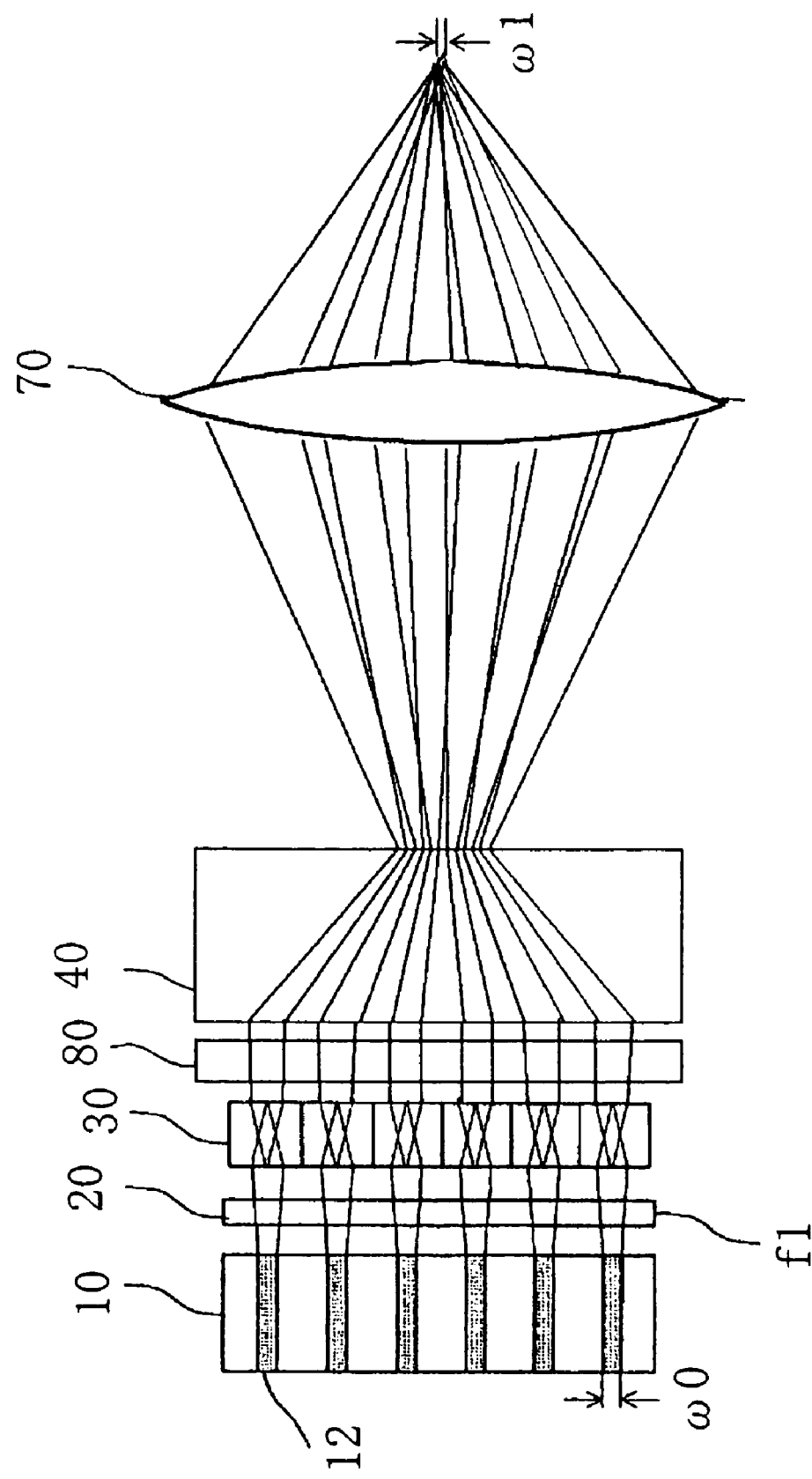
FIG. 7 is a plan view of an exemplary embodiment of a semiconductor laser device according to the present invention.
Figure 8:
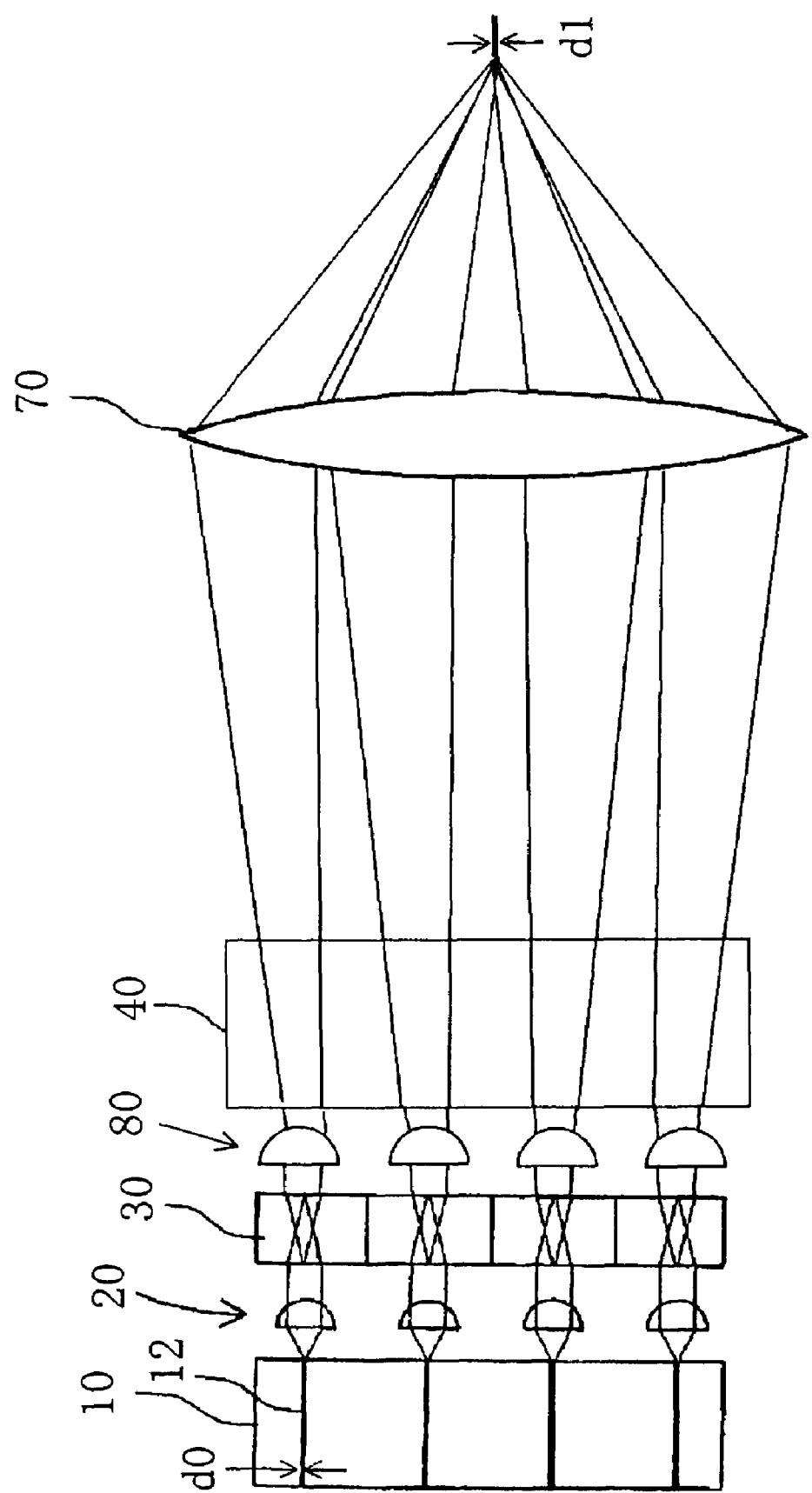
FIG. 8 is an elevation view of an exemplary semiconductor laser device of the present invention.

FIG. 7 is a plan view of an exemplary embodiment of a semiconductor laser device according to the present invention, and FIG. 8 is an elevation view of the same. It should be noted that the terms "semiconductor laser" and "laser diode" amay be used synonymously herein. The semiconductor laser stack array 10 of FIG. 7 may be comprised of semiconductor laser linear arrays, each comprised of 10 to 100 active layer stripes 12 emitting laser beams (in FIG. 7, for the sake of convenience, the number thereof is six) arranged in a row in a width of about 10 mm, stacked in parallel (in FIG. 8, four layers shown) to a height of 5 mm to 40 mm.

The cross-section of each active layer stripe 12 has for example a width of 100 μm to 200 μm and a thickness of 0.1 μm to ⅓ μm. The laser beams emitted from the end faces of the active layer stripes have emission angles in the thickness direction (hereinafter referred to as a "slow axis direction") of 40° to 50° and emission angles in the width direction (hereinafter referred to as a "fast axis direction") of 10° and form the emission light sources of the semiconductor laser stack array 10.

The active layer stripes are arranged in a row at the end of each semiconductor laser linear array, so the semiconductor laser stack array provides a light source for light emission comprised of line segments arranged in a two-dimensional array. A first cylindrical lens array 20 has the ability to bundle the laser beams emitted from the semiconductor laser stack array 10 in the direction of the thicknesses of the active layer stripes and makes the fast axis components parallel. The first cylindrical lens array 20 has an equal optical thickness equal in the width direction. The beams proceed substantially straight, so the emission angles of the slow axis components of the laser beams remains unchanged at about 10°.

The first beam converter 30 rotates the cross-section of the laser beam outputs from the first cylindrical lens array 20 about 90° from the incident beams. The first beam converter 30 arranges optical elements in a one-to-one correspondence with the active layers of the semiconductor laser stack array 10 in a two-dimensional array so as to correspond to the active layer stripes. The laser beams emitted by the first cylindrical lens array 20 in the width direction by an angle of about 10° and now forming parallel beams in the thickness direction (see FIG. 8) are rotated about 90° for each active layer stripe by the first beam converter 30, so are converted to beams having emission angles of about 10° in the thickness direction and parallel in the width direction (see FIG. 7). Note that the optical element can be designed to handle a group of stripes including a plurality of active layer stripes.

Since laser beams rotated about 90° for beam conversion are aligned in parallel in exactly the number of the active layer stripes or stripe groups, the emission beams of the semiconductor laser stack array 10 are arranged in parallel in a ladder rung configuration. This parallel arrangement becomes substantially the same as one with a further plurality arranged in parallel to form a two-dimensional array. The next collimation can be easily realized by this rotation.

The second cylindrical lens array 80 bends and collimates the group of laser beams in the thickness direction for each row. At the same time, by offsetting the center axes of the lens and beams by exactly predetermined amounts for use, angular change of the optical axes is caused for conversion to a group of beams emitted from approximately the same object.

The beam compressor 40 shortens the intervals of the ladder rungs of laser beams arranged in parallel in a ladder rung configuration to compress the laser beams. Such compressed laser beams are further aligned linearly in one row in the height direction (stack direction) of the semiconductor laser stack array. The compressed group of beams are narrow in intervals of the ladder rungs, so during propagation, there is overlap in the intensity profile and the beams no longer appear to be separate. That is, the beams emitted from the semiconductor laser stack array become a single group of beams for each array at the exit of the beam compressor 40.

Further, the condensing lens 70 condenses all of the group of beams. The group of beams become approximately beams emitted from the same object on the center axis of the condensing lens 70, so form an image on the same spot on the center axis. The size of the condensed spot becomes a size of an extent of the collimated beam diameters for each direction multiplied with the imaging ratio of the condensing lens 70 when deeming those diameters as the size of the objects.

However, the size of a object at the fast axis direction is preferably deemed the beam size for slow axis direction at the beam compressor multiplied with the compression ratio of the beam compressor 40. For example, when the beam size for slow axis direction is 10 mm and the compression ratio of the beam compressor 40 is 1/10, the size of the object on the fast axis direction is considered to be 1 mm. Therefore, if making the imaging ratio of the condensing lens 70 1/3, the size of the image becomes about 330 μm. Strictly speaking, line segment shaped images are arranged at equal intervals in it. Regarding the slow axis direction, if the collimated diameter due to the second cylindrical lens array 80 is 400 μm, the image becomes 133 μm. As a result, a spot of 330 μm×133 μm is obtained. A power density of 2 MW/cm² is obtained by an output of 1 kW. This is a sufficient power density for deep penetration welding of metal.

If not allowing an angular change by the second cylindrical lens array 80, the group of beams from the array forms separate images, so the size of the overall image for the slow axis direction will become a size of the height of the stack multiplied with the imaging ratio of the condensing lens 70. For example, if the stack height is 30 mm, the size of the total image will become 10 mm. In this way, it is possible to superpose discrete images at one spot by an angular change.

The second cylindrical lens array 80 may be arranged in front of the first beam converter 30 as shown in FIG. 7 and FIG. 8 or may be arranged in front of the beam compressor 40. At that time, the first beam converter 30 and second cylindrical lens array 80 or the second cylindrical lens array 80 and beam compressor 40 can be made integral. Thus, there is the advantage that the number of parts can be reduced and the loss at the interface is reduced.

Figure 9:
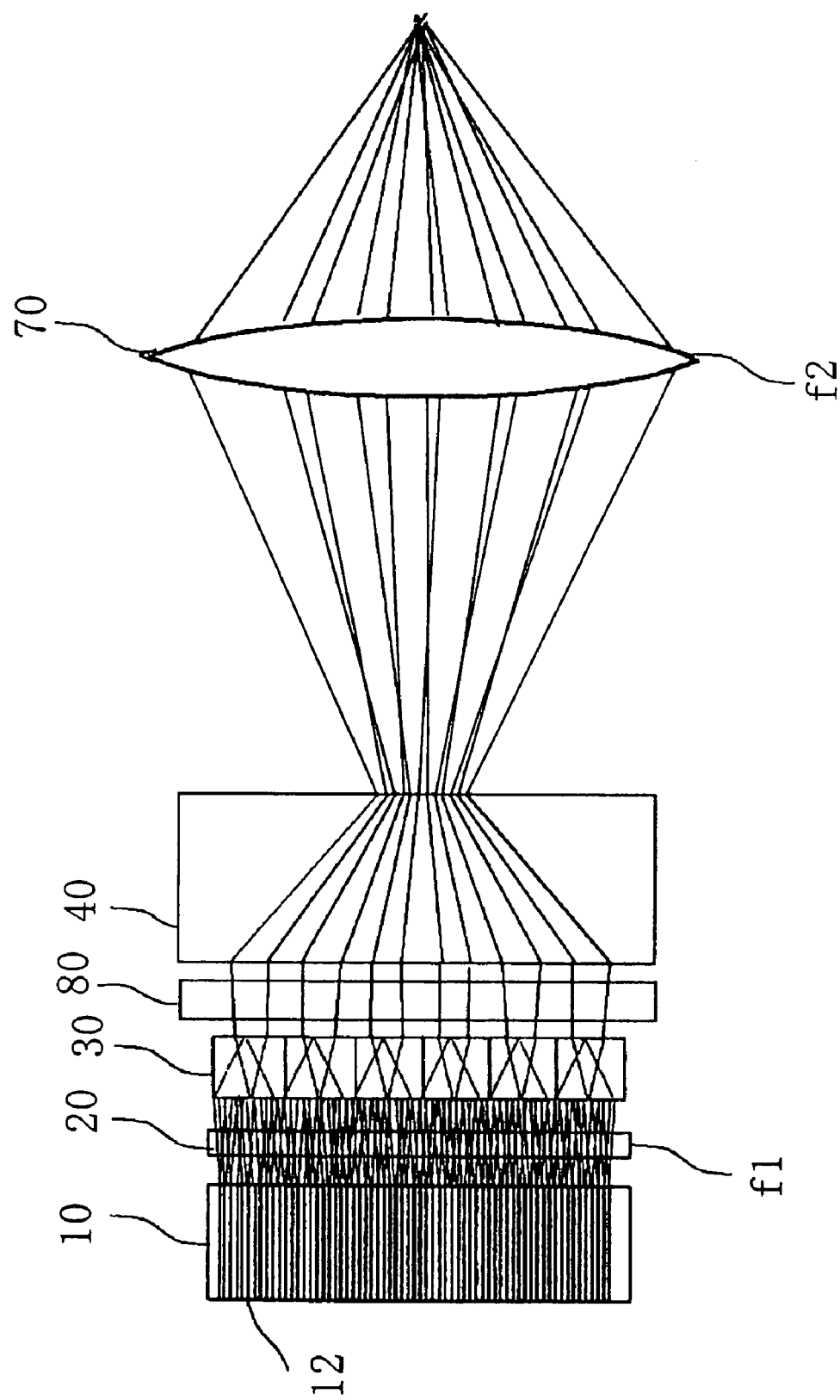
FIG. 9 is a plan view of an exemplary semiconductor laser device of the present invention using a dense emitter structure semiconductor laser.
Figure 10:
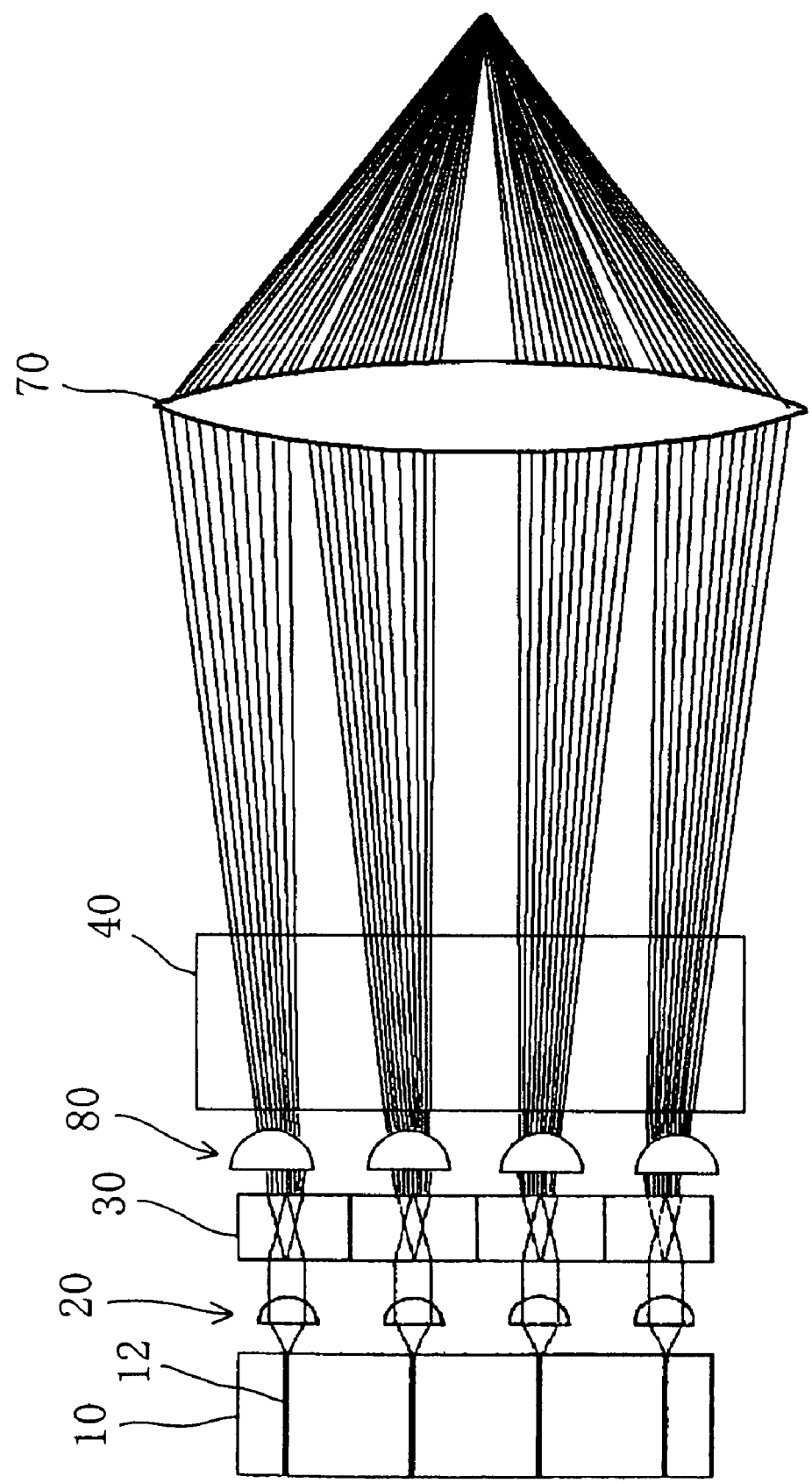
FIG. 10 is an elevation view of the semiconductor laser device shown in FIG. 9.

FIG. 9 is a plan view of a semiconductor laser device of the present invention in the case of using such a quasi-continuous wave laser diode (e.g., a quasi-CW-LD) with a high density of light emitter as the laser diode stack array, while FIG. 10 is an elevation view. The laser diode stack array 10 is provided with a large number of active layer stripes 12 at a high density and forms a linear emitter with substantially no breaks.

The first beam converter 30 may be comprised of a linearly aligned suitable number of optical elements either having no relation with the size of the active layer stripes or having dimensions corresponding to a predetermined number of stripes. The positions and actions of the first cylindrical lens array 20, the first beam converter 30, the beam compressor 40, the second cylindrical lens array 80, and the condensing lens 70 are substantially the same as those described with reference to FIG. 7 and FIG. 8.

When using laser diodes with short widths of the active layer stripes or narrow intervals of the same in this way, fabrication of a beam converter becomes difficult if providing the optical elements of the first beam converter in a one-to-one correspondence with the active layer stripes. This mode instead can group a suitable number of active layer stripes together and provides the elements in correspondence with them. Further, instead of viewing the emission parts of the laser diodes as a broken line, it may also be considered to deem them as a single stripe, divide it into suitable sections by optical elements, and rotate the same so as to change them to laser diodes emitting light in a de facto ladder rung configuration.

Figure 11:
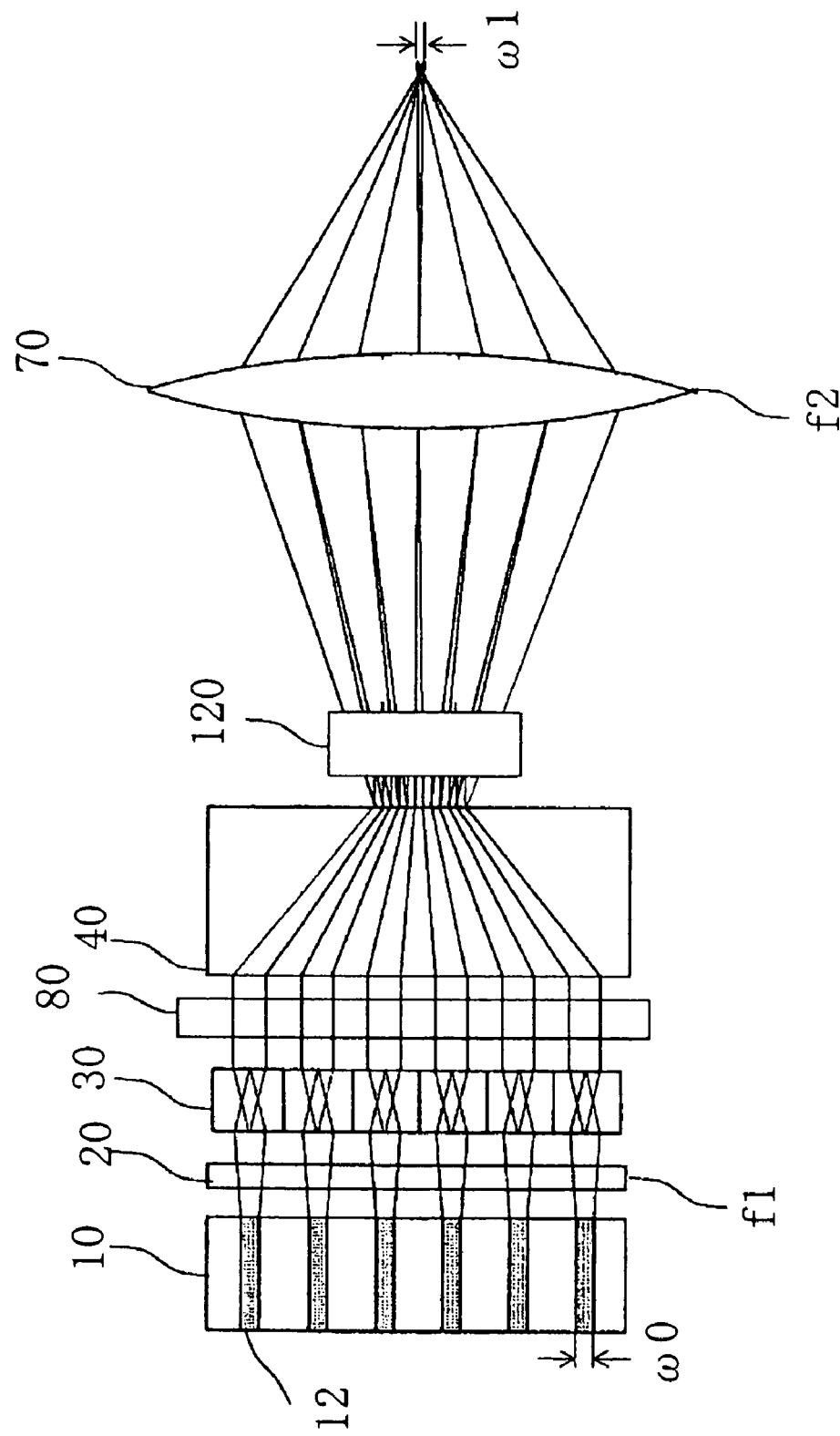
FIG. 11 is a plan view of an exemplary embodiment of the semiconductor laser device according to the present invention that uses transparent wedge plates as a means for changing the beam angles.
Figure 12:
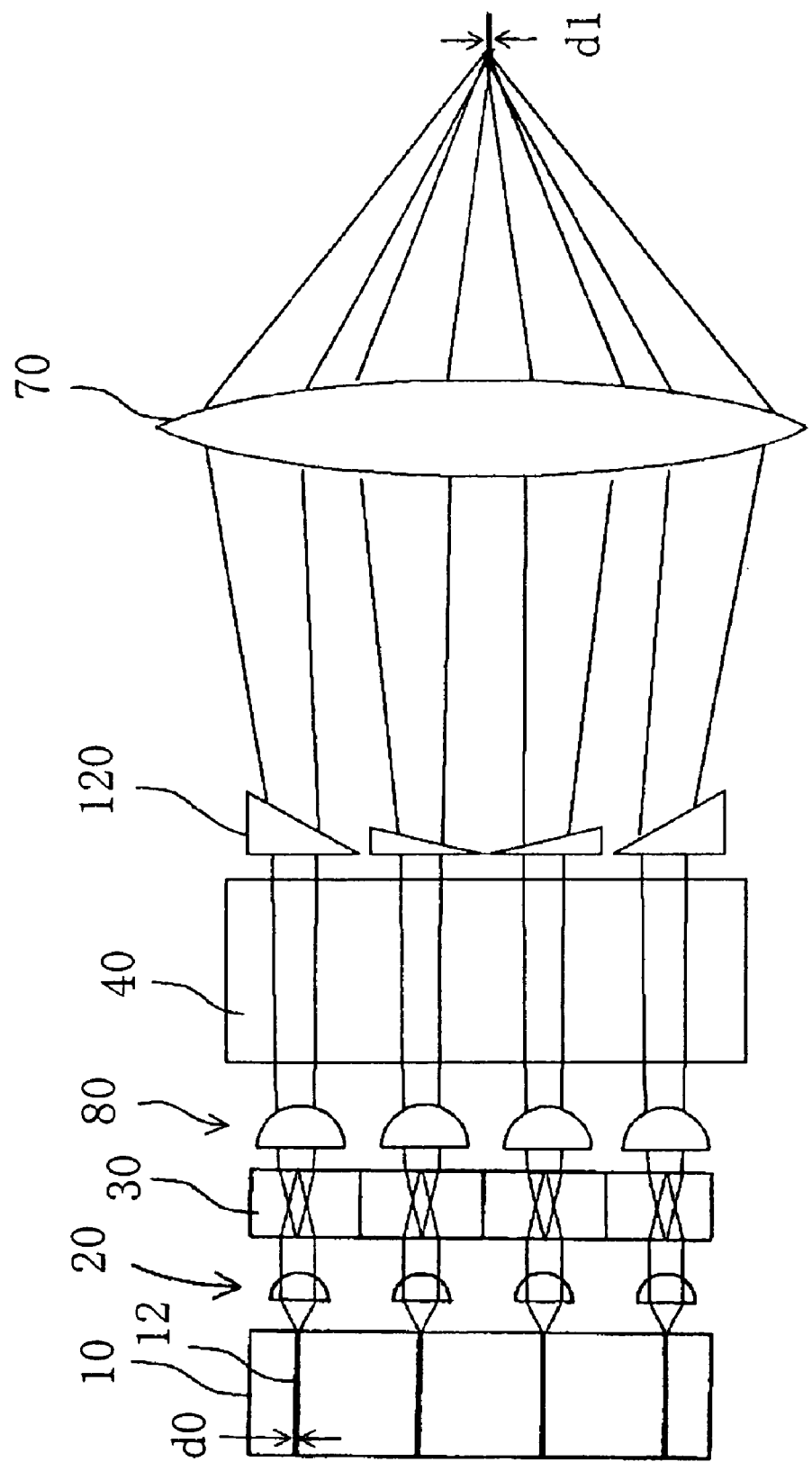
FIG. 12 is an elevation view of the semiconductor laser device shown in FIG. 11.

FIG. 11 is a plan view of another exemplary embodiment of a semiconductor laser device according to the present invention, and FIG. 12 is an elevation view of the same. The point of difference from the example shown in FIG. 7 and FIG. 8 is that the means for changing the beam angles is not the second cylindrical lens array 80, but newly separately provided transparent wedge plates 120. The second cylindrical lens array 80 handles only the action of collimating the slow axis components.

The transparent wedge plates 120 are transparent plates with angles as shown in FIG. 12. Beams are given an angular change due to refraction when passing through the same. The position of provision of the transparent wedge plates 120, as shown in FIG. 11 and FIG. 12, may be in front of the beam compressor 40 or between the second cylindrical lens array 80 and the beam compressor 40. At this time, it is also possible to make the transparent wedge plates 120 and second cylindrical lens array 80 or beam compressor 40 integral. Accordingly, there are the advantages that the number of parts can be slashed and the loss at the interface is reduced. This exemplary embodiment can also be similarly applied to a semiconductor laser stack array having a linear emission part with substantially no breaks.

Figure 13:
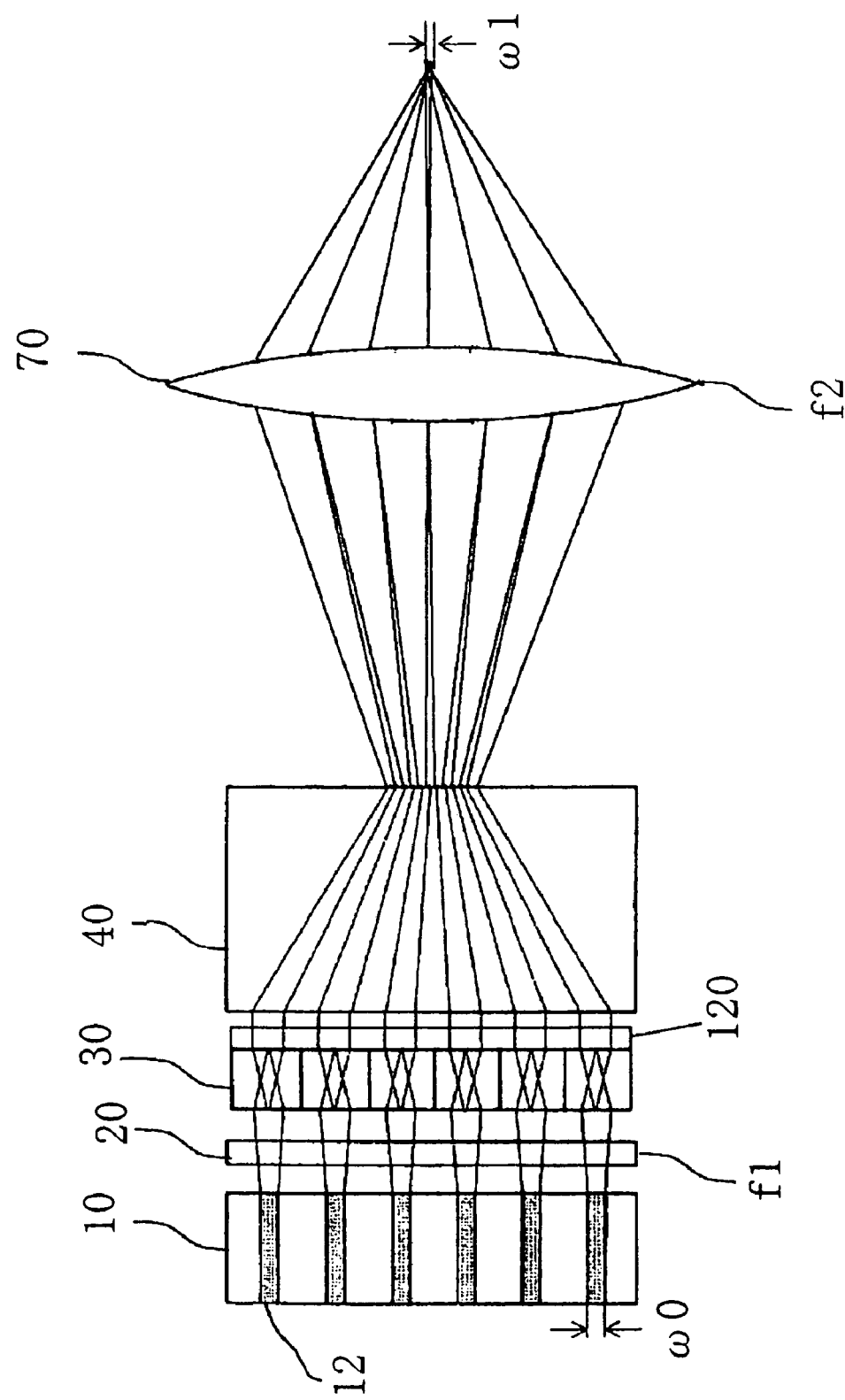
FIG. 13 is a plan view of an exemplary embodiment of the semiconductor laser device according to the present invention combining a beam converter and transparent wedge plates integrally.
Figure 14:
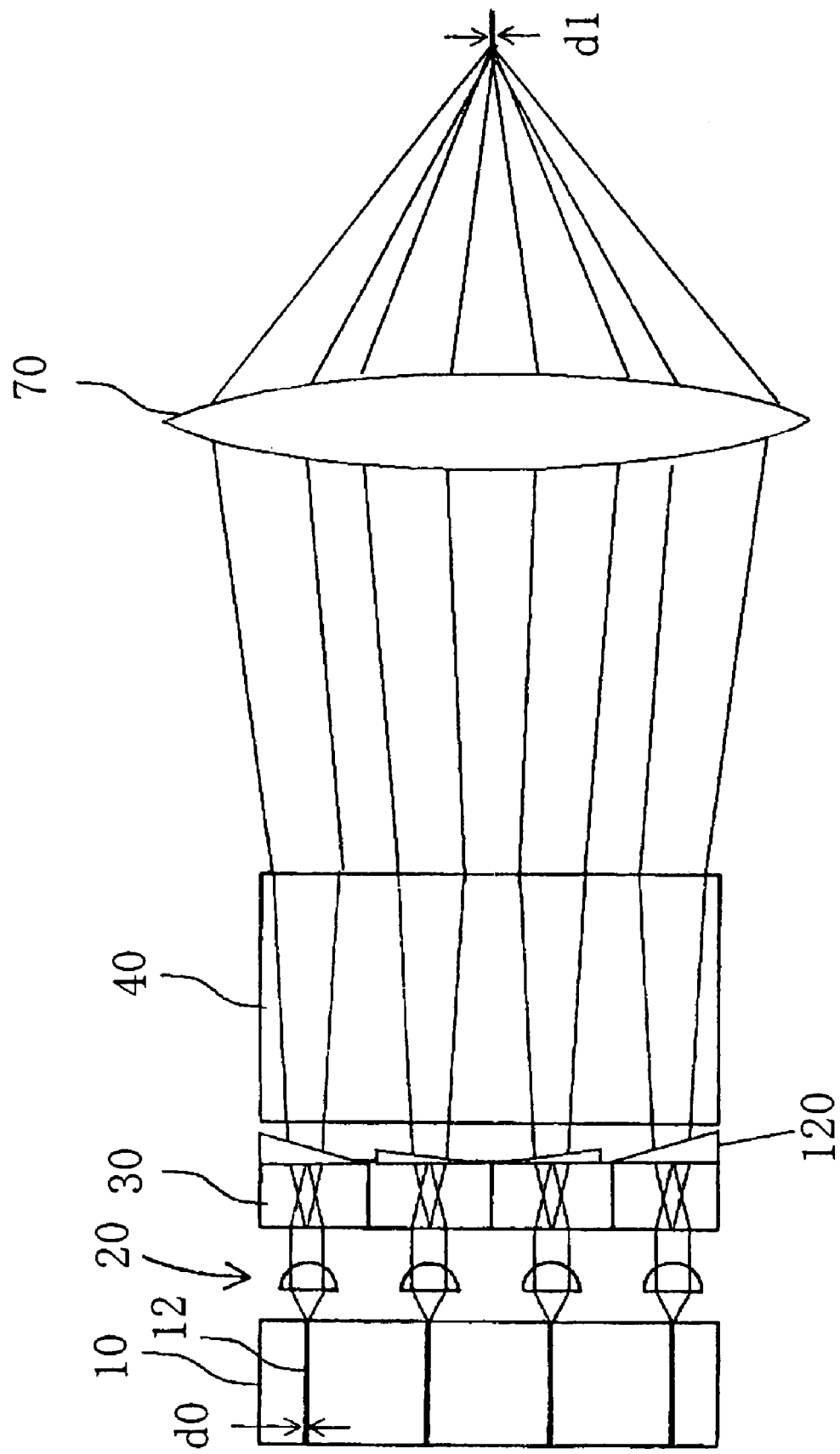
FIG. 14 is an elevation view of the semiconductor laser device shown in FIG. 13.

Further, it is also possible to omit the second cylindrical lens array as shown in FIG. 13 and FIG. 14. Note that FIG. 13 and FIG. 14 show an example where the first beam converter 30 and transparent wedge plates are made integral. Further, the present exemplary embodiment can also be similarly applied to a semiconductor laser stack array having a linear emission part with substantially no breaks.

Figure 15:
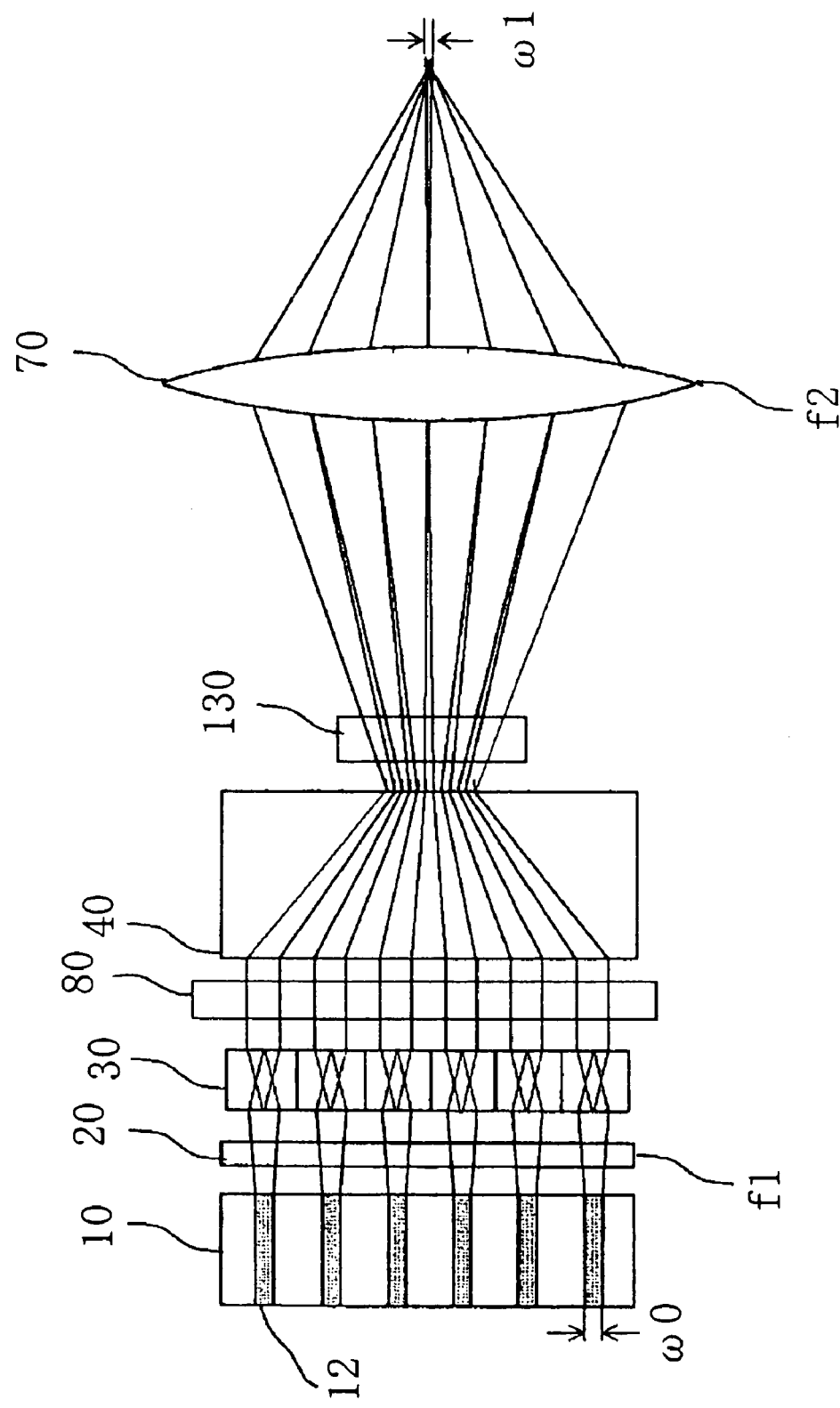
FIG. 15 is a plan view of an exemplary embodiment of the semiconductor laser device according to the present invention that uses a cylindrical lens as the means for changing the beam angles.
Figure 16:
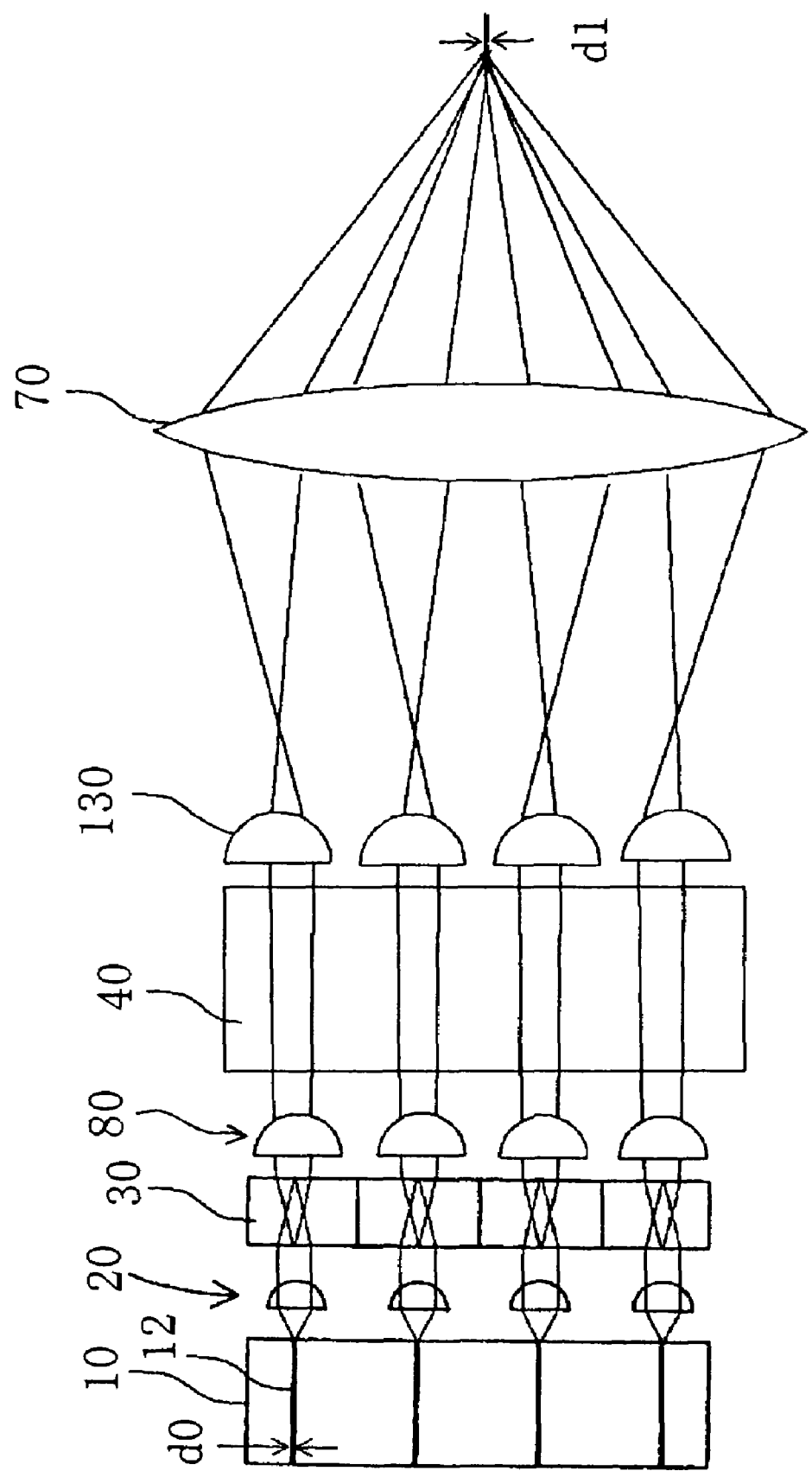
FIG. 16 is an elevation view of the semiconductor laser device shown in FIG. 15.

FIG. 15 is a plan view of another exemplary embodiment of the semiconductor laser device of the present invention, while FIG. 16 is an elevation view. The difference from the example shown in FIG. 7 and FIG. 8 is that the means for changing the beam angles is not the second cylindrical lens array 80, but newly separately provided cylindrical lenses 130. The second cylindrical lens array 80 likely handles only the action of collimating the slow axis components.

The cylindrical lenses 130, as shown in FIG. 16, are lenses acting in the stack direction of the stack array (second direction) and create angular changes by use offset in center axis. The cylindrical lenses 130, as shown in FIG. 16, are arranged in front of the beam compressor 40 or are arranged between the second cylindrical lens array 80 and the beam compressor 40. At that time, it is also possible to make the cylindrical lenses and beam compressor 40 integral. Further, the second cylindrical lens array 80 may also be omitted. Further, the present exemplary embodiment can also be similarly applied to a semiconductor laser stack array having a linear emission part with substantially no breaks.

Figure 17:
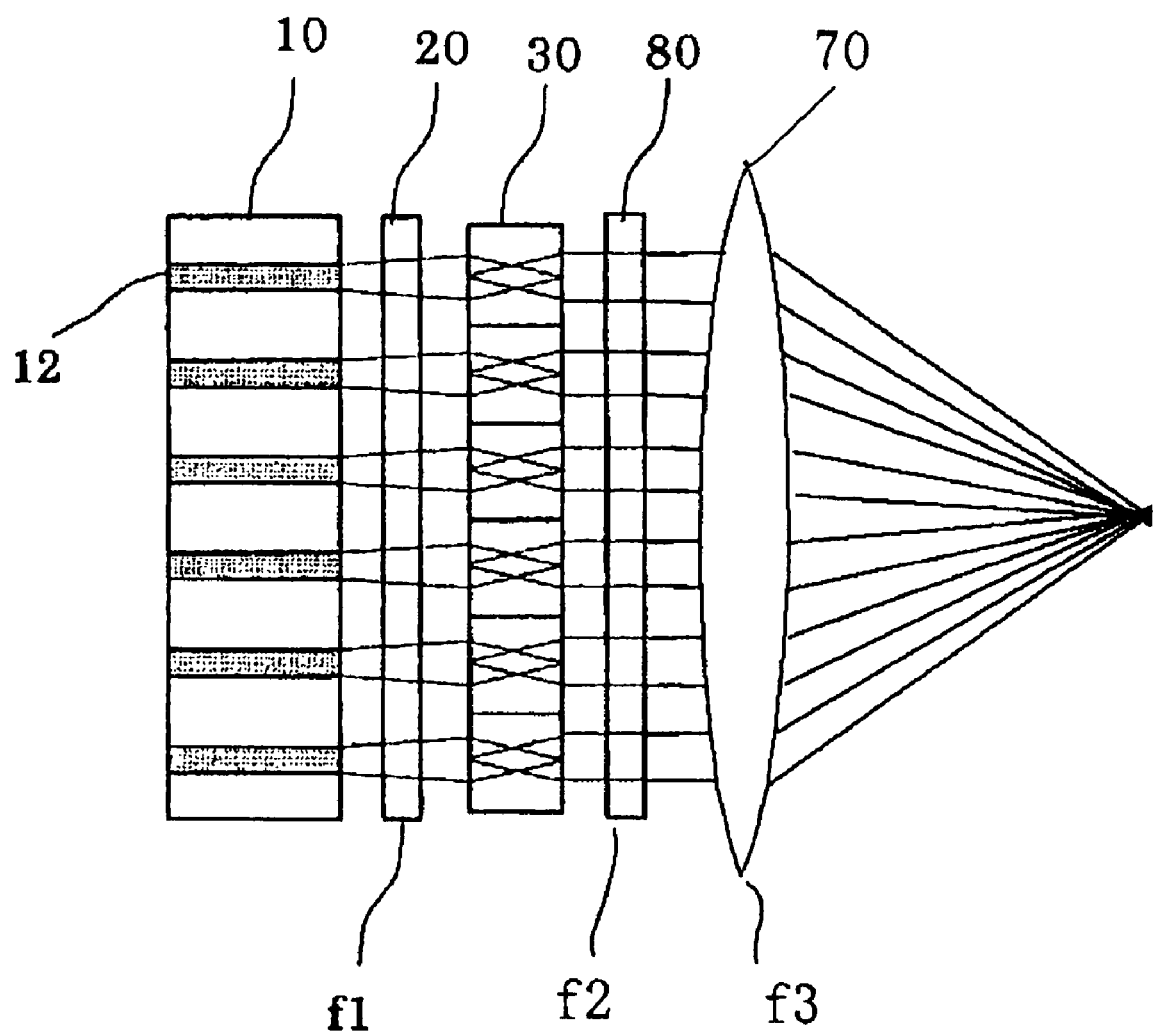
FIG. 17 is a plan view of an exemplary embodiment of the semiconductor laser device according to the present invention designed to make the center axes of the beams closer.
Figure 18:
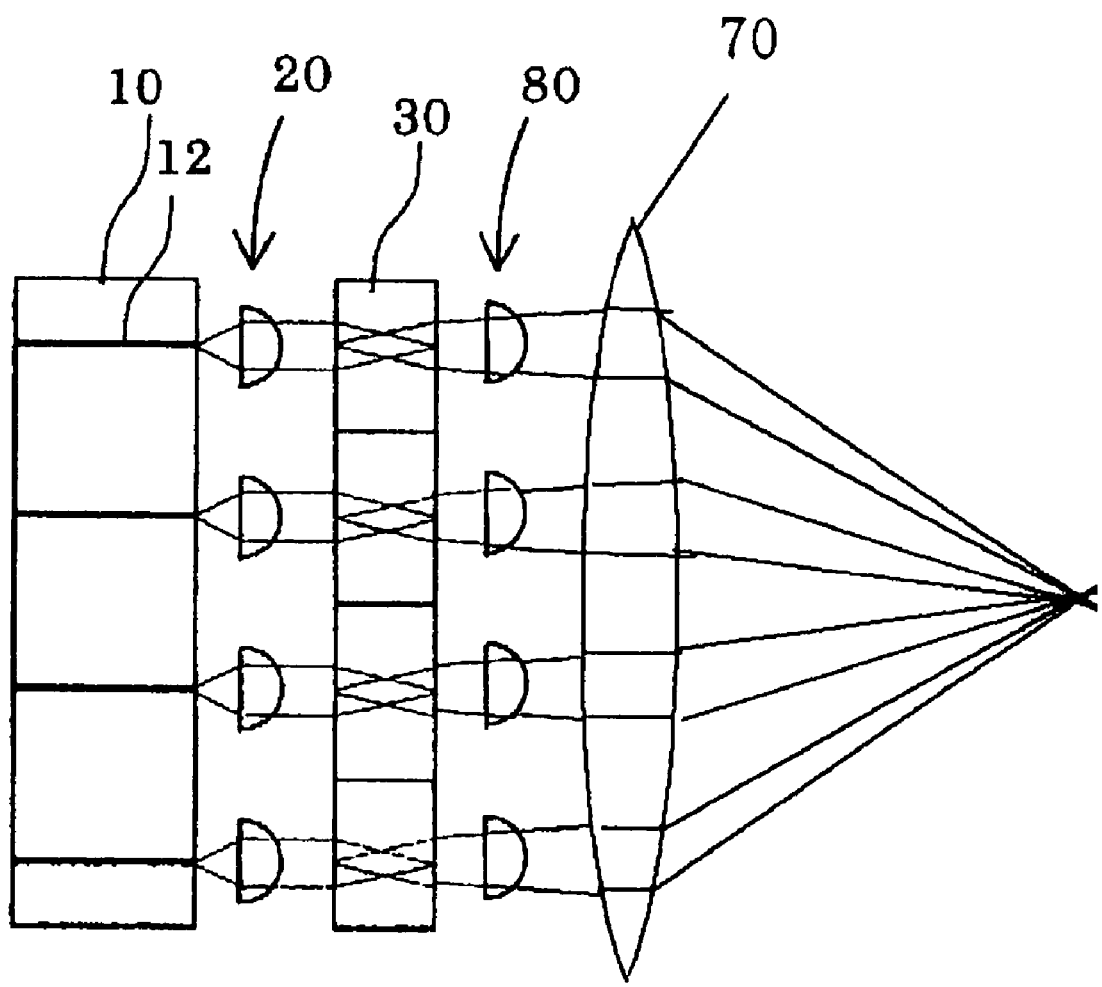
FIG. 18 is an elevation view of the semiconductor laser device shown in FIG. 17.

FIG. 17 is a plan view of another exemplary embodiment of the semiconductor laser device according to the present invention, and FIG. 18 is an elevation view. The difference from the example shown in FIG. 7 and FIG. 8 is that the beam angles are not changed, but rather the method is adopted of narrowing the distance between center axes of the beams. Therefore, a second condensing lens 71 having a focal length f3 is provided after the second cylindrical lens array 80. The slow axis components of the group of beams emitted from the laser diode stack array are collimated by the second cylindrical lens array 80 having the focal length f2, but spread during propagation due to the nature of waves and therefore become somewhat divergent beams before the second condensing lens. However, the center axes are approximately parallel.

Therefore, if concentrating these by the second condensing lens, as indicated above with reference to FIG. 4, discrete images can be formed. For example, after the second cylindrical lens array 80, the object can be thought of as moving to a position where the wave front becomes flat. However, since the divergence angles are small, the offset distances of the images from the center axis of the second condensing lens 70 are extremely small and the images appear superposed, e.g., almost completely. The same may apply to the fast axis components. The object can be formed right after the first cylindrical lens array 20. If the images are concentrated using the second condensing lens 70, again discrete images may be formed. However, since the distance between images is still shorter compared with the slow axis components, the overall intensity profile may become an almost completely single peak type.

In this manner, at the image-forming plane of the second condensing lens 70, a single peak type image is obtained in both directions. However, an enlarged imaging system is formed with a magnification of the image of f3/f1 in the fast axis direction and f3/f2 in the slow axis direction, so the image may become larger.

FIGS. 19A to 19C schematically illustrate the above description in a manner tracking the object for the configuration of FIG. 17 and FIG. 18. The illustration of FIG. 19A shows the output beams of the laser diode stack array from the front. For the purpose of simplicity, a part is taken to show six stripes per array and four stack layers (note that the total width is 10 mm and the actual number of stripes is greater than six).

FIG. 19B shows the cross sectional view of the beams after the first beam converter, and FIG. 19C shows the image formed by the second condensing lens. Next, concrete numerical figures are discussed to explain the state of image formation. For example, it may be assumed that the emission diameter of the fast axis components is 1 μm, while the emission diameter of the slow axis components is 200 μm. If the focal length f1 of the first cylindrical lens array 20 is 0.3 mm, the focal length f2 of the second cylindrical lens array 80 is 4.5 mm, and the focal length f3 of the condensing lens 71 is 30 mm, an image of a size of about 1 μm×30/0.3=100 μm in the original array direction and about 200 μm×30/4.5=1.3 mm in the stack direction of the stack array is obtained. However, in practice, there may be a mounting error, etc. in the emitters and optical system, so the condensing diameter in the array direction sometimes becomes about double the above or about 200 μm. If the output at this time is 50 W, the power density becomes about $2\times10^4$ W/cm$^2$. The spot is oval. The present exemplary embodiment of the present invention can also be similarly applied to a semiconductor laser stack array having a linear emission part with substantially no breaks.

Figure 20:
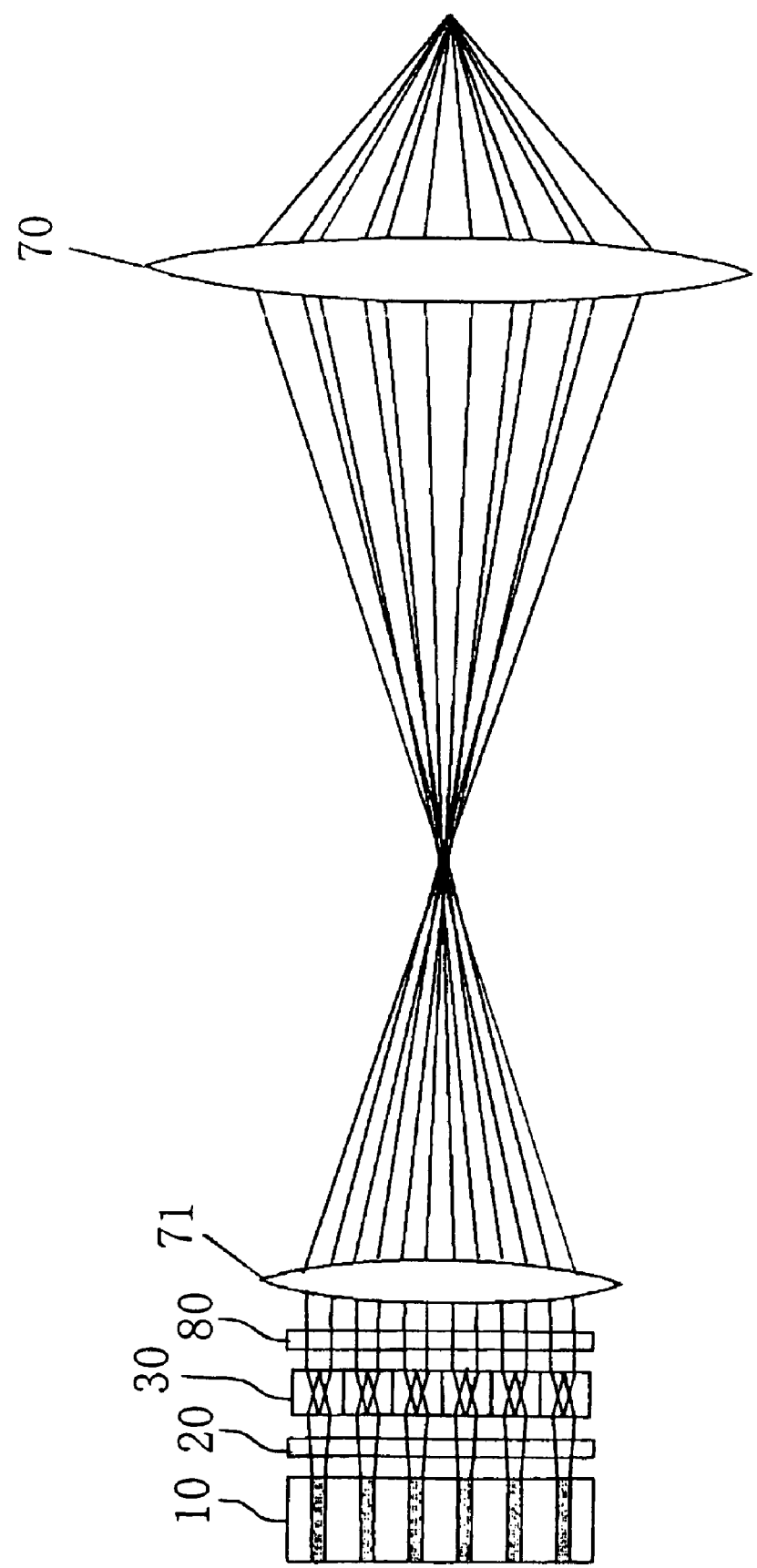
FIG. 20 is a plan view of an exemplary embodiment of the semiconductor laser device according to the present invention forming an image by further reducing the output of the semiconductor laser device shown in FIG. 17 and FIG. 18.
Figure 21:
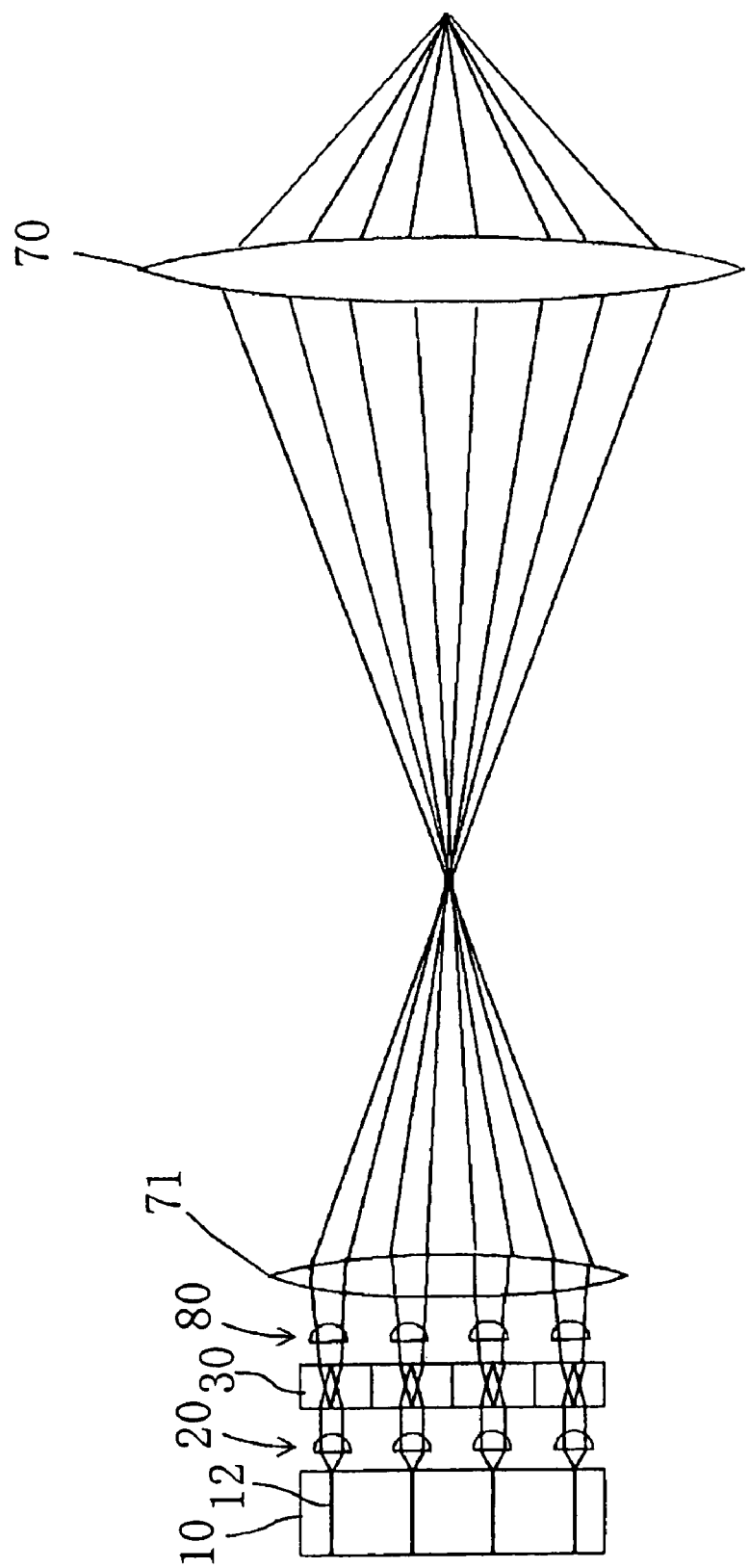
FIG. 21 is an elevation view of the semiconductor laser device shown in FIG. 19.

FIG. 20 is a plan view of another exemplary embodiment of the semiconductor laser device according to the present invention, and FIG. 21 is an elevation view thereof. The present exemplary embodiment can further reduce the image from the embodiment shown in FIG. 17 and FIG. 18 to narrow the distance between center axes of the beams. Therefore, a condenser 70 may be provided after the condenser 71. A further higher power density can be realized from the example shown in FIG. 17 and FIG. 18. The present exemplary embodiment can also be similarly applied to a semiconductor laser stack array having a linear emission part with substantially no breaks.

Figure 22:
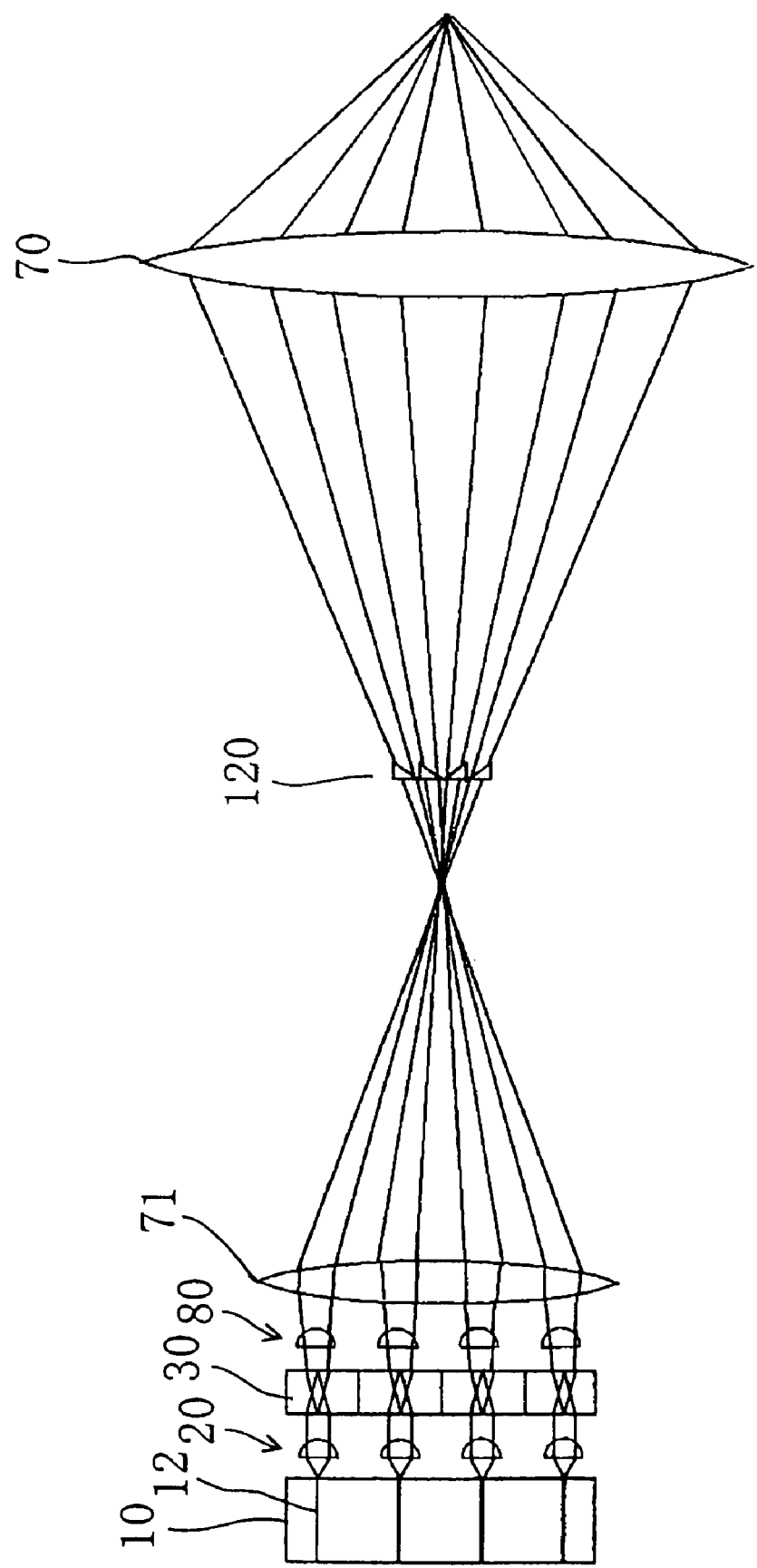
FIG. 22 is a side view illustrating the semiconductor laser device shown in FIG. 20 and FIG. 21 provided with an optical axis angle changing function near the focal point of the second condensing lens relating to the stack direction and configured to form an image by a final condensing lens.

FIG. 22 is a side view explaining a configuration providing the exemplary embodiment shown in FIG. 20 and FIG. 21 with an optical axis angle changing function near the focal point of the second condensing lens for the stack direction and forming an image by the condensing lens 70. As the optical axis angle changing element, transparent wedge plates 120 are used. Near the focal point, each beam forms an image, so the beams are clearly separated. Therefore, by providing the transparent wedge plates there, it is possible to convert all of the beams to a beam appearing to be emitted from a common object. As a result, the images in the stack direction match at the image-forming point of the condensing lens. This effect can be similarly obtained in the array direction as well. Further, it is also possible to change the angle of several beams together. Note that it is also possible to use a cylindrical lens to obtain the optical axis angle changing function. The present exemplary embodiment can also be similarly applied to a semiconductor laser stack array having a linear emission part with substantially no breaks.

Figure 23:
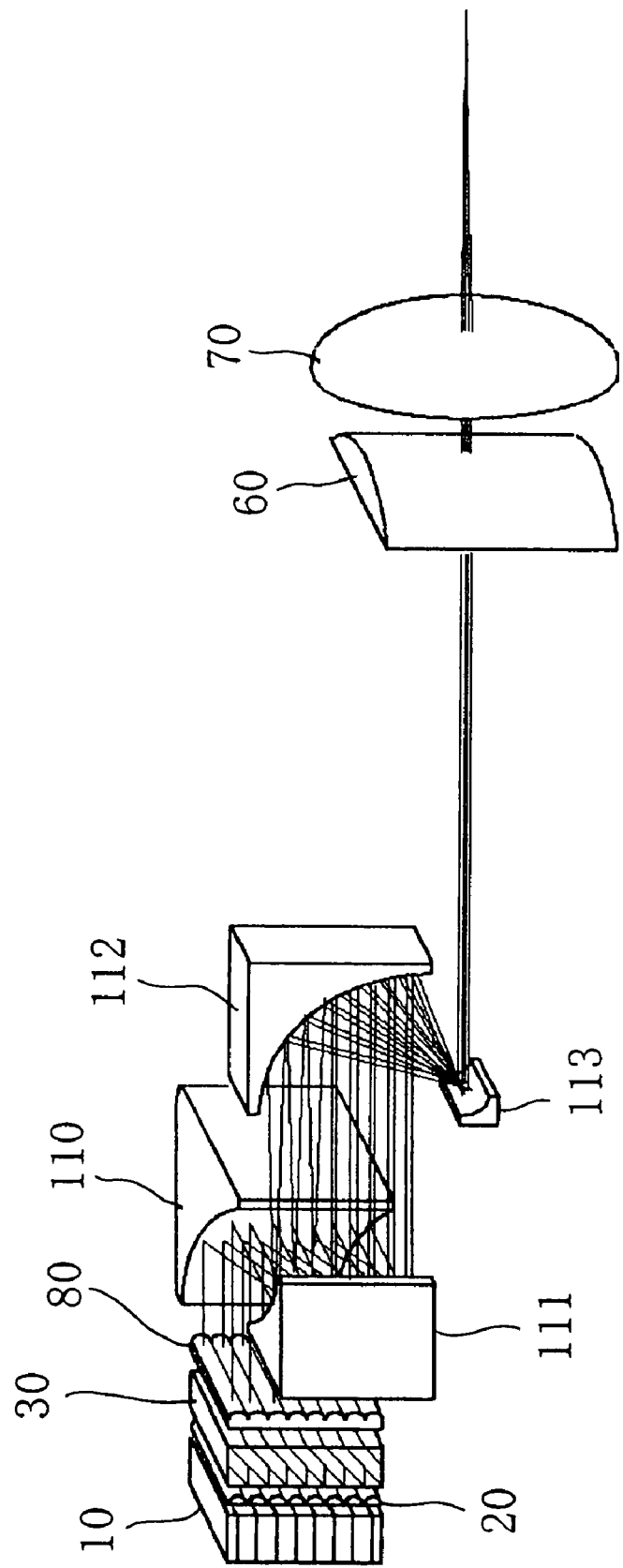
FIG. 23 is a plan view of an exemplary embodiment of the semiconductor laser device according to the present invention that uses two one-dimensional telescopes as means for bringing the center axes of the beams closer.

FIG. 23 is a perspective view of still another exemplary embodiment of a semiconductor laser device according to the present invention. The present exemplary embodiment uses as an arrangement for reducing the distance between center axes of the beams two one-dimensional telescopes using parabolic mirrors. For this purpose, four cylindrical parabolic mirrors are set after the second cylindrical lens array 80. In this example, the compression of the semiconductor laser stack array in the array direction and the compression in the stack direction are functionally separated. The first cylindrical parabolic mirror 110 and the second cylindrical parabolic mirror 111 configure the array direction compression telescope, while the third cylindrical parabolic mirror 112 and the fourth cylindrical parabolic mirror 113 configure the stack direction compression telescope. The telescopes may be the Kepler type or the Galileo type. In either case, a new object is formed at the exit side of the telescope. The telescopes may also be configured by cylindrical lenses. It is also possible to use a combination of cylindrical parabolic mirrors and cylindrical lenses. To correct the increase in divergence angles due to the beam compression, a cylindrical lens 60 may be provided. The present exemplary embodiment can also be similarly applied to a semiconductor laser stack array having a linear emission part with substantially no breaks.

Figure 24:
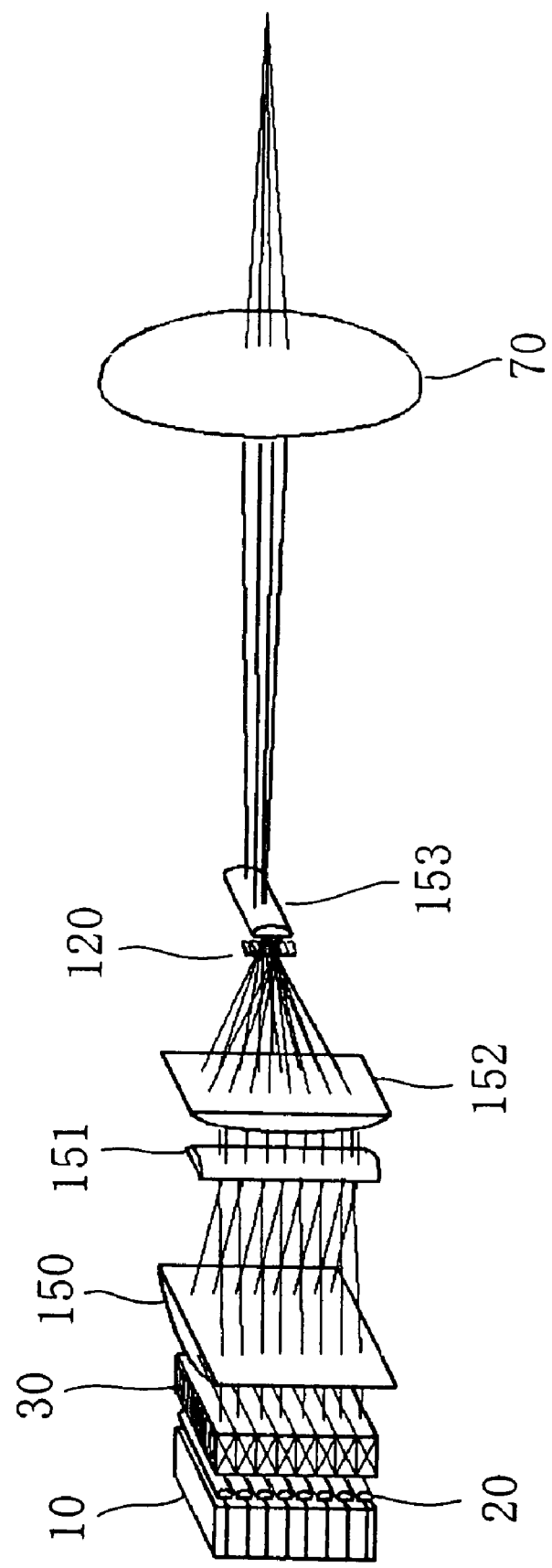
FIG. 24 is a plan view of an exemplary embodiment of the semiconductor laser device according to the present invention that uses two one-dimensional telescopes as means for bringing the center axes of the beams closer and transparent wedge plates as means for making the objects match.
Figure 25:
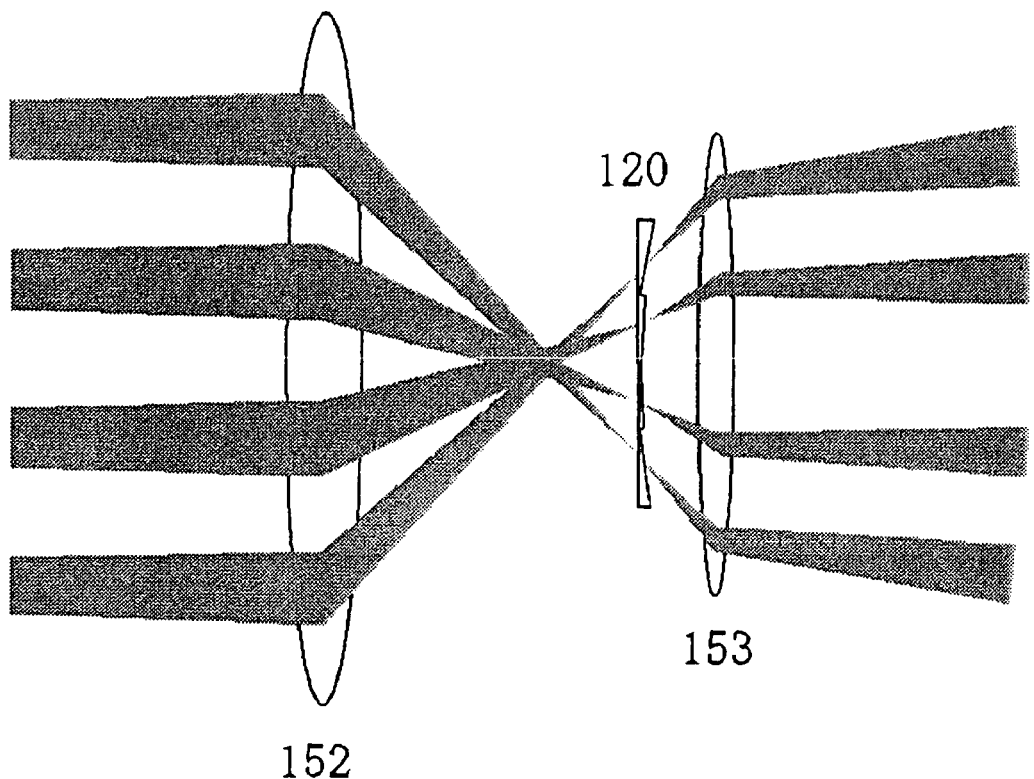
FIG. 25 is an enlarged view of the portion for setting the transparent wedge plates of FIG. 24.
Figure 26:
FIGS. 26A and 26B are views for explaining the state of change of an image in the semiconductor laser device shown in FIG. 25.

FIG. 24 is a perspective view explaining a configuration using as the telescopes in the exemplary embodiment shown in FIG. 23 using cylindrical lenses, and for example using a Kepler type for the stack direction, and further providing an optical axis angle changing element at the focal point or its vicinity and combining the images. As the optical axis angle changing element, transparent wedge plates 120 are used. FIG. 25 is an enlarged view of part of this exemplary effect. For example, near the focal point, the beams form images, so the beams are clearly separated. By arranging the transparent wedge plates 120 there, it is possible to convert all of the beams to appear to be a beam emitted from a common object. As a result, at the image-forming point of the condensing lens 70, the images for stack direction coincide. FIG. 26 shows this exemplary state. At the image-forming point, the distance between optical axes of the beam is narrow, so there are the advantages that the wedge plate angle can be made small and the effective aperture of the condensing lens 70 can be made small. The effect of this exemplary embodiment can be similarly obtained in the array direction as well. It is also possible to use a cylindrical lens to obtain the optical axis angle changing function. The present exemplary embodiment can also be similarly applied to a semiconductor laser stack array having a linear emission part with substantially no breaks.

Figure 27:
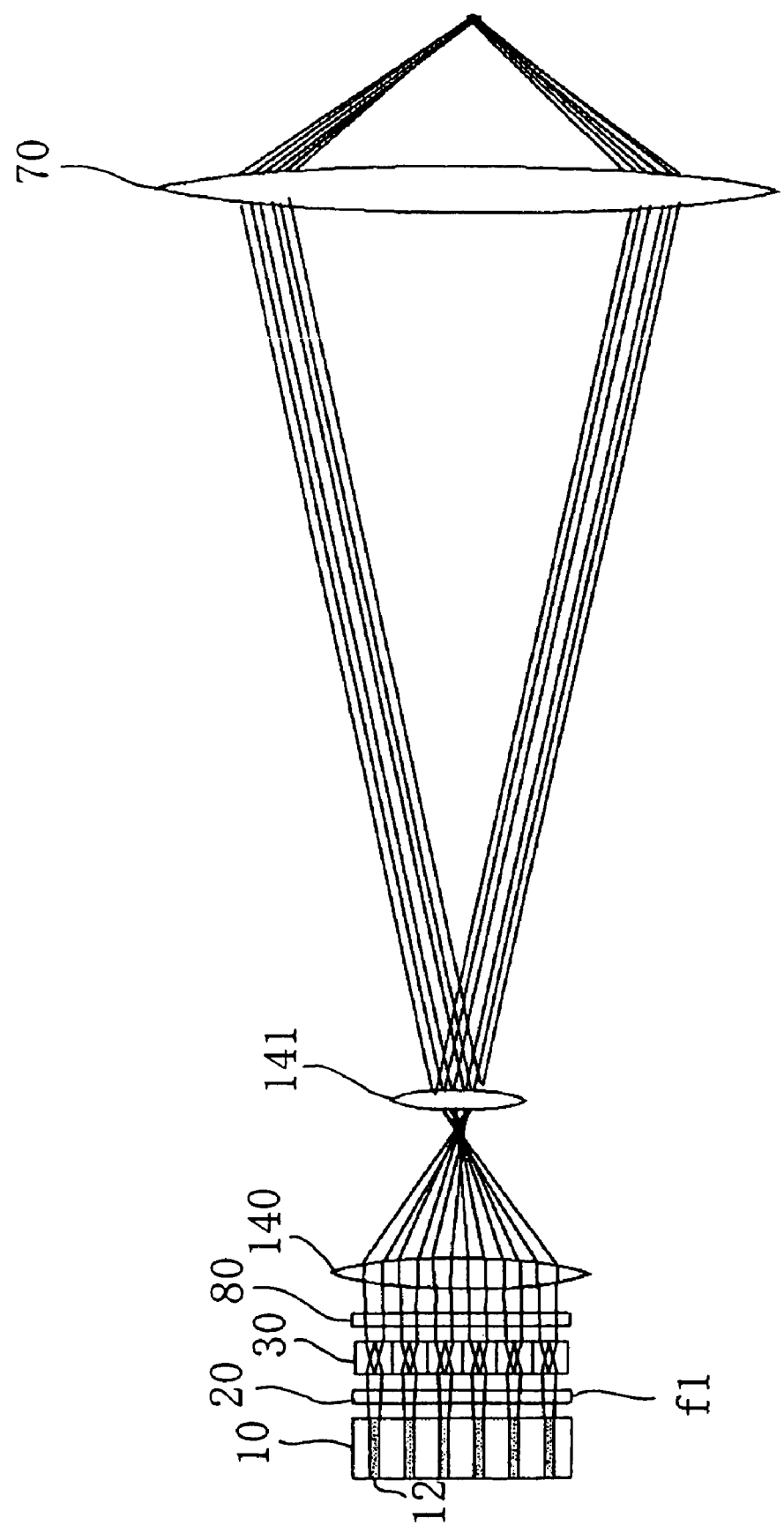
FIG. 27 is a plan view of an exemplary embodiment of the semiconductor laser device according to the present invention that uses a telescope as the means for bringing the center axes of the beams closer.
Figure 28:
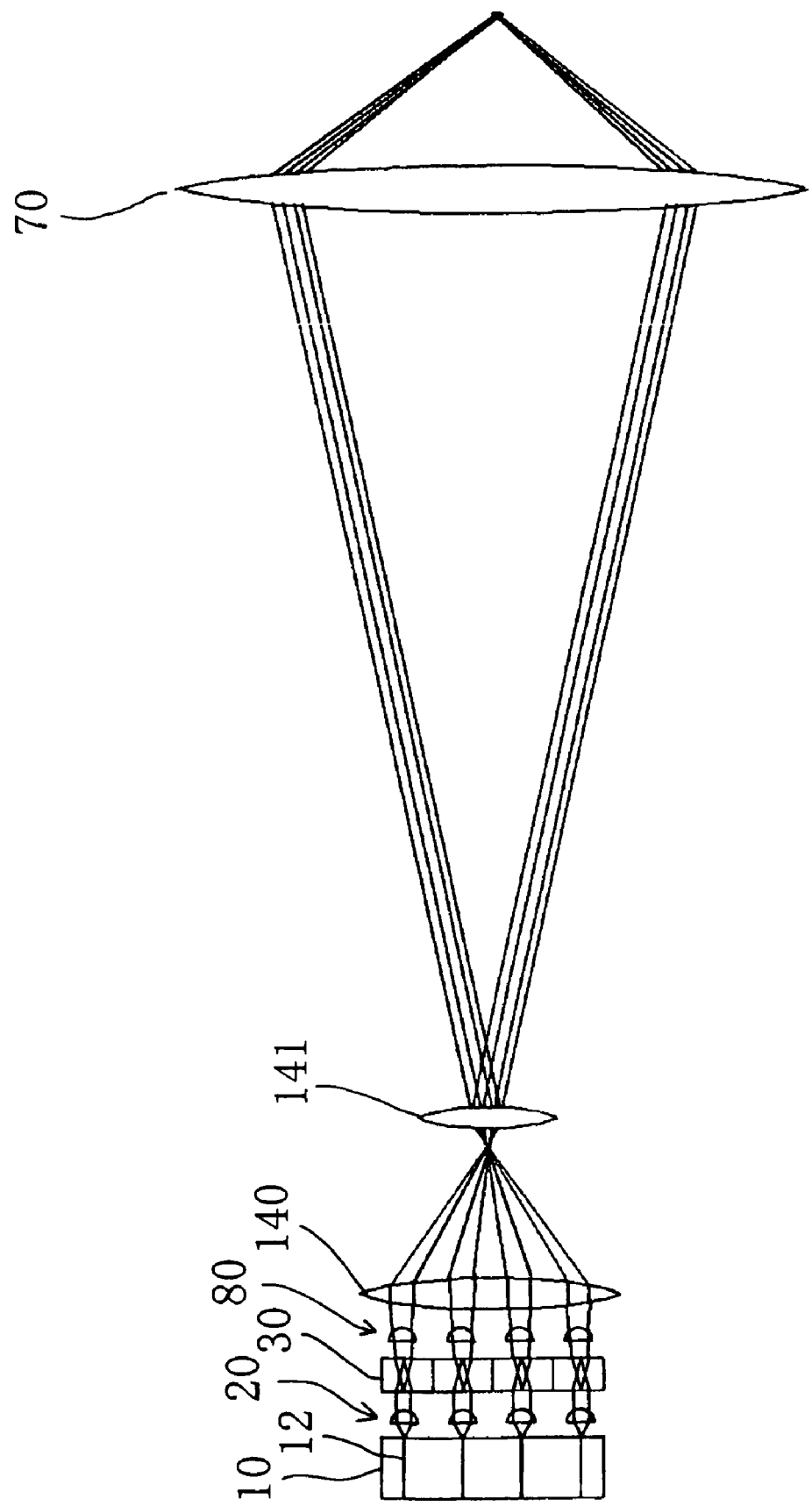
FIG. 28 is an elevation view of the semiconductor laser device shown in FIG. 27.

FIG. 27 is a plan view of yet another exemplary embodiment of the semiconductor laser device according to the present invention, and FIG. 28 is an elevation view of the same. This exemplary embodiment uses telescopes as an arrangement for reducing the distances between center axes of the beams. Therefore, the lens 141 is provided after the lens 140. The lens 140 and the lens 141 configure a Kepler type telescope. It is also possible to make the lens 141 a concave lens and make the telescope a Galileo type. The wave front may become flat in the vicinity of exit side of the lens 141, so a new object is formed there. First, the state of the beams at the telescope exit side will be explained. If the stack distance is made 1.75 mm, the number of layers 20, the stripe distance 800 μm, the collimate diameter at the fast axis side by the first cylindrical lens array 20 200 μm, the collimated diameter for the slow axis direction by the second cylindrical lens array 80 400 μm, and the reduction ratio of the telescope 1/10, then 12 stripe images will be arranged in a ladder rung configuration at intervals of about 80 μm in a total width of about 14 mm in the original array direction. In the original array direction, the beam diameter of a single beam is about 20 μm, so the overall images become discrete. On the other hand, four groups of beams are arranged at intervals of about 175 μm in the stack direction of the stack array. In this direction, the beam diameter of a single beam is about 40 μm, so the images become even more discrete compared with the original array direction.

Two-dimensionally, the result is an image with line segments arranged in a rectangle of about 3.3 mm in the stack direction. FIGS. 29A and 29B illustrate the state of change of the image before and after the telescope. In these figures, for the sake of convenience, four stack layers of six stripes each are shown. Next, the first condensing lens 70 is used to again reduce the above object and form an image so as to form an image appearing sufficient for practical use. The reduction ratio is made 1/4, so 12 stripes are arranged in a ladder rung configuration at distances of about 20 μm in a total width of about 250 μm in the original array direction. For the stack direction of the stack array, 20 groups of beams are arranged at intervals of about 44 μm in a total width of about 830 μm. In particular, two dimensionally, the result is an overall image of line segments arranged in a rectangle of 250 μm in the array direction and 830 μm in the stack direction.

If such reduction is achieved, however, even if used for materials processing, the heat transfer and dispersion at the workpiece side should be considered, whether or not the image is uniform is no longer than much of a problem. For example, if the output at the condensing point is 500 W, the average power density of the overall image becomes 2.4× $10^5$ W/cm² — which is sufficient for materials processing such as deep penetration welding of metals. As a way for reducing the distance between center axes of the beams, it is also possible to use a telescope using a parabolic mirror. Further, the present exemplary embodiment can also be similarly applied to a semiconductor laser stack array having a linear emission part with substantially no breaks.

Figure 30:
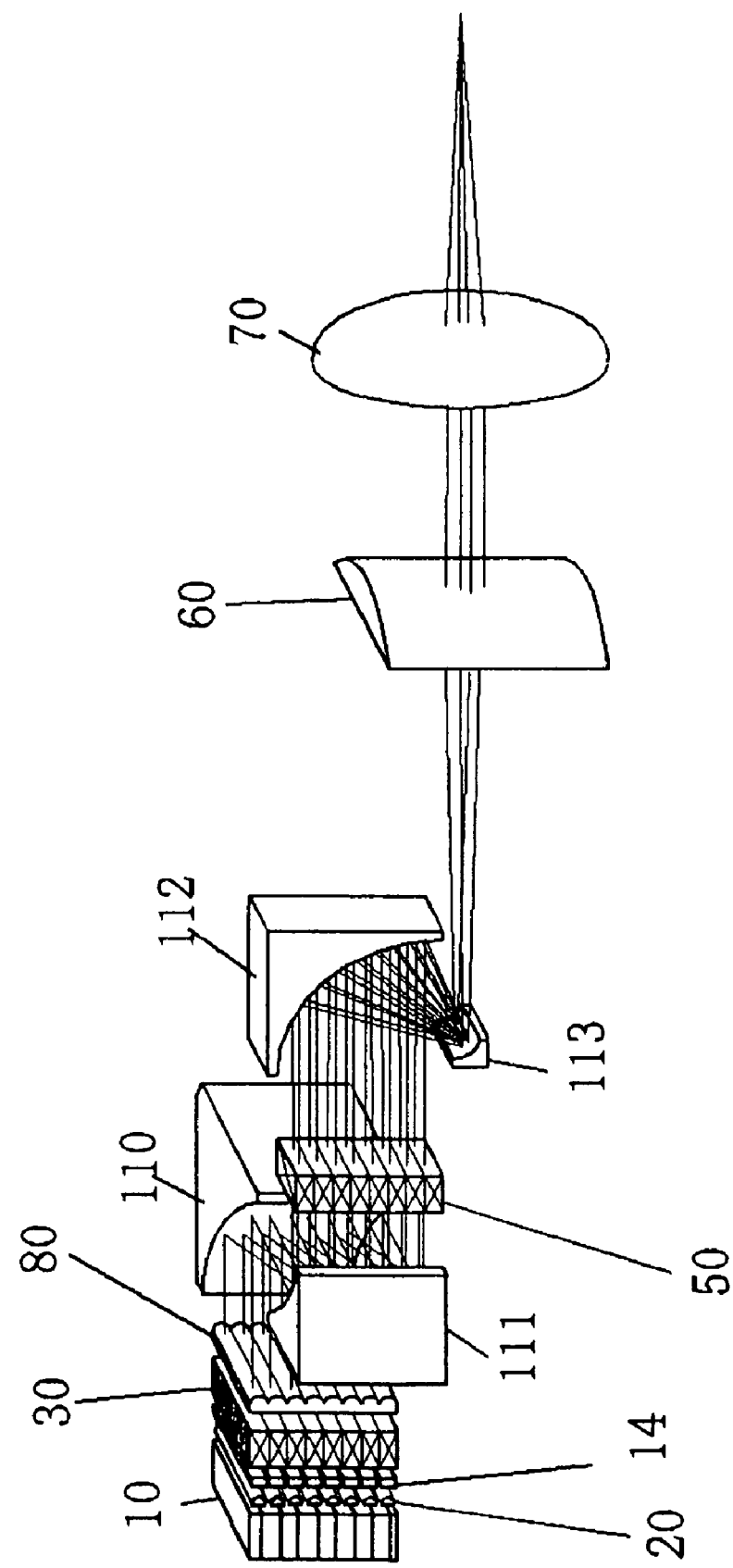
FIG. 30 is a perspective view of an example of a configuration providing a second beam converter between an array direction telescope and stack direction telescope in addition to the example shown in FIG. 25.

FIG. 30 is a perspective view of an example of a configuration comprised of the embodiment shown in FIG. 23, as well as a second beam converter 50 between the array direction telescope and stack direction (second direction) telescope. The second beam converter 50 rotates the group of beams for each array to convert it to a single row ladder rung configuration. Along with this operation, the fast axis components are compressed by the second telescope constituted by the stack direction telescope. Therefore, together with the first telescope constituted by the array direction telescope, the fast axis components are compressed twice. The second beam converter (50) preferably is struck by the beams of each stack bar at its beam conversion elements. The stack beams may also strike it after being superposed. In this case, the beam is divided and rotated for each beam conversion element of the second beam converter.

Figure 31:
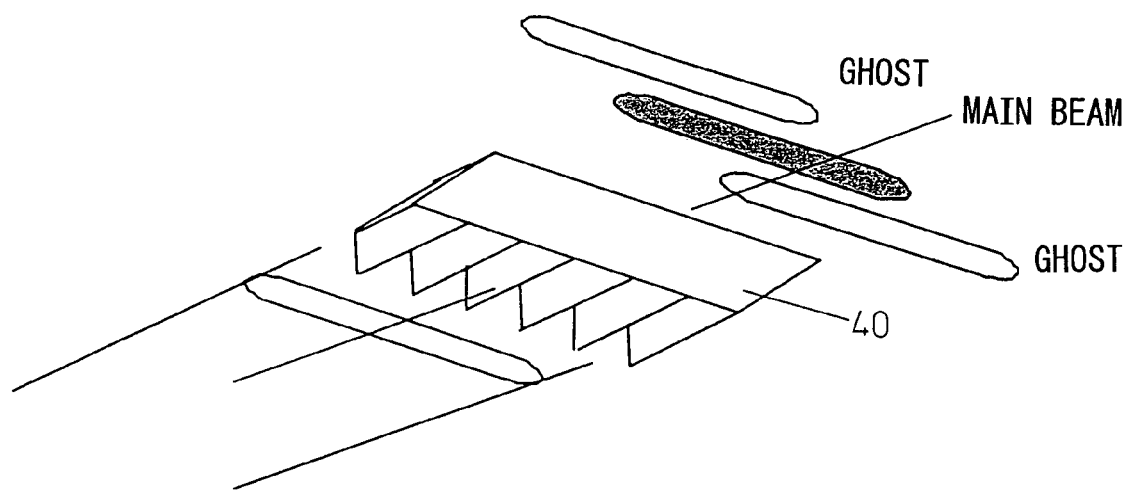
FIG. 31 is a view showing appearance of ghosts when laser beams pass through a second beam converter.
Figure 32:
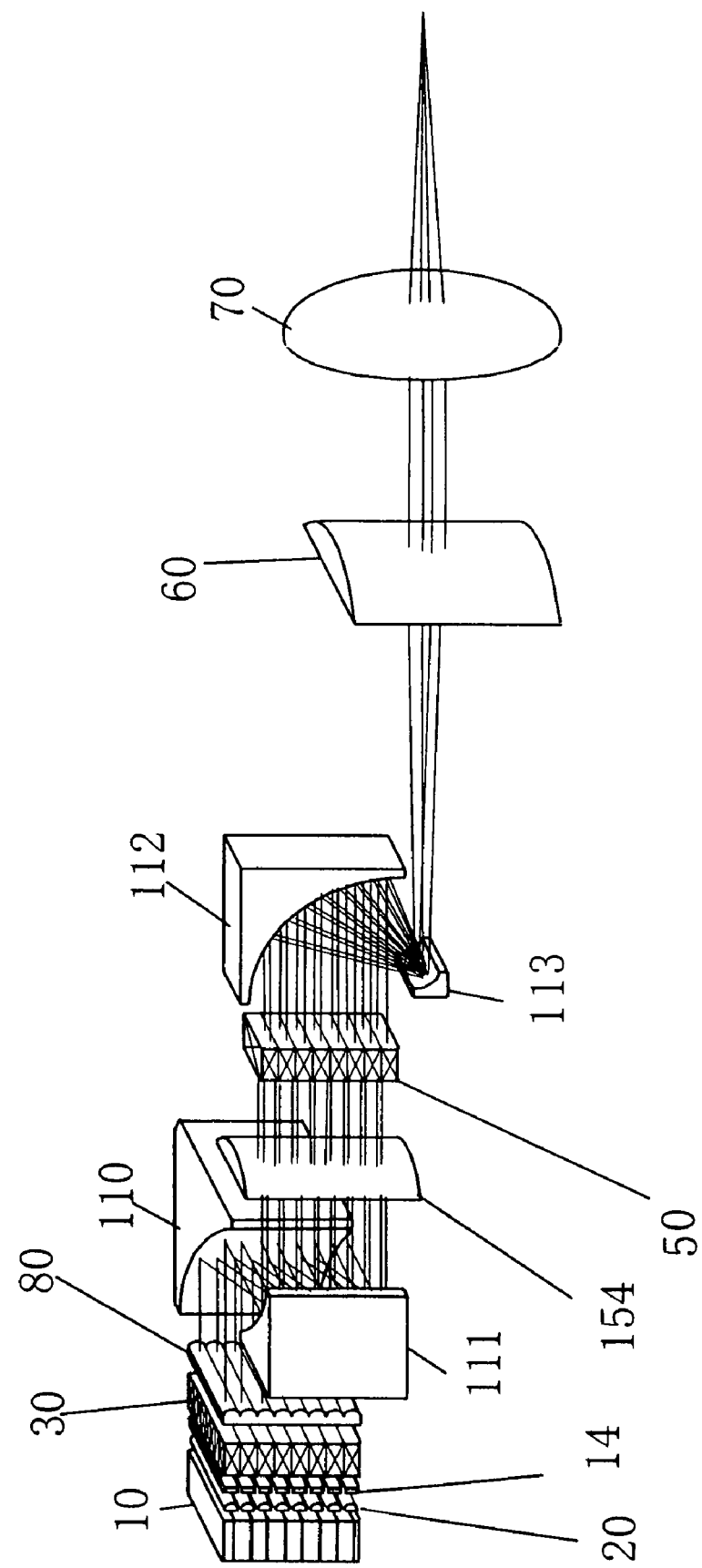
FIG. 32 is a view of an exemplary embodiment of the semiconductor laser device according to the present invention that provides a cylindrical lens (e.g., a fifth condenser) between a first beam compressor and second beam converter.

In the example of the configuration shown in FIG. 30, when the laser beams passing through the first beam compressor (110, 111) are beams having some divergence angles in the fast axis direction, when the laser beams pass through the second beam converter (50), they protrude out to the adjoining beam conversion elements and, as shown in FIG. 31, form ghosts. As a result, the thruput of the beams is reduced. Therefore, as shown in FIG. 32, it may be preferable to provide between the first beam compressor (110, 111) and second beam converter (50) a cylindrical lens (fifth condenser (154)) for bending and collimating the laser beams of each row passing through the first beam compressor (110, 111) in a first direction (slow axis direction). By provision of the fifth condenser (154), the envelope line of the group of laser beams passing through the second beam converter (50) becomes narrower and the ghosts disappear.

One of the properties of light is the constant nature of the product $D \cdot \theta$ of beam diameter D and divergence angle θ. The smaller the product, the better the condensability. Further, if the fast axis component is one where $D_F=1$ μm and $\theta_F=0.698$ rad and the slow axis component is one where $D_S=200$ μm and $\theta_S=0.175$ rad, then $D_F \cdot \theta_F=0.7$ μm·rad and $D_S \cdot \partial$there is a 50-fold gap in the size of the products. In this way, the slow axis component is better in condensability, so compressing the fast axis component twice is advantageous. Conversely, the beam divergence angle is increased by the amount of compression, so there is a concern that the overall beam diameter of the striking the condensing lens will become larger. Therefore, the cylindrical lens 60 is arranged to close the gap of divergence between the array direction and the stack direction. The present exemplary embodiment can also be similarly applied to a semiconductor laser stack array having a linear emission part with substantially no breaks.

Figure 33:
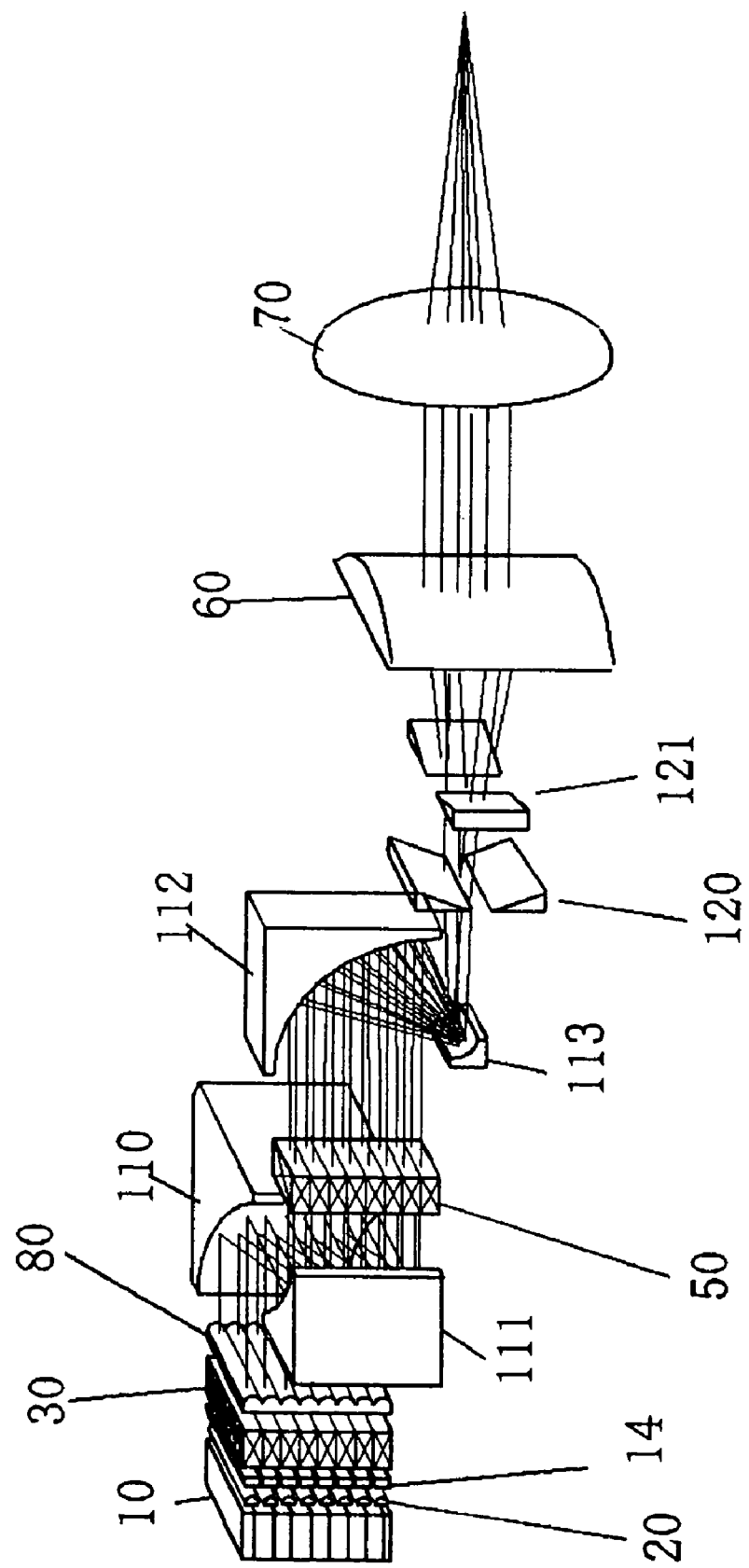
FIG. 33 is a perspective view of a configuration adding stack direction and array direction transparent wedge plates to the arrangement of FIG. 30.

FIG. 33 is a perspective view of another exemplary embodiment of the present invention in which the arrangement of FIG. 30 is augmented by stack direction and array direction transparent wedge plates (120, 121). This figure shows that the group of beams is divided into three to change the direction in the stack direction and the array direction.

Figure 34:
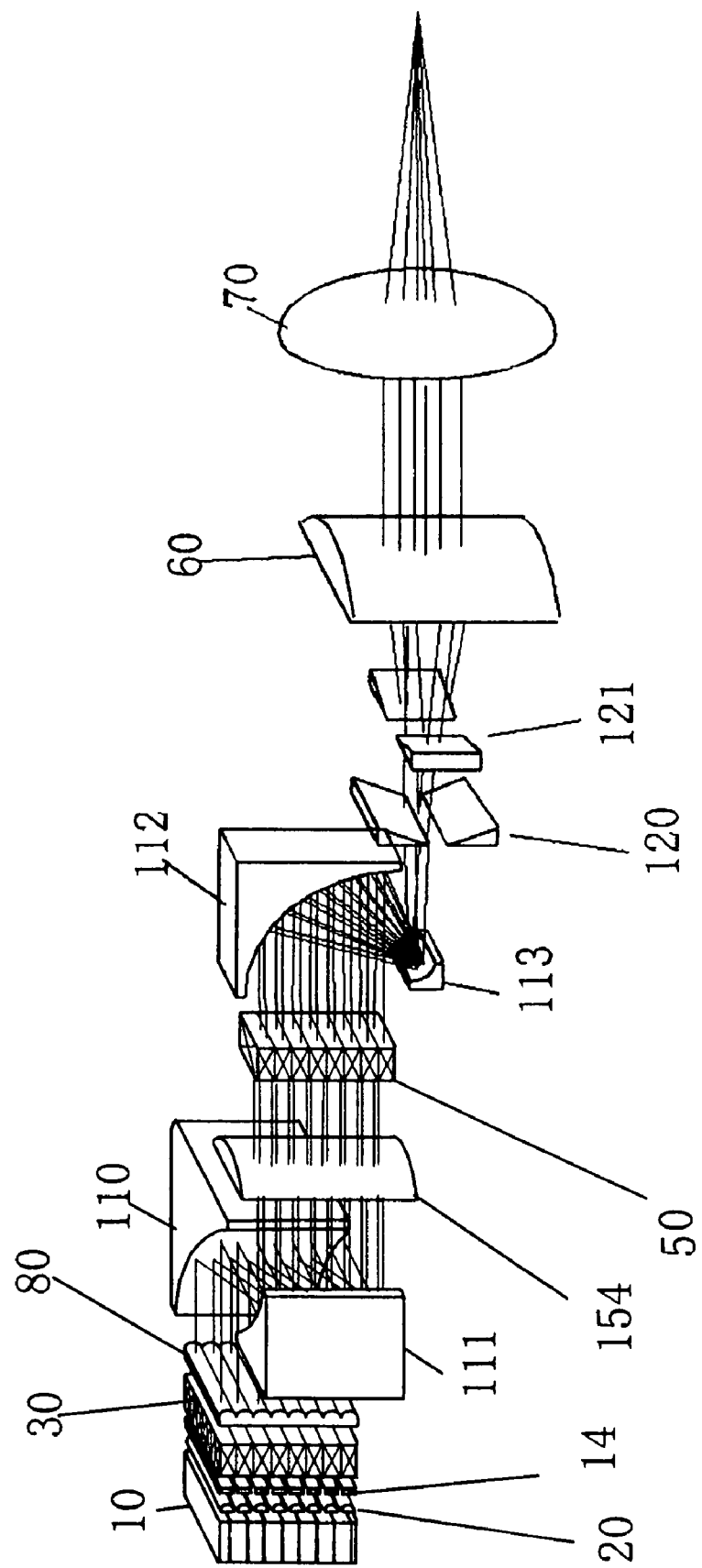
FIG. 34 is a view of another exemplary embodiment of the semiconductor laser device providing the cylindrical lens (e.g., the fifth condenser) between a first beam compressor and second beam converter.

Further, FIG. 34 shows another exemplary embodiment comprised of the embodiment shown in FIG. 33 wherein the first beam compressor (110, 111) and the second beam converter (50 have a cylindrical lens (first condenser (154)) provided between them. The group of beams is divided into three in the stack direction and the array direction, then the beams are superposed at the image-forming point of the condensing lens 70. That is, in each embodiment, compared with the method shown in FIG. 30, the spot diameter becomes about 1/3. Further, instead of the transparent wedge plates, it is also possible to use a beam compressor.

Figure 35:
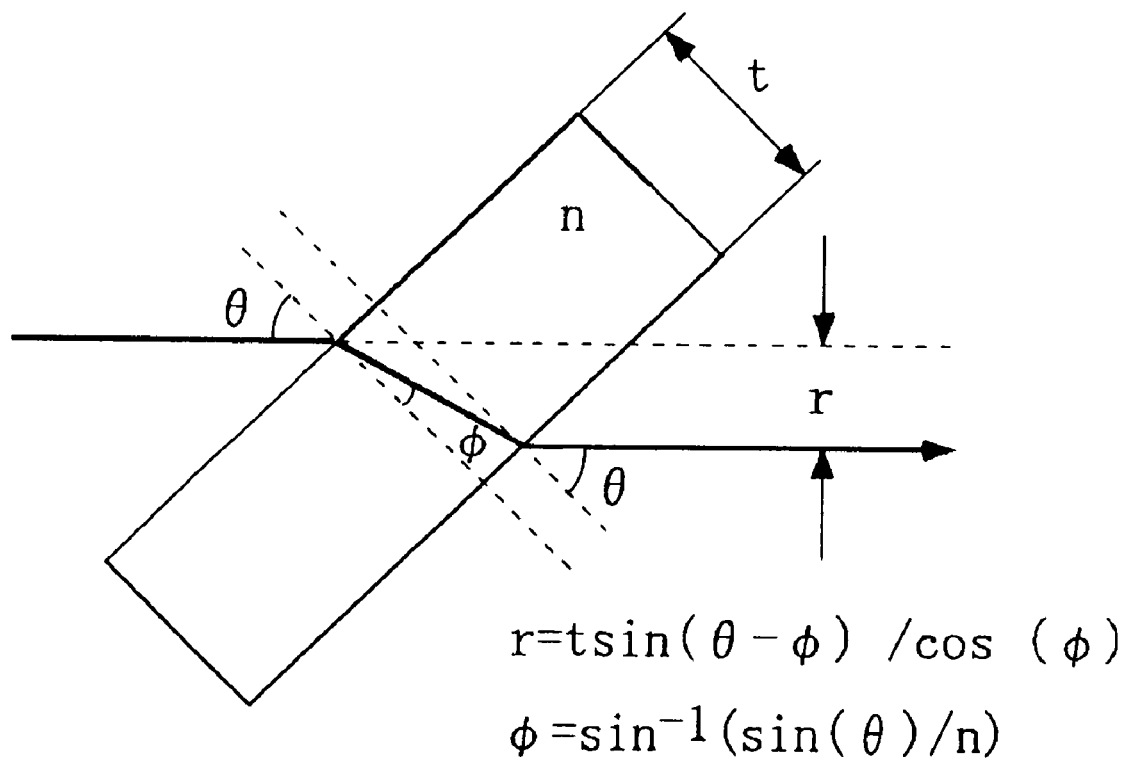
FIG. 35 is a view illustrating an optical axis shift due to a beam shifter.

The present exemplary embodiment can also be similarly applied to a semiconductor laser stack array having a linear emission part with substantially no breaks. FIG. 35 is a view illustrating an optical axis shift using a beam shifter. As the beam shifter, it is possible to use transparent parallel plates. The principle of optical axis shift is based on the law of refraction. When light passes through transparent parallel plates having a refractive index n and thickness t, the optical axis is shifted in parallel according to the refractive index n and thickness t and the incidence angle θ. The shift r is expressed by the equation r=t·sin(θ−φ)/cos(φ), where φ=sin$^{-1}$(sin(θ)/n). If arranging the beam shifter in advance of the first beam converter 30 to adjust the incidence angle, it is possible to adjust the beam optical axes at the center of the aperture of the first beam converter 30. Further, by arranging it in advance of the second cylindrical lens array 80 to adjust the angle, it is possible to adjust the beam optical axes at the center of the aperture of the second cylindrical lens array 80. Further, if changing the positions of the beams striking the second cylindrical lens array 80 by this, it is possible to give an angular change to the beams.

Figure 36:
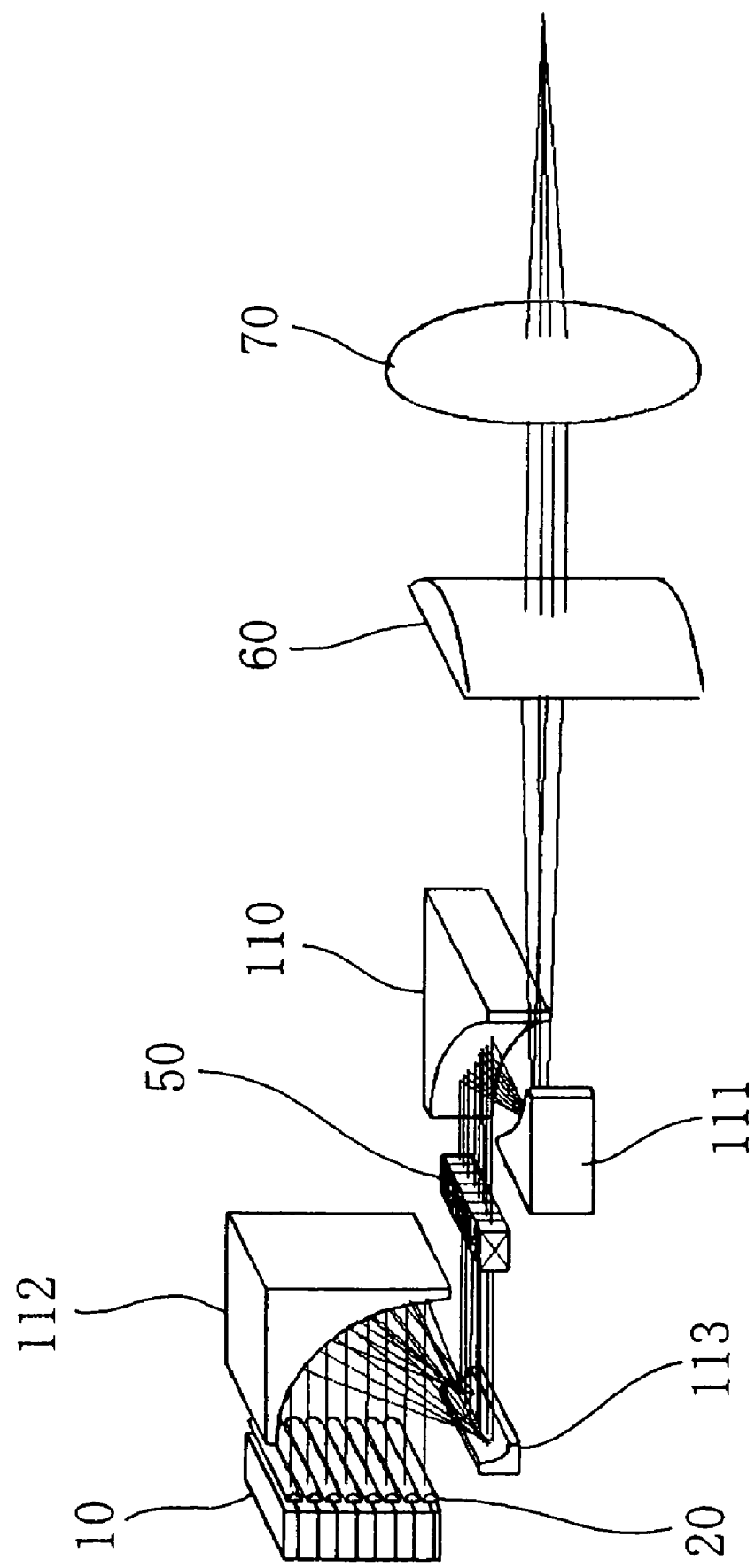
FIG. 36 is a perspective view of a configuration removing one beam converter from the arrangement of FIG. 30 and switching the array direction and stack direction telescopes.

FIG. 36 is a perspective view of still another exemplary embodiment of the present invention comprised of the arrangement of FIG. 30 from which one beam converter is removed and having the array direction (first direction) and stack direction (second direction) telescopes switched. The first cylindrical lens 20 is used to collimate the fast axis components, then the fast axis components of the entire stack are compressed all together by the second beam compressor (in the figure, comprised by 112 and 113), then the second beam converter 50 is used to indiscriminately divide and rotate the slow axis components. This state is shown in FIG. 37. The first cylindrical lens array 20 may be used to obtain sufficiently broadened beam diameters close to the stack pitch. The pitch of the second beam converter 50 is made 0.5 mm or so. When emerging from the second beam converter 50, the beams are aligned vertically. Further, the second beam compressor (cylindrical parabolic mirrors) 112, 113 is used to compress the fast axis components in the array direction, the cylindrical lens 60 is used to match the divergence of the fast axis components and slow axis components, then the condensing lens 70 is used for focusing. As the first cylindrical lens array 20, it is possible to use lenses with a relatively long focal length. A clearance up to the emitters of about 1 mm may be taken, so easy alignment becomes possible. The present exemplary embodiment can also be similarly applied to a semiconductor laser stack array having a linear emission part with substantially no breaks.

Figure 38:
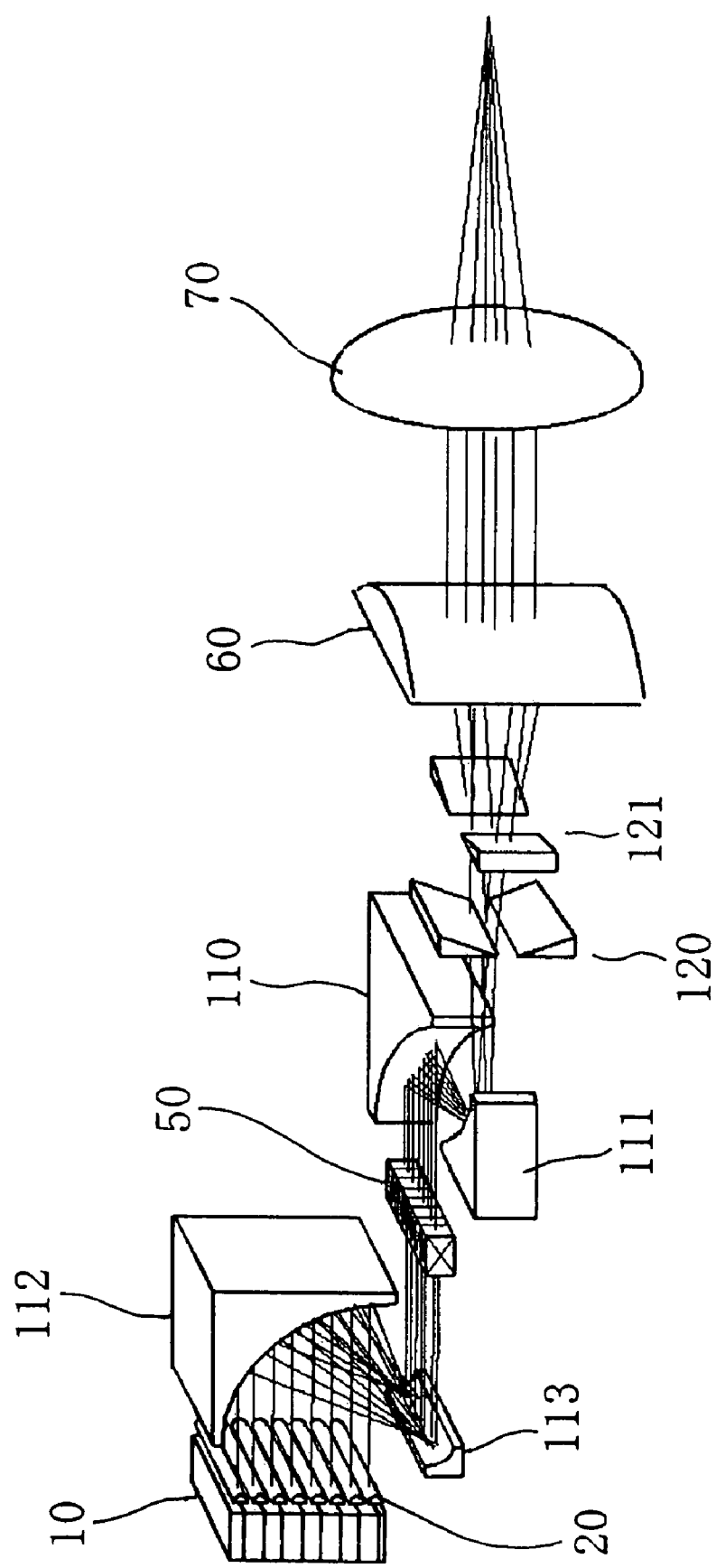
FIG. 38 is a perspective view of a configuration adding stack direction and array direction transparent wedge plates to the arrangement of FIG. 36.
Figure 39:
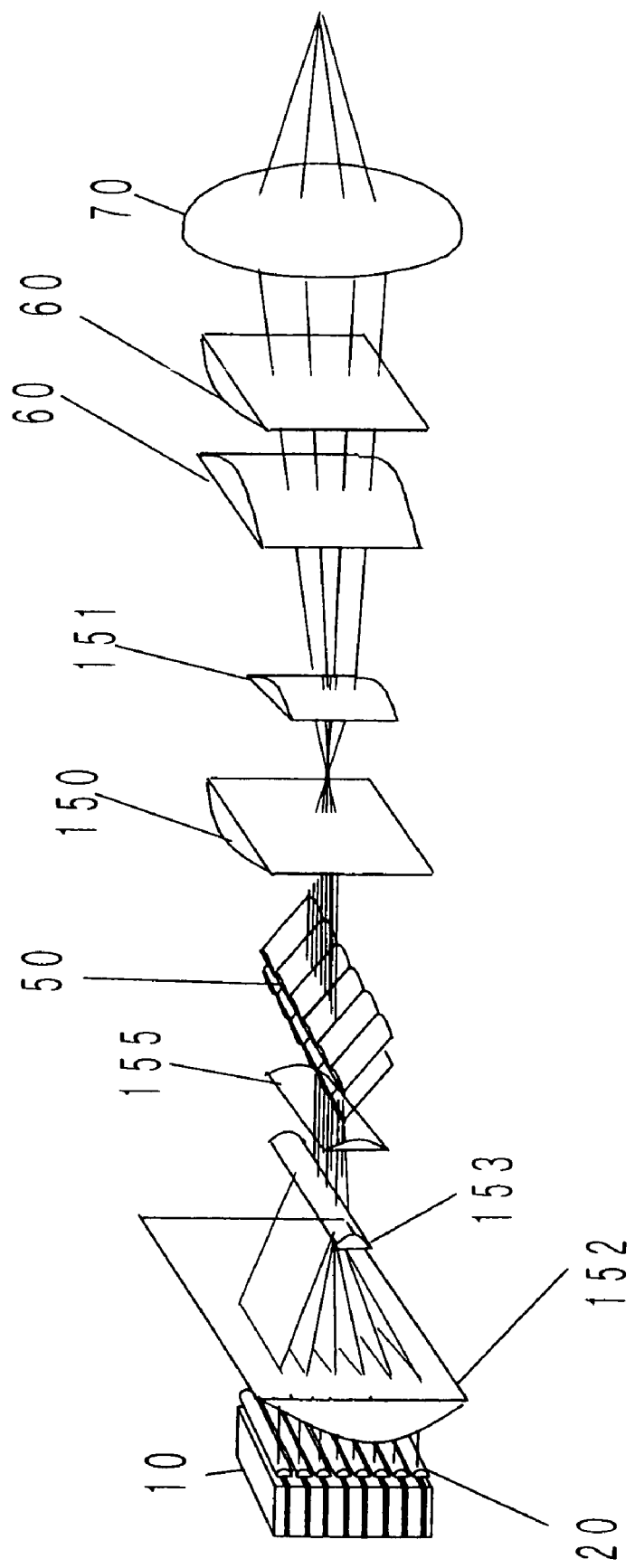
FIG. 39 is a view of another exemplary embodiment of the semiconductor laser device providing the cylindrical lens (e.g., the fifth condenser) between a first beam compressor and second beam converter.

FIG. 38 is a perspective view of another exemplary embodiment of the present invention comprised of the arrangement of FIG. 36 augmented by stack direction and array direction transparent wedge plates (120, 121). The figure shows the case of dividing the group of beams into three and changing their directions in the stack direction and array direction. The group of beams is divided into three in the stack direction and the array direction, then the beams are superposed at the image-forming point of the condensing lens 70. That is, compared with the method shown in FIG. 36, the spot diameter becomes about 1/3. Further, instead of the transparent wedge plates (120, 121), it is also possible to use a beam compressor. Further, as shown in FIG. 39, to make the ghosts derived from the divergence angle in the fast axis direction of the laser beams disappear, it is preferable to provide between the second beam compressor (152, 153) and the beam converter (50) a cylindrical lens (fifth condenser (155)) for bending and collimating each row of laser beams passing through the second beam compressor (152, 153). In this case, the beam compressor is comprised of cylindrical lens. The present exemplary embodiment can also be similarly applied to a semiconductor laser stack array having a linear emission part with substantially no breaks.

Figure 40:
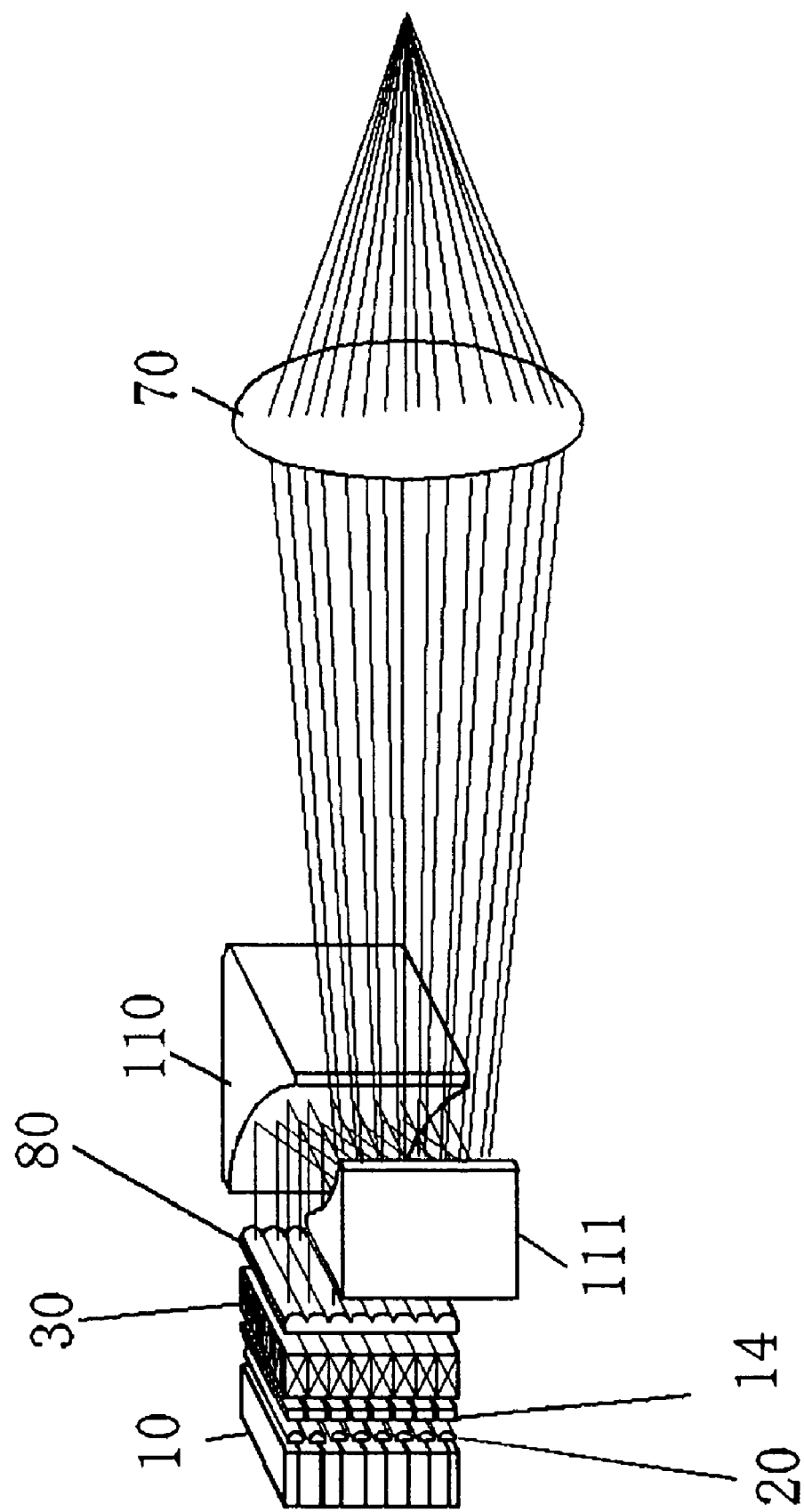
FIG. 40 is a perspective view of an exemplary embodiment of the semiconductor laser device according to the present invention that uses segment type reflection mirrors as a way for changing the beam angles.

FIG. 40 is a perspective view of another exemplary embodiment of a semiconductor laser device according to the present invention. The difference from the example shown in FIG. 7 and FIG. 8 is that the arrangement for changing the beam angles is not the second cylindrical lens array 80, but a parabolic mirror 111 used as a beam compressor (in the figure, comprised of 110 and 111) with a reflecting face segmented corresponding to the groups of beams. The present exemplary embodiment can also be similarly applied to a semiconductor laser stack array having a linear emission part with substantially no breaks.

As explained herein with respect to other exemplary embodiments, the present invention can make the laser energy converge at an extremely small area. To further raise the convergence degree, however, it may be needed to raise the parallelism of the optical axes of the laser beams emitted from the first cylindrical lens array (e.g., a first condenser). In particular, if there is error of as little as about 1/10000 radian in the mounting of the first cylindrical lens array (first condenser), the parallelism between optical axes of the laser beams emitted from the laser diode stack array will deteriorate and the beams will end up being condensed at a point different from the scheduled condensing point in some cases. Due to this, it may be preferable to provide in front of the first cylindrical lens array (first condenser) an angle adjuster able to finely adjust the optical axis angle on the order of 1/10000 radian in the second direction (slow axis direction) for each row.

Figure 41:
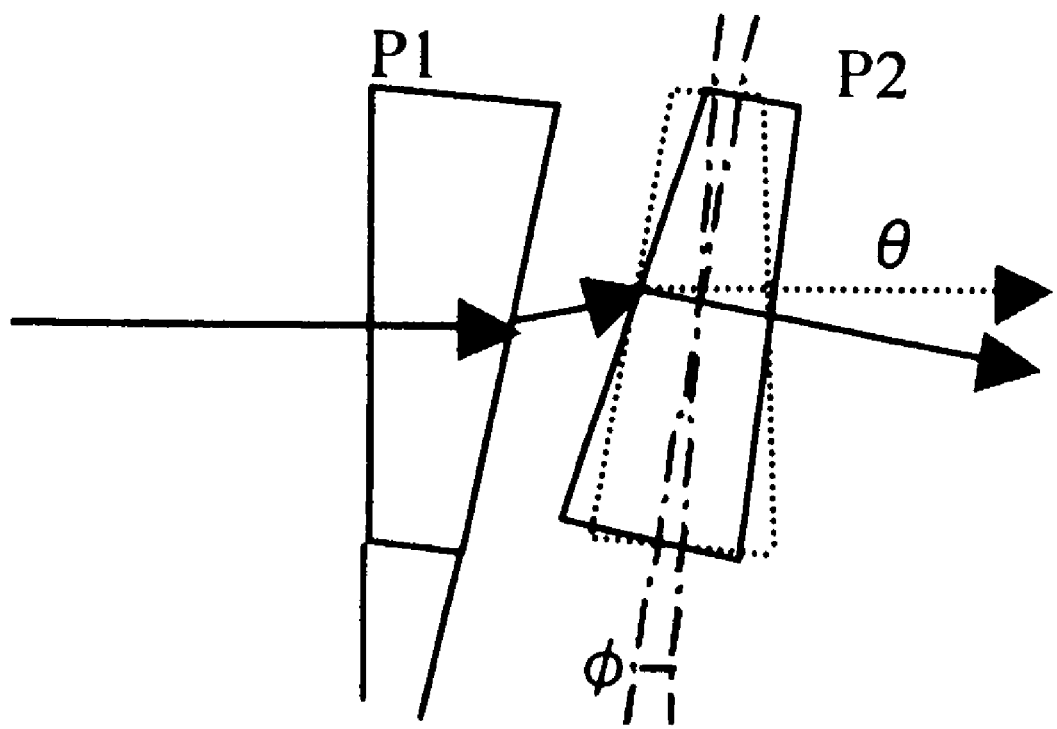
FIG. 41 is a view of an example of an angle adjuster.
Figure 42:
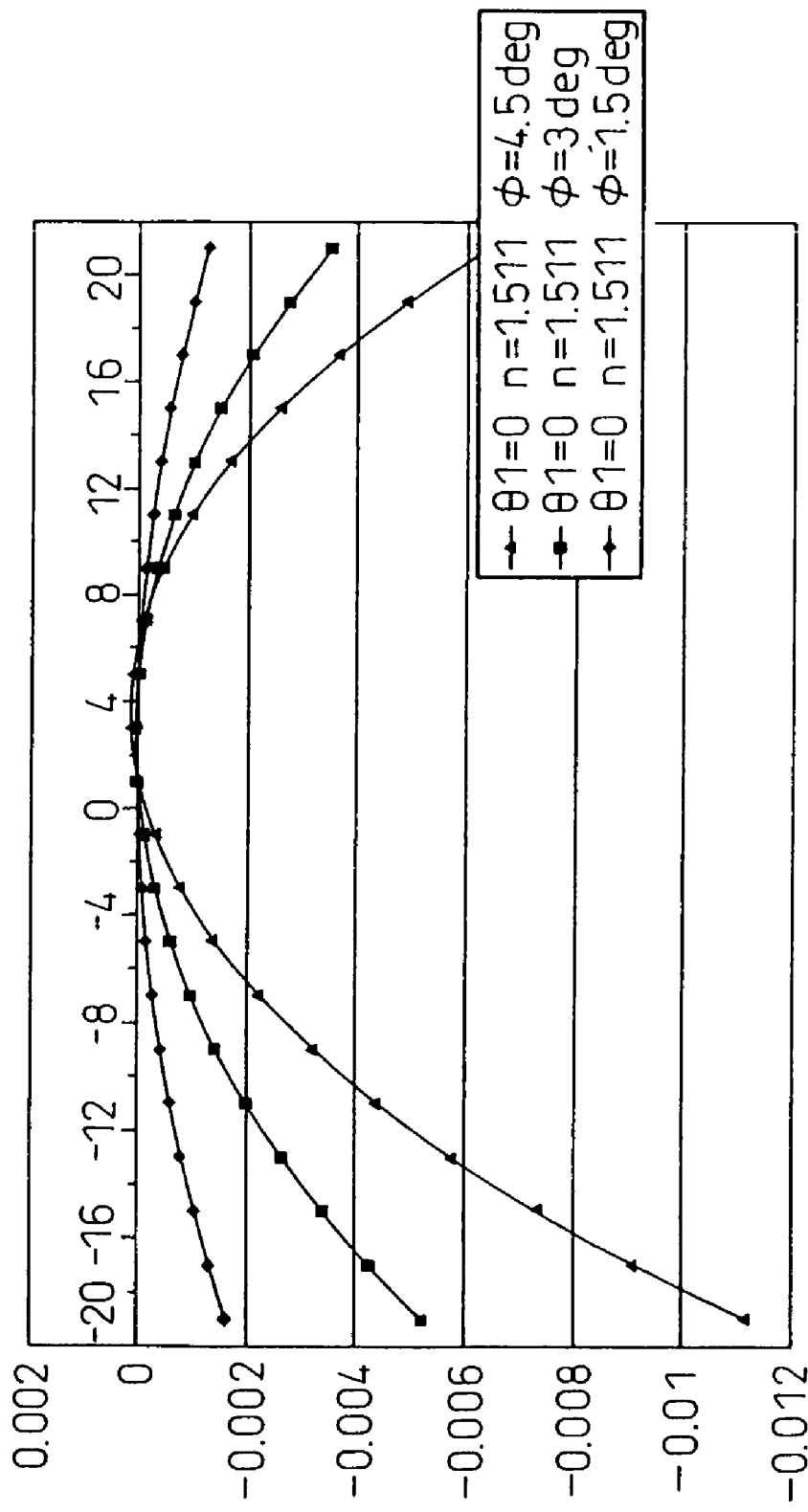
FIG. 42 is a view of the precision of angle adjustment.

An example of this angle adjuster is shown in FIG. 41. As shown in the figure, two wedge plates (P1 and P2) having predetermined inclination angles (φ) are combined in reverse directions. One (P1) is fixed, while one (P2) is rotatable (rotation angle θ). Note that in the figure, the arrows show the optical axes. With the single rotatable wedge plate, fine adjustment of the optical axis angle of a laser beam on the 1/10000 radian order is not possible, but with the above configuration using two wedge plates, fine adjustment of the optical axis angle on the 1/10000 radian order is possible. FIG. 42 shows the adjustment angles of an optical axis when using wedge plates with inclination angles φ of 1.5°, 3°, and 4.5°, making the incidence angle θ1 to the first wedge plate P1 (fixed) 0, making n (refractive index) 1.511, and rotating the second wedge plate P2 (abscissa θ2). When the inclination angle φ is 3°, the rotation angle θ2 is −10° to 14° and angle adjustment of about 1/1000 radian is possible. However, since the polarization directions of the optical axes are the same (for example, only minus side), when using the above angle adjuster, care and ingenuity may be required.

Figure 51:
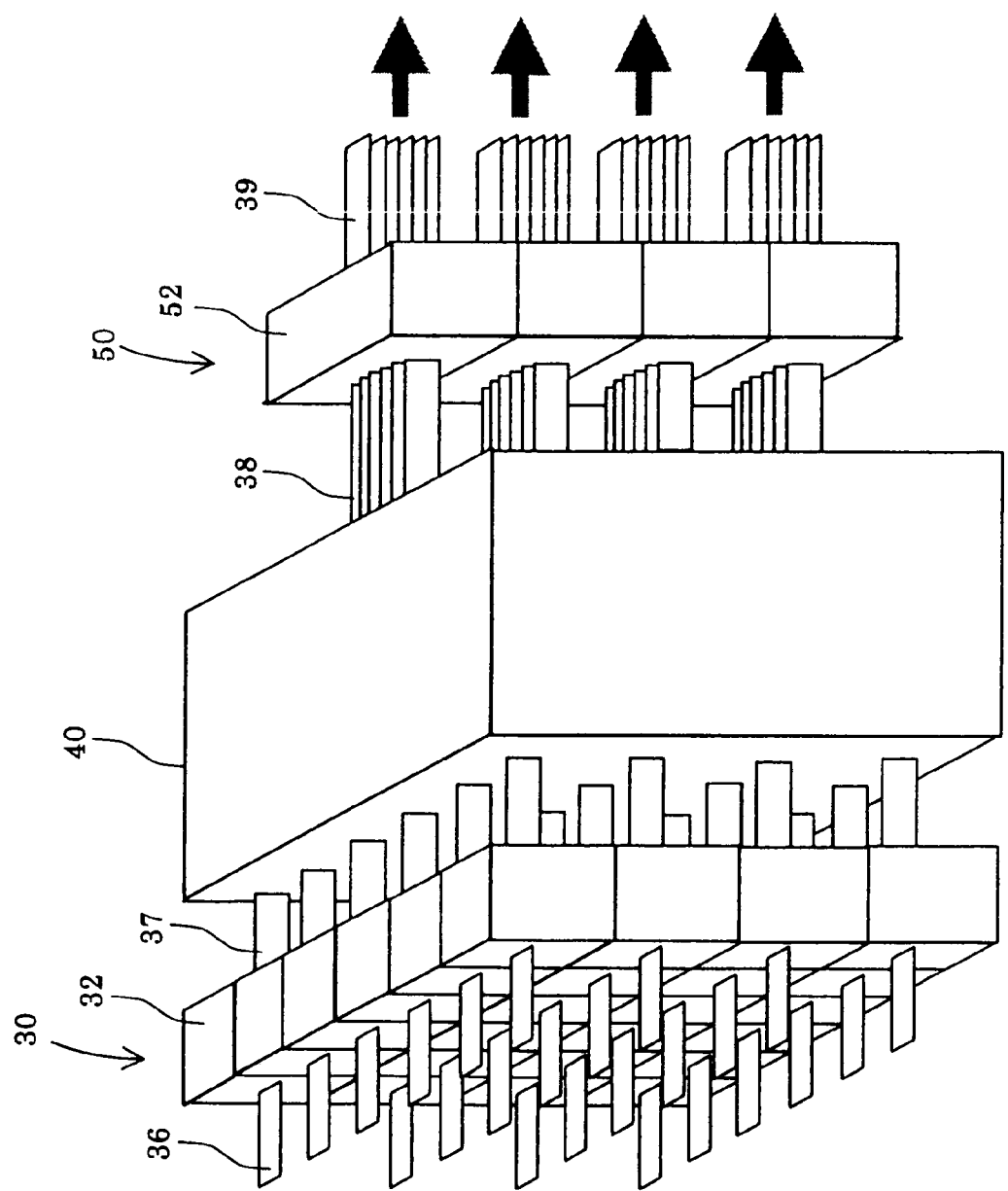
FIG. 51 is a schematic view illustrating a first beam converter, beam compressor, and second beam converter according to an exemplary embodiment of the present invention.

However, whatever the case, by using the above angle adjuster, it is possible to obtain the effect of the present invention more remarkably. FIG. 51 is a schematic view for explaining the optical system comprised of the first beam converter 30, the beam compressor 40, and the second beam converter 50 of the present invention. The first beam converter 30, as shown in FIG. 51, is formed by linking a suitable number of optical elements 32 in a two-dimensional array. The width and height of the first beam converter correspond to the emission face of the laser diode stack array. The optical elements 32, as shown in FIG. 51, have light receiving faces for receiving light face-perpendicular to the laser beams 36 having axial directions of the active layer stripes in the width direction of the first beam converter and output faces for outputting face-vertically the laser beams 37 processed to twist in their optical paths along the optical axes in the optical elements and be converted in optical paths.

The optical elements 32 for example horizontally receive laser beams 36 having directions of the long axes of the stripes emitted from the active layer stripes arranged at intervals of 800 μm and rotate the orientations of the cross-sections of the received laser beams about 90° to convert the beams so that the stripe axial directions become vertical. The optical elements 32 used for the first beam converter 30 generally are provided in a one-to-one correspondence with the active layer stripes 12 of the laser diode stack array 10 used for a laser device incorporating the first beam converter. Therefore, when for example using a laser diode stack array comprised of 20 arrays each comprised of 12 active layer stripes at intervals of 800 μm and stacked every 1.75 mm, the first beam converter becomes one comprised of arrays of 12 optical elements at intervals of 800 μm stacked every 1.75 mm.

However, as shown in the example shown in FIG. 9, when active layer stripes are arranged in a high density, it is deemed that the laser beams are emitted from a single continuous wave. By punctuating the laser received at the first beam converter at suitable intervals and rotating the laser beam by about 90° at each portion for use, it is possible to treat this as a laser diode linear array having ladder rung configuration emission parts having those intervals as widths and further as a laser diode stacked array comprised of these laser diode linear arrays stacked together. For this purpose, it may be sufficient to arrange a suitable number of optical elements in parallel two-dimensionally regardless of the number of active layer stripes.

To meet with the fact that the emission face of the laser diode stack array is a flat surface, it is convenient in terms of the structure of the laser device that the incidence faces and emission faces of the first beam converter 30 be arranged on single planes across the entirety of the first beam converter.

Figure 52:
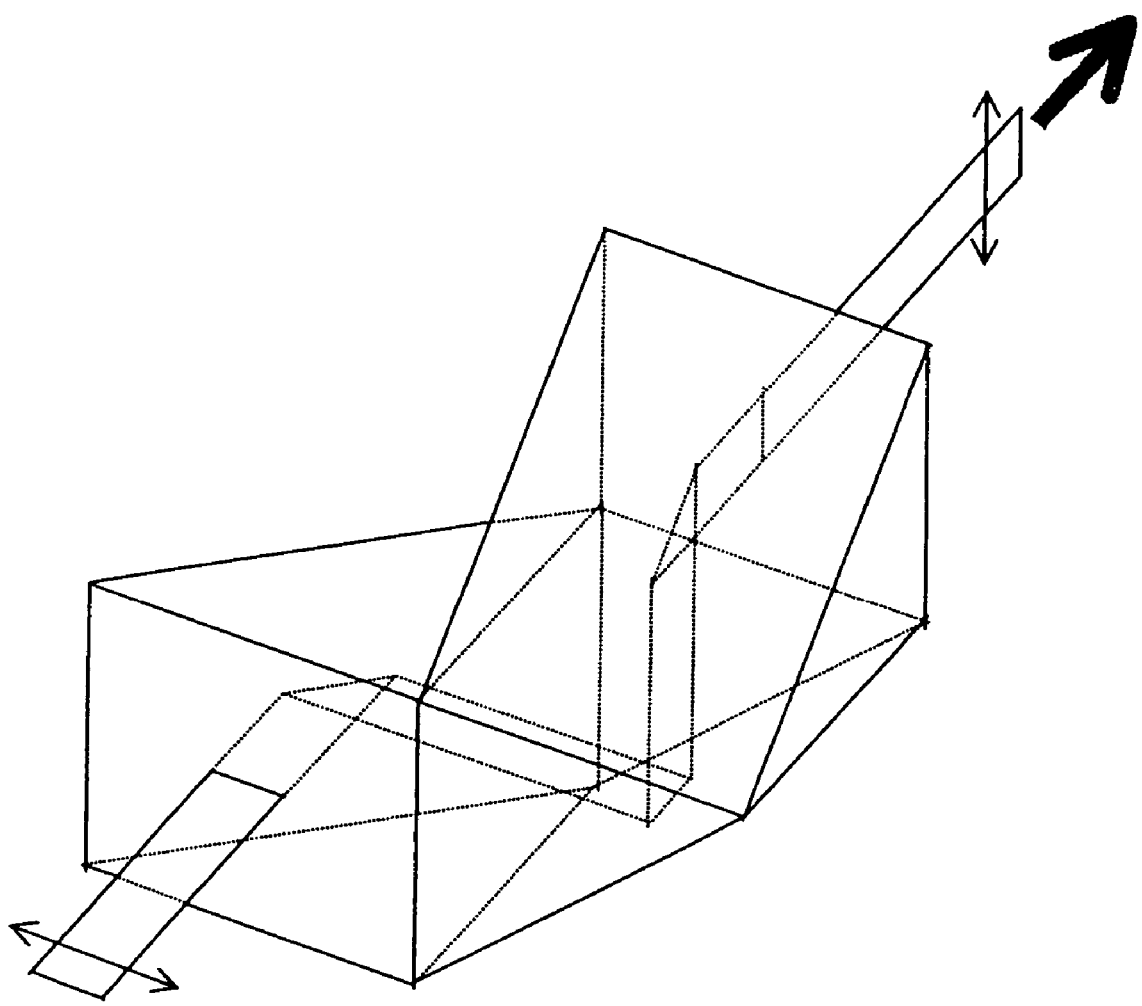
FIG. 52 is a view illustrating a principle of beam conversion by three reflection actions using three right angle prisms.
Figure 53:
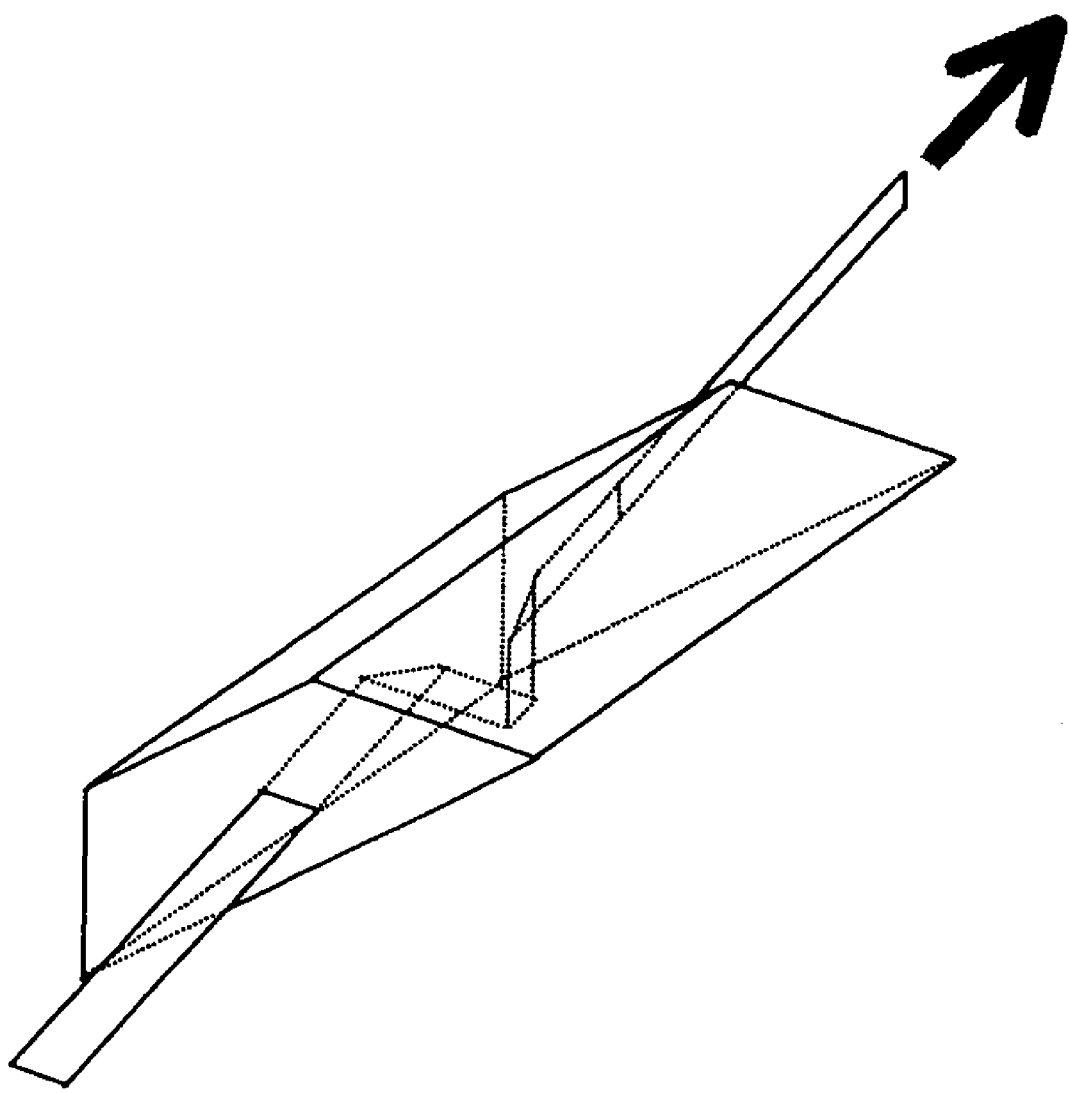
FIG. 53 is a perspective view of an optical element shaped as a prism and beam conversion by the same.
Figure 54:
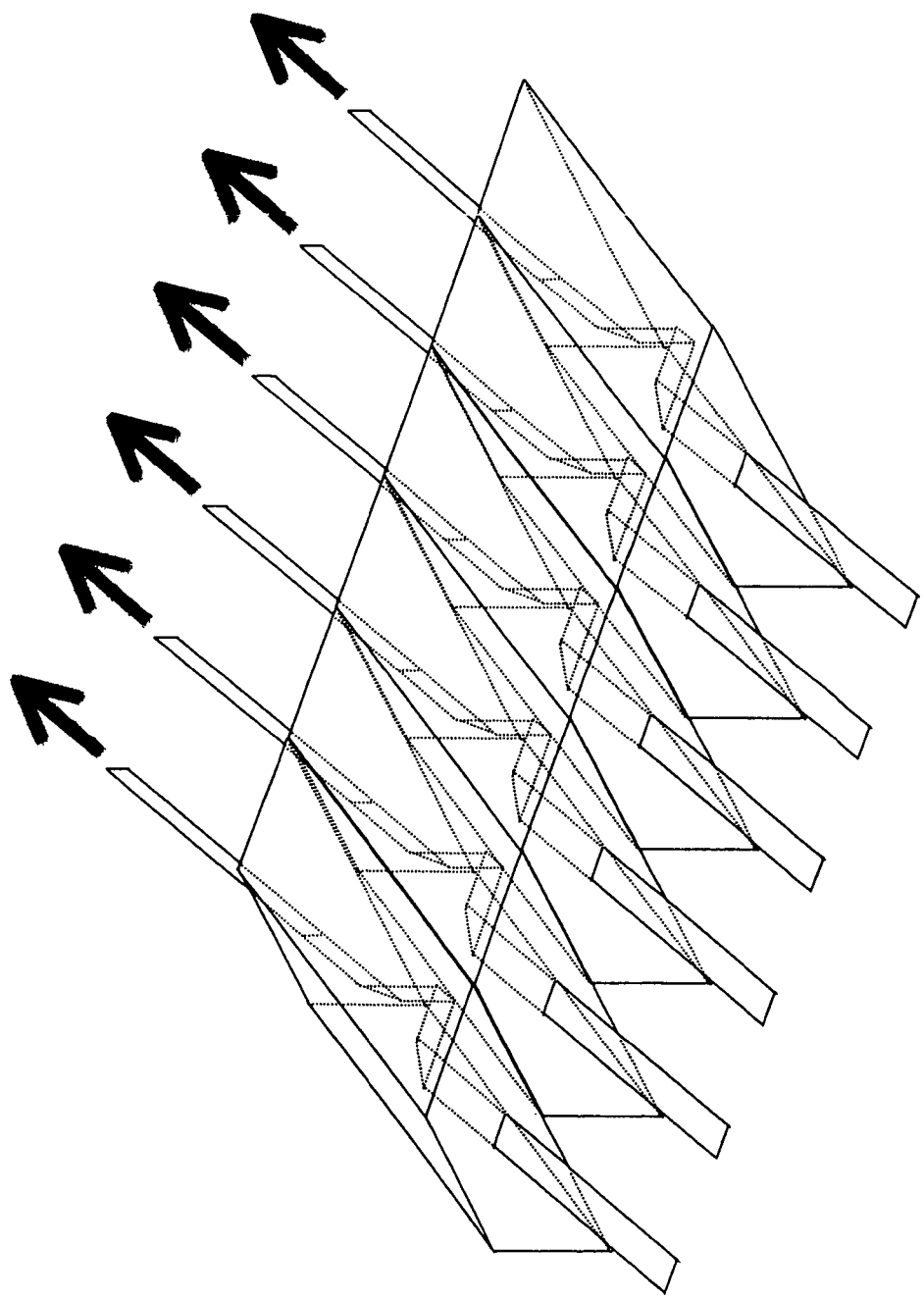
FIG. 54 is a perspective view of a beam converter obtained by arranging the optical elements of FIG. 53 in parallel and beam conversion by the same.

The above optical elements may be formed based on various principles as described in U.S. Pat. No. 5,513,201, the entire disclosure of which is incorporated by reference. First, there are ones based on twisting by three reflection actions. This is easy to understand if envisioning three right angle prisms. That is, three right angle prisms are combined as shown in FIG. 52. If the first right angle prism receives a horizontally oriented flat laser beam, the beam is converted to a vertically oriented flat laser beam twisted 90° by the three total reflection actions in the first, second, and third prisms and is emitted from the third right angle prism. The functions performed by the three right angle prisms can be achieved by a single prism element as shown in FIG. 53. If arranging such prism elements in a one-dimensional array to obtain a prism array such as in FIG. 54, an array of laser beams aligned linearly in a broken line configuration is received and is emitted converted to an array of laser beams aligned in parallel in a ladder rung configuration.

Figure 55:
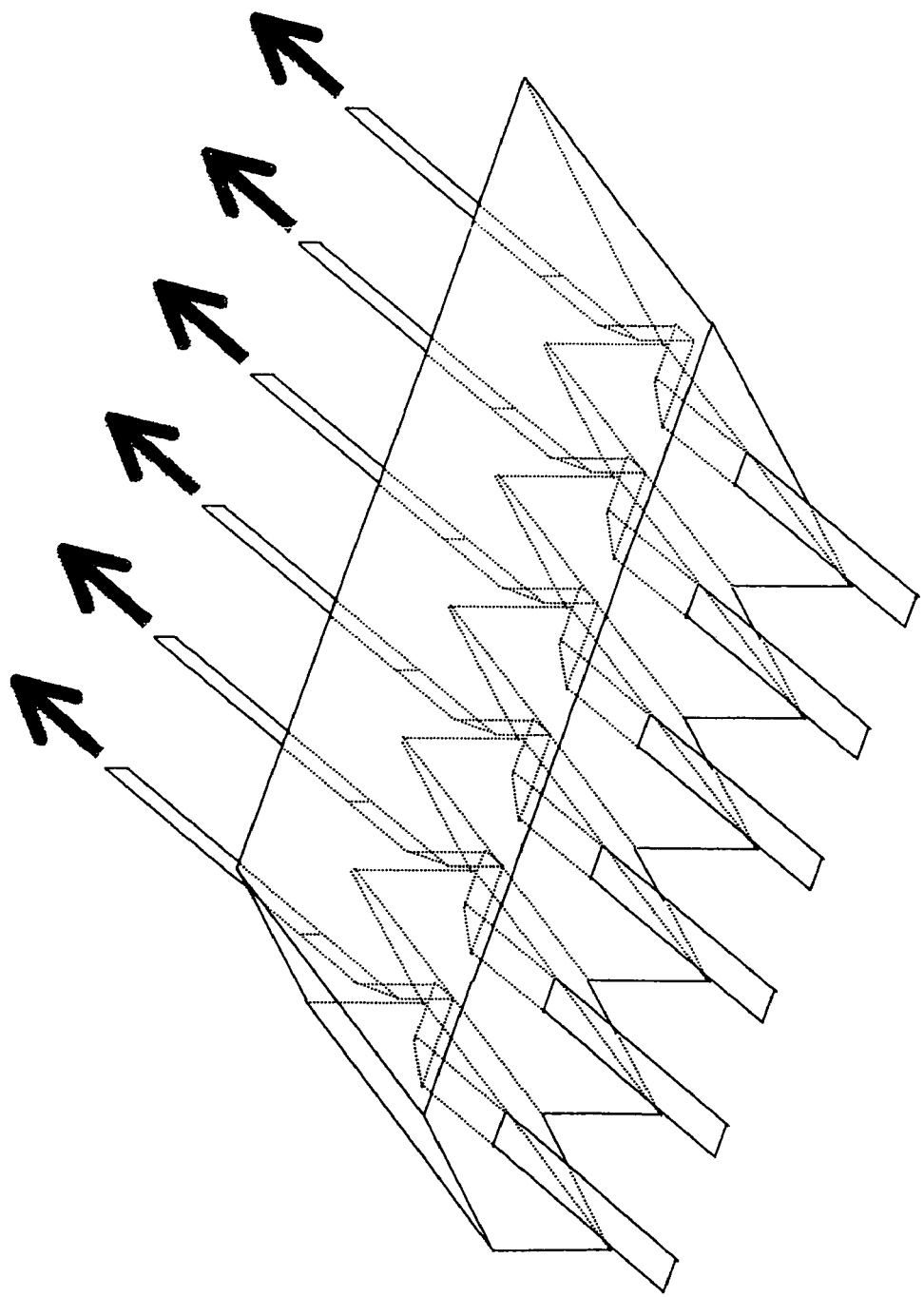
FIG. 55 is a perspective view of an integral beam converter equivalent to the beam converter of FIG. 54 and beam conversion by the same.
Figure 56:
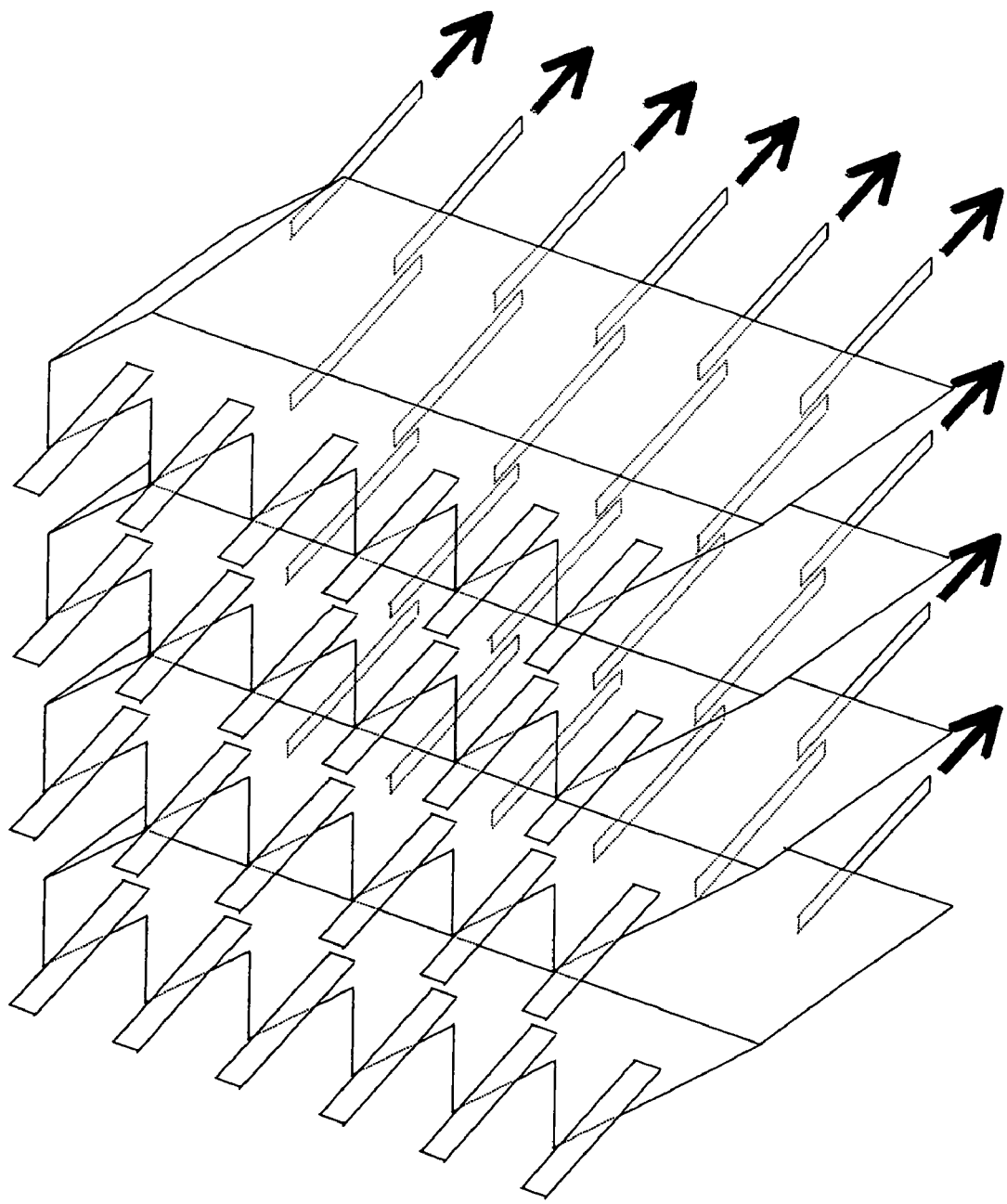
FIG. 56 is a perspective view of a first beam converter obtained by stacking beam converters of FIG. 55 and beam conversion by the same.

Such a prism array can be formed monolithically from a single glass plate as shown in FIG. 55. If vertically stacking such prism arrays to obtain a two-dimensional array of prism elements as shown in FIG. 56, an array of laser beams comprised of broken lines arranged in parallel is received and is emitted converted to an array of laser beams comprised of ladder rungs aligned in parallel. The three reflection actions do not necessarily have to be at right angles as in a right angle prism. In the final analysis, it is sufficient that an array of laser beams comprised of broken lines arranged in parallel be received and converted to an array of laser beams comprised of ladder rungs aligned in parallel. Further, the optical elements using reflection surfaces may also be not prisms, but suitably arranged reflection mirrors. When using reflection mirrors to form the beam converter, it is sufficient to form a mirror array so that the total reflecting faces of the prism array are used as the reflecting face. As the material, a metal, metal plated glass, reflective coated glass, plastic, silicon, etc. may be used.

Figure 57:
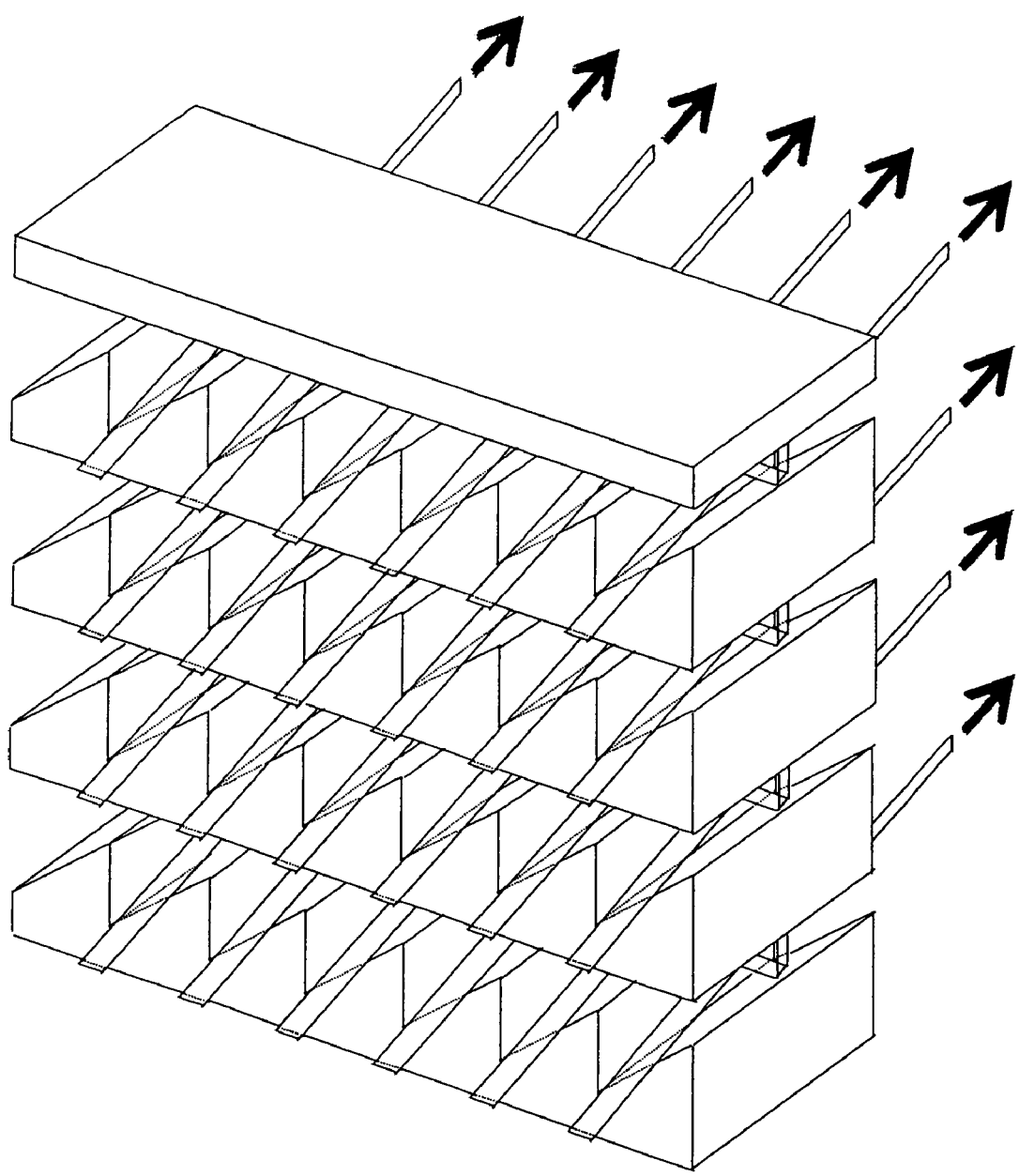
FIG. 57 is a perspective view of a first beam converter obtained by stacking mirror arrays and beam conversion by the same.

Fine optical elements can be produced by precision dies or produced by applying for example semiconductor production processes or LIGA processes. When using silicon crystals, processing also becomes easy is using the cleavage faces as reflecting mirror surfaces. If using a one-dimensional mirror array, an array of laser beams aligned linearly in a broken line configuration is received and is emitted converted to an array of laser beams arranged in parallel in a ladder rung configuration. If vertically stacking such mirror arrays to obtain a two-dimensional array of mirror elements as shown in FIG. 57, an array of laser beams comprised of broken lines aligned in parallel is received and is emitted converted to an array of laser beams comprised of ladder rungs aligned in parallel.

Figure 58:
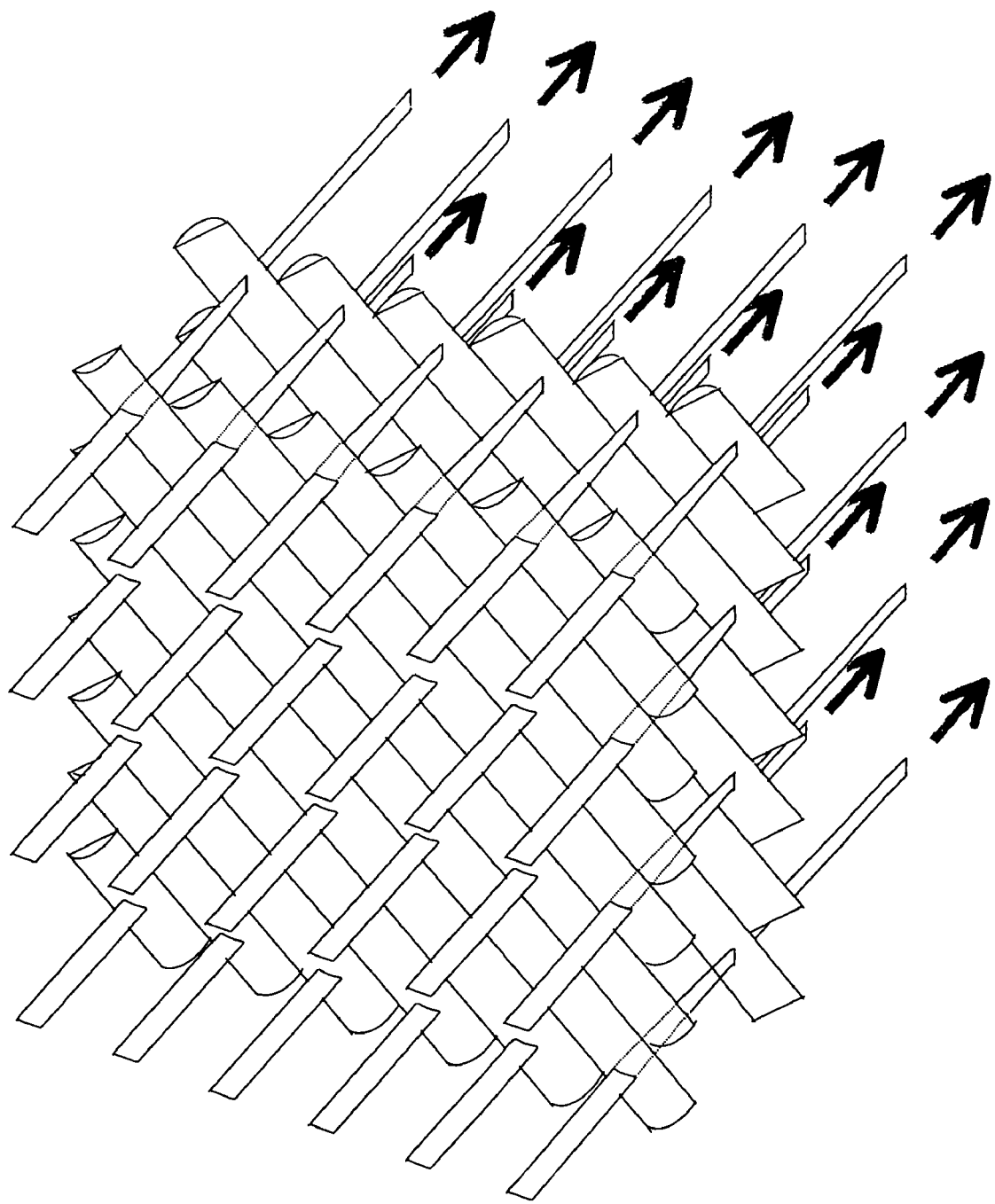
FIG. 58 is a perspective view of a first beam converter comprised of cylindrical lenses arranged in parallel and beam conversion by the same.

FIG. 58 is a view of a first beam converter comprised of cylindrical lenses aligned in parallel. The first beam converter is comprised of two parallel arrangements of cylindrical lenses inclined 45° in axes facing each other across a space having a suitable distance. The flat beams striking the incidence faces horizontally receive refractive forces differing depending on the incidence positions from the 45° inclined cylindrical lenses whereby they are rotated in flat axes and further are rotated in flat axes by a total of 90° by 45° inclined cylindrical lens and emitted from the emission faces. By using the first beam converter, the stripe beams from the laser diode stack array are substantially changed to an array of ladder rungs arranged in parallel. When the array of 45° inclined cylindrical lenses does not match the array of stripes of the adjoining LD linear array layers, the cylindrical lens array may be cut divided into different regions to correspond to the LD linear array layers and shifted to match with the stripes.

Figure 59:
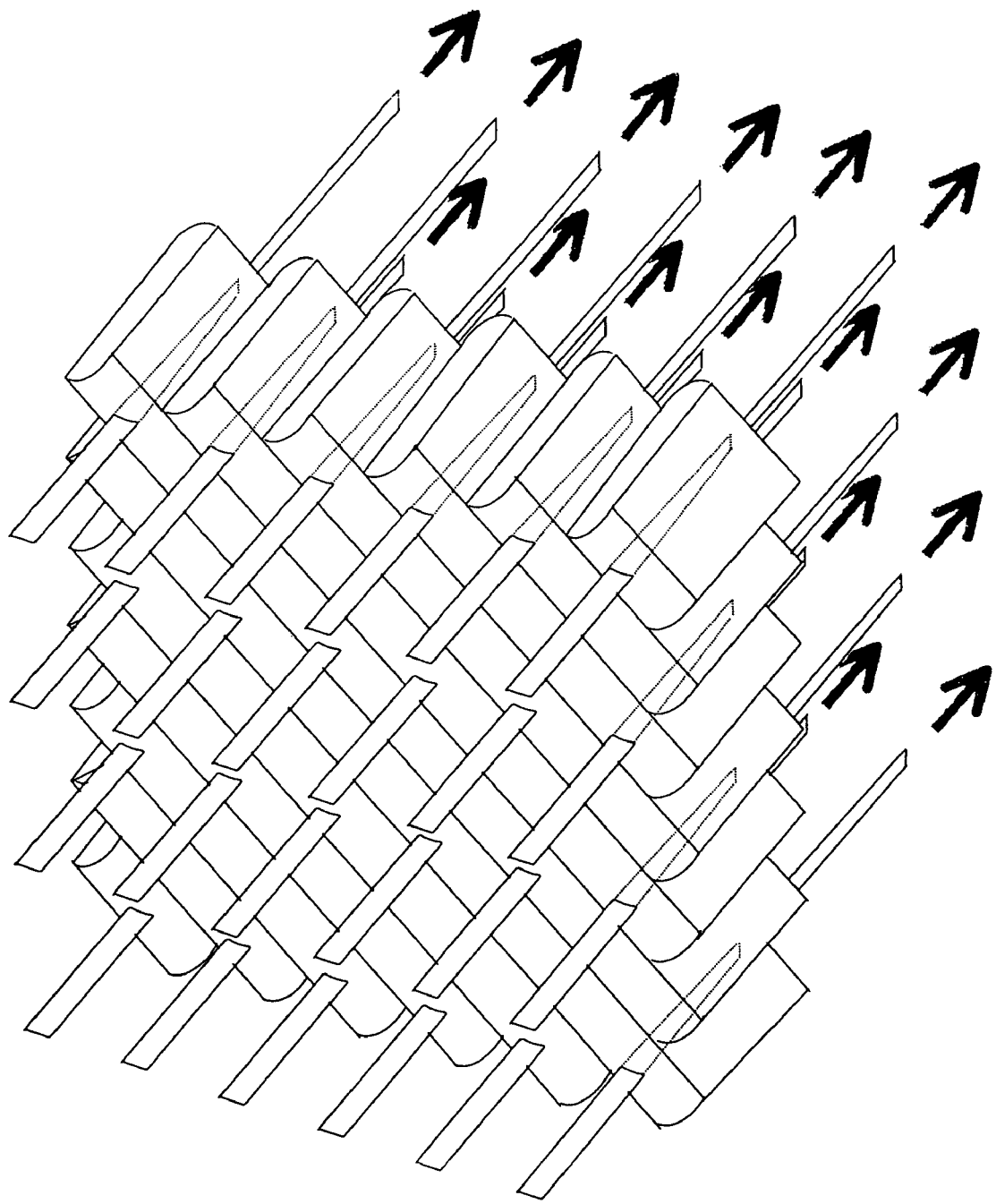
FIG. 59 is a perspective view of a first beam converter comprised of optical elements having an incidence face and emission face as cylindrical surfaces and beam conversion by the same.

FIG. 59 shows a first beam converter comprised of a plurality of joined optical glass optical elements with incidence faces and emission faces having cylindrical surfaces, having parallel side faces, and having dense insides. These optical elements are also types of cylindrical lenses. The optical elements are inclined 45° with respect to the horizontal plane. The flat beams striking the incidence faces horizontally receive different refractive forces arising at the cylindrical surfaces of the 45° inclined incidence faces whereby they are rotated in flat axes and further are rotated about 90° in flat axes at the 45° inclined cylindrical surfaces of the emission faces and emitted from the emission faces. By using the first beam converter, the stripe beams from the laser diode stack array are substantially changed to an array of ladder rungs arranged in parallel. When aligned with the intervals between stripe beams, there is no need for the side faces to be parallel faces. It is also possible to use cylindrical lenses with circular cross-sections. When the array of 45° inclined cylindrical lenses does not match the array of stripes of the adjoining LD linear array layers, in the same way as the above, the cylindrical lens array may be cut divided into different regions to correspond to the LD linear array layers and shifted to match with the stripes.

Figure 60:
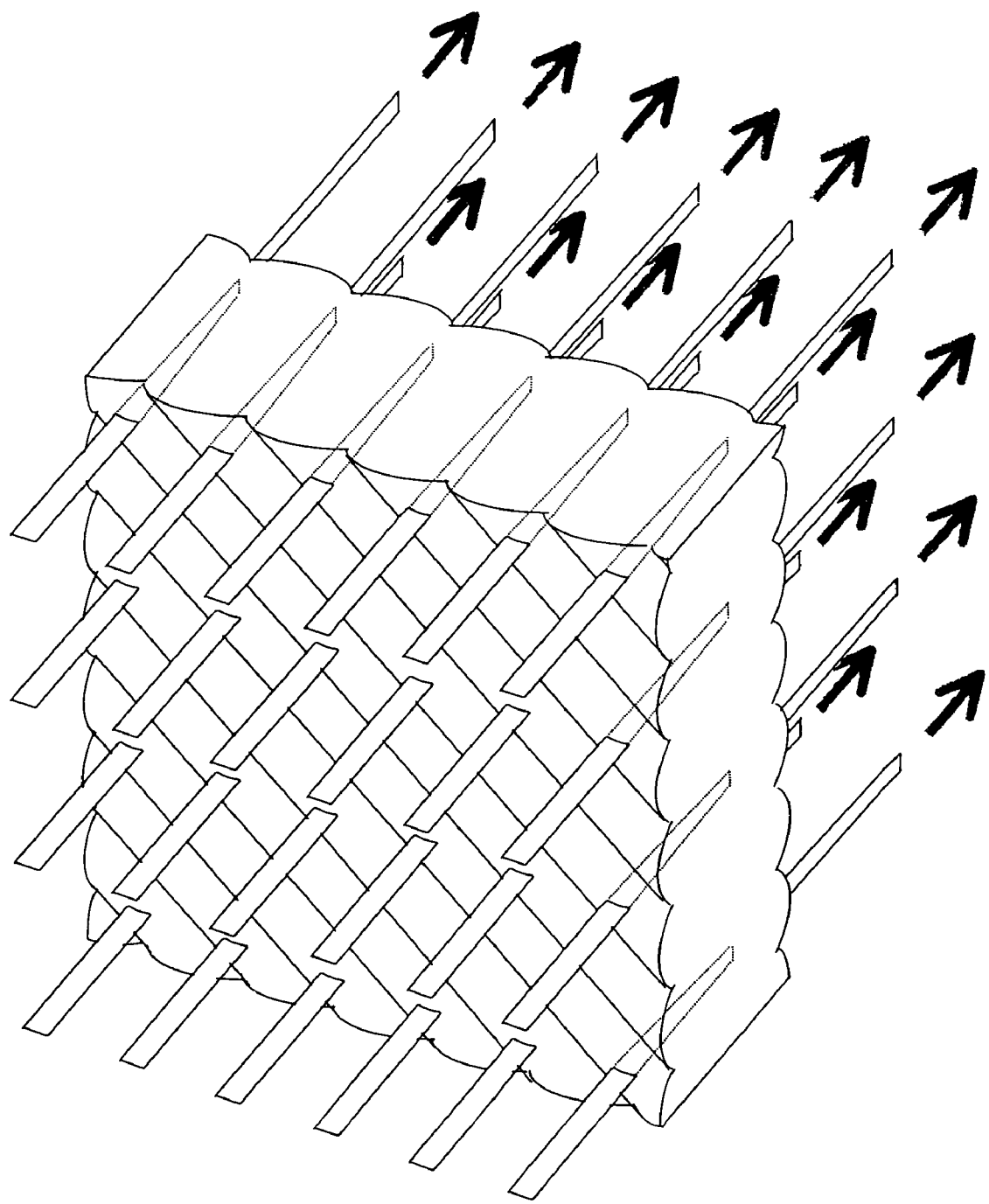
FIG. 60 is a perspective view of a first beam converter fabricated from a block of optical glass and beam conversion by the same.

FIG. 60 shows a first beam converter fabricated from a block of optical glass. This beam converter is comprised of an optical glass prism with a rectangular cross-section formed on its incidence face and emission face with a plurality of cylindrical surfaces inclined 45° in the same direction and has the same functions as the beam converter of FIG. 59. When the array of 45° inclined cylindrical surfaces does not match the array of stripes of the adjoining linear array LD layers, in the same way as the above, the cylindrical surface area may be cut divided into different regions to correspond to the LD linear array layers and shifted to match with the stripes.

Figure 61:
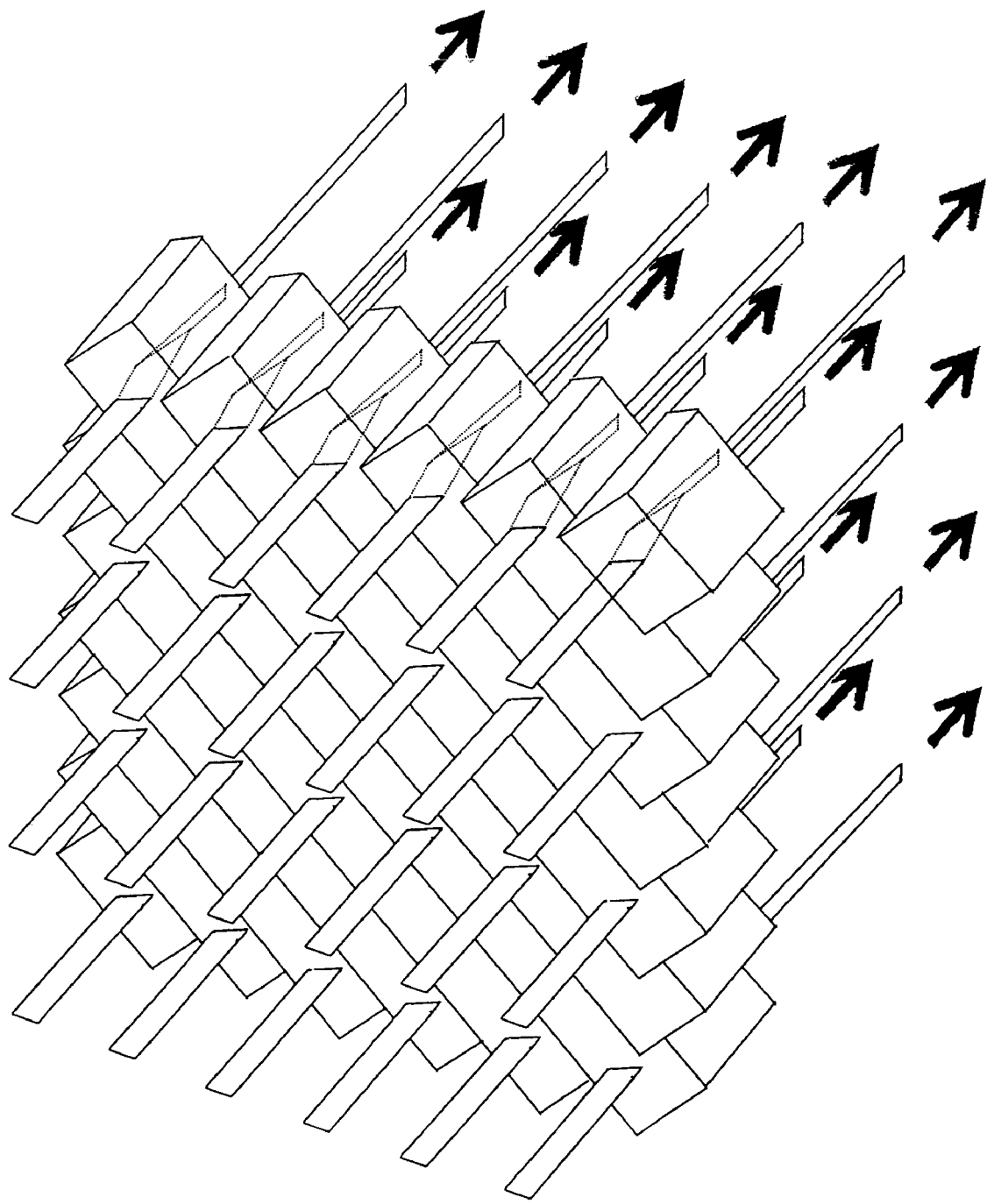
FIG. 61 is a perspective view of a first beam converter comprised of dub prisms arranged in parallel and beam conversion by the same.

FIG. 61 shows a first beam converter comprised of a plurality of dub prisms. The optical elements are inclined 45° with respect to the horizontal plane. The flat beams entering the incidence faces horizontally become flat beams emitted vertically at the emission faces since the reflection positions at the bottom surface differ depending on the incidence positions. Therefore, the beams are emitted with flat axes rotated about 90°. By using the first beam converter, the stripe beams from the laser diode stack array change to an arrangement of ladder rungs aligned in parallel. When joining adjoining prisms, if necessary, it is possible to give the bottom surface of the dub prism a reflective coating. The beam converter may also be one using optical elements utilizing diffraction.

Figure 62:
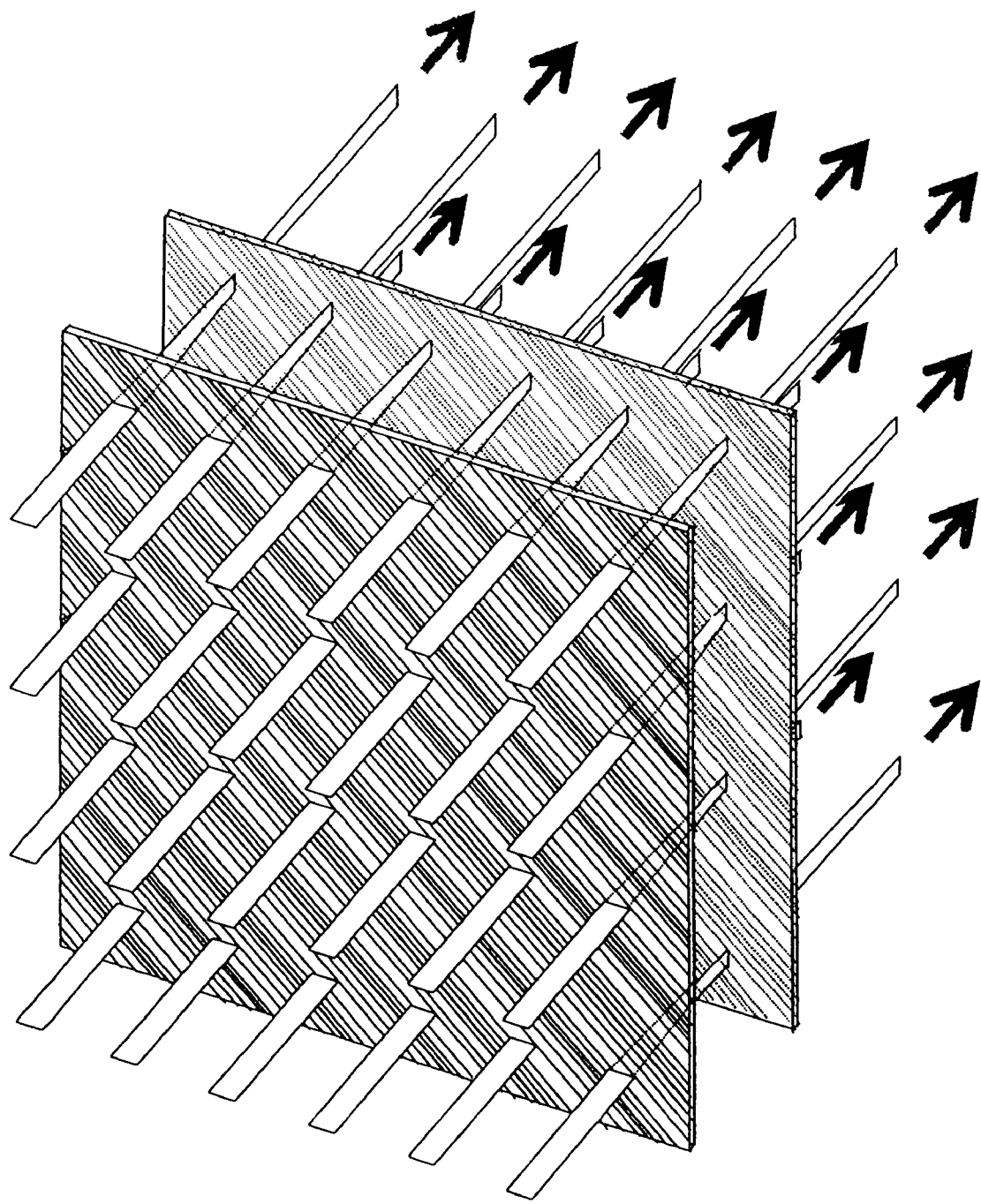
FIG. 62 is a perspective view of a first beam converter comprised of binary optic elements arranged in parallel and beam conversion by the same.

FIG. 62 is a view of an optical element utilizing binary optical elements. This optical element is comprised of a transparent plate provided with a plurality of grooves arranged with center axes inclined 45° and changing in depth in a direction perpendicular to the center axes symmetrically with respect to the center axes. The grooves change in depth so as to increase the diffraction angle the further from the centers to the outsides using diffraction. The stepped surface at the emission face is cut to be face symmetric with the stepped surface at the incidence face. The flat beams striking the incidence face horizontally receive refractive forces differing according to the incidence positions at the stepped surface with center axes inclined 45°, whereby the flat axes rotate. Further, from the emission face to the stepped surface with center axes inclined 45°, the flat axes rotate a total of 90° for emission of the beams from the emission face. Such a binary optical element is comprised of optical glass or plastic. In addition to production by a semiconductor production process, it may also be produced using dies.

Figure 63:
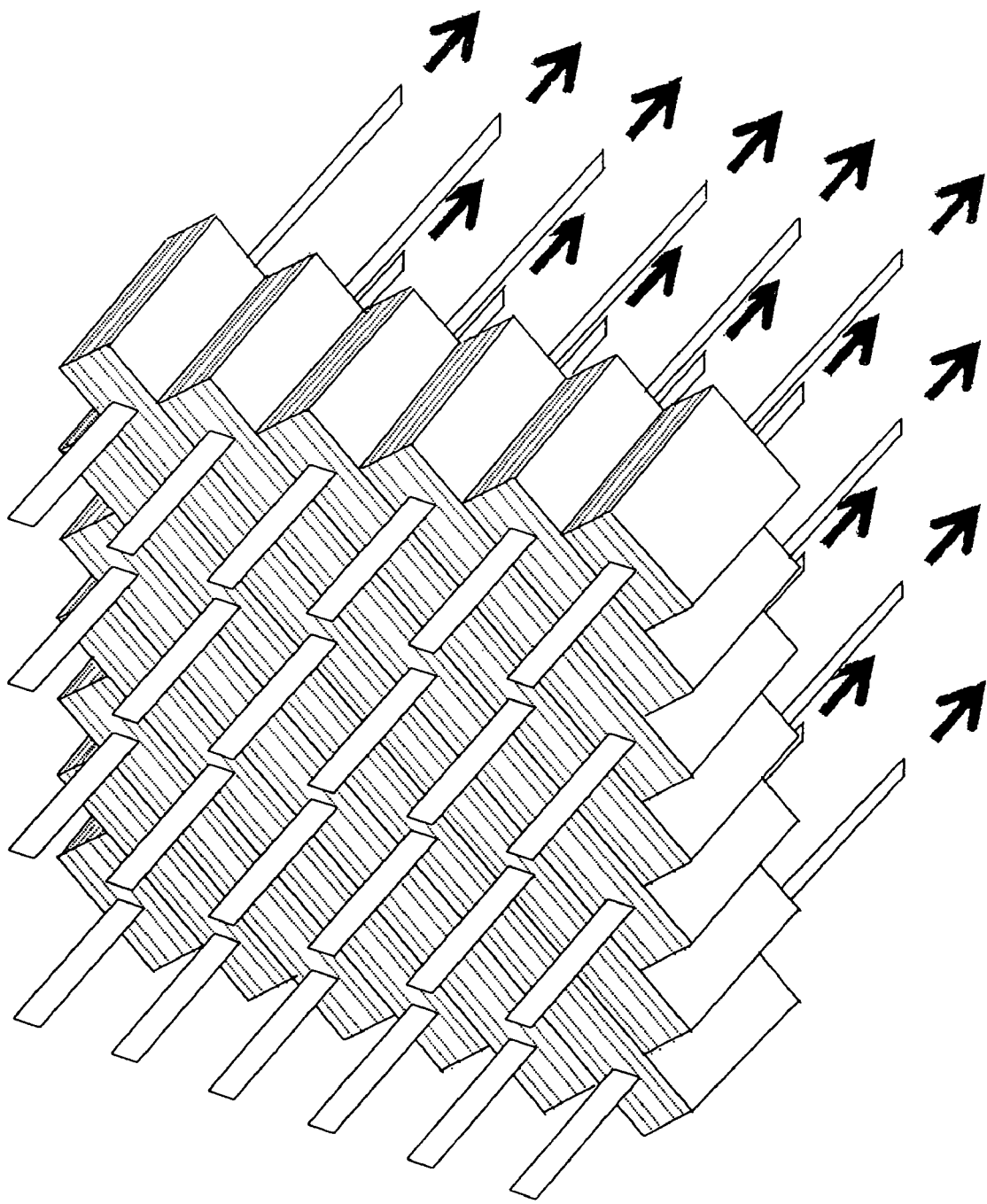
FIG. 63 is a perspective view of a first beam converter comprised of one-dimensional profile refractive index lenses arranged in parallel and beam conversion by the same.

FIG. 63 shows a first beam converter comprised of a plurality of joined one-dimensional profile refractive index lenses comprised of optical glass members becoming highest in refractive index at the center face and becoming lower in refractive index the closer to the side faces. The one-dimensional profile refractive index lens is inclined 45° with respect to the horizontal plane. The flat beams striking the incidence face horizontally receive refractive forces directed to the center face inclined 45°, whereby they are rotated about 90° in flat axes and emitted from the emission face.

Figure 64:
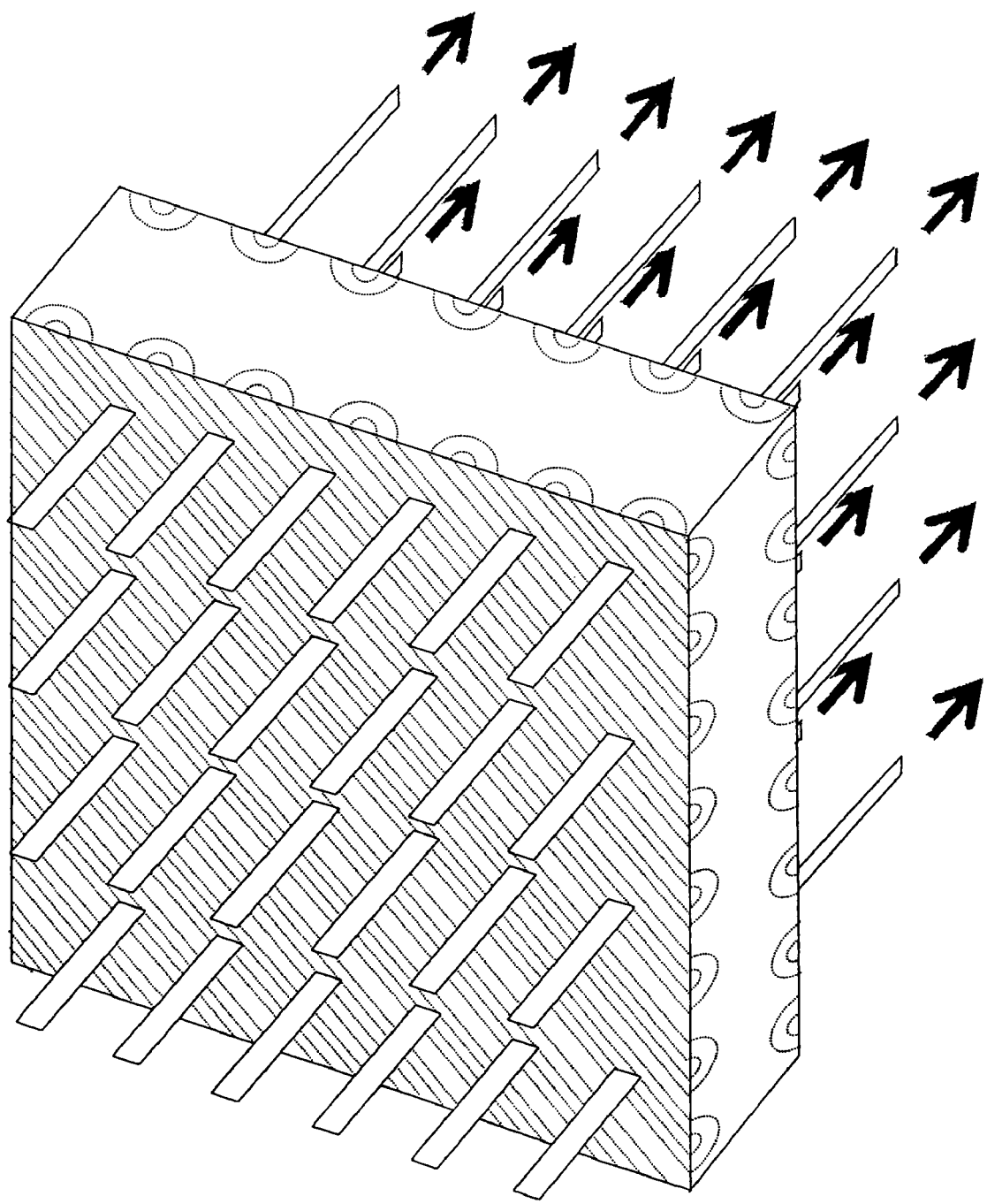
FIG. 64 is a perspective view of a first beam converter comprised of semicylindrical profile refractive index lens elements arranged in parallel and beam conversion by the same.

FIG. 64 shows a first beam converter comprised of an optical glass plate formed on its two surfaces with a plurality of pairs of substantially semicylindrical profile refractive index elements arranged facing each other in the same directions. The center axes of the semicylinders are inclined 45° with respect to the horizontal plane. The refractive index is highest at the center of the semicircles, while the refractive index becomes lower the further to the outsides. The two surfaces of the optical glass plate form the incidence face and the emission face. Flat beams striking the incidence face horizontally receive refractive forces differing according to the incidence positions due to profile refractive index lens elements inclined 45° and are emitted from the emission face rotated in flat axes about 90°.

Figure 65:
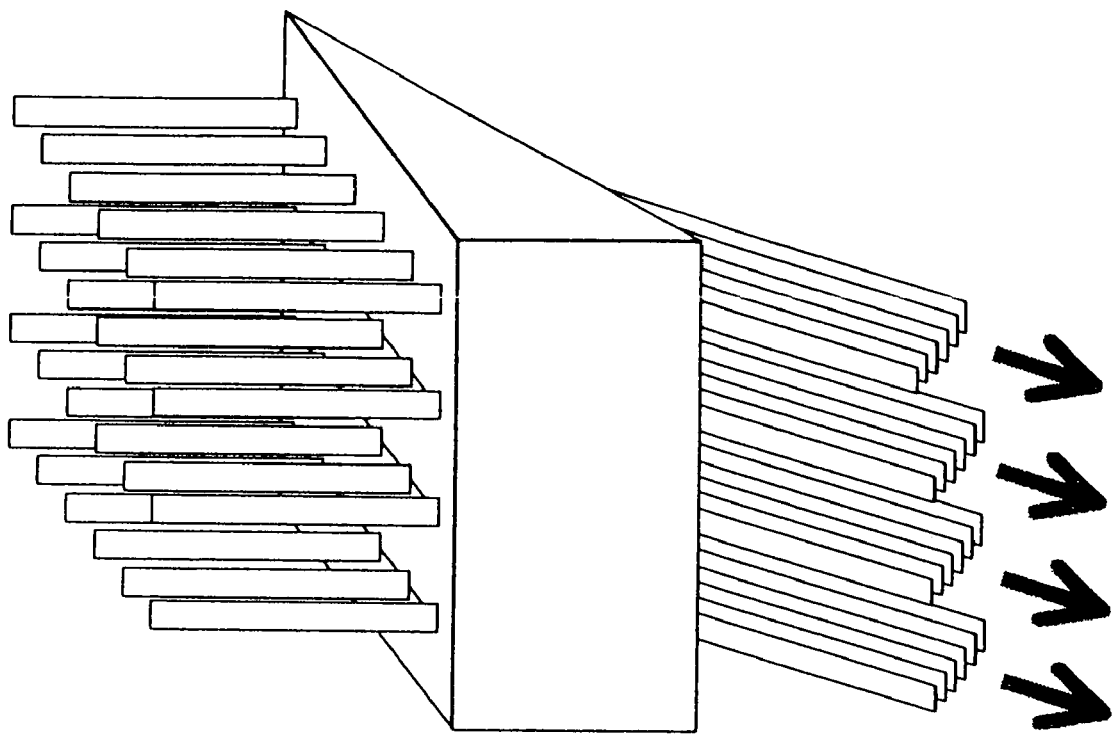
FIG. 65 is a perspective view of a beam compressor using an anamorphic prism and beam compression by the same.
Figure 66:
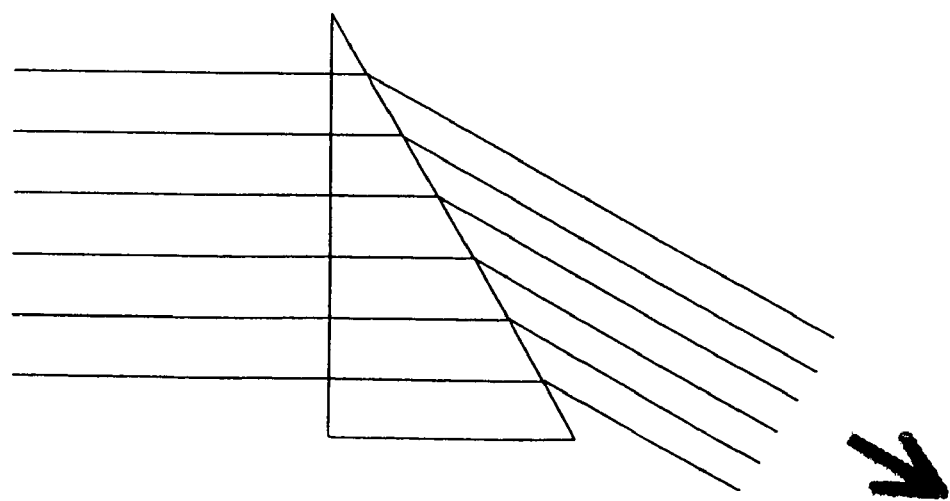
FIG. 66 is a plan view of the beam compressor shown in FIG. 65 and beam compression using the same.
Figure 67:
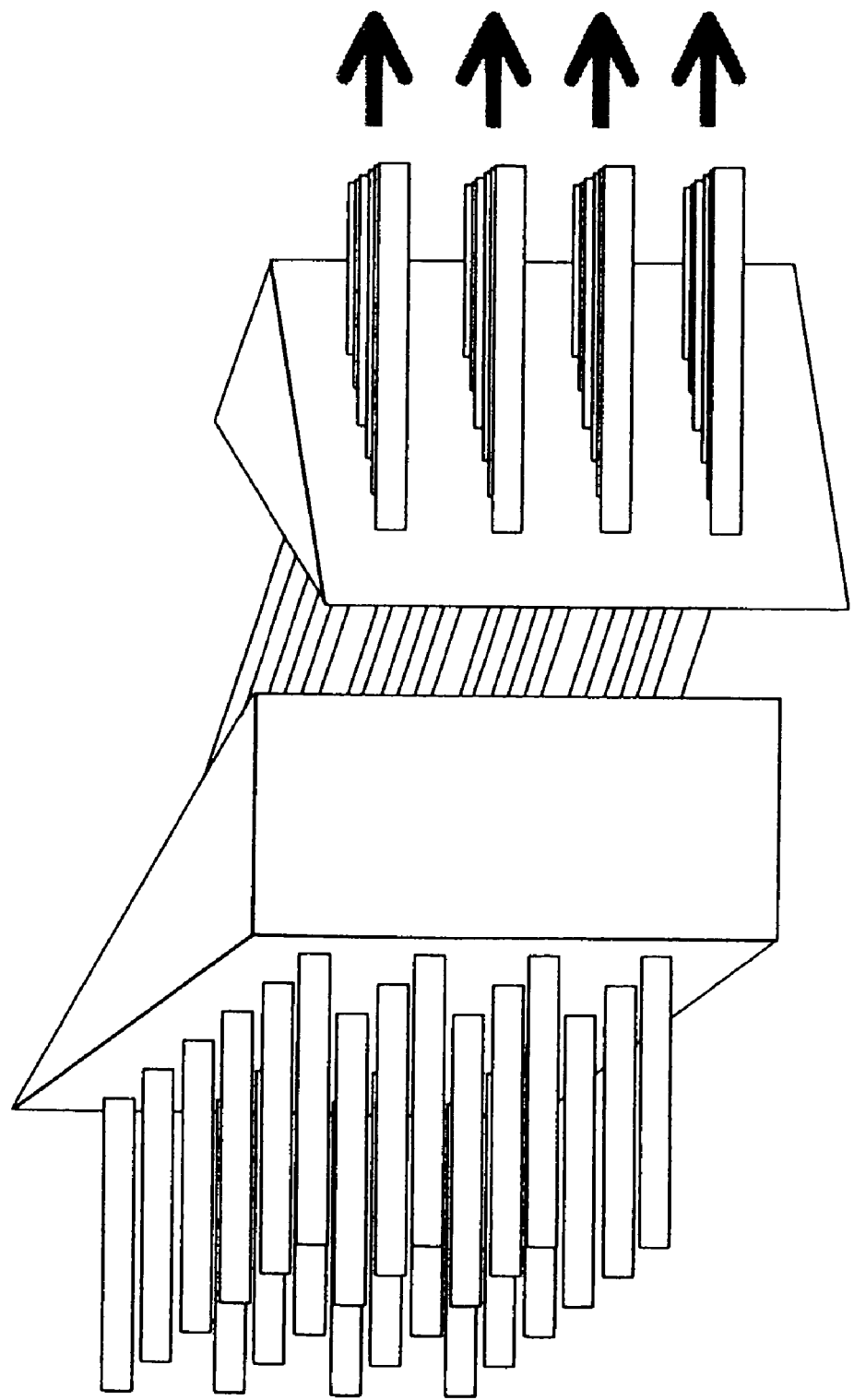
FIG. 67 is a perspective view of a beam compressor using an anamorphic prism pair using two anamorphic prisms and beam compression by the same.
Figure 68:
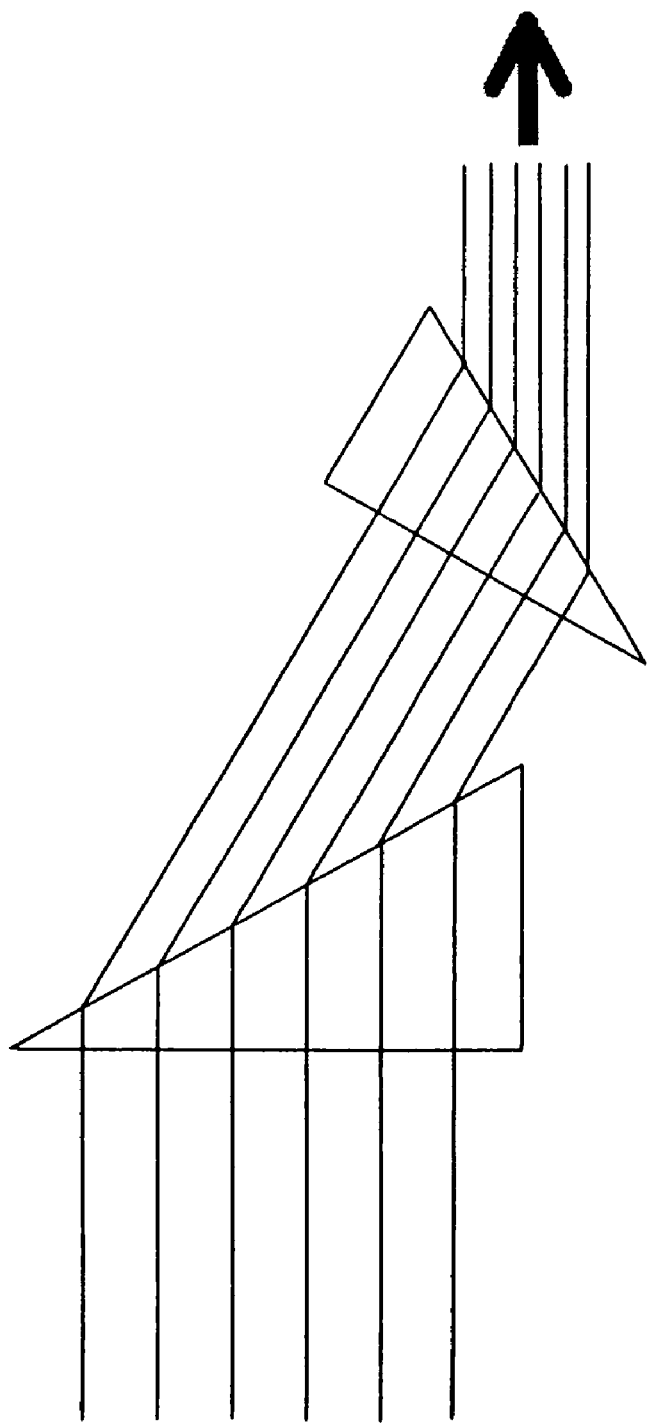
FIG. 68 is a plan view of the beam compressor shown in FIG. 67 and beam compression using the same.

FIG. 65 is a perspective view of a beam compressor using an anamorphic prism as an exemplary embodiment other than the reflection mirror type beam compressors or transmission lens type beam compressors shown up to here, while FIG. 66 is a plan view of the same. If the anamorphic prism is struck by parallel beams having certain widths, they are converted to beams shortened in width due to the refractive effect and emitted from the anamorphic prism. As shown in the perspective view of FIG. 67 and its plan view constituted by FIG. 68, if providing one more anamorphic prism to make an anamorphic prism pair, the two refraction effects further cause not only the width to be reduced, but also the emission optical axis to only move in parallel with the incidence optical axis and not change in direction. The group of laser beams comprised of a plurality of rows of laser beams, emitted from the first beam converter and arranged in parallel in a ladder rung configuration, further arranged in parallel to form a two-dimensional array is compressed by the anamorphic prism and converted to rows of laser beams where the individual rows of laser beams are compressed and the ladder rung intervals are shortened and as a result are converted to an arrangement wherein these compressed rows of laser beams are aligned in a single row. Further, if preparing another anamorphic prism pair and using a total of four anamorphic prisms, it is possible to position the emission optical axis in front of the incidence optical axis. Of course, if a change in the orientation of the optical axis is not minded, it is also possible to use just one anamorphic prism.

The second beam converter 50, as shown in FIG. 51, can be formed by linking a number of optical elements in a one-dimensional array corresponding to the number of stack layers of the laser diode stack array. The optical elements 52 used for the second beam converter 50 are provided in a one-to-one correspondence with the compressed rows of laser beams emitted from the beam compressor 40. When not using the first beam converter, but using the first beam compressor to first compress the fast axis components, the second beam converter divides and rotates the slow axis components. This is similar to the case of the quasi-CW LDs being divided and rotated by the first beam converter. The optical elements 52 twist the incident laser beams 90° by the same principle as the optical elements 32 used for the first beam converter 30. Therefore, when the group of laser beams comprised of the compressed rows of parallel laser beams further aligned linearly is emitted from the beam compressor and enters the second beam converter, the compressed rows of parallel laser beams are twisted 90° and as a result become an arrangement wherein all of the laser beam elements are aligned in parallel in a single row. The above optical elements can be formed based on the various principles used for the first beam converter.

Figure 69:
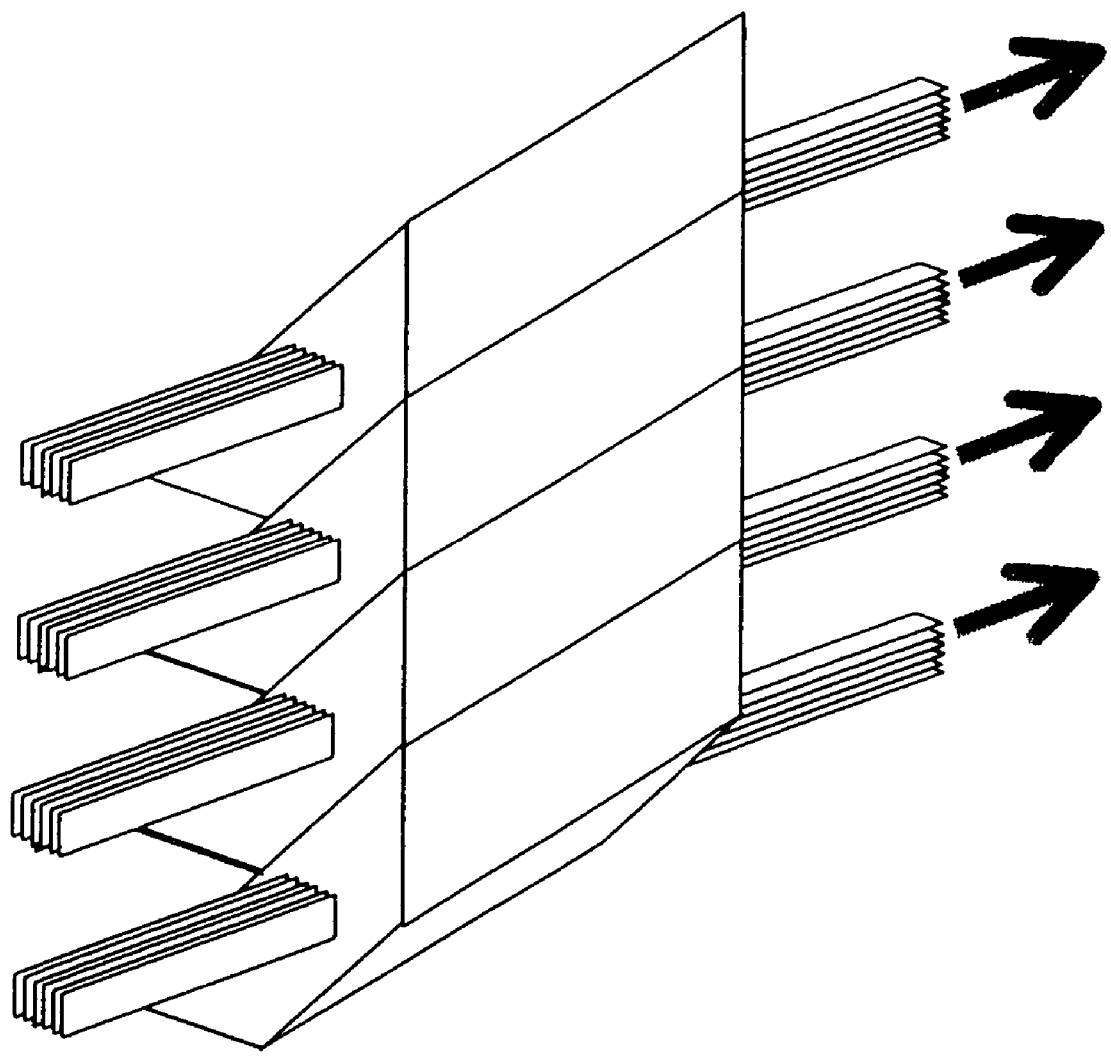
FIG. 69 is a perspective view of a second beam converter comprised of an optical element having a prism shape and beam conversion by the same.
Figure 70:
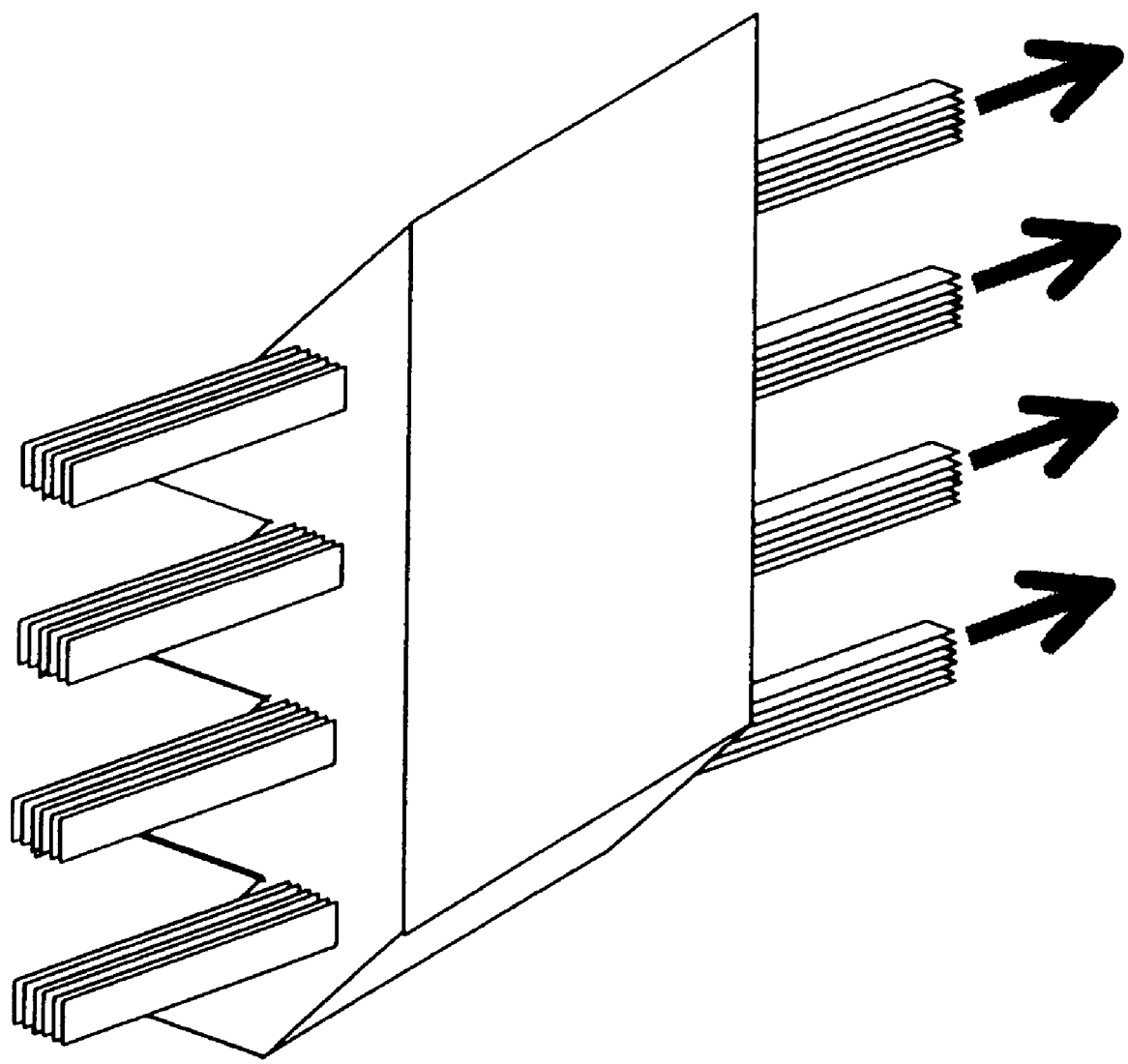
FIG. 70 is a perspective view of an integral second beam converter equivalent to the beam converter of FIG. 69 and beam conversion by the same.

First, there are ones based on twisting by three reflection actions. As shown in FIG. 69, if arranging in a one-dimensional array prism elements which receive vertically oriented flat laser beams arranged in parallel horizontally and emit horizontally oriented flat laser beams twisted 90° by three reflection actions and arranged in parallel vertically, the group of laser beams comprised of the compressed rows of parallel laser beams further aligned linearly is received and is emitted converted to an arrangement where all laser beam elements are aligned in parallel in a single row. Such a one-dimensional array can be formed monolithically from a single glass substrate as shown in FIG. 70.

Figure 71:
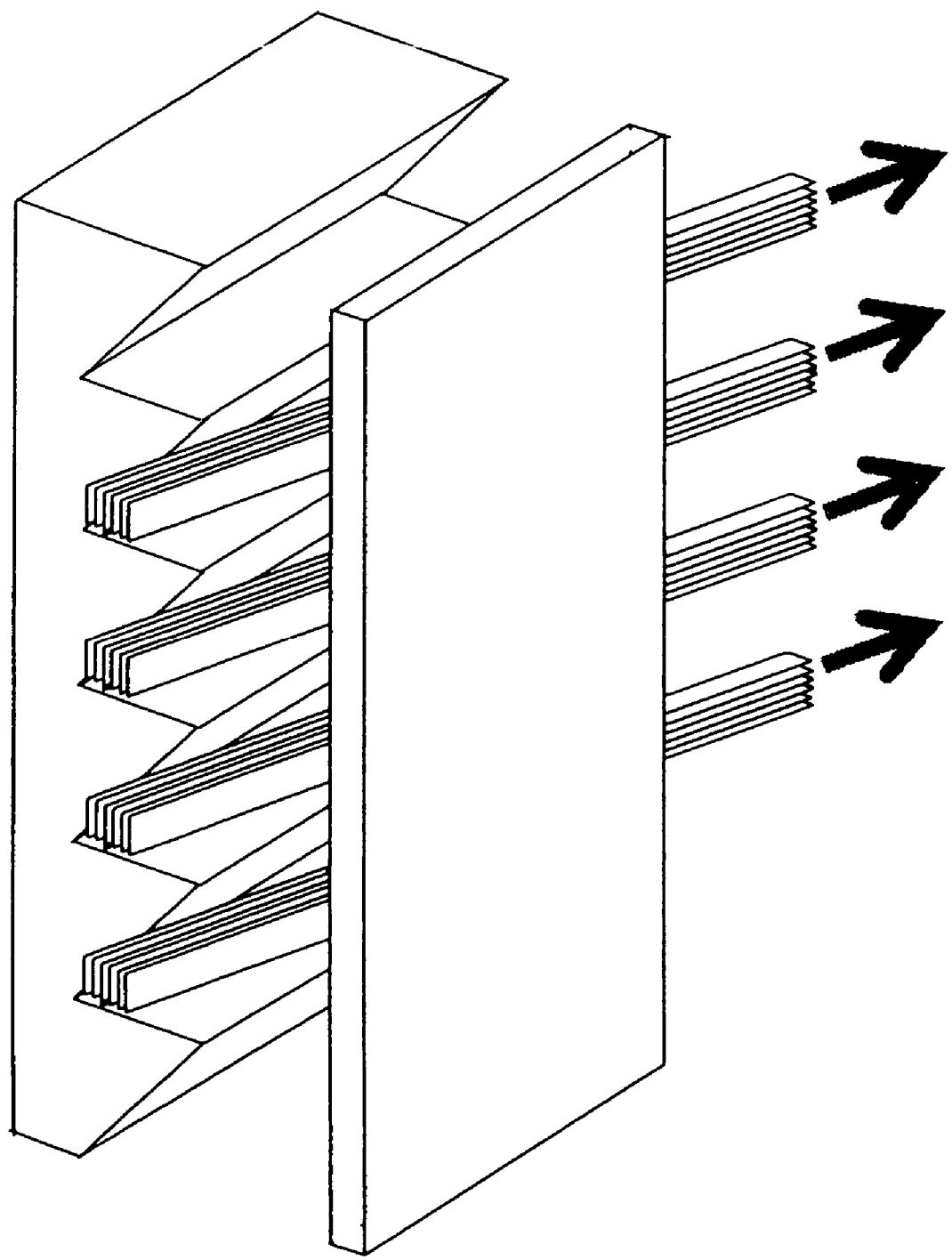
FIG. 71 is a perspective view of a second beam converter comprised of mirror elements arranged in parallel and beam conversion by the same.

The three reflection actions do not necessarily have to be at right angles as in a right angle prism. In the final analysis, it is sufficient that the group of laser beams comprised of the compressed rows of parallel laser beams and aligned linearly be received and converted to an arrangement where all laser beam elements are aligned in parallel in a single row in the same way as the first beam converter. Further, the optical elements using reflecting faces may also be not prisms, but suitably arranged reflection mirrors. As shown in FIG. 71, by arranging in a one-dimensional array the mirror elements from which horizontally oriented flat laser beams twisted 90° by three reflection actions are emitted aligned vertically, a group of laser beams comprised of compressed rows of parallel laser beams further aligned linearly is received and is emitted converted to an arrangement where all laser beam elements are aligned in parallel in a single row.

Figure 72:
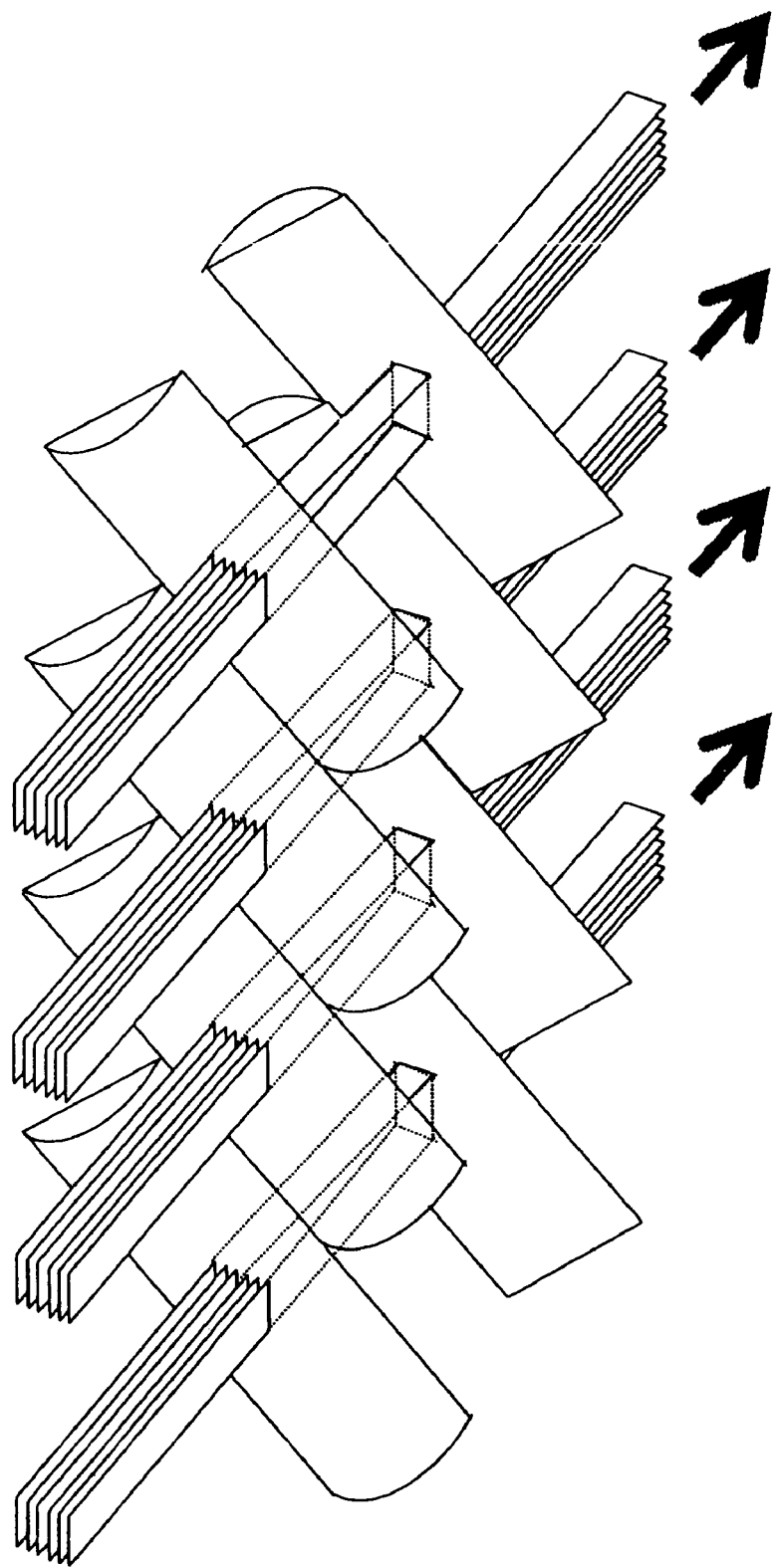
FIG. 72 is a perspective view of a second beam converter comprised of cylindrical lenses arranged in parallel and beam conversion by the same.

FIG. 72 is a view of a second beam converter comprised of cylindrical lenses arranged in parallel. This beam converter is comprised of parallel arrangements of cylindrical lenses, inclined in axes by 45°, arranged facing each other across a space having a suitable distance.

The compressed row of parallel beams striking the incidence faces horizontally receive refractive forces differing according to the incident positions at the 45° inclined cylindrical lenses, whereby a row of beams is rotated in cross-section. The row of beams is rotated a total of about 90° in cross-section by the cylindrical lenses inclined 45° from the emission faces and emitted from the emission faces. By using the second beam converter, the compressed row of parallel laser beams from the beam compressor and further the linearly arranged group of laser beams is substantially converted to an arrangement where all laser beams are aligned in parallel in one row in a ladder rung configuration. At such time, there is no need for the distance between all ladder rungs to be identical.

Figure 73:
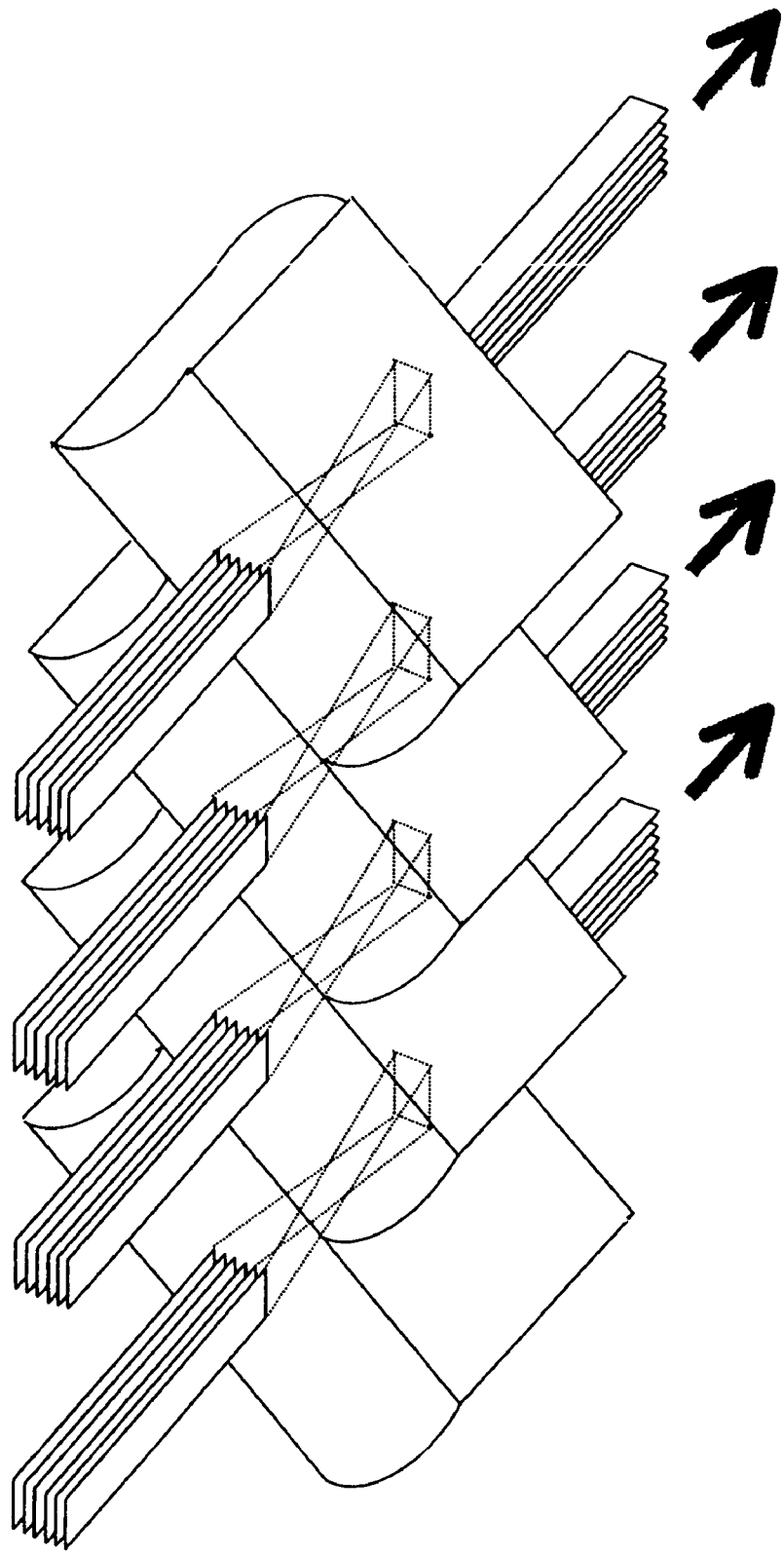
FIG. 73 is a perspective view of a second beam converter comprised of an optical element having an incidence face and an emission face as cylindrical surfaces and beam conversion by the same.

FIG. 73 shows a beam converter comprised of a plurality of joined optical glass optical elements with incidence faces and emission faces having cylindrical surfaces, with parallel side faces parallel, and with dense insides. The optical elements are inclined 45° with respect to the horizontal plane. The compressed row of laser beams striking the incidence faces horizontally receives different refractive forces occurring at the cylindrical surfaces of the 45° inclined incidence faces, whereby a row of beams is rotated in cross-section. The row of beams is rotated about 90° in cross-section at the 45° inclined cylindrical surfaces of the emission faces and emitted from the emission faces. By using the second beam converter, the compressed row of parallel laser beams from the beam compressor and further the linearly arranged group of laser beams are substantially converted to an array in which all laser beams are aligned in parallel in a single row in a ladder rung configuration. At this time, there is no need for all of the distances between ladder rungs to be the same. When aligning the distances between the compressed row of parallel laser beams and the adjoining rows of beams, the side faces do not have to be parallel faces. It is also possible to utilize a cylindrical lens with a circular cross-section.

Figure 74:
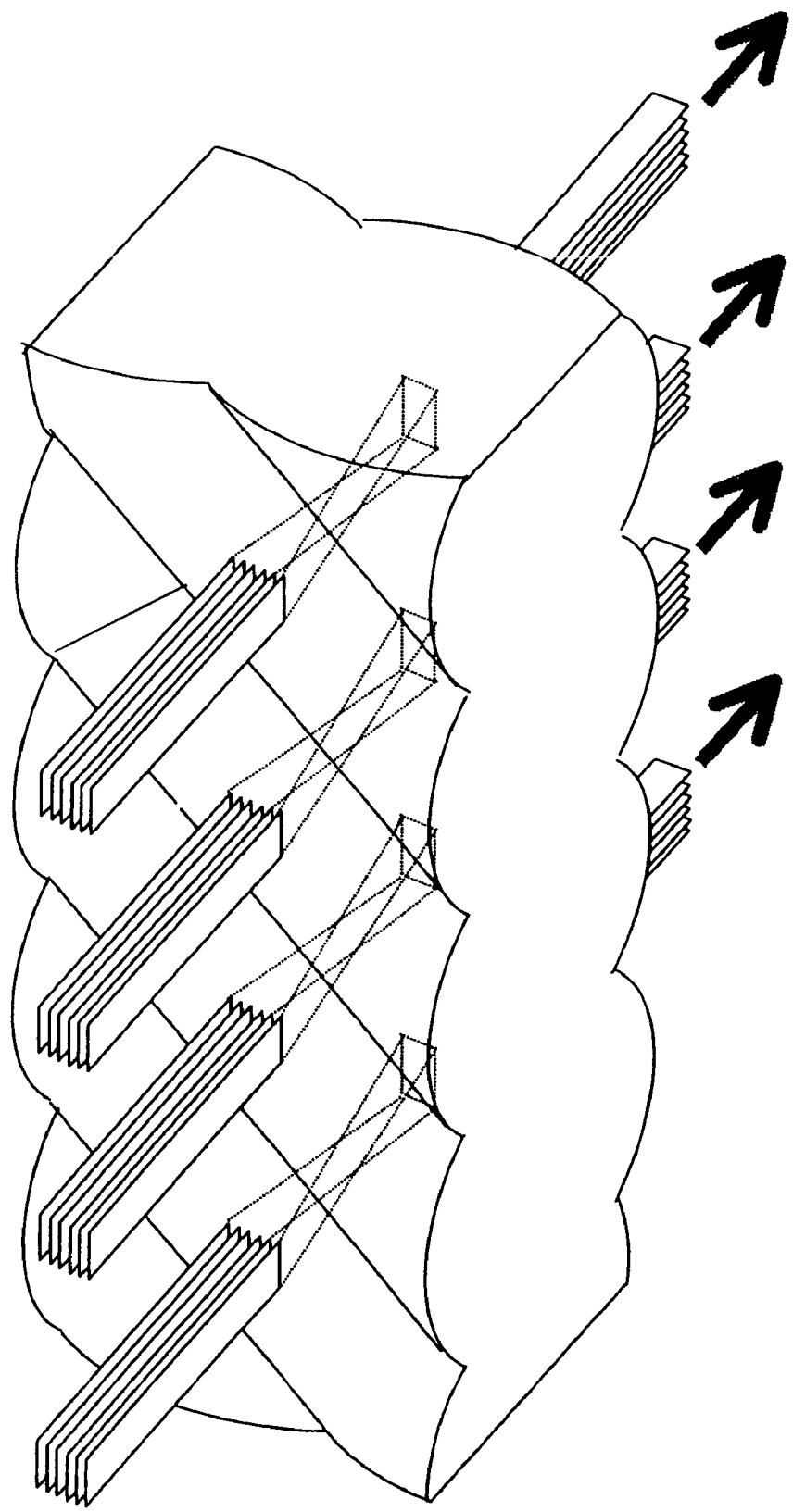
FIG. 74 is a perspective view of a second beam converter fabricated from a block of optical glass and beam conversion by the same.

FIG. 74 shows a second beam converter fabricated from a block of optical glass. This beam converter is comprised of an optical glass prism with a rectangular cross-section and formed with a plurality of cylindrical surfaces inclined 45° in the same direction at the incidence face and emission face and has the same function as the second beam converter of FIG. 13.

Figure 75:
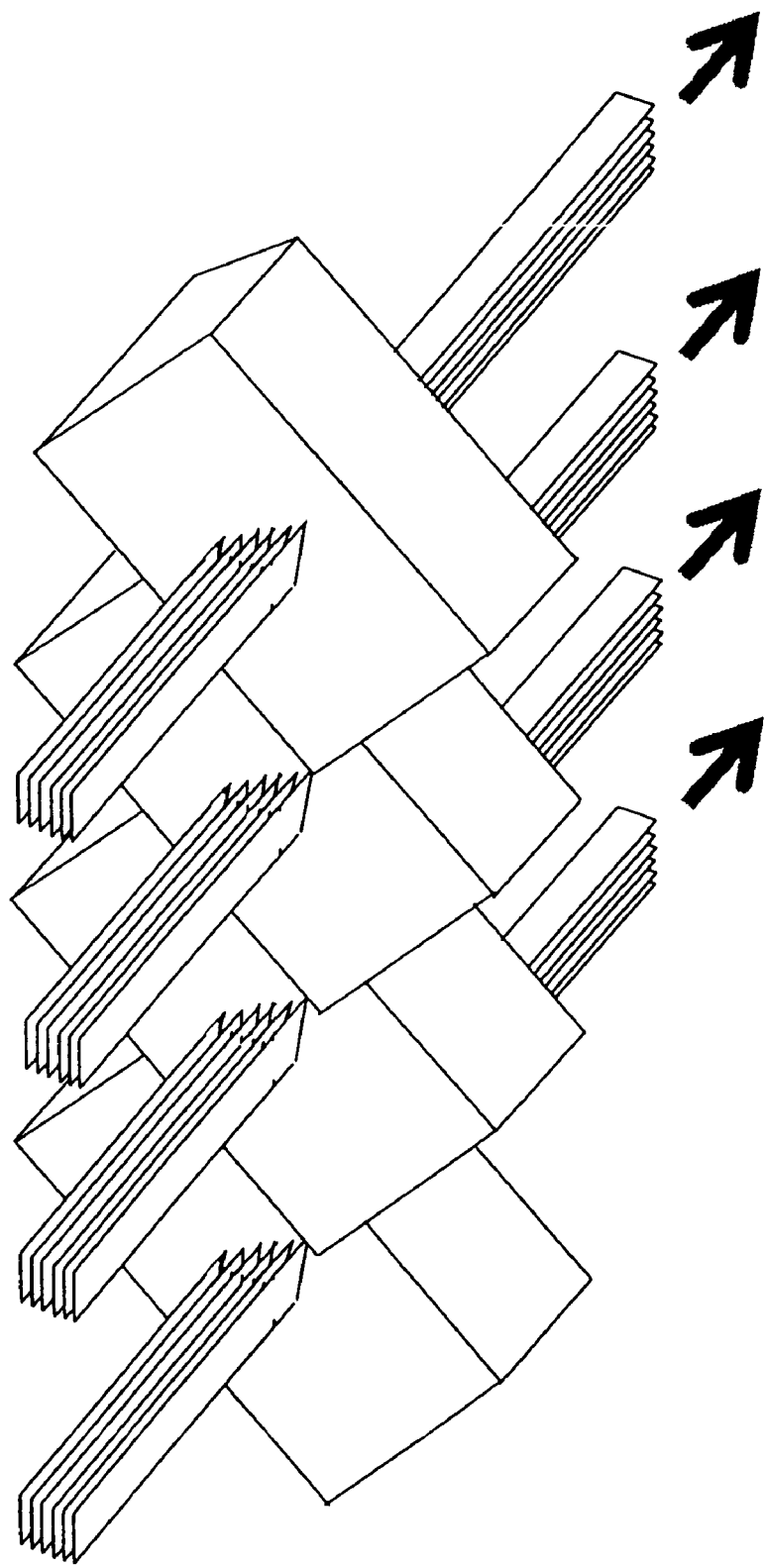
FIG. 75 is a perspective view of a second beam converter comprised of dub prisms arranged in parallel and beam conversion by the same.

FIG. 75 shows a second beam converter utilizing dub prisms. A compressed row of parallel laser beams striking an incidence face horizontally is refracted at the incidence face of a 45° inclined dub prism. The differences in incidence positions gives different reflection positions at the bottom surface, so at the emission face, the row of beams is refracted and emitted from the emission face rotated substantially 90° in cross-section. When joining adjoining dub prisms, if necessary, the bottom surfaces of the dub prisms may be given a reflective coating in advance.

Figure 76:
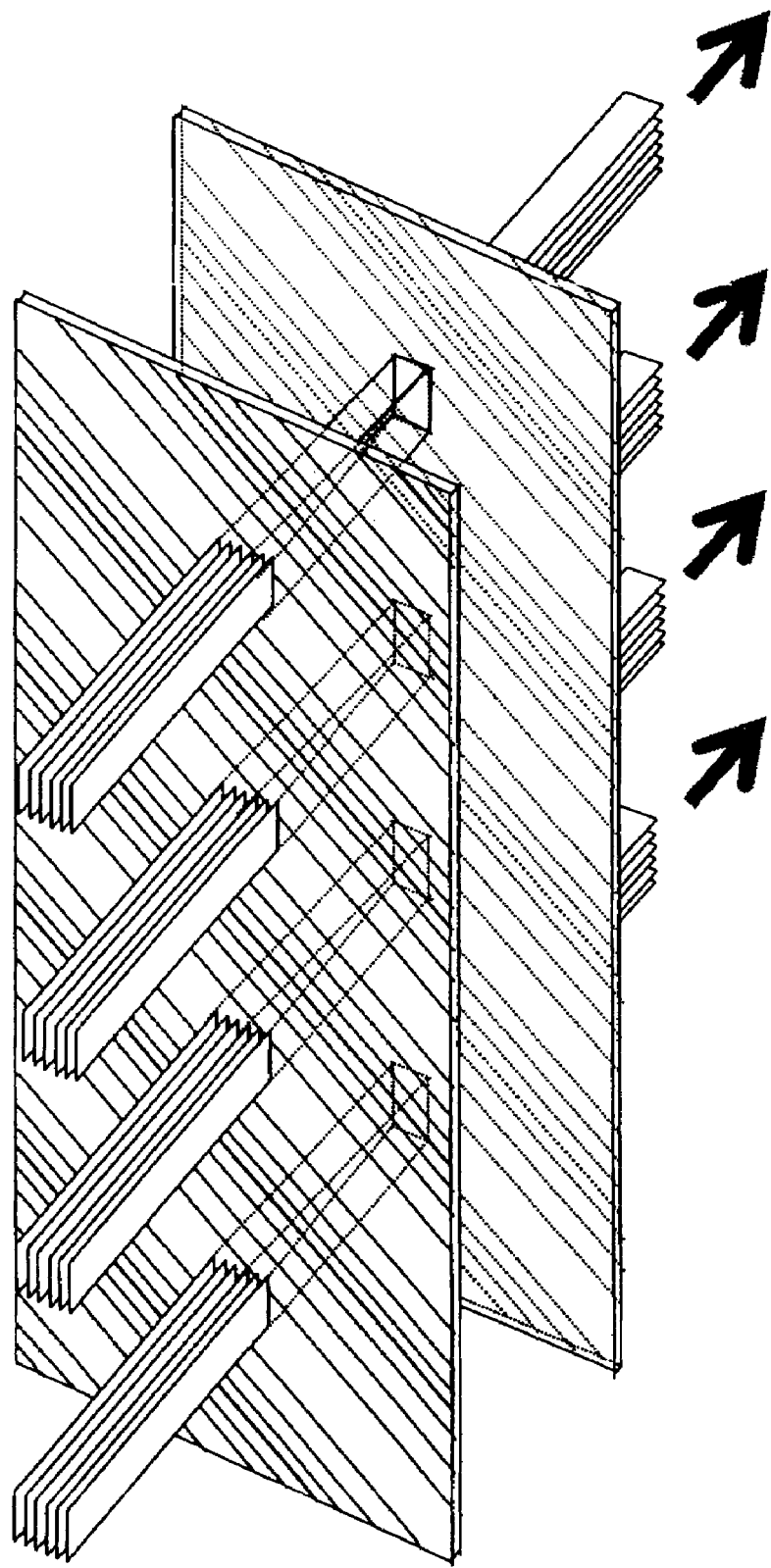
FIG. 76 is a perspective view of a second beam converter comprised of binary optical elements arranged in parallel and beam conversion by the same.

FIG. 76 shows a second beam converter utilizing binary optical elements. This beam converter is formed with a plurality of stepped surfaces with center axes inclined 45° in the same direction at the incidence faces and emission faces. The compressed row of parallel laser beams striking the incidence face horizontally receive different diffractive forces occurring at the stepped surface of the 45° inclined incidence face, whereby the row of beams is rotated. The row of beams is rotated 90° in cross-section at the 45° inclined stepped surface of the emission face and emitted from the emission face.

Figure 77:
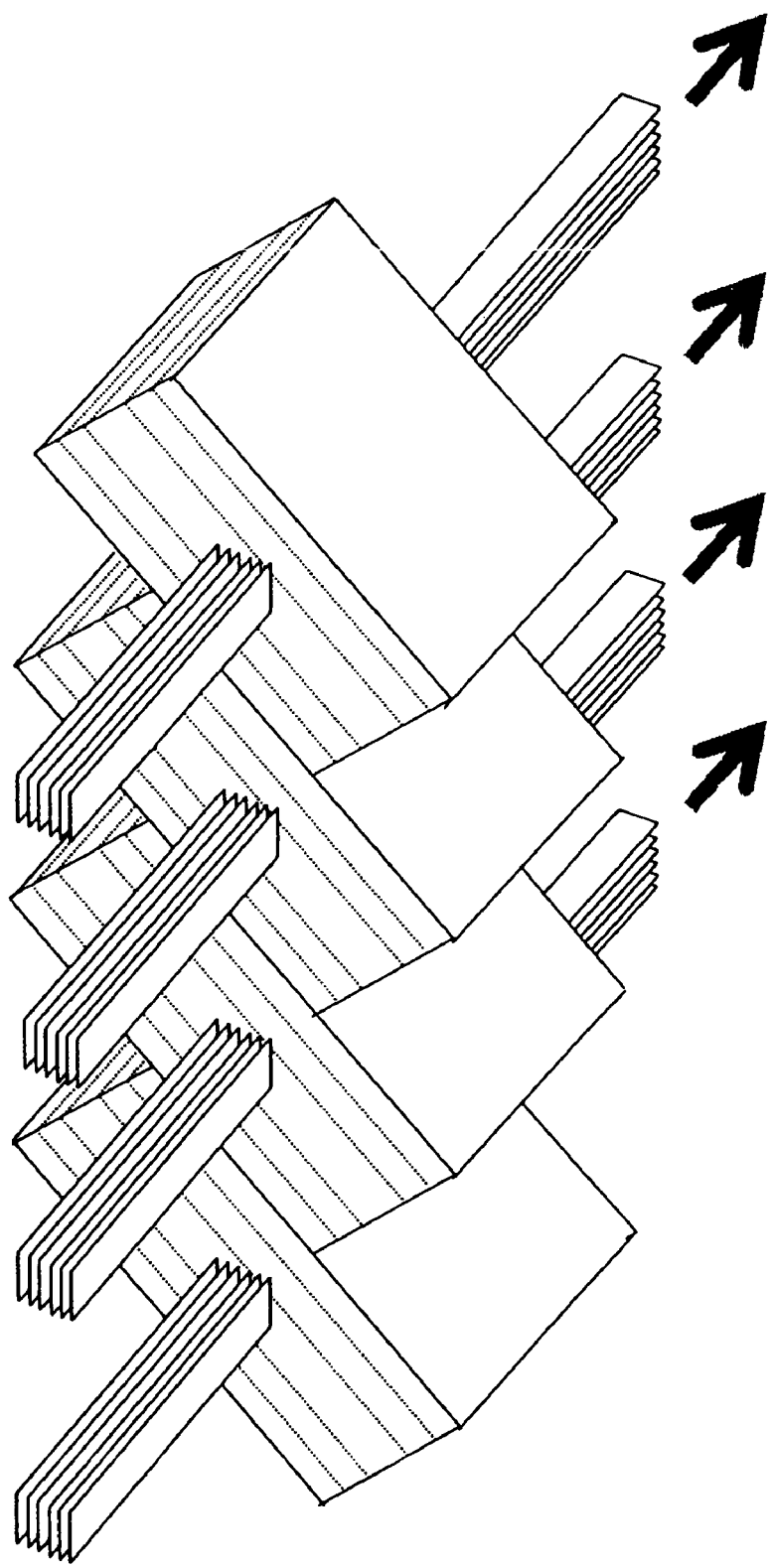
FIG. 77 is a perspective view of a second beam converter comprised of one-dimensional profile refractive index lenses arranged in parallel and beam conversion by the same.

FIG. 77 shows a second beam converter utilizing one-dimensional profile refractive index lenses. This beam converter comprises a plurality of one-dimensional profile refractive index lenses, comprised of optical glass members with the highest refractive indexes at the center faces and with refractive indexes becoming lower the closer to the side faces, joined inclined by 45°. A row of parallel laser beams horizontally striking an incidence face receives different refractive forces depending on the incident positions in a 45° inclined one-dimensional profile refractive index lens, whereby the row of beams is rotated. The row of beams is emitted from the emission face rotated 90° in cross-section.

Figure 78:
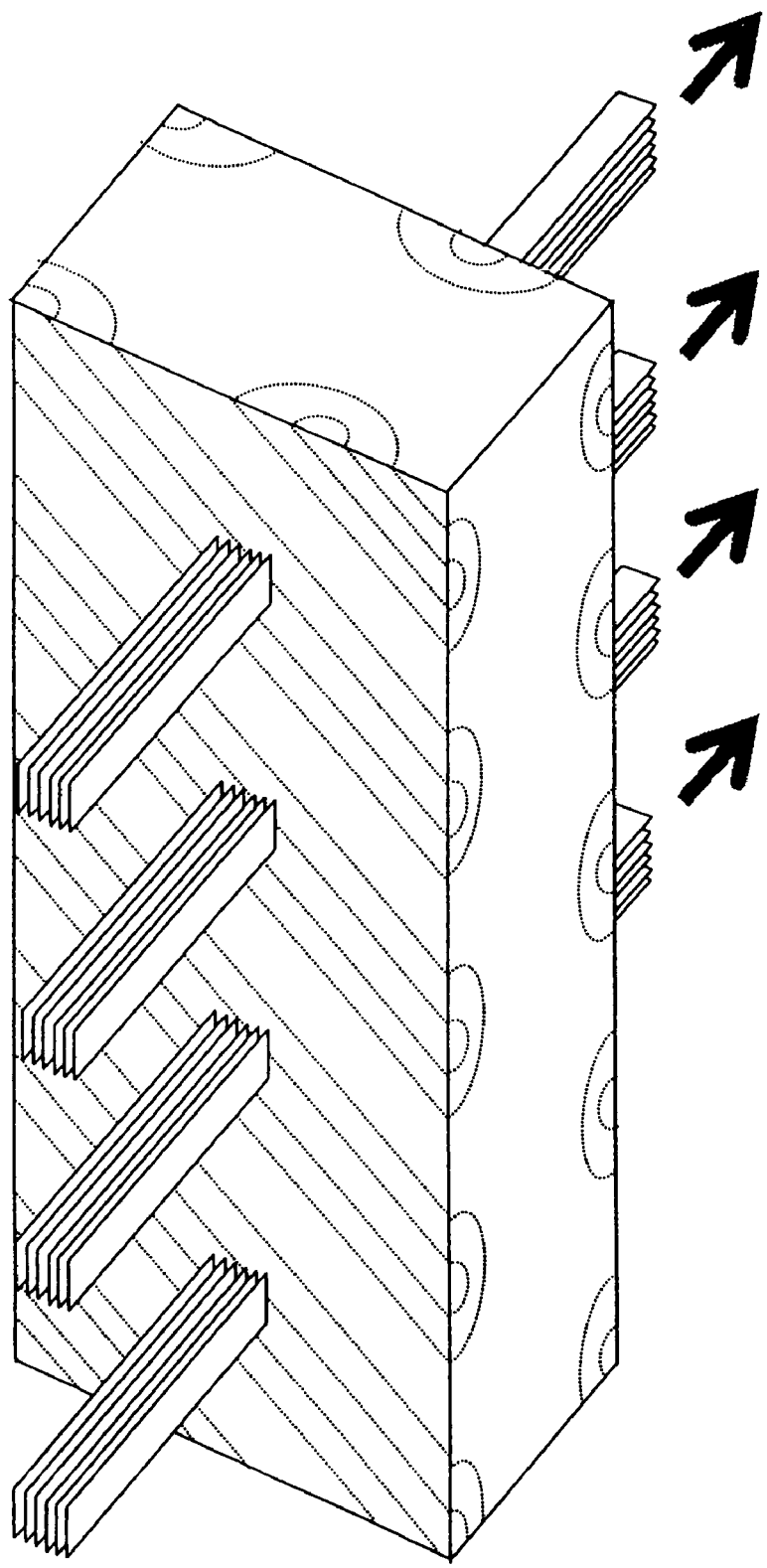
FIG. 78 is a perspective view of a second beam converter comprised of semicylindrical profile refractive index lens elements arranged in parallel and beam conversion by the same.

FIG. 78 shows a second beam converter utilizing facingly arranged profile refractive index lens elements. This beam converter comprises a plurality of substantially semicylindrical profile refractive index lens element forming pairs in the same direction and arranged facing each other at the two faces of the optical glass plate. The center axes of the semicylinders are inclined 45° with respect to a horizontal plane. The center of the semicircle is highest in refractive index, while the refractive index becomes lower the further to the outsides. The compressed row of parallel laser beams striking the incidence face horizontally receives different refractive forces depending on the incidence positions from the 45° inclined one-dimensional profile refractive index lens elements, whereby the row of beams is rotated. The row of beams is emitted from the emission face-rotated 90° in cross-section.

Figure 79:
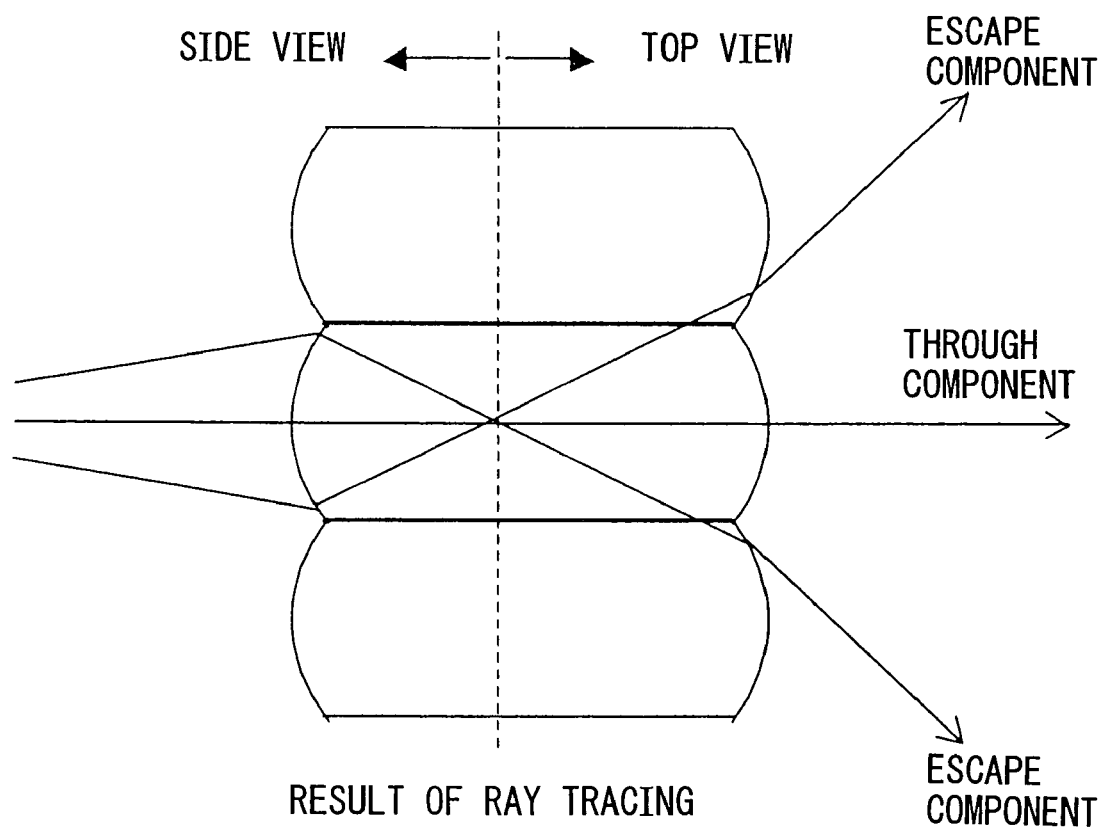
FIG. 79 is a view of the generation of protruding components (e.g., escape components) in adjoining elements at the beam emission side.
Figure 80:
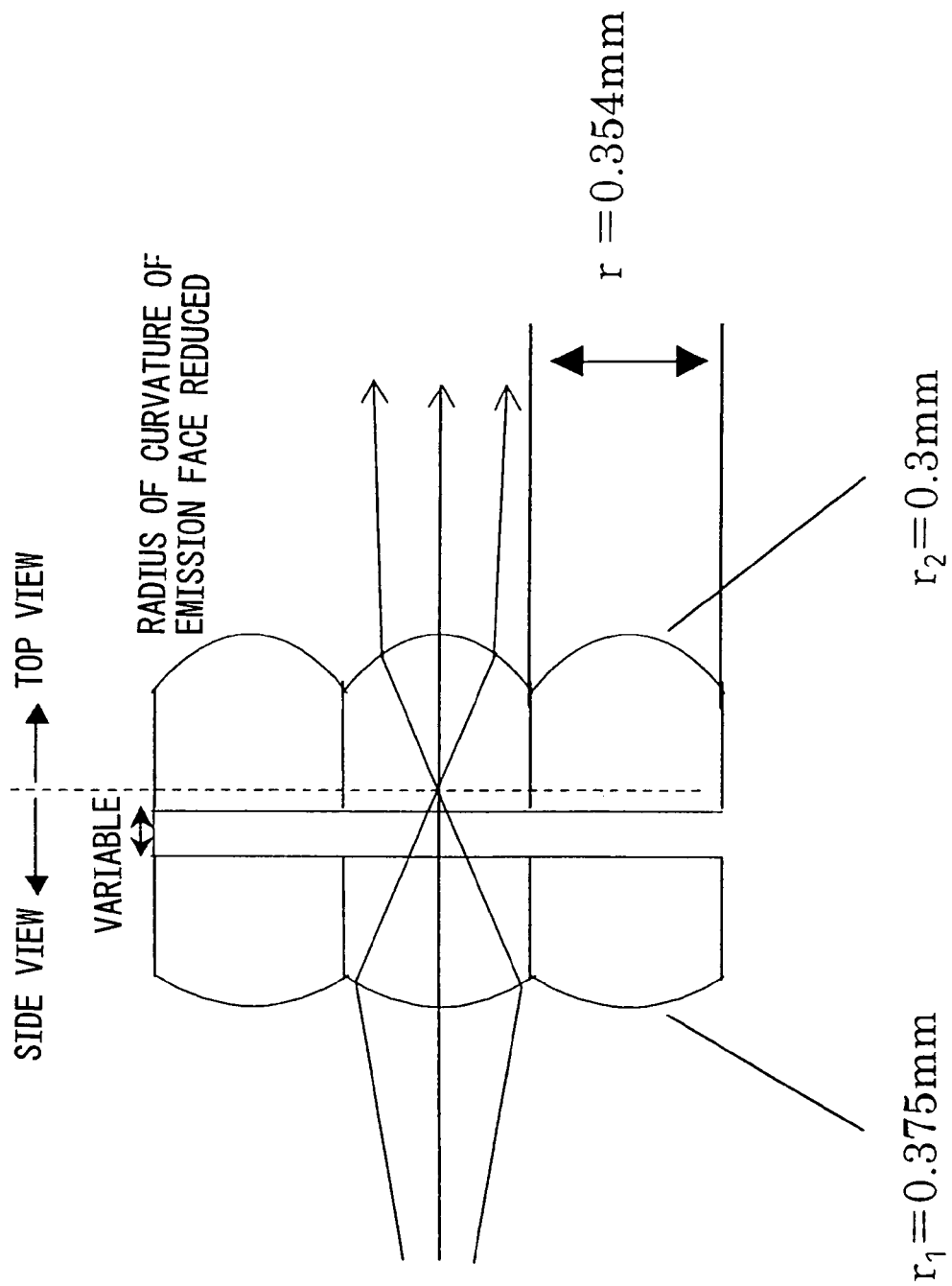
FIG. 80 is a view of a beam converter dividing a cylindrical lens array into two and reducing the radii of curvature of the cylindrical lenses at the beam emission side from the radii of curvature of the cylindrical lenses at the beam incidence side.

As described above, the exemplary embodiments of the present invention can use a beam converter comprised of a cylindrical lens array, but when laser beams having divergence angles enter this converter, as shown in FIG. 79, components projecting out to the adjoining elements at the beam exit side (in the figure, the escape components) occur and ghosts sometimes are produced. As a result, the thruput of the laser beams falls. To eliminate the ghosts arising due to the divergence angles of the incident beams, it is necessary to give the converter the function of adjusting the divergence angles. Therefore, the inventors, as shown in FIG. 80, divides into two the beam converter comprised of the cylindrical lens array and makes the radii of curvature of the cylindrical lenses at the beam emission side smaller than the radii of curvature of the cylindrical lenses of the beam incidence side. Therefore, it is possible to reduce the beam size at the beam emission side, eliminate the components where the laser beams protrude from the adjoining elements at the emission side (escape components), and suppress the occurrence of ghosts.

FIG. 80 shows the beam incidence side converter and the beam exit side converter set apart and made variable in distance, but the two converters may also be joined to form an integral structure. This figure shows the case where the thickness r of the cylindrical lens is 0.354 mm, the radius of curvature r1 of the incidence side cylindrical lens is 0.375 mm, and the radius of curvature 42 of the exit side cylindrical lens is 0.3 mm. If $r2/r1<1$, the laser beams will not be fully rotated 90°, but this can be solved by arranging the cylindrical lenses at a slant. At that time, the output of commercially available laser diode stack arrays is about 50 W per stack. Further, the number of stack layers ends up being limited to about 20 or so due to the mounting precision, so the output of one array is about 1 kW at the maximum. However, if considering application to metal processing, a larger output may be needed. Therefore, according to an exemplary embodiment of the present invention, at least two laser diode stack arrays may be coupled to increase the output. That is, according to an exemplary embodiment of the present invention, at least two groups of laser beams emitted from at least two laser diode stack arrays and emitted from first condensers arranged in front of the arrays are coupled by an optical device arranged in front of the first condensers.

Figure 81:
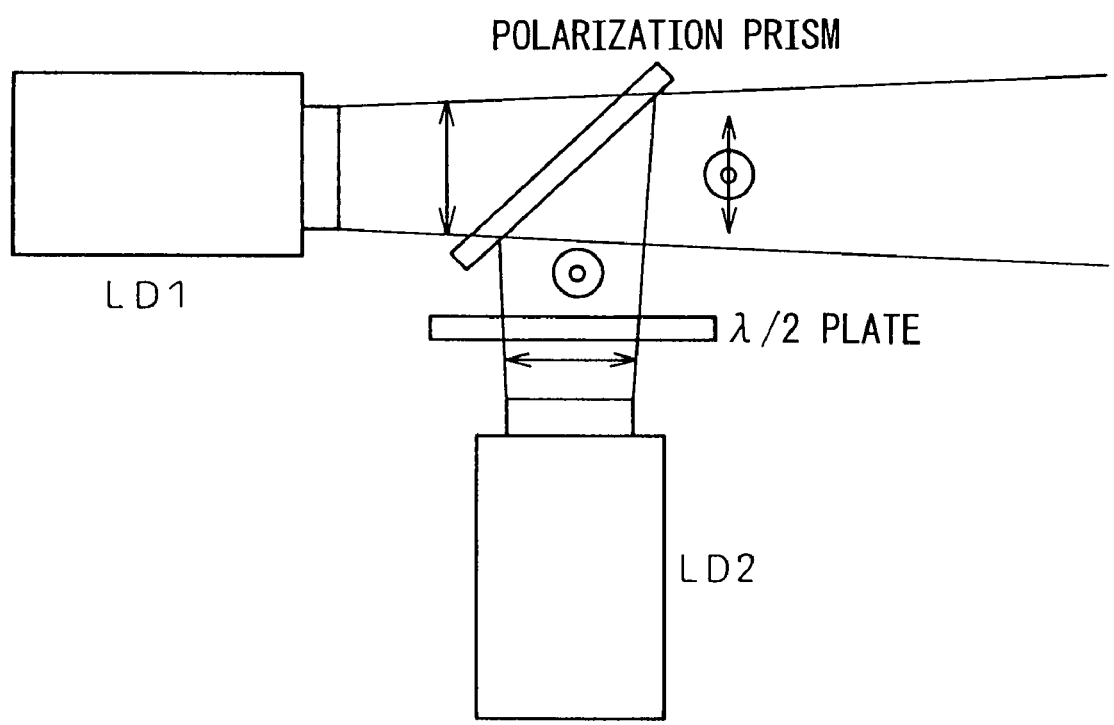
FIG. 81 is a view of a mode of coupling two laser beams using a polarization element.
Figure 82:
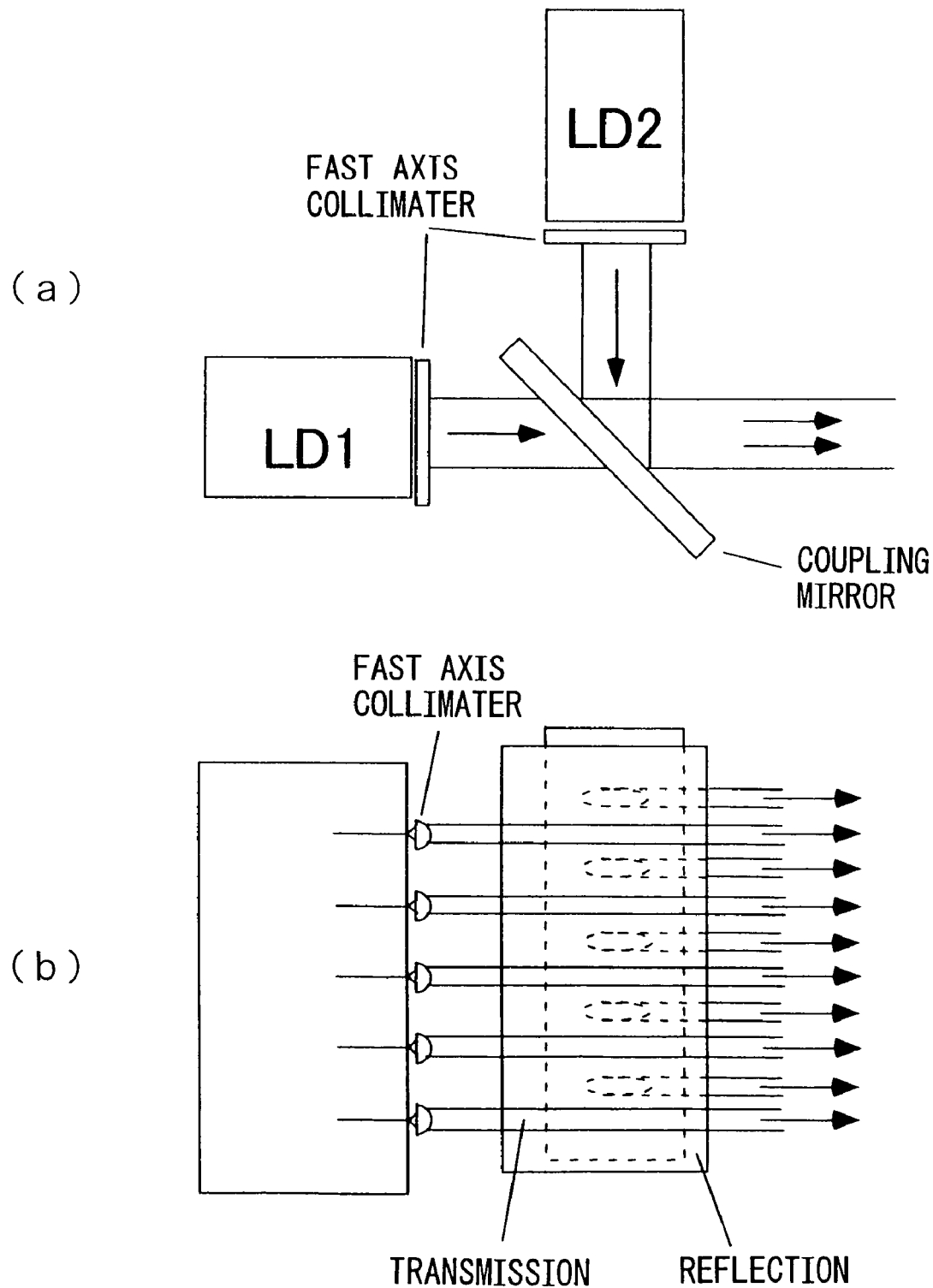
FIGS. 82A and 82B are views of a mode of coupling two laser beams using a mirror formed with through windows at the same pitch as the stack pitch of the laser diode stack array.
Figure 84:
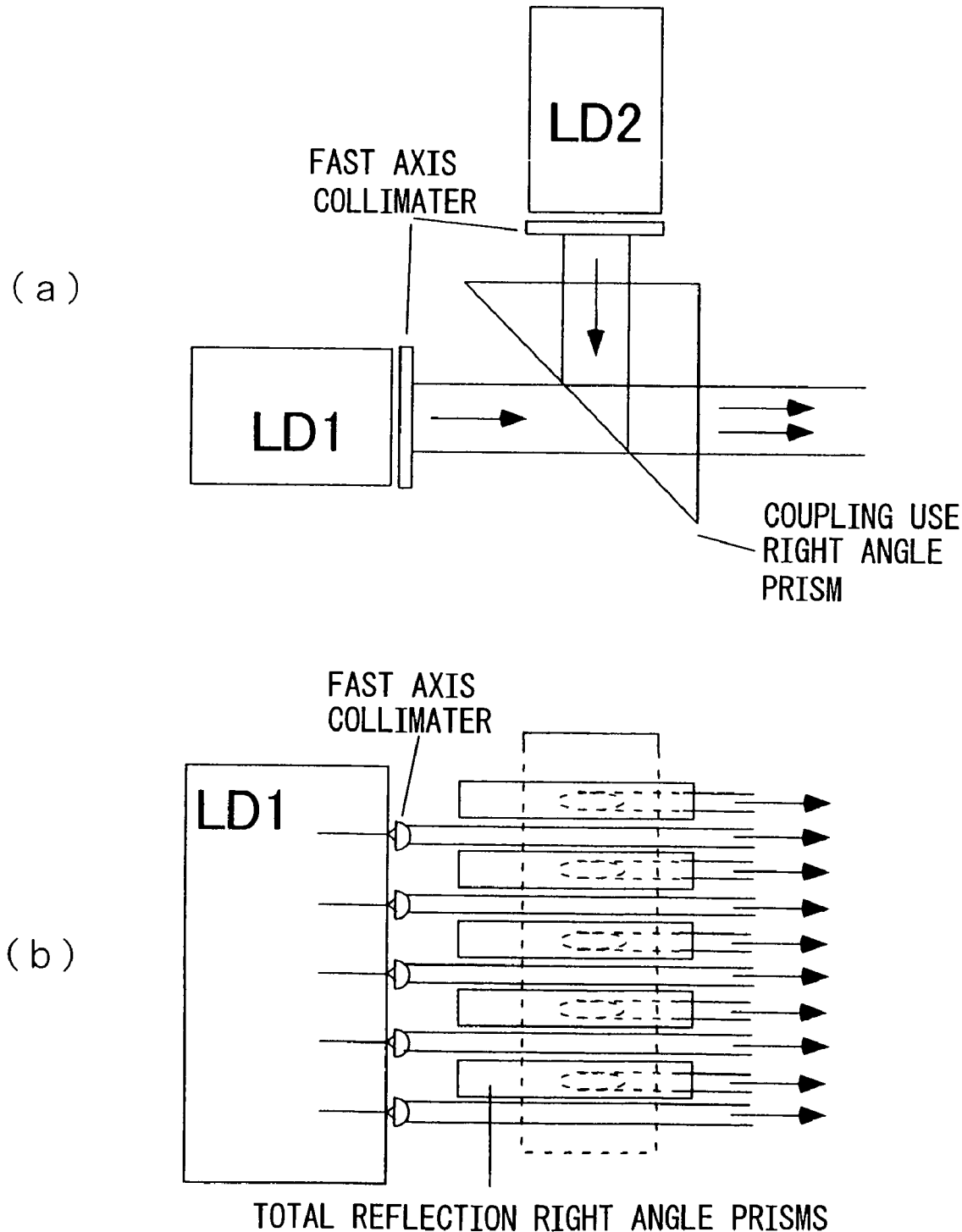
FIGS. 84A and 84B are views of a mode of coupling two laser beams using right angle prisms arranged at the same pitch as the stack pitch of the laser diode stack array.

FIG. 81 shows the case of coupling using a polarization element as the optical device. The laser beam emitted from one laser diode stack array (LD2) is passed through a λ/2 plate and then coupled with a laser beam emitted from another laser diode stack array (LD1) through the polarization element (polarization prism). FIG. 82 shows the state of coupling using a mirror formed with through windows at the same pitch as the stack pitch of the laser diode stack array. Further, FIG. 83 shows the state of coupling using small mirrors arranged at the same pitch as the stack pitch of the laser diode stack array. Further, FIG. 84 shows the state of coupling using right angle prisms arranged at the same pitch as the stack pitch of the laser diode stack array.

Figure 85:
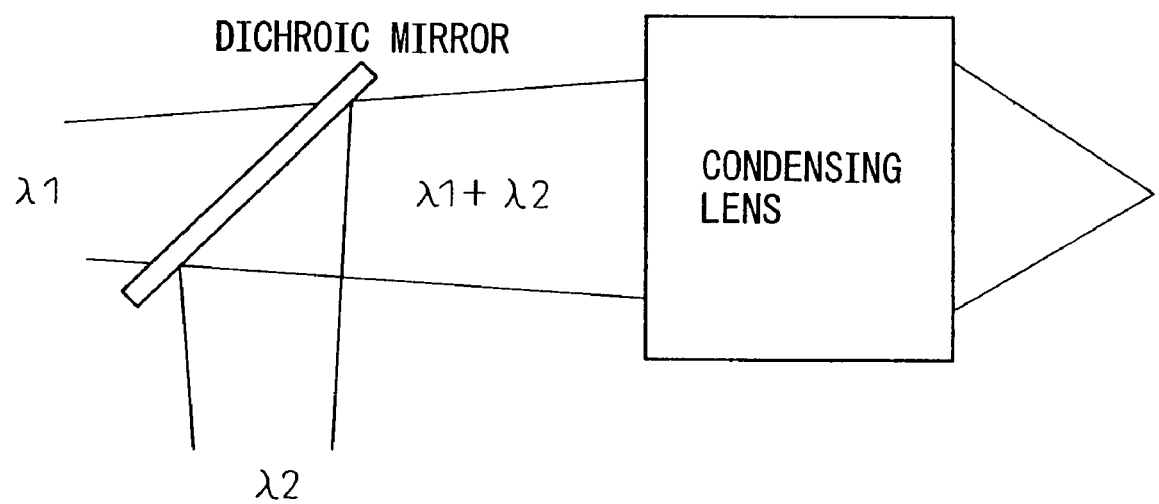
FIG. 85 is a view of the mode of wavelength coupling at least two laser beam groups entering a third condenser.

Further, according to an exemplary embodiment of the present invention, as shown in FIG. 85, at least two laser diode stack arrays are provided, and an optical device for wavelength coupling the at least two groups of laser beams entering the third condenser is provided in back of the third condenser so as to couple the groups of laser beams. In this case, it may be preferable to use a dichroic mirror as the optical device. Further, according to an exemplary embodiment of the present invention, a plurality of laser diode stack arrays provided with first condensers in front of them are provided, an optical device for coupling at least two groups of laser beams emitted from the condensers is provided in front of the first condensers, and an optical device for wavelength coupling at least two groups of laser beams striking the condensers is provided in back of the third condenser to couple the plurality of groups of laser beams. In this manner, it is possible to couple a plurality of laser beams to obtain a large output laser beam.

Figure 43:
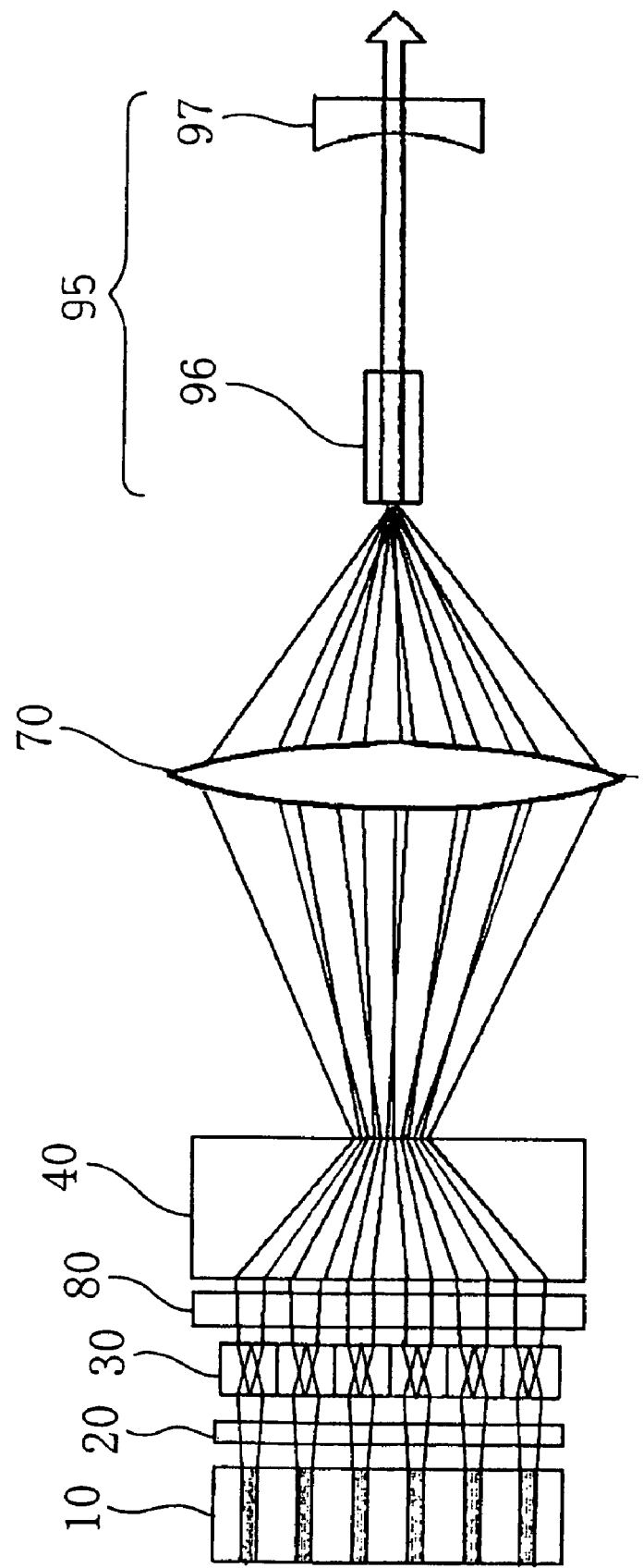
FIG. 43 is a plan view for explaining a semiconductor laser pumped solid-state laser device according to an exemplary embodiment of the present invention.
Figure 44:
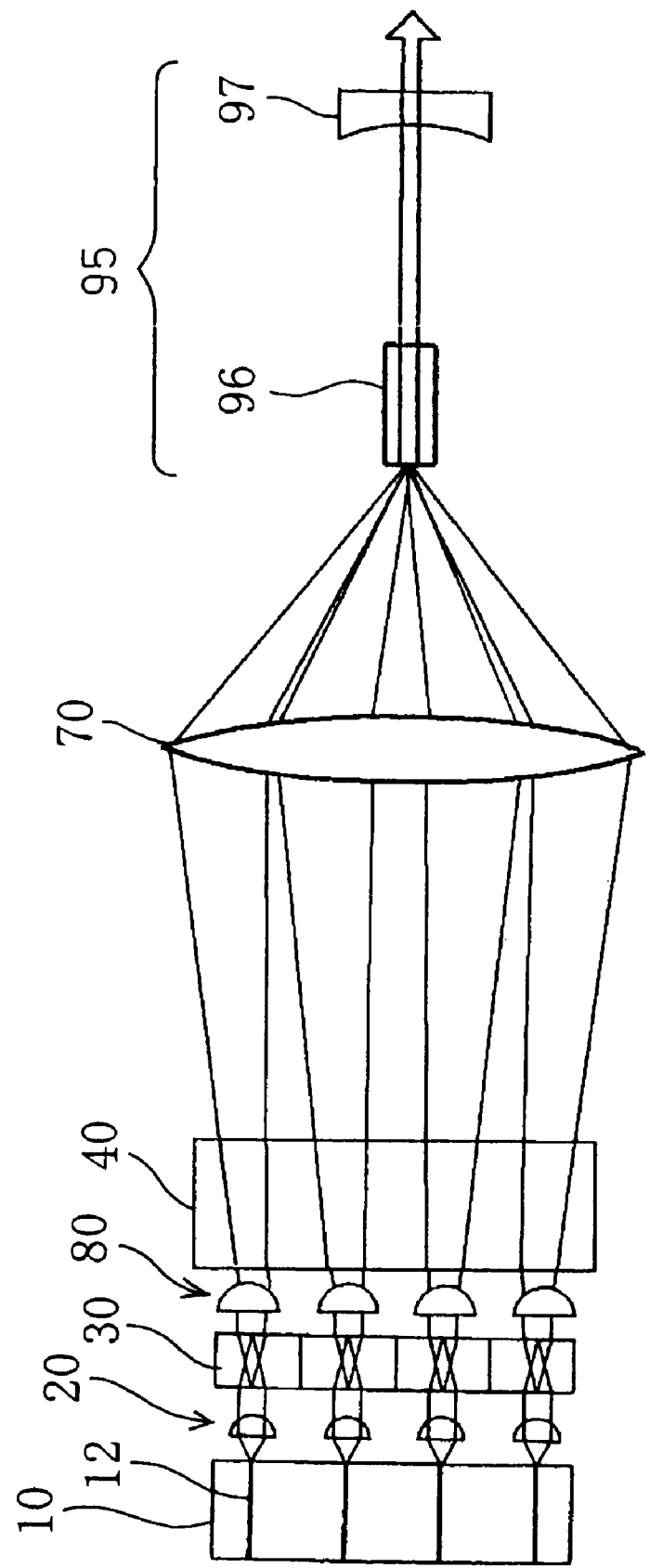
FIG. 44 is a schematic elevation view for explaining the semiconductor laser pumped solid-state laser device shown in FIG. 43.

FIG. 43 is a schematic plan view explaining a semiconductor laser pumped solid-state laser device according to an exemplary embodiment of the present invention, while FIG. 44 is an elevation view of the same. The semiconductor laser pumped solid-state laser device uses the semiconductor laser device of the present invention as a pumping light source of the solid-state laser 95. A conventional semiconductor laser device utilizing a laser diode stack array is limited in the horizontal length region even if concentrating the energy. The substantive energy density does not become large. Further, if trying to effectively utilize this energy, only side face pumping of the solid-state laser is possible.

The semiconductor laser pumped solid-state laser device according to an exemplary embodiment of the present invention concentrates broken line configuration emission stripes of the laser diode stack array 10 in a direction perpendicular to the stripes by a first cylindrical lens array having a short focal length f1, then converts them to a plurality of rows of ladder rung configuration laser beams using a first beam converter 30 and also changes the direction of the beams so as to give a group of beams emitted simultaneously from the same object. Further, the condensing lens 70 makes the energy converge at a small region on the light receiving face of the solid-state laser element 96.

The semiconductor laser device according to an exemplary embodiment of the present invention, as explained above, can concentrate energy to a predetermined narrow range. Therefore, the semiconductor laser pumped solid-state laser device of the present invention utilizing the semiconductor laser device of the present invention can effectively use the output of the laser diode stack array 10 and enables end face pumping of the solid-state laser 95. As the solid-state laser element, a YAG, YLF, yttria, or other ordinary solid-state laser element and also a solid-state laser element including a Q-switch or wavelength conversion element may also be utilized.

Further, the pumping light source may be introduced to the solid-state laser element by the Brewster's angle. The solid-state laser element may also be a short absorption length laser crystal ($YVO_4$). The semiconductor laser pumped solid-state laser device of the present invention can give a 100 W YAG laser output using a 300 W semiconductor laser element.

Figure 45:
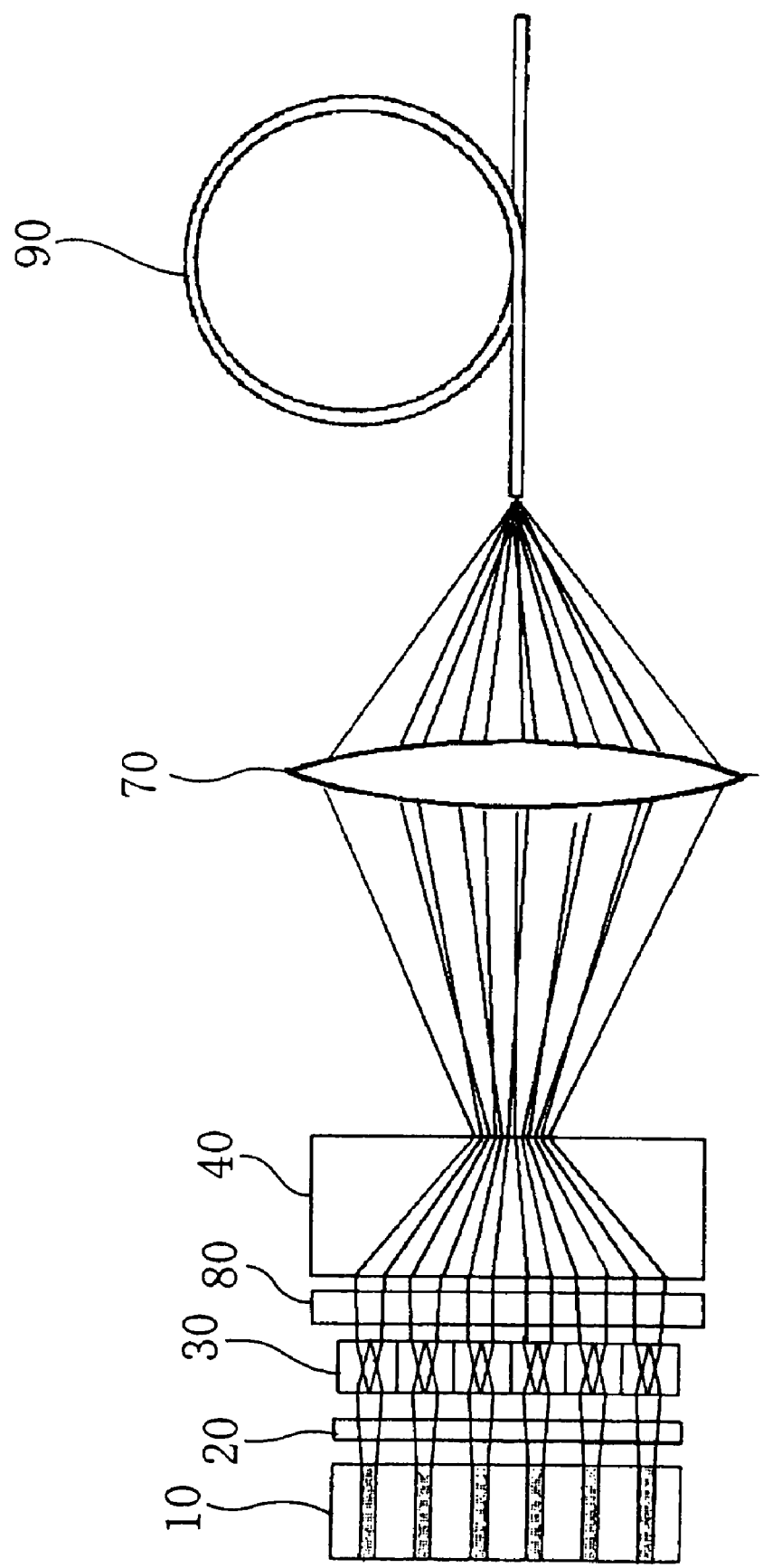
FIG. 45 is a plan view of an exemplary embodiment of the semiconductor laser device according to the present invention that uses an optical fiber.
Figure 46:
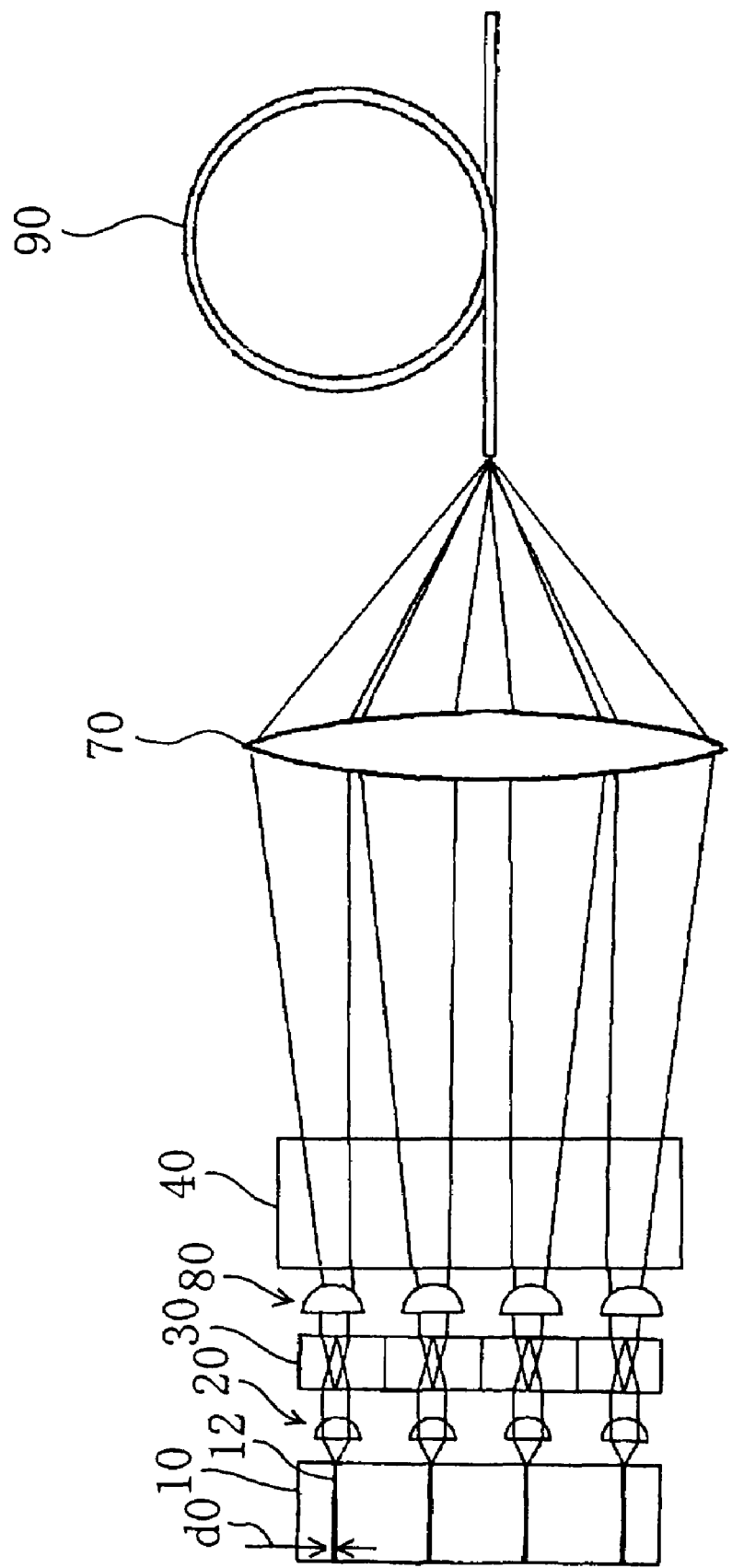
FIG. 46 is a schematic elevation view of the semiconductor laser device shown in FIG. 45.

FIG. 45 is a plan view of a laser device according to the present invention using an optical fiber 90, while FIG. 46 is an elevation view. The light receiving face of the optical fiber 90 is arranged at the position of the laser spot formed by the above laser device to receive the laser energy emitted from the laser 10 and transmit it to the other end face side of the optical fiber 90. Due to the length and flexibility of the optical fiber 90, it is possible to obtain an easy-to-use laser device enabling work while bringing the emission part to the target location. A laser device configured using as a light source a laser diode stack array 10 having a 800 W output and forming a laser spot smaller than the cross-section of the core at the incidence face of an optical fiber 90 having a core diameter of 400 µm achieves an efficiency of 60%.

Figure 47:
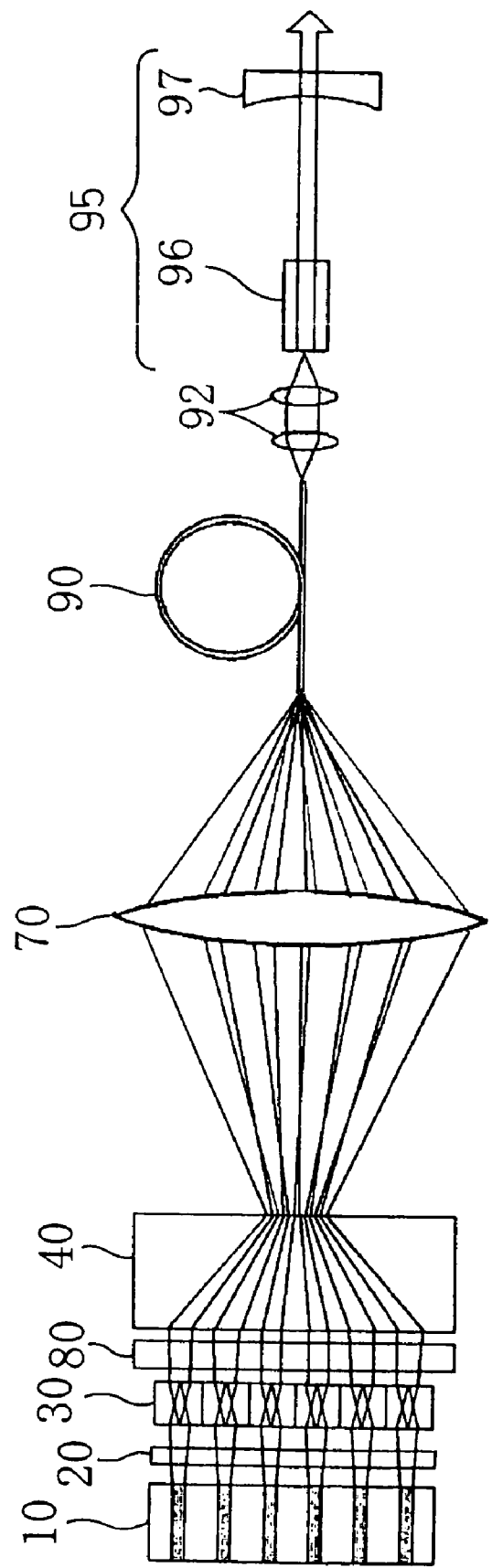
FIG. 47 is a schematic plan view for explaining an optical fiber guided semiconductor laser pumped solid-state laser device according to an exemplary embodiment of the present invention.
Figure 48:
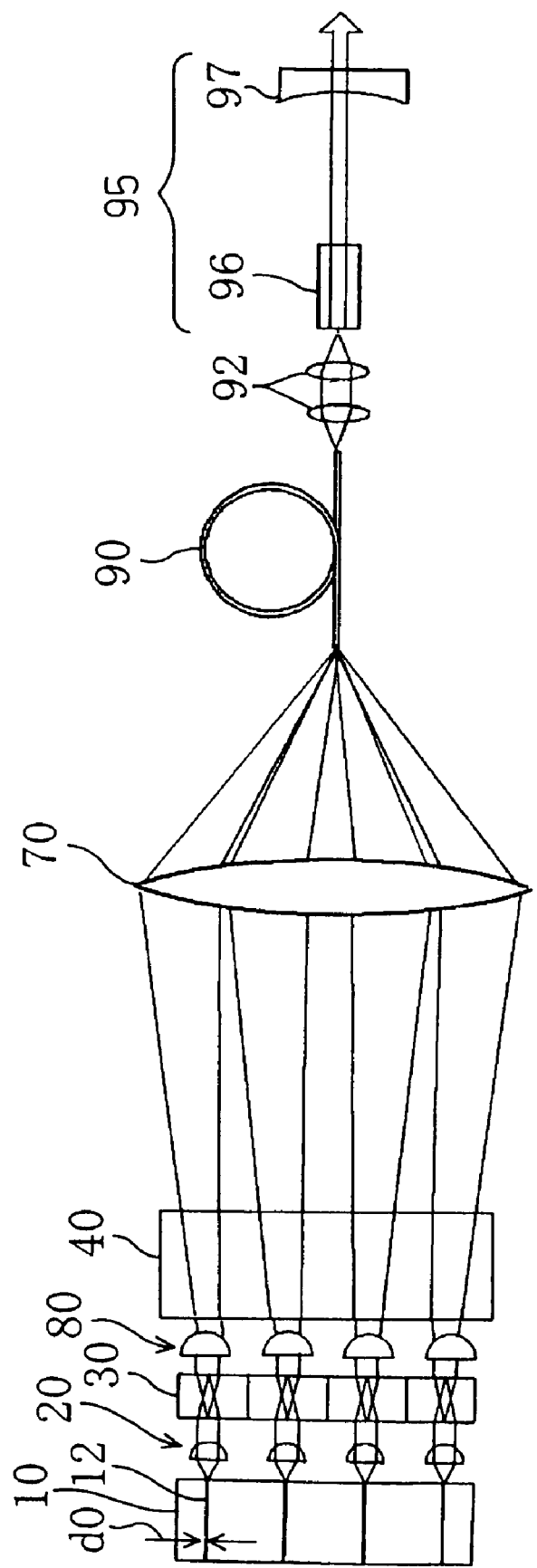
FIG. 48 is a schematic elevation view illustrating the optical fiber guided semiconductor laser pumped solid-state laser device shown in FIG. 47.

FIG. 47 is a schematic plan view explaining an optical fiber guided semiconductor laser pumped solid-state laser device of the present invention, while FIG. 48 is an elevation view of the same. The optical fiber guided semiconductor laser pumped solid-state laser device guides the output of the semiconductor laser device of the present invention by an optical fiber 90 to form a pumping light source of the solid-state laser 95.

The output part of the optical fiber is provided with an optical system 92 for collimating and reconverging the energy of the laser beam diffused from the end. In this way, there is a flexible optical fiber between the semiconductor laser device part and the solid-state laser device part, so there are the advantages that the degree of freedom of the device is remarkably increased and configuration becomes easy. The optical fiber guided semiconductor laser pumped solid-state laser device according to an exemplary embodiment of the present invention can give an 80 W YAG laser output using a 400 W semiconductor laser element.

Figure 49:
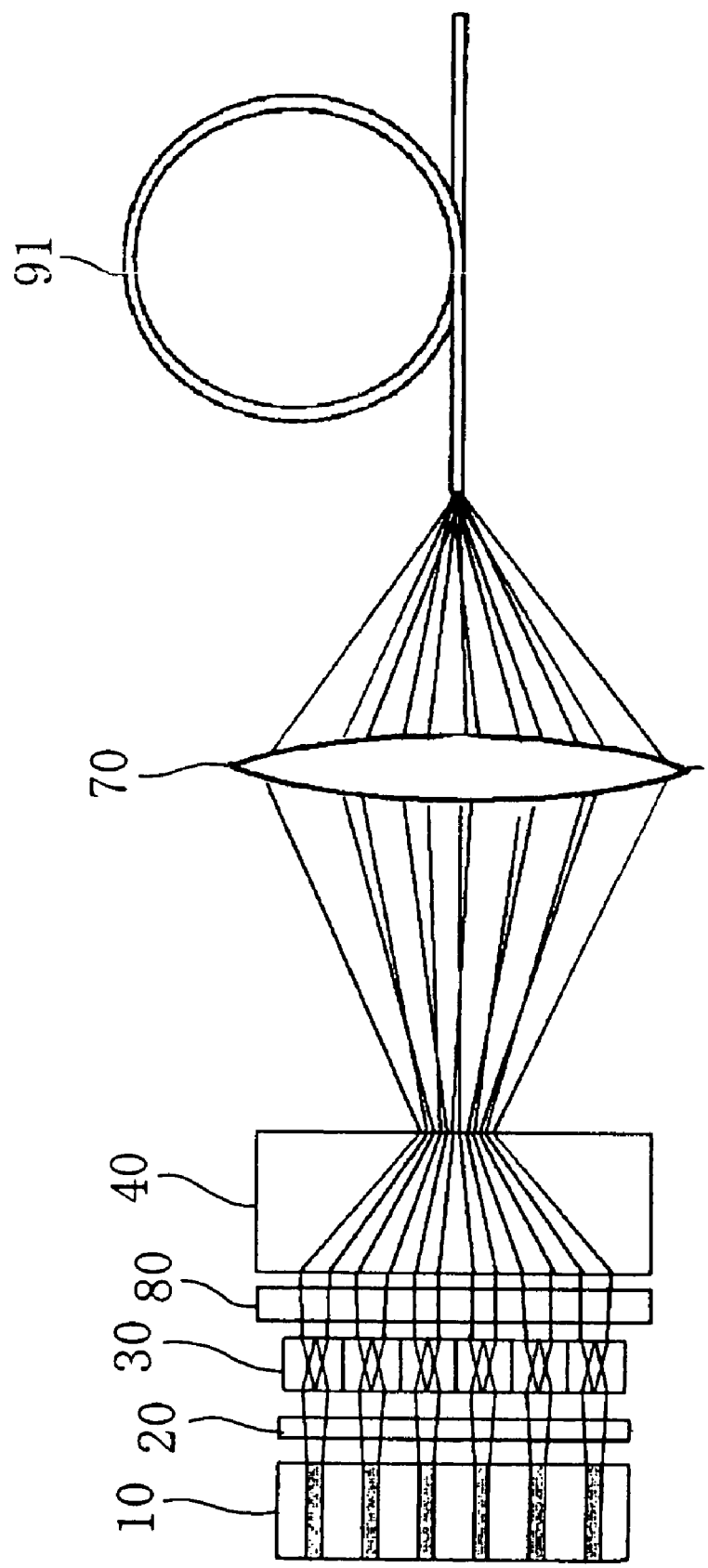
FIG. 49 is a schematic plan view illustrating the semiconductor laser pumped fiber laser device of the present invention.
Figure 50:
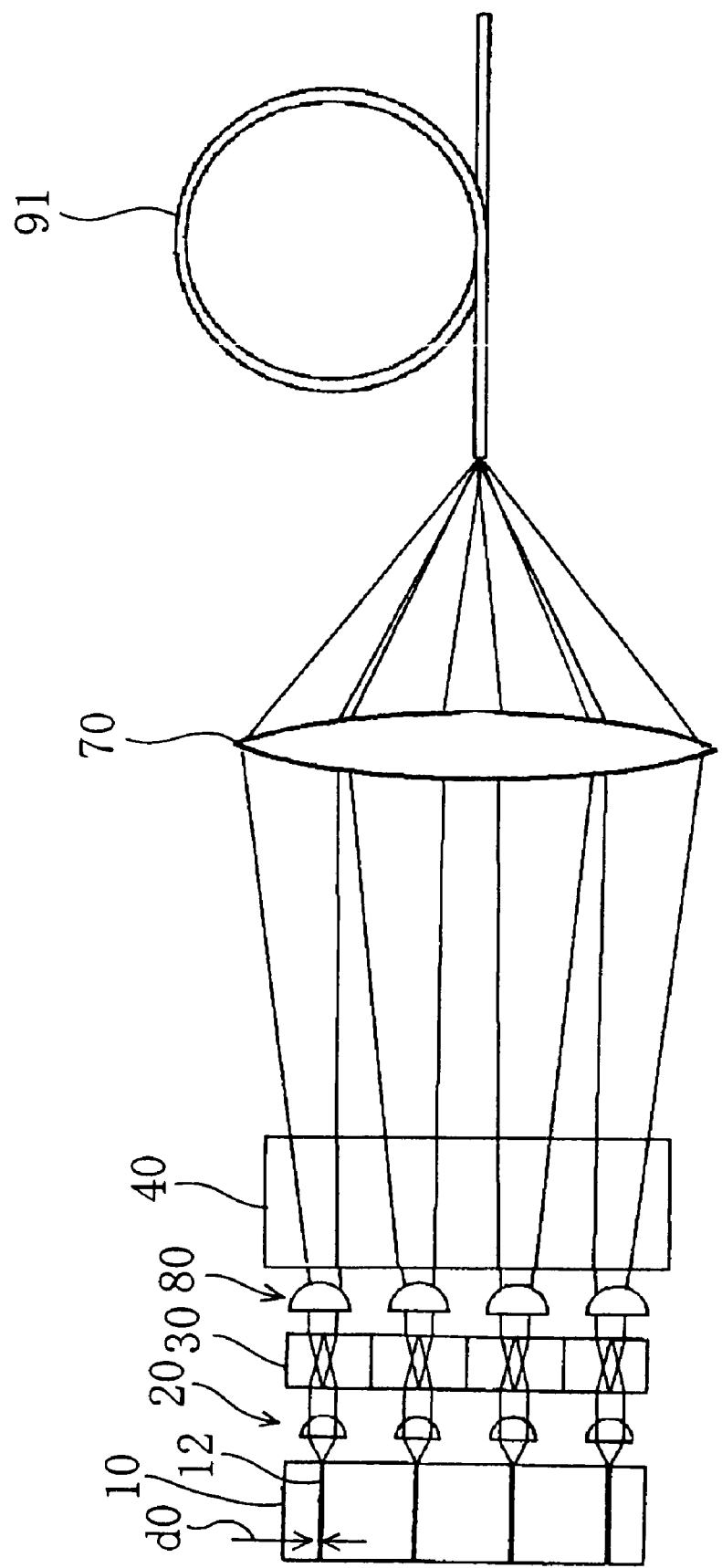
FIG. 50 is a schematic elevation view illustrating the semiconductor laser pumped fiber laser device of the present invention.

FIG. 49 is a schematic plan view explaining a semiconductor laser pumped fiber laser device of the present invention, while FIG. 50 is an elevation view of the same. The semiconductor laser pumped fiber laser device inputs the output of the semiconductor laser device of the present invention to the inner cladding of the double clad fiber 91 to excite the core. The diameter of the inner cladding is 600 µm×240 µm. The core diameter is 40 µm. When the output of the laser diode stack array is 1 kW, a fiber laser output of 500 W is obtained. This output beam is a completely single peak type.

The invention claimed is:

1. A semiconductor laser device, comprising:
   a laser diode stack array including a plurality of emitters which extend long in a first direction of emission of laser beams, the emitters capable of being arranged linearly in the first direction and situated in a plurality of rows, and the emitter adapted to emit a group of laser beams that have laser beam elements arranged in a two-dimensional array;
   a first condenser provided in front of the laser diode stack array, the first condenser bending and collimating the group of laser beams for every one of the rows in a second direction substantially at right angles to the first direction;
   a first beam converter provided in front of the first condenser, the first beam converter configured to receive the group of laser beams collimated in the second direction, and emitting the group of laser beams converted to a substantially ladder rung configuration group of laser beams that extend in the first direction for every one of the rows;
   a second condenser provided in front of either the first beam converter or a beam first compressor, the second condenser adapted for bending the group of laser beams output from the first beam converter or the first beam compressor, and adapted for using each of the beams with center axes offset by predetermined amounts to generate beams that are emitted from approximately the same object by generating an angular change of the optical axes;
   the first beam compressor configured for receiving the group of laser beams output from the first beam converter or the second condenser, and emitting the beams converted to a compressed substantially ladder rung configuration group of laser beams with shortened ladder rung intervals and extending in the first direction of the plurality of rows; and
   a third condenser configured to condense the group of laser beams output from the first beam compressor.

2. The semiconductor laser device according to claim 1, further comprising a shifter that is provided between the first beam converter and the second condenser, the shifter being capable of shifting in parallel optical axes in the second direction for each of the rows.

3. The semiconductor laser device according to claim 1, further comprising a shifter that is provided between the first condenser and the first beam converter, the shifter being adapted for shifting in parallel optical axes in the second direction for each of the rows.

4. The semiconductor laser device according to claim 1, wherein the second condenser includes a one-dimensional array of cylindrical lenses.

5. The semiconductor laser device according to claim 1, wherein the beam compressor is comprised of at least one of an anamorphic prism and anamorphic prism pair.

6. The semiconductor laser device according to claim 1, wherein the beam compressor is a telescope that includes at least one of one-dimensional lenses and two-dimensional lenses.

7. The semiconductor laser device according to claim 1, wherein the beam compressor is a telescope that includes at least one of a one-dimensional parabolic mirror and a two-dimensional parabolic mirror.

8. The semiconductor laser device according to claim 1, wherein the first condenser is a one-dimensional array of cylindrical lenses.

9. The semiconductor laser device according to claim 1, further comprising an angle adjuster provided in front of the first condenser, the angle adjuster being configured for finely adjusting the angle of optical axes for each of the rows to the second direction.

10. The semiconductor laser device according to claim 9, wherein the angle adjuster combines at least two wedge plates in reverse directions, and capable of rotating at least one of the wedge plates.

11. The semiconductor laser device according to claim 1, further comprising:
    at least two laser diode stack arrays which are provided behind the first condenser; and
    an optical device adapted for coupling the at least two groups of laser beams emitted from the first condenser that are provided in front of the condenser.

12. The semiconductor laser device according to claim 11, wherein the optical device is a mirror formed with through windows at approximately the same pitch as a stack pitch of the laser diode stack array.

13. The semiconductor laser device according to claim 11, wherein the optical device is comprised of mirrors arranged at approximately the same pitch as a stack pitch of the laser diode stack array.

14. The semiconductor laser device according to claim 11, wherein the optical device is comprised of right angle prisms arranged at approximately the same pitch as a stack pitch of the laser diode stack array.

15. The semiconductor laser device according to claim 1, further comprising a beam converter including a plurality of optical elements, each of the elements including:
   a. a receiving part adapted to receive incident light beams having cross-sections provided along first axes perpendicular to the optical axes, b. an optical system adapted to rotate the first axis of the beam cross-sections to substantially right angles, and
c. an emission part adapted to emit emitted beams passing through the optical system, wherein the optical elements are arranged on the optical axes of the laser beams, and the receiving and emission parts of the optical elements are arranged adjoining each other two-dimensionally on the same planes.

16. The semiconductor laser device according to claim 15, wherein the optical element is a space defined by reflecting faces, the space providing:
 i. a first reflecting face vertical and inclined about 45° with respect to incident beams,
 ii. a second reflecting face parallel to the incident beams and inclined about 45° with respect to the horizontal plane, and
 iii. a third reflecting face perpendicular to the vertical surface parallel to the incident beams, parallel to the line of intersection between the first reflecting face and second reflecting face, and inclined about 45° with respect to the horizontal plane.

17. The semiconductor laser device according to claim 15, wherein the optical element is a prism comprised of a first total reflecting face, a second total reflecting face, a third total reflecting face, an incidence face, an emission face, and a joining face,
 wherein the first, second, and third total reflecting faces intersect each other with an intersecting angles of 60°, the incidence face and emission face are parallel and perpendicularly intersect the second total reflecting face and are inclined about 45° with respect to the first and third total reflecting faces, and the joining face is parallel to the second total reflecting face, and
 wherein one of a one-dimensional array of prisms comprised of prisms are arranged adjoining each other with the third total reflecting faces, incidence faces, and emission faces on the same planes and with joining faces and second total reflecting faces of adjoining prisms joined together and a two-dimensional array comprised of one-dimensional arrays of prisms further aligned in parallel is used as the beam converter.

18. The semiconductor laser device according to claim 15, wherein one of an optical glass member having parallel first and second flat surfaces, a third flat surface intersecting the first flat surface by an angle of 135°, and a fourth surface comprised of a cyclically bent surface comprised of peaks and valleys having a bending angle of the line along which the peaks and valleys extend of 60°, are form continuously in a wave configuration in a direction intersecting the first flat surface by an angle of $\tan^1 (1/\sqrt{2})$, and having peak lines and valley lines parallel to the third flat surface, the first flat surface being used as an incidence face, the second flat surface being used as an emission face, the faces of the bent faces forming the fourth surface intersecting the first flat surface by an angle of 45° being used as a first reflecting face, the other faces being used as a second reflecting face, and the third flat surface being used as a third reflecting face, and a one-dimensional array comprised of the optical glass members further aligned linearly is used as a beam converter.

19. The semiconductor laser device according to claim 15, wherein one of a mirror structure having a first flat surface intersecting a flat surface perpendicular to an incidence optical axis by an angle of 135°, a second surface comprised of a cyclically bent surface comprised of peaks and valleys having a bending angle of the line along which the peaks and valleys extend of 60°, are formed continuously in a wave configuration in a direction intersecting a flat surface perpendicular to the incidence optical axis by an angle of $\tan^{-1} (1/\sqrt{2})$, and having peak lines and valley lines parallel to the first flat surface, the first flat surface and the second surface being treated to form mirror surfaces, the faces among the bent faces forming the second surface intersecting the flat surface perpendicular to the incidence optical axis by an angle of 45° being used as a first reflecting face, the other faces being used as a second reflecting face, and the first flat surface being used as a third reflecting face, and a one-dimensional array comprised of the mirror structures further aligned linearly is used as a beam converter.

20. The semiconductor laser device according to claim 15, wherein the optical element is comprised of a pair of convex cylindrical lenses, each of the lenses having axes inclined about 45° arranged facing each other across a space of a predetermined distance.

21. The semiconductor laser device according to claim 20, wherein a radius of curvature of emission side lenses is smaller than a radius of curvature of incidence side lenses in the pairs of cylindrical lenses.

22. The semiconductor laser device according to claim 15, wherein the optical element is comprised of an array of a plurality of pairs of convex cylindrical lenses, each of the lenses having an axes inclined about 45° arranged facing each other across a space of a predetermined distance.

23. The semiconductor laser device according to claim 22, wherein a radius of curvature of emission side lenses is smaller than a radius of curvature of incidence side lenses in the pairs of cylindrical lenses.

24. The semiconductor laser device according to claim 15, wherein the optical element is a cylindrical lens having convex lens parts at the two ends of the side faces, and wherein a plurality of optical elements are joined inclined by about 45° with respect to an incidence optical axis.

25. The semiconductor laser device according to claim 24, wherein a radius of curvature of emission side lenses is smaller than a radius of curvature of incidence side lenses in the convex lens parts.

26. The semiconductor laser device according to claim 15, wherein the beam converter is a one-dimensional array of a plurality of cylindrical lenses having convex lens parts at the two ends of the side faces joined inclined by about 45° with respect to an incidence optical axis.

27. The semiconductor laser device according to claim 26, wherein a radius of curvature of emission side lenses is smaller than a radius of curvature of incidence side lenses in the convex lens parts.

28. The semiconductor laser device according to claim 15, wherein the beam converter is comprised of an optical glass prism having a rectangular cross-section formed with a plurality of cylindrical surfaces inclined about 45° in the same direction as its incidence face and emission face, and wherein the converter emits incident beams entering its cylindrical surfaces rotated about 90° in cross-section.

29. The semiconductor laser device according to claim 28, wherein a radius of curvature of emission side surfaces is smaller than a radius of curvature of incidence side surfaces in the cylindrical surfaces, and wherein the angle of inclination is adjustable to emit incident beams entering its cylindrical surfaces rotated about 90° in cross-section.

30. The semiconductor laser device according to claim 15, wherein the optical element is a dub prism having a trapezoidal cross-section and a plurality of the optical elements is arranged inclined by about 45°.

31. The semiconductor laser device according to claim 15, wherein the optical element is comprised of two optical elements changing in power in only a direction approximately perpendicular to a center axis due to diffraction and arranged with center axes inclined about 45°.

32. The semiconductor laser device according to claim 15, wherein, at the incidence side and the emission side, the beam converter is comprised of a pair of binary optic elements arranged facing each other across a space of a predetermined distance, the surfaces of the incidence side binary optic element and emission side binary optic element being formed with pluralities of axially symmetric stepped surfaces changing in depth so that the powers change symmetric to center axes inclined about 45° in directions perpendicular to the center axes, and emits incident beams entering the axially symmetric stepped surfaces rotated about 90° in cross-section.

33. The semiconductor laser device according to claim 15, wherein the optical element is comprised of an optical element comprised of a structure with continuously changing refractive indexes and changing in power only in a direction approximately perpendicular to the orientation of arrangement and is arranged inclined 45° with respect to a horizontal plane.

34. The semiconductor laser device according to claim 15, wherein the beam converter is comprised of a plurality of one-dimensional profile refractive index lens elements comprised of optical glass members with refractive indexes highest at the center faces and becoming lower the closer to the side faces and joined with the center faces inclined about 45° with respect to a horizontal plane.

35. The semiconductor laser device according to claim 15, wherein the beam converter is comprised of an optical glass plate on both surfaces of which are formed pluralities of semicylindrical profile refractive index lens elements inclined about 45° with respect to those surfaces, arranged facing each other in the same direction, and having refractive indexes highest at the centers of the semicylinders and the refractive indexes becoming lower the further to the outsides.

36. The semiconductor laser device according to claim 1, further comprising:
  at least two laser diode stack arrays; and
  an optical device adapted for wavelength coupling the at least two groups of laser beams entering the third condenser after the first condenser.

37. The semiconductor laser device according to claim 36, wherein the optical device is a dichroic mirror.

38. The semiconductor laser device according to claim 1, further comprising:
  at least three laser diode stack arrays provided behind the first condenser;
  a first optical device adapted for coupling the at least two groups of laser beams emitted from the first condenser received in front of the first condenser; and
  a second optical device adapted for wavelength coupling at least two groups of laser beams entering the third condenser after the first condenser.

39. The semiconductor laser device according to claim 38, wherein the optical device is a mirror formed with through windows at approximately the same pitch as a stack pitch of the laser diode stack array.

40. The semiconductor laser device according to claim 38, wherein the optical device is comprised of mirrors arranged at approximately the same pitch as a stack pitch of the laser diode stack array.

41. The semiconductor laser device according to claim 38, wherein the optical device is comprised of right angle prisms arranged at approximately the same pitch as a stack pitch of the laser diode stack array.

42. The semiconductor laser device according to claim 38, wherein the optical device is a dichroic mirror.

43. The semiconductor laser device according to claim 1, further comprising an optical fiber having an end face at a focal plane of the third condenser.

44. The semiconductor laser device according to claim 43, wherein the optical fiber is an optical fiber having a core doped with a rare earth element.

45. The semiconductor laser device according to claim 43, wherein the laser device is a semiconductor laser pumped solid-state laser device, wherein the optical system is capable of collimating the beams emitted from the optical fiber so as to converge the beams to the focal point, and further comprising a solid-state laser element having a pumped light receiving face that is matched with a position of the focal point.

46. The semiconductor laser device according to claim 45, wherein the optical fiber is an optical fiber having a core doped with a rare earth element.

47. The semiconductor laser device according to claim 1, wherein the laser device is a semiconductor laser pumped solid-state laser device, and further comprising a solid-state laser element which has a pumped light receiving face approximately matched with a focal position of the third condenser.

48. A semiconductor laser device, comprising:
  an arrangement which is at least one of:
  a. a laser diode stack array which includes a plurality of emitters that extend long in a first direction of an emission of laser beams, the emitters capable of being arranged linearly in the first direction and situated in a plurality of rows, the emitters being adapted to emit a group of laser beams having laser beam elements arranged in a two-dimensional array, and
  b. a laser diode stack array which includes the emitters which extend long in the first direction of emission of laser beams, the emitters capable of being arranged linearly densely in the first direction and situated in the rows, the emitters capable of emitting the group of laser beams comprised of laser beams substantially continuing linearly arranged in the rows;
  a first condenser situated in front of the laser diode stack array, and configured for bending and collimating the group of laser beams for every one of the rows in a second direction substantially at right angles to the first direction;
  a first beam converter situated in front of the first condenser, the first beam converter adapted for dividing the group of laser beams in each one of the rows, providing optical elements in each of the rows in parallel so as to bend the axes of the cross-sections of the laser beam units to substantially right angles using as units the divided laser beams, receiving the group of laser beams collimated in the second direction, rotating the axes of the cross-sections of the laser beam units for each optical element, and emitting the beams as a substantially ladder rung configuration group of laser beams extending in the first direction using the divided laser beams as units;
  a second condenser situated in front of either the first beam converter or a first beam compressor, the second condenser capable of bending the group of laser beams output from the first beam converter or the first beam compressor, and using the group of laser beams with center axes offset by predetermined amounts to convert the laser beams to beams emitted from approximately the same object by generating an angular change of the optical axes;

the first beam compressor configured to receive an output of the group of laser beams from either the first beam converter or the second condenser, and emit the output converted to a substantially ladder rung configuration group of laser beams with shortened ladder rung intervals and extending in the first direction of the rows; and a third condenser adapted for condensing the group of laser beams output from the first beam compressor.

49. The semiconductor laser device according to claim 48, further comprising a shifter that is provided between the first beam converter and the second condenser, the shifter being capable of shifting in parallel optical axes in the second direction for each of the rows.

50. The semiconductor laser device according to claim 48, further comprising a shifter that is provided between the first condenser and the first beam converter, the shifter being adapted for shifting in parallel optical axes in the second direction for each of the rows.

51. The semiconductor laser device according to claim 48, wherein the second condenser includes a one-dimensional array of cylindrical lenses.

52. The semiconductor laser device according to claim 48, wherein the beam compressor is comprised of at least one of an anamorphic prism and anamorphic prism pair.

53. The semiconductor laser device according to claim 48, wherein the beam compressor is a telescope that includes at least one of one-dimensional lenses and two-dimensional lenses.

54. The semiconductor laser device according to claim 48, wherein the beam compressor is a telescope that includes at least one of a one-dimensional parabolic mirror and a two-dimensional parabolic mirror.

55. The semiconductor laser device according to claim 48, wherein the first condenser is a one-dimensional array of cylindrical lenses.

56. The semiconductor laser device according to claim 48, further comprising an angle adjuster provided in front of the first condenser, the angle adjuster being configured for finely adjusting the angle of optical axes for each of the rows to the second direction.

57. The semiconductor laser device according to claim 56, wherein the angle adjuster combines at least two wedge plates in reverse directions, and capable of rotating at least one of the wedge plates.

58. The semiconductor laser device according to claim 48, further comprising:
at least two laser diode stack arrays which are provided behind the first condenser; and
an optical device adapted for coupling the at least two groups of laser beams emitted from the first condenser that are provided in front of the condenser.

59. The semiconductor laser device according to claim 58, wherein the optical device is a mirror formed with through windows at approximately the same pitch as a stack pitch of the laser diode stack array.

60. The semiconductor laser device according to claim 58, wherein the optical device is comprised of mirrors arranged at approximately the same pitch as a stack pitch of the laser diode stack array.

61. The semiconductor laser device according to claim 58, wherein the optical device is comprised of right angle prisms arranged at approximately the same pitch as a stack pitch of the laser diode stack array.

62. The semiconductor laser device according to claim 48, further comprising:
at least two laser diode stack arrays; and
an optical device adapted for wavelength coupling the at least two groups of laser beams entering the third condenser after the first condenser.

63. The semiconductor laser device according to claim 48, wherein the optical device is a dichroic mirror.

64. The semiconductor laser device according to claim 48, further comprising:
at least three laser diode stack arrays provided behind the first condenser;
a first optical device adapted for coupling the at least two groups of laser beams emitted from the first condenser received in front of the first condenser; and
a second optical device adapted for wavelength coupling at least two groups of laser beams entering the third condenser after the first condenser.

65. The semiconductor laser device according to claim 64, wherein the optical device is a mirror formed with through windows at approximately the same pitch as a stack pitch of the laser diode stack array.

66. The semiconductor laser device according to claim 64, wherein the optical device is comprised of mirrors arranged at approximately the same pitch as a stack pitch of the laser diode stack array.

67. The semiconductor laser device according to claim 64, wherein the optical device is comprised of right angle prisms arranged at approximately the same pitch as a stack pitch of the laser diode stack array.

68. The semiconductor laser device according to claim 64, wherein the optical device is a dichroic mirror.

69. The semiconductor laser device according to claim 27, further comprising an optical fiber having an end face at a focal plane of the third condenser.

70. The semiconductor laser device according to claim 69, wherein the optical fiber is an optical fiber having a core doped with a rare earth element.

71. The semiconductor laser device according to claim 69, wherein the laser device is a semiconductor laser pumped solid-state laser device, wherein the optical system is capable of collimating the beams emitted from the optical fiber so as to converge the beams to the focal point, and further comprising a solid-state laser element having a pumped light receiving face that is matched with a position of the focal point.

72. The semiconductor laser device according to claim 71, wherein the optical fiber is an optical fiber having a core doped with a rare earth element.

73. The semiconductor laser device according to claim 48, wherein the laser device is a semiconductor laser pumped solid-state laser device, and further comprising a solid-state laser element which has a pumped light receiving face approximately matched with a focal position of the third condenser.

74. The semiconductor laser device according to claim 48, further comprising a beam converter including a plurality of optical elements, each of the elements including:
a. a receiving part adapted to receive incident light beams having cross-sections provided along first axes perpendicular to the optical axes,
b. an optical system adapted to rotate the first axis of the beam cross-sections to substantially right angles, and c. an emission part adapted to emit emitted beams passing through the optical system, wherein the optical elements are arranged on the optical axes of the laser beams, and the receiving and emission parts of the optical elements are arranged adjoining each other two-dimensionally on the same planes.

75. The semiconductor laser device according to claim 74, wherein the optical element is a space defined by reflecting faces, the space providing:
  i. a first reflecting face vertical and inclined about 45° with respect to incident beams,
  ii. a second reflecting face parallel to the incident beams and inclined about 45° with respect to the horizontal plane, and
  iii. a third reflecting face perpendicular to the vertical surface parallel to the incident beams, parallel to the line of intersection between the first reflecting face and second reflecting face, and inclined about 45° with respect to the horizontal plane.

76. The semiconductor laser device according to claim 74, wherein the optical element is a prism comprised of a first total reflecting face, a second total reflecting face, a third total reflecting face, an incidence face, an emission face, and a joining face,
  wherein the first, second, and third total reflecting faces intersect each other with an intersecting angles of 60°, the incidence face and emission face are parallel and perpendicularly intersect the second total reflecting face and are inclined about 45° with respect to the first and third total reflecting faces, and the joining face is parallel to the second total reflecting face, and
  wherein one of a one-dimensional array of prisms comprised of prisms are arranged adjoining each other with the third total reflecting faces, incidence faces, and emission faces on the same planes and with joining faces and second total reflecting faces of adjoining prisms joined together and a two-dimensional array comprised of one-dimensional arrays of prisms further aligned in parallel is used as the beam converter.

77. The semiconductor laser device according to claim 74, wherein one of an optical glass member having parallel first and second flat surfaces, a third flat surface intersecting the first flat surface by an angle of 135°, and a fourth surface comprised of a cyclically bent surface comprised of peaks and valleys having a bending angle of the line along which the peaks and valleys extend of 60°, are form continuously in a wave configuration in a direction intersecting the first flat surface by an angle of $\tan^{-1}$ $(1/\sqrt{2})$, and having peak lines and valley lines parallel to the third flat surface, the first flat surface being used as an incidence face, the second flat surface being used as an emission face, the faces of the bent faces forming the fourth surface intersecting the first flat surface by an angle of 45° being used as a first reflecting face, the other faces being used as a second reflecting face, and the third flat surface being used as a third reflecting face, and a one-dimensional array comprised of the optical glass members further aligned linearly is used as a beam converter.

78. The semiconductor laser device according to claim 74, wherein one of a mirror structure having a first flat surface intersecting a flat surface perpendicular to an incidence optical axis by an angle of 135°, a second surface comprised of a cyclically bent surface comprised of peaks and valleys having a bending angle of the line along which the peaks and valleys extend of 60°, are formed continuously in a wave configuration in a direction intersecting a flat surface perpendicular to the incidence optical axis by an angle of $\tan^{-1}$ $(1/\sqrt{2})$, and having peak lines and valley lines parallel to the first flat surface, the first flat surface and the second surface being treated to form mirror surfaces, the faces among the bent faces forming the second surface intersecting the flat surface perpendicular to the incidence optical axis by an angle of 45° being used as a first reflecting face, the other faces being used as a second reflecting face, and the first flat surface being used as a third reflecting face, and a one-dimensional array comprised of the mirror structures further aligned linearly is used as a beam converter.

79. The semiconductor laser device according to claim 74, wherein the optical element is comprised of a pair of convex cylindrical lenses, each of the lenses having axes inclined about 45° arranged facing each other across a space of a predetermined distance.

80. The semiconductor laser device according to claim 79, wherein a radius of curvature of emission side lenses is smaller than a radius of curvature of incidence side lenses in the pairs of cylindrical lenses.

81. The semiconductor laser device according to claim 74, wherein the optical element is comprised of an array of a plurality of pairs of convex cylindrical lenses, each of the lenses having an axes inclined about 45° arranged facing each other across a space of a predetermined distance.

82. The semiconductor laser device according to claim 81, wherein a radius of curvature of emission side lenses is smaller than a radius of curvature of incidence side lenses in the pairs of cylindrical lenses.

83. The semiconductor laser device according to claim 74, wherein the optical element is a cylindrical lens having convex lens parts at the two ends of the side faces, and wherein a plurality of optical elements are joined inclined by about 45° with respect to an incidence optical axis.

84. The semiconductor laser device according to claim 74, wherein a radius of curvature of emission side lenses is smaller than a radius of curvature of incidence side lenses in the convex lens pads.

85. The semiconductor laser device according to claim 74, wherein the beam converter is a one-dimensional array of a plurality of cylindrical lenses having convex lens parts at the two ends of the side faces joined inclined by about 45° with respect to an incidence optical axis.

86. The semiconductor laser device according to claim 85, wherein a radius of curvature of emission side lenses is smaller than a radius of curvature of incidence side lenses in the convex lens pads.

87. The semiconductor laser device according to claim 74, wherein the beam converter is comprised of an optical glass prism having a rectangular cross-section formed with a plurality of cylindrical surfaces inclined about 45° in the same direction as its incidence face and emission face, and wherein the converter emits incident beams entering its cylindrical surfaces rotated about 90° in cross-section.

88. The semiconductor laser device according to claim 87, wherein a radius of curvature of emission side surfaces is smaller than a radius of curvature of incidence side surfaces in the cylindrical surfaces, and wherein the angle of inclination is adjustable to emit incident beams entering its cylindrical surfaces rotated about 90° in cross-section.

89. The semiconductor laser device according to claim 74, wherein the optical element is a dub prism having a trapezoidal cross-section and a plurality of the optical elements is arranged inclined by about 45°.

90. The semiconductor laser device according to claim 74, wherein the optical element is comprised of two optical elements changing in power in only a direction approximately perpendicular to a center axis due to diffraction and arranged with center axes inclined about 45°.

91. The semiconductor laser device according to claim 74, wherein, at the incidence side and the emission side, the beam converter is comprised of a pair of binary optic elements arranged facing each other across a space of a predetermined distance, the surfaces of the incidence side binary optic element and emission side binary optic element being formed with pluralities of axially symmetric stepped surfaces changing in depth so that the powers change symmetric to center axes inclined about 45° in directions perpendicular to the center axes, and emits incident beams entering the axially symmetric stepped surfaces rotated about 90° in cross-section.

92. The semiconductor laser device according to claim 74, wherein the optical element is comprised of an optical element comprised of a structure with continuously changing refractive indexes and changing in power only in a direction approximately perpendicular to the orientation of arrangement and is arranged inclined 45° with respect to a horizontal plane.

93. The semiconductor laser device according to claim 74, wherein the beam converter is comprised of a plurality of one-dimensional profile refractive index lens elements comprised of optical glass members with refractive indexes highest at the center faces and becoming lower the closer to the side faces and joined with the center faces inclined about 45° with respect to a horizontal plane.

94. The semiconductor laser device according to claim 74, wherein the beam converter is comprised of an optical glass plate on both surfaces of which are formed pluralities of semicylindrical profile refractive index lens elements inclined about 45° with respect to those surfaces, arranged facing each other in the same direction, and having refractive indexes highest at the centers of the semicylinders and the refractive indexes becoming lower the further to the outsides.

95. A semiconductor laser device, comprising:
a laser diode stack array including a plurality of emitters which extend in a first direction of emission of laser beams, the emitters capable of being arranged linearly in the first direction and situated along a plurality of rows, the emitters being configured to emit a group of laser beams having laser beam elements arranged in a two-dimensional array;
a first condenser situated in front of the laser diode stack array, and capable of bending and collimating the group of laser beams for every one of the rows in a second direction substantially at right angles to the first direction;
a first beam converter situated in front of the first condenser, the first beam converter adapted for receiving the group of laser beams collimated in the second direction, and emitting the group of beams converted to a substantially ladder rung configuration group of laser beams extending in the first direction for every row;
a second condenser situated in front of either the first beam converter or a first beam compressor, and configured to bend the group of laser beams output from the first beam converter or the first beam compressor in a second direction substantially at right angles to the first direction for every row;
the first beam compressor capable of receiving the group of laser beams output from the first beam converter or the second condenser, and emitting the laser beams converted to a compressed substantially ladder rung configuration group of laser beams with shortened ladder rung intervals and extending in the first direction of the rows;
an angle changer situated in front of one of the second condenser and the first beam compressor, the angle changer capable of receiving the substantially ladder rung configuration group of laser beams extending in the first direction of the rows, and changing the center optical axes of the group of beams to the second direction for each row to obtain a group of beams emitted from substantially the same object; and
a third condenser adapted for condensing the group of laser beams changed in center optical axes.

96. The semiconductor laser device according to claim 95, further comprising a shifter that is provided between the first beam converter and the second condenser, the shifter being capable of shifting in parallel optical axes in the second direction for each of the rows.

97. The semiconductor laser device according to claim 95, further comprising a shifter that is provided between the first condenser and the first beam converter, the shifter being adapted for shifting in parallel optical axes in the second direction for each of the rows.

98. The semiconductor laser device according to claim 95, wherein the second condenser includes a one-dimensional array of cylindrical lenses.

99. The semiconductor laser device according to claim 95, wherein the beam compressor is comprised of at least one of an anamorphic prism and anamorphic prism pair.

100. The semiconductor laser device according to claim 95, wherein the beam compressor is a telescope that includes at least one of one-dimensional lenses and two-dimensional lenses.

101. The semiconductor laser device according to claim 95, wherein the beam compressor is a telescope that includes at least one of a one-dimensional parabolic mirror and a two-dimensional parabolic mirror.

102. The semiconductor laser device according to claim 95, wherein the first condenser is a one-dimensional array of cylindrical lenses.

103. The semiconductor laser device according to claim 95, further comprising an angle adjuster provided in front of the first condenser, the angle adjuster being configured for finely adjusting the angle of optical axes for each of the rows to the second direction.

104. The semiconductor laser device according to claim 103, wherein the angle adjuster combines at least two wedge plates in reverse directions, and capable of rotating at least one of the wedge plates.

105. The semiconductor laser device according to claim 95, further comprising:
at least two laser diode stack arrays which are provided behind the first condenser; and
an optical device adapted for coupling the at least two groups of laser beams emitted from the first condenser that are provided in front of the condenser.

106. The semiconductor laser device according to claim 105, wherein the optical device is a mirror formed with through windows at approximately the same pitch as a stack pitch of the laser diode stack array.

107. The semiconductor laser device according to claim 105, wherein the optical device is comprised of mirrors arranged at approximately the same pitch as a stack pitch of the laser diode stack array.

108. The semiconductor laser device according to claim 105, wherein the optical device is comprised of right angle prisms arranged at approximately the same pitch as a stack pitch of the laser diode stack array.

109. The semiconductor laser device according to claim 95, further comprising:
at least two laser diode stack arrays; and
an optical device adapted for wavelength coupling the at least two groups of laser beams entering the third condenser after the first condenser.

110. The semiconductor laser device according to claim 95, wherein the optical device is a dichroic mirror.

111. The semiconductor laser device according to claim 95, further comprising:
at least three laser diode stack arrays provided behind the first condenser;
a first optical device adapted for coupling the at least two groups of laser beams emitted from the first condenser received in front of the first condenser; and
a second optical device adapted for wavelength coupling at least two groups of laser beams entering the third condenser after the first condenser.

112. The semiconductor laser device according to claim 111, wherein the optical device is a mirror formed with through windows at approximately the same pitch as a stack pitch of the laser diode stack array.

113. The semiconductor laser device according to claim 111, wherein the optical device is comprised of mirrors arranged at approximately the same pitch as a stack pitch of the laser diode stack array.

114. The semiconductor laser device according to claim 111, wherein the optical device is comprised of right angle prisms arranged at approximately the same pitch as a stack pitch of the laser diode stack array.

115. The semiconductor laser device according to claim 111, wherein the optical device is a dichroic mirror.

116. The semiconductor laser device according to claim 95, further comprising an optical fiber having an end face at a focal plane of the third condenser.

117. The semiconductor laser device according to claim 116, wherein the optical fiber is an optical fiber having a core doped with a rare earth element.

118. The semiconductor laser device according to claim 116, wherein the laser device is a semiconductor laser pumped solid-state laser device, wherein the optical system is capable of collimating the beams emitted from the optical fiber so as to converge the beams to the focal point, and further comprising a solid-state laser element having a pumped light receiving face that is matched with a position of the focal point.

119. The semiconductor laser device according to claim 118, wherein the optical fiber is an optical fiber having a core doped with a rare earth element.

120. The semiconductor laser device according to claim 95, wherein the laser device is a semiconductor laser pumped solid-state laser device, and further comprising a solid-state laser element which has a pumped light receiving face approximately matched with a focal position of the third condenser.

121. The semiconductor laser device according to claim 95, wherein the angle changer is integrally formed with one of the second condenser and the first beam converter.

122. The semiconductor laser device according to claim 95, wherein the angle changer is one of an inclined transparent plate and an array of wedge prisms.

123. The semiconductor laser device according to claim 95, wherein the angle changer is an array of cylindrical lenses.

124. The semiconductor laser device according to claim 95, wherein the angle changer is a segment type reflection mirror.

125. The semiconductor laser device according to claim 95, further comprising a beam converter including a plurality of optical elements, each of the elements including:
a. a receiving part adapted to receive incident light beams having cross-sections provided along first axes perpendicular to the optical axes,
b. an optical system adapted to rotate the first axis of the beam cross-sections to substantially right angles, and
c. an emission part adapted to emit emitted beams passing through the optical system, wherein the optical elements are arranged on the optical axes of the laser beams, and the receiving and emission parts of the optical elements are arranged adjoining each other two-dimensionally on the same planes.

126. The semiconductor laser device according to claim 125, wherein the optical element is a space defined by reflecting faces, the space providing
i. a first reflecting face vertical and inclined about 45° with respect to incident beams,
ii. a second reflecting face parallel to the incident beams and inclined about 45° with respect to the horizontal plane, and
iii. a third reflecting face perpendicular to the vertical surface parallel to the incident beams, parallel to the line of intersection between the first reflecting face and second reflecting face, and inclined about 45° with respect to the horizontal plane.

127. The semiconductor laser device according to claim 125, wherein the optical element is a prism comprised of a first total reflecting face, a second total reflecting face, a third total reflecting face, an incidence face, an emission face, and a joining face,
wherein the first, second, and third total reflecting faces intersect each other with an intersecting angles of 60°, the incidence face and emission face are parallel and perpendicularly intersect the second total reflecting face and are inclined about 45° with respect to the first and third total reflecting faces, and the joining face is parallel to the second total reflecting face, and
wherein one of a one-dimensional array of prisms comprised of prisms are arranged adjoining each other with the third total reflecting faces, incidence faces, and emission faces on the same planes and with joining faces and second total reflecting faces of adjoining prisms joined together and a two-dimensional array comprised of one-dimensional arrays of prisms further aligned in parallel is used as the beam converter.

128. The semiconductor laser device according to claim 125, wherein one of an optical glass member having parallel first and second flat surfaces, a third flat surface intersecting the first flat surface by an angle of 135°, and a fourth surface comprised of a cyclically bent surface comprised of peaks and valleys having a bending angle of the line along which the peaks and valleys extend of 60°, are form continuously in a wave configuration in a direction intersecting the first flat surface by an angle of $\tan^{-1}(1/\sqrt{2})$, and having peak lines and valley lines parallel to the third flat surface, the first flat surface being used as an incidence face, the second flat surface being used as an emission face, the faces of the bent faces forming the fourth surface intersecting the first flat surface by an angle of 45° being used as a first reflecting face, the other faces being used as a second reflecting face, and the third flat surface being used as a third reflecting face, and a one-dimensional array comprised of the optical glass members further aligned linearly is used as a beam converter.

129. The semiconductor laser device according to claim 125, wherein one of a mirror structure having a first flat surface intersecting a flat surface perpendicular to an incidence optical axis by an angle of 135°, a second surface comprised of a cyclically bent surface comprised of peaks and valleys having a bending angle of the line along which the peaks and valleys extend of 60°, are formed continuously in a wave configuration in a direction intersecting a flat surface perpendicular to the incidence optical axis by an angle of $\tan^{-1}(1/\sqrt{2})$, and having peak lines and valley lines parallel to the first flat surface, the first flat surface and the second surface being treated to form mirror surfaces, the faces among the bent faces forming the second surface intersecting the flat surface perpendicular to the incidence optical axis by an angle of 45° being used as a first reflecting face, the other faces being used as a second reflecting face, and the first flat surface being used as a third reflecting face, and a one-dimensional array comprised of the mirror structures further aligned linearly is used as a beam converter.

130. The semiconductor laser device according to claim 125, wherein the optical element is comprised of a pair of convex cylindrical lenses, each of the lenses having axes inclined about 45° arranged facing each other across a space of a predetermined distance.

131. The semiconductor laser device according to claim 130, wherein a radius of curvature of emission side lenses is smaller than a radius of curvature of incidence side lenses in the pairs of cylindrical lenses.

132. The semiconductor laser device according to claim 125, wherein the optical element is comprised of an array of a plurality of pairs of convex cylindrical lenses, each of the lenses having an axes inclined about 45° arranged facing each other across a space of a predetermined distance.

133. The semiconductor laser device according to claim 132, wherein a radius of curvature of emission side lenses is smaller than a radius of curvature of incidence side lenses in the pairs of cylindrical lenses.

134. The semiconductor laser device according to claim 125, wherein the optical element is a cylindrical lens having convex lens parts at the two ends of the side faces, and wherein a plurality of optical elements are joined inclined by about 45° with respect to an incidence optical axis.

135. The semiconductor laser device according to claim 134, wherein a radius of curvature of emission side lenses is smaller than a radius of curvature of incidence side lenses in the convex lens parts.

136. The semiconductor laser device according to claim 125, wherein the beam converter is a one-dimensional array of a plurality of cylindrical lenses having convex lens parts at the two ends of the side faces joined inclined by about 45° with respect to an incidence optical axis.

137. The semiconductor laser device according to claim 136, wherein a radius of curvature of emission side lenses is smaller than a radius of curvature of incidence side lenses in the convex lens parts.

138. The semiconductor laser device according to claim 125, wherein the beam converter is comprised of an optical glass prism having a rectangular cross-section formed with a plurality of cylindrical surfaces inclined about 45° in the same direction as its incidence face and emission face, and wherein the converter emits incident beams entering its cylindrical surfaces rotated about 90° in cross-section.

139. The semiconductor laser device according to claim 138, wherein a radius of curvature of emission side surfaces is smaller than a radius of curvature of incidence side surfaces in the cylindrical surfaces, and wherein the angle of inclination is adjustable to emit incident beams entering its cylindrical surfaces rotated about 90° in cross-section.

140. The semiconductor laser device according to claim 125, wherein the optical element is a dub prism having a trapezoidal cross-section and a plurality of the optical elements is arranged inclined by about 45°.

141. The semiconductor laser device according to claim 125, wherein the optical element is comprised of two optical elements changing in power in only a direction approximately perpendicular to a center axis due to diffraction and arranged with center axes inclined about 45°.

142. The semiconductor laser device according to claim 125, wherein, at the incidence side and the emission side, the beam converter is comprised of a pair of binary optic elements arranged facing each other across a space of a predetermined distance, the surfaces of the incidence side binary optic element and emission side binary optic element being formed with pluralities of axially symmetric stepped surfaces changing in depth so that the powers change symmetric to center axes inclined about 45° in directions perpendicular to the center axes, and emits incident beams entering the axially symmetric stepped surfaces rotated about 90° in cross-section.

143. The semiconductor laser device according to claim 125, wherein the optical element is comprised of an optical element comprised of a structure with continuously changing refractive indexes and changing in power only in a direction approximately perpendicular to the orientation of arrangement and is arranged inclined 45° with respect to a horizontal plane.

144. The semiconductor laser device according to claim 125, wherein the beam converter is comprised of a plurality of one-dimensional profile refractive index lens elements comprised of optical glass members with refractive indexes highest at the center faces and becoming lower the closer to the side faces and joined with the center faces inclined about 45° with respect to a horizontal plane.

145. The semiconductor laser device according to claim 125, wherein the beam converter is comprised of an optical glass plate on both surfaces of which are formed pluralities of semicylindrical profile refractive index lens elements inclined about 45° with respect to those surfaces, arranged facing each other in the same direction, and having refractive indexes highest at the centers of the semicylinders and the refractive indexes becoming lower the further to the outsides.

146. A semiconductor laser device comprising:
an arrangement which includes at least one of:
a laser diode stack array provided which includes a plurality of emitters, the transmitters extending long in a first direction of emission of laser beams, arranged linearly in the first direction and provided in a plurality of rows, the transmitters capable of emitting a group of laser beams having laser beam elements arranged in a two-dimensional array, and
ii. a laser diode stack array provided with a plurality of further emitters, the further transmitter extending long in a first direction of emission of laser beams, arranged linearly densely in the first direction and provided in a plurality of rows, the further transmitter capable of emitting a group of laser beams comprised of laser beams substantially continuing linearly arranged in a plurality of rows;
a first condenser provided in front of the laser diode stack array, the first condenser being capable of bending and collimating the laser beams for every one of the rows in a second direction substantially at right angles to the first direction;

a first beam converter provided in front of the first condenser, the first beam converter dividing the group of laser beams in each row, and including in each row in parallel optical elements for bending the axes of the cross-sections of the laser beam units to substantially right angles using as units the divided pluralities of laser beams, the first beam converter capable of receiving the group of laser beams collimated in the second direction, rotating the axes of the cross-sections of the laser beam units for each optical element, and emitting the beams as a substantially ladder rung configuration group of laser beams extending in the first direction using the divided pluralities of laser beams as units;

a second condenser provided in front of either the first beam converter or a first beam compressor, the second condenser capable of bending the group of laser beams output from the first beam converter or the first beam compressor;

the first beam compressor capable of receiving the laser beams output from the first beam converter or the second condenser, and emitting the laser beams converted to a substantially ladder rung configuration group of laser beams with shortened ladder rung intervals and extending in the first direction of the plurality of rows;

an angle changer provided in front of one of the second condenser and the first beam compressor, the angle changer capable of receiving the substantially ladder rung configuration group of laser beams extending in the first direction of the plurality of rows, and changing the center optical axes of the group of beams to the second direction for each of the rows to obtain a group of beams emitted from substantially the same object; and a third condenser configured for condensing the group of laser beams.

147. The semiconductor laser device according to claim 146, further comprising a shifter that is provided between the first beam converter and the second condenser, the shifter being capable of shifting in parallel optical axes in the second direction for each of the rows.

148. The semiconductor laser device according to claim 146, further comprising a shifter that is provided between the first condenser and the first beam converter, the shifter being adapted for shifting in parallel optical axes in the second direction for each of the rows.

149. The semiconductor laser device according to claim 146, wherein the second condenser includes a one-dimensional array of cylindrical lenses.

150. The semiconductor laser device according to claim 146, wherein the beam compressor is comprised of at least one of an anamorphic prism and anamorphic prism pair.

151. The semiconductor laser device according to claim 146, wherein the beam compressor is a telescope that includes at least one of one-dimensional lenses and two-dimensional lenses.

152. The semiconductor laser device according to claim 146, wherein the beam compressor is a telescope that includes at least one of a one-dimensional parabolic mirror and a two-dimensional parabolic mirror.

153. The semiconductor laser device according to claim 146, wherein the first condenser is a one-dimensional array of cylindrical lenses.

154. The semiconductor laser device according to claim 146, further comprising an angle adjuster provided in front of the first condenser, the angle adjuster being configured for finely adjusting the angle of optical axes for each of the rows to the second direction.

155. The semiconductor laser device according to claim 154, wherein the angle adjuster combines at least two wedge plates in reverse directions, and capable of rotating at least one of the wedge plates.

156. The semiconductor laser device according to claim 146, further comprising:
at least two laser diode stack arrays which are provided behind the first condenser; and
an optical device adapted for coupling the at least two groups of laser beams emitted from the first condenser that are provided in front of the condenser.

157. The semiconductor laser device according to claim 156, wherein the optical device is a mirror formed with through windows at approximately the same pitch as a stack pitch of the laser diode stack array.

158. The semiconductor laser device according to claim 156, wherein the optical device is comprised of mirrors arranged at approximately the same pitch as a stack pitch of the laser diode stack array.

159. The semiconductor laser device according to claim 156, wherein the optical device is comprised of right angle prisms arranged at approximately the same pitch as a stack pitch of the laser diode stack array.

160. The semiconductor laser device according to claim 146, further comprising:
at least two laser diode stack arrays; and
an optical device adapted for wavelength coupling the at least two groups of laser beams entering the third condenser after the first condenser.

161. The semiconductor laser device according to claim 146, wherein the optical device is a dichroic mirror.

162. The semiconductor laser device according to claim 146, further comprising:
at least three laser diode stack arrays provided behind the first condenser;
a first optical device adapted for coupling the at least two groups of laser beams emitted from the first condenser received in front of the first condenser; and
a second optical device adapted for wavelength coupling at least two groups of laser beams entering the third condenser after the first condenser.

163. The semiconductor laser device according to claim 162, wherein the optical device is a mirror formed with through windows at approximately the same pitch as a stack pitch of the laser diode stack array.

164. The semiconductor laser device according to claim 162, wherein the optical device is comprised of mirrors arranged at approximately the same pitch as a stack pitch of the laser diode stack array.

165. The semiconductor laser device according to claim 162, wherein the optical device is comprised of right angle prisms arranged at approximately the same pitch as a stack pitch of the laser diode stack array.

166. The semiconductor laser device according to claim 162, wherein the optical device is a dichroic mirror.

167. The semiconductor laser device according to claim 146, further comprising an optical fiber having an end face at a focal plane of the third condenser.

168. The semiconductor laser device according to claim 167, wherein the optical fiber is an optical fiber having a core doped with a rare earth element.

169. The semiconductor laser device according to claim 168, wherein the laser device is a semiconductor laser pumped solid-state laser device, wherein the optical system is capable of collimating the beams emitted from the optical fiber so as to converge the beams to the focal point, and further comprising a solid-state laser element having a pumped light receiving face that is matched with a position of the focal point.

170. The semiconductor laser device according to claim 169, wherein the optical fiber is an optical fiber having a core doped with a rare earth element.

171. The semiconductor laser device according to claim 146, wherein the laser device is a semiconductor laser pumped solid-state laser device, and further comprising a solid-state laser element which has a pumped light receiving face approximately matched with a focal position of the third condenser.

172. The semiconductor laser device according to claim 146, wherein the angle changer is integrally formed with one of the second condenser and the first beam converter.

173. The semiconductor laser device according to claim 146, wherein the angle changer is one of an inclined transparent plate and an array of wedge prisms.

174. The semiconductor laser device according to claim 146, wherein the angle changer is an array of cylindrical lenses.

175. The semiconductor laser device according to claim 146, wherein the angle changer is a segment type reflection mirror.

176. The semiconductor laser device according to claim 146, further comprising a beam converter including a plurality of optical elements, each of the elements including:
  a. a receiving part adapted to receive incident light beams having cross-sections provided along first axes perpendicular to the optical axes,
  b. an optical system adapted to rotate the first axis of the beam cross-sections to substantially right angles, and
  c. an emission part adapted to emit emitted beams passing through the optical system, wherein the optical elements are arranged on the optical axes of the laser beams, and the receiving and emission parts of the optical elements are arranged adjoining each other two-dimensionally on the same planes.

177. The semiconductor laser device according to claim 176, wherein the optical element is a space defined by reflecting faces, the space providing
  i. a first reflecting face vertical and inclined about 45° with respect to incident beams,
  ii. a second reflecting face parallel to the incident beams and inclined about 45° with respect to the horizontal plane, and
  iii. a third reflecting face perpendicular to the vertical surface parallel to the incident beams, parallel to the line of intersection between the first reflecting face and second reflecting face, and inclined about 45° with respect to the horizontal plane.

178. The semiconductor laser device according to claim 176,
  wherein the optical element is a prism comprised of a first total reflecting face, a second total reflecting face, a third total reflecting face, an incidence face, an emission face, and a joining face,
  wherein the first, second, and third total reflecting faces intersect each other with an intersecting angles of 60°, the incidence face and emission face are parallel and perpendicularly intersect the second total reflecting face and are inclined about 45° with respect to the first and third total reflecting faces, and the joining face is parallel to the second total reflecting face, and
  wherein one of a one-dimensional array of prisms comprised of prisms are arranged adjoining each other with the third total reflecting faces, incidence faces, and emission faces on the same planes and with joining faces and second total reflecting faces of adjoining prisms joined together and a two-dimensional array comprised of one-dimensional arrays of prisms further aligned in parallel is used as the beam converter.

179. The semiconductor laser device according to claim 176, wherein one of an optical glass member having parallel first and second flat surfaces, a third flat surface intersecting the first flat surface by an angle of 135°, and a fourth surface comprised of a cyclically bent surface comprised of peaks and valleys having a bending angle of the line along which the peaks and valleys extend of 60°, are form continuously in a wave configuration in a direction intersecting the first flat surface by an angle of $\tan^{-1}(1/\sqrt{2})$, and having peak lines and valley lines parallel to the third flat surface, the first flat surface being used as an incidence face, the second flat surface being used as an emission face, the faces of the bent faces forming the fourth surface intersecting the first flat surface by an angle of 45° being used as a first reflecting face, the other faces being used as a second reflecting face, and the third flat surface being used as a third reflecting face, and a one-dimensional array comprised of the optical glass members further aligned linearly is used as a beam converter.

180. The semiconductor laser device according to claim 176, wherein one of a mirror structure having a first flat surface intersecting a flat surface perpendicular to an incidence optical axis by an angle of 135°, a second surface comprised of a cyclically bent surface comprised of peaks and valleys having a bending angle of the line along which the peaks and valleys extend of 60°, are formed continuously in a wave configuration in a direction intersecting a flat surface perpendicular to the incidence optical axis by an angle of $\tan^{-1}(1/\sqrt{2})$, and having peak lines and valley lines parallel to the first flat surface, the first flat surface and the second surface being treated to form mirror surfaces, the faces among the bent faces forming the second surface intersecting the flat surface perpendicular to the incidence optical axis by an angle of 45° being used as a first reflecting face, the other faces being used as a second reflecting face, and the first flat surface being used as a third reflecting face, and a one-dimensional array comprised of the mirror structures further aligned linearly is used as a beam converter.

181. The semiconductor laser device according to claim 176, wherein the optical element is comprised of a pair of convex cylindrical lenses, each of the lenses having axes inclined about 45° arranged facing each other across a space of a predetermined distance.

182. The semiconductor laser device according to claim 181, wherein a radius of curvature of emission side lenses is smaller than a radius of curvature of incidence side lenses in the pairs of cylindrical lenses.

183. The semiconductor laser device according to claim 176, wherein the optical element is comprised of an array of a plurality of pairs of convex cylindrical lenses, each of the lenses having an axes inclined about 45° arranged facing each other across a space of a predetermined distance.

184. The semiconductor laser device according to claim 183, wherein a radius of curvature of emission side lenses is smaller than a radius of curvature of incidence side lenses in the pairs of cylindrical lenses.

185. The semiconductor laser device according to claim 176, wherein the optical element is a cylindrical lens having convex lens parts at the two ends of the side faces, and wherein a plurality of optical elements are joined inclined by about 45° with respect to an incidence optical axis.

186. The semiconductor laser device according to claim 185, wherein a radius of curvature of emission side lenses is smaller than a radius of curvature of incidence side lenses in the convex lens parts.

187. The semiconductor laser device according to claim 176, wherein the beam converter is a one-dimensional array of a plurality of cylindrical lenses having convex lens parts at the two ends of the side faces joined inclined by about 45° with respect to an incidence optical axis.

188. The semiconductor laser device according to claim 187, wherein a radius of curvature of emission side lenses is smaller than a radius of curvature of incidence side lenses in the convex lens parts.

189. The semiconductor laser device according to claim 176, wherein the beam converter is comprised of an optical glass prism having a rectangular cross-section formed with a plurality of cylindrical surfaces inclined about 45° in the same direction as its incidence face and emission face, and wherein the converter emits incident beams entering its cylindrical surfaces rotated about 90° in cross-section.

190. The semiconductor laser device according to claim 189, wherein a radius of curvature of emission side surfaces is smaller than a radius of curvature of incidence side surfaces in the cylindrical surfaces, and wherein the angle of inclination is adjustable to emit incident beams entering its cylindrical surfaces rotated about 90° in cross-section.

191. The semiconductor laser device according to claim 176, wherein the optical element is comprised of two optical elements changing in power in only a direction approximately perpendicular to a center axis due to diffraction and arranged with center axes inclined about 45°.

192. The semiconductor laser device according to claim 176, wherein, at the incidence side and the emission side, the beam converter is comprised of a pair of binary optic elements arranged facing each other across a space of a predetermined distance, the surfaces of the incidence side binary optic element and emission side binary optic element being formed with pluralities of axially symmetric stepped surfaces changing in depth so that the powers change symmetric to center axes inclined about 45° in directions perpendicular to the center axes, and emits incident beams entering the axially symmetric stepped surfaces rotated about 90° in cross-section.

193. The semiconductor laser device according to claim 176, wherein the optical element is comprised of an optical element comprised of a structure with continuously changing refractive indexes and changing in power only in a direction approximately perpendicular to the orientation of arrangement and is arranged inclined 45° with respect to a horizontal plane.

194. The semiconductor laser device according to claim 176, wherein the beam converter is comprised of a plurality of one-dimensional profile refractive index lens elements comprised of optical glass members with refractive indexes highest at the center faces and becoming lower the closer to the side faces and joined with the center faces inclined about 45° with respect to a horizontal plane.

195. The semiconductor laser device according to claim 176, wherein the beam converter is comprised of an optical glass plate on both surfaces of which are formed pluralities of semicylindrical profile refractive index lens elements inclined about 45° with respect to those surfaces, arranged facing each other in the same direction, and having refractive indexes highest at the centers of the semicylinders and the refractive indexes becoming lower the further to the outsides.

196. A semiconductor laser device comprising:
a laser diode stack array including a plurality of emitters, the emitters extending long in a first direction of emission of laser beams, arranged linearly in the first direction and provided in a plurality of rows, the emitters capable of emitting a group of laser beams having laser beam elements arranged in a two-dimensional array;
a first condenser provided in front of the laser diode stack array, the first condenser configured to bend and collimate the laser beams for every one of the rows in a second direction substantially at right angles to the first direction;
a first beam converter provided in front of the first condenser, the first beam converter capable of receiving the laser beams collimated in the second direction, and emitting the laser beams converted to a substantially ladder rung configuration group of laser beams extending in the first direction for every one of the rows;
a second condenser provided in front of the first beam converter, the second condenser capable of bending the laser beams output from the first beam converter and using the beams with center axes offset by predetermined amounts to generate beams that are emitted from approximately the same object by generating an angular change of the optical axes; and
a third condenser adapted for receiving the laser beams output from the second condenser, forming images, and reducing the distance between the rows.

197. A semiconductor laser device comprising:
an arrangement which includes at least one of:
i a laser diode stack array which includes a plurality of emitters, the emitters extending long in a first direction of emission of laser beams, arranged linearly in the first direction and provided in a plurality of rows, the emitter capable of emitting a group of laser beams having laser beam elements arranged in a two-dimensional array, and
ii. a laser diode stack array comprising a plurality of further emitters, the further emitters extending long in a first direction of emission of laser beams, arranged linearly densely in the first direction and provided in a plurality of rows, the further emitters capable of emitting a group of laser beams comprised of laser beams substantially continuing linearly arranged in a plurality of rows;
a first condenser provided in front of the laser diode stack array, and configured for bending and collimating the group of laser beams for every one of the rows in a second direction substantially at right angles to the first direction;
a first beam converter provided in front of the first condenser, capable of dividing the group of laser beams in each row, providing in each row in parallel optical elements for bending the axes of the cross-sections of the laser beam units to substantially right angles using as units the divided pluralities of laser beams, receiving the group of laser beams collimated in the second direction, rotating the axes of the cross-sections of the laser beam units for each optical element, and emitting the beams as a substantially ladder rung configuration group of laser beams extending in the first direction using the divided pluralities of laser beams as units;

a second condenser provided in front of the first beam converter, and capable of bending the group of laser beams output from the first beam converter and using the beams with center axes offset by predetermined amounts to generate beams that are emitted from approximately the same object by generating an angular change of the optical axes; and a third condenser capable of receiving the group of laser beams, forming images, and reducing the distance between rows.

198. A semiconductor laser device comprising:

a laser diode stack array including a plurality of emitters, extending long in a first direction of emission of laser beams, the emitted being arranged linearly in the first direction, provided in a plurality of rows and capable of emitting a group of laser beams having laser beam elements arranged in a two-dimensional array;

a first condenser provided in front of the laser diode stack array, and capable of bending and collimating the group of laser beams for every one of the rows in a second direction substantially at right angles to the first direction;

a first beam converter provided in front of the first condenser, adapted for receiving the group of laser beams collimated in the second direction, and emitting the laser beams converted to a substantially ladder rung configuration group of laser beams extending in the first direction for every one of the rows;

a second condenser provided in front of the first beam converter, and capable of bending and collimating the group of laser beams output from the first beam converter in a second direction substantially at right angles to the first direction for every one of the rows;

a fourth condenser provided in front of the second condenser, configured for receiving the substantially ladder rung configuration group of laser beams extending in the first direction of the plurality of rows, forming images, and reducing the distance between the rows; and a third condenser configured for further reducing and reforming the image from the fourth condenser.

199. The semiconductor laser device according to claim 198, further comprising an angle changer provided along at least one of the image-forming plane of the fourth condenser and in a vicinity of the image-forming plane, the angle changer being capable of changing the center optical axes of the beams to the second direction for each one of the rows to obtain the beams emitted from substantially the same object.

200. A semiconductor laser device comprising:

at least one arrangement which is at least one of:

a laser diode stack array including a plurality of emitters, extending long in a first direction of emission of laser beams, the emitters being arranged linearly in the first direction, provided in a plurality of rows, and capable of emitting a group of laser beams having laser beam elements arranged in a two-dimensional array, and ii. a laser diode stack array including the emitters, extending long in a first direction of emission of laser beams, the emitters being arranged linearly densely in the first direction and arranged in a plurality of rows and capable of emitting the laser beams which are substantially continuing linearly arranged in the rows;

a first condenser provided in front of the laser diode stack array, and capable of bending and collimating the group of laser beams for every one of the rows in a second direction substantially at right angles to the first direction;

a first beam converter provided in front of the first condenser, capable of dividing the laser beams in each one of the rows, providing in each row in parallel optical elements for bending the axes of the cross-sections of the laser beam units to substantially right angles using as units the divided pluralities of laser beams, receiving the group of laser beams collimated in the second direction, rotating the axes of the cross-sections of the laser beam units for each optical element, and emitting the beams as a substantially ladder rung configuration group of laser beams extending in the first direction using the divided pluralities of laser beams as units;

a second condenser provided in front of the first beam converter, and configured for bending and collimating the laser beams output from the first beam converter in a second direction substantially at right angles to the first direction for every one of the rows;

a fourth condenser provided in front of the second condenser, capable of receiving the substantially ladder rung configuration group of laser beams extending in the first direction of the rows, forming images, and reducing the distance between the rows; and a third condenser configured for further reducing and reforming the image from the fourth condenser.

201. The semiconductor laser device according to claim 200, further comprising an angle changer provided along at least one of the image-forming plane of the fourth condenser and in a vicinity of the image-forming plane, the angle changer being capable of changing the center optical axes of the beams to the second direction for each one of the rows to obtain the beams emitted from substantially the same object.

202. The semiconductor laser device according to claim 200, wherein the angle changer is one of an inclined transparent plate and an array of wedge prisms.

203. The semiconductor laser device according to claim 201, wherein the angle changer is an array of cylindrical lenses.

204. The semiconductor laser device according to claim 200, wherein the angle changer is a segment type reflection mirror.

205. A semiconductor laser device comprising:

a laser diode stack array including a plurality of emitters, extending long in a first direction of emission of laser beams, the emitters being arranged linearly in the first direction, provided in a plurality of rows, and capable of emitting a group of laser beams having laser beam elements arranged in a two-dimensional array;

a first condenser provided in front of the laser diode stack array, and configured for bending and collimating the laser beams for every one of the rows in a second direction substantially at right angles to the first direction;

a first beam converter provided in front of the first condenser, capable of receiving the group of laser beams collimated in the second direction, and emitting the laser beams converted to a substantially ladder rung configuration group of laser beams extending in the first direction for every one of the rows;

a second condenser provided in front of the first beam converter, and capable of bending and collimating the laser beams output from the first beam converter in a second direction substantially at right angles to the first direction for every one of the rows;

a first beam compressor capable of receiving the laser beams output from the second condenser, and emitting the laser beams converted into a compressed substantially ladder rung configuration group of laser beams extending in the first direction of the rows;

a second beam compressor provided in front of the first beam compressor, and capable of emitting the laser beams output from the first beam compressor converted into a group of laser beams with shortened intervals of the rows and compressed in the second direction of the rows;

a fourth condenser configured for receiving the beams output from the second beam compressor, and making the beam divergence angle in the first direction close to the beam divergence angle of the second direction; and a third condenser capable of condensing the group of laser beams output from the fourth condenser.

206. A semiconductor laser device comprising:

at least one arrangement which is at least one of:

i. a laser diode stack array including a plurality of emitters, extending long in a first direction of emission of laser beams, the emitters being arranged linearly in the first direction and arranged in a plurality of rows, and capable of emitting a group of laser beams having laser beam elements arranged in a two-dimensional array, and ii. a laser diode stack array provided with the emitters, extending long in the first direction of emission of the laser beams, the emitters being arranged linearly densely in the first direction, provided in the rows, and capable of emitting the laser beams comprised of laser beams substantially continuing linearly arranged in the rows;

a first condenser provided in front of the laser diode stack array, and capable of bending and collimating the laser beams for every one of the rows in a second direction substantially at right angles to the first direction;

a first beam converter provided in front of the first condenser, capable of dividing the laser beams in each one of the rows, providing in each one of the rows, in parallel, optical elements configured for bending the axes of the cross-sections of the laser beam units to substantially right angles using as units the divided pluralities of laser beams, receiving the laser beams collimated in the second direction, rotating the axes of the cross-sections of the laser beam units for each of the optical elements, and emitting the beams as a substantially ladder rung configuration group of laser beams extending in the first direction using the divided pluralities of laser beams as units; a second condenser provided in front of the first beam converter, and capable of bending and collimating the laser beams output from the first beam converter in a second direction substantially at right angles to the first direction for every one of the rows;

a first beam compressor receiving the laser beams output from the second condenser, and capable of emitting the laser beams converted into a compressed substantially ladder rung configuration group of laser beams extending in the first direction of the rows;

a second beam compressor provided in front of the first beam compressor, and capable of emitting the laser beams output from the first beam compressor converted into a group of laser beams with shortened intervals of the rows and compressed in the second direction of the rows;

a fourth condenser configured for receiving the beams output from the second beam compressor, and making the beam divergence angle in the first direction close to the beam divergence angle of the second direction; and a third condenser configured to condense the laser beams output from the fourth condenser.

207. A semiconductor laser device comprising:

a laser diode stack array provided with a plurality of emitters, extending long in a first direction of emission of laser beams, the emitters being arranged linearly in the first direction, provided in a plurality of rows, and capable of emitting a group of laser beams having laser beam elements arranged in a two-dimensional array;

a first condenser provided in front of the laser diode stack array, and capable of bending and collimating the laser beams for every one of the rows in a second direction substantially at right angles to the first direction;

a first beam converter provided in front of the first condenser, capable of receiving the laser beams collimated in the second direction, and emitting the laser beams converted to a substantially ladder rung configuration group of laser beams extending in the first direction for every one of the rows a second condenser provided in front of the first beam converter, and capable of bending and collimating the laser beams output from the first beam converter in a second direction substantially at right angles to the first direction for every one of the rows;

a first beam compressor capable of receiving the laser beams output from the second condenser, and emitting the laser beams converted into a compressed substantially ladder rung configuration group of laser beams with shortened ladder rung intervals and extending in the first direction of the rows;

a second beam compressor provided in front of the first beam compressor, and capable of emitting the laser beams converted into a compressed group of laser beams with shortened intervals of the rows and extending in the second direction of the rows an angle changer provided inside at least one of the first beam compressor and the second beam compressor, and capable of changing the optical axis angles; and a third condenser adapted for condensing the laser beams.

208. The semiconductor laser device according to claim 207, wherein the angle changer is one of an inclined transparent plate and an array of wedge prisms.

209. The semiconductor laser device according to claim 207, wherein the angle changer is an array of cylindrical lenses.

210. The semiconductor laser device according to claim 207, wherein the angle changer is a segment type reflection mirror.

211. The semiconductor laser device according to claim 210, wherein the beam compressors include a two-dimensional beam compressor combining functions of the first beam compressor and second beam compressor.

212. The semiconductor laser device according to claim 210, further comprising a second beam converter provided between the first beam compressor and the second beam compressor, capable of receiving the substantially ladder rung configuration group of laser beams with shortened ladder rung intervals and extending in the first direction of the plurality of rows, converting the laser beams to substantially ladder rung configuration laser beams extending in the second direction for each row, and as a result emitting the laser beams converted to a single row of substantially ladder rung configuration laser beams with all laser beams extending in the second direction.

213. The semiconductor laser device according to claim 212, further comprising:
- a second beam converter provided between the first beam compressor and the second beam compressor, capable of receiving the substantially ladder rung configuration group of laser beams with shortened ladder rung intervals and extending in the first direction of the rows, converting the laser beams to substantially ladder rung configuration laser beams extending in the second direction for each row, and as a result emitting the laser beams converted to a single row of substantially ladder rung configuration laser beams with all laser beams extending in the second direction; and
- an angle changer provided in front of the second beam converter, and capable of changing the center optical axes of the laser beams to the second direction to obtain a group of beams emitted from substantially the same object.

214. The semiconductor laser device according to claim 213, further comprising a fifth condenser provided between the first beam compressor and the second beam converter, capable of receiving the substantially ladder rung configuration group of laser beams with shortened ladder rung intervals, and extending in the first direction of the rows and emitting the laser beams bending and collimating the laser beams of each one of the rows.

215. A semiconductor laser device comprising:
- at least one arrangement which is at least one of:
  - i. a laser diode stack array including a plurality of emitters, extending long in a first direction of emission of laser beams, the emitters being arranged linearly in the first direction and arranged in a plurality of rows, and capable of emitting a group of laser beams having laser beam elements arranged in a two-dimensional array, and
  - ii. a laser diode stack array including the emitters, extending long in the first direction of emission of the laser beams, the emitters being arranged linearly densely in the first direction, provided in the rows, and capable of emitting the laser beams which are substantially continuing linearly arranged in the rows;
- a first condenser provided in front of the laser diode stack array, and capable of bending and collimating the laser beams for every one of the rows in a second direction substantially at right angles to the first direction;
- a first beam converter provided in front of the first condenser, capable of dividing the laser beams in each one of the rows, providing in each one of the rows in parallel optical elements for bending the axes of the cross-sections of the laser beam units to substantially right angles using as units the divided laser beams, receiving the laser beams collimated in the second direction, rotating the axes of the cross-sections of the laser beam units for each optical element, and emitting the beams as a substantially ladder rung configuration group of laser beams extending in the first direction using the divided pluralities of laser beams as units;
- a second condenser provided in front of the first beam converter, capable of bending and collimating the laser beams output from the first beam converter in a second direction substantially at right angles to the first direction for every one of the rows;
- a first beam compressor capable of receiving the laser beams output from the second condenser, and emitting the laser beams converted into a compressed substantially ladder rung configuration group of laser beams extending in the first direction of the rows;
- a second beam compressor provided in front of the first beam compressor, and capable of emitting the laser beams output from the first beam compressor converted into a compressed group of laser beams with shortened intervals of the rows and extending in the second direction of the rows;
- an angle changer provided inside at least one of the first beam compressor and the second beam compressor, and capable of changing the optical axis angles; and
- a third condenser capable of condensing the group of laser beams.

216. The semiconductor laser device according to claim 213, wherein the beam compressors include a two-dimensional beam compressor combining functions of the first beam compressor and second beam compressor.

217. The semiconductor laser device according to claim 213, further comprising a second beam converter provided between the first beam compressor and the second beam compressor, capable of receiving the substantially ladder rung configuration group of laser beams with shortened ladder rung intervals and extending in the first direction of the plurality of rows, converting the laser beams to substantially ladder rung configuration laser beams extending in the second direction for each row, and as a result emitting the laser beams converted to a single row of substantially ladder rung configuration laser beams with all laser beams extending in the second direction.

218. The semiconductor laser device according to claim 217, further comprising:
- a second beam converter provided between the first beam compressor and the second beam compressor, capable of receiving the substantially ladder rung configuration group of laser beams with shortened ladder rung intervals and extending in the first direction of the rows, converting the laser beams to substantially ladder rung configuration laser beams extending in the second direction for each row, and as a result emitting the laser beams converted to a single row of substantially ladder rung configuration laser beams with all laser beams extending in the second direction; and
- an angle changer provided in front of the second beam converter, and capable of changing the center optical axes of the laser beams to the second direction to obtain a group of beams emitted from substantially the same object.

219. The semiconductor laser device according to claim 218, further comprising a fifth condenser provided between the first beam compressor and the second beam converter, capable of receiving the substantially ladder rung configuration group of laser beams with shortened ladder rung intervals, and extending in the first direction of the rows and emitting the laser beams bending and collimating the laser beams of each one of the rows.

220. The semiconductor laser device according to claim 213, wherein the angle changer is one of an inclined transparent plate and an array of wedge prisms.

221. The semiconductor laser device according to claim 213, wherein the angle changer is an array of cylindrical lenses.

222. The semiconductor laser device according to claim 213, wherein the angle changer is a segment type reflection mirror.

223. A semiconductor laser device comprising:

a laser diode stack array including a plurality of emitters, extending long in a first direction of emission of laser beams, the emitters being arranged linearly in the first direction, provided in a plurality of rows, and capable of emitting a group of laser beams having laser beam elements arranged in a two-dimensional array;

a first condenser provided in front of the laser diode stack array, and capable of bending and collimating the laser beams for every one of the rows in a second direction substantially at right angles to the first direction;

a second beam compressor provided in front of the first condenser, capable of receiving the laser beams collimated in the second direction, and emitting the laser beams converted into a group of laser beams with compressed distances between optical axes in the second direction;

a first beam converter provided in front of the second beam compressor, capable of dividing the laser beams in each one of the rows, providing in each one of the rows in parallel optical elements for bending the axes of the cross-sections of the laser beam units to substantially right angles using as units the divided pluralities of laser beams, receiving the laser beams collimated in the second direction and compressed in distance between optical axes in the second direction, rotating the axes of the cross-sections of the laser beam units for each of the optical elements, and emitting the beams as a substantially ladder rung configuration group of laser beams extending in the first direction using the divided pluralities of laser beams as units;

a first beam compressor provided in front of the first beam converter, and capable of emitting the laser beams converted into a group of laser beams compressed in the first direction;

a second condenser provided in front of the first beam compressor, and capable of making the beam divergence angle of the first direction close to the divergence angle of the second direction; and a third condenser configured for condensing the laser beams.

224. A semiconductor laser device comprising:

an arrangement which includes at least one of:

i. a laser diode stack array including a plurality of emitters, extending long in a first direction of emission of laser beams, the emitter being arranged linearly in the first direction and arranged in a plurality of rows, and capable of emitting a group of laser beams having laser beam elements arranged in a two-dimensional array, and ii. a laser diode stack array including the emitters that extend along the first direction of emission of laser beams, the emitters being arranged linearly densely in the first direction in the rows, and capable of emitting the laser beams comprised of laser beams substantially continuing linearly arranged in the rows;

a first condenser provided in front of the laser diode stack array, and capable of bending and collimating the laser beams for every one of the rows in a second direction substantially at right angles to the first direction;

a second beam compressor provided in front of the first condenser, capable of receiving the laser beams collimated in the second direction, and emitting the laser beams converted into a group of laser beams with compressed distances between optical axes in the second direction;

a first beam converter provided in front of the second beam compressor, capable of dividing the laser beams in each row, providing in each one of the rows in parallel optical elements for bending the axes of the cross-sections of the laser beam units to substantially right angles using as units the divided laser beams, receiving the laser beams collimated in the second direction and compressed in distance between optical axes in the second direction, rotating the axes of the cross-sections of the laser beam units for each optical element, and emitting the beams as a substantially ladder rung configuration group of laser beams extending in the first direction using the divided laser beams as units;

a first beam compressor provided in front of the first beam converter, and capable of emitting the laser beams converted into a group of laser beams compressed in the first direction;

a second condenser provided in front of the first beam compressor, and capable of making the beam divergence angle of the first direction close to the divergence angle of the second direction; and a third condenser configured for condensing the laser beams.

225. The semiconductor laser device according to claim 224, further comprising a fifth condenser provided between the second beam compressor and the first beam converter, capable of receiving a further group of laser beams with distances between optical axes in the second direction compressed, and emitting the further laser beams of each one of the rows bent and collimated in the second direction.

226. The semiconductor laser device according to claim 225, further comprising an angle changer situated in front of the second beam compressor changing the center optical axes of the laser beams to obtain a group of beams emitted from substantially the same object.

227. The semiconductor laser device according to claim 225, wherein the fifth condenser is a cylindrical lens.

228. The semiconductor laser device according to claim 225, wherein the angle changer is one of an inclined transparent plate and an array of wedge prisms.

229. The semiconductor laser device according to claim 225, wherein the angle changer is an array of cylindrical lenses.

230. The semiconductor laser device according to claim 225, wherein the angle changer is a segment type reflection mirror.

231. The semiconductor laser device according to claim 1, wherein the second condenser is also adopted for collimating the group of laser beams in a second direction substantially at right angles to the first direction for every one of the rows and the first beam compressor is located in front of the second converter.

232. The semiconductor laser device according to claim 48, wherein the second condenser is also adopted for collimating the group of laser beams in a second direction substantially at right angles to the first direction for every one of the rows and the first beam compressor is located in front of the second converter.

233. The semiconductor laser device according to claim 95, wherein the second condenser is also adopted for collimating the group of laser beams in a second direction substantially at right angles to the first direction for every one of the rows and the first beam compressor is located in front of the second converter.

234. The semiconductor laser device according to claim 146, wherein the second condenser is also adopted for collimating the group of laser beams in a second direction substantially at right angles to the first direction for every one of the rows and the first beam compressor is located in front of the second converter.

235. The semiconductor laser device according to claim 196, wherein the second condenser is also adopted for collimating the group of laser beams in a second direction substantially at right angles to the first direction for every one of the rows.

* * * * *